(12) United States Patent
Bouche et al.

(10) Patent No.: US 11,430,866 B2
(45) Date of Patent: Aug. 30, 2022

(54) DEVICE CONTACT SIZING IN INTEGRATED CIRCUIT STRUCTURES

(71) Applicant: Intel Corporation, Santa Clara, CA (US)

(72) Inventors: Guillaume Bouche, Portland, OR (US); Andy Chih-Hung Wei, Yamhill, OR (US); Sean T. Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/831,640

(22) Filed: Mar. 26, 2020

(65) Prior Publication Data

US 2021/0305370 A1 Sep. 30, 2021

(51) Int. Cl.
*H01L 29/08* (2006.01)
*H01L 23/522* (2006.01)
*H01L 23/535* (2006.01)
*H01L 29/06* (2006.01)

(52) U.S. Cl.
CPC ...... *H01L 29/0847* (2013.01); *H01L 23/5226* (2013.01); *H01L 23/535* (2013.01); *H01L 29/0649* (2013.01)

(58) Field of Classification Search
CPC ............. H01L 29/0847; H01L 29/0649; H01L 29/0673; H01L 29/6656; H01L 23/5226; H01L 23/535; H01L 27/0218; H01L 27/105
USPC ........................................................ 257/288
See application file for complete search history.

(56) References Cited

U.S. PATENT DOCUMENTS

| 5,591,657 | A | * | 1/1997 | Fujishima | ........... | H01L 21/8249 |
| | | | | | | 257/E21.417 |
| 5,925,912 | A | * | 7/1999 | Arai | ...................... | H01L 23/485 |
| | | | | | | 257/344 |
| 5,965,917 | A | * | 10/1999 | Maszara | ........... | H01L 29/41733 |
| | | | | | | 257/347 |
| 10,186,456 | B2 | * | 1/2019 | Wang | ................ | H01L 21/76829 |
| 10,529,824 | B2 | * | 1/2020 | Chiou | ................ | H01L 29/4958 |
| 2008/0277725 | A1 | * | 11/2008 | Shino | ................ | H01L 27/10844 |
| | | | | | | 257/347 |
| 2009/0014796 | A1 | * | 1/2009 | Liaw | ..................... | H01L 23/528 |
| | | | | | | 257/347 |
| 2009/0218640 | A1 | * | 9/2009 | Hampp | ............. | H01L 21/76834 |
| | | | | | | 257/412 |
| 2012/0049290 | A1 | * | 3/2012 | Shiraishi | ............. | H01L 29/7811 |
| | | | | | | 257/369 |

(Continued)

FOREIGN PATENT DOCUMENTS

EP 0510667 A1 10/1992

OTHER PUBLICATIONS

EPO Apr. 15, 2021—Extended European Search Report for European Patent No. 20207504; 7 pages.

*Primary Examiner* — Dao H Nguyen
(74) *Attorney, Agent, or Firm* — Akona IP

(57) ABSTRACT

Discussed herein is device contact sizing in integrated circuit (IC) structures. In some embodiments, an IC structure may include: a first source/drain (S/D) contact in contact with a first S/D region, and a second S/D contact in contact with a second S/D region, wherein the first S/D region and the second S/D region have a same length, and the first S/D contact and the second S/D contact have different lengths.

18 Claims, 99 Drawing Sheets

(56) References Cited

U.S. PATENT DOCUMENTS

| | | | |
|---|---|---|---|
| 2015/0171166 A1* | 6/2015 | Liu | H01L 21/8258 |
| | | | 257/369 |
| 2016/0056155 A1* | 2/2016 | Park | H01L 21/768 |
| | | | 257/401 |
| 2016/0307837 A1* | 10/2016 | Park | H01L 23/485 |
| 2018/0277662 A1* | 9/2018 | Liang | H01L 29/7848 |

* cited by examiner

DEVICE CONTACT SIZING IN INTEGRATED CIRCUIT STRUCTURES

BACKGROUND

Electronic components may include active electrical elements, such as transistors. The design of these elements may impact the size, performance, and reliability of the electronic component.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
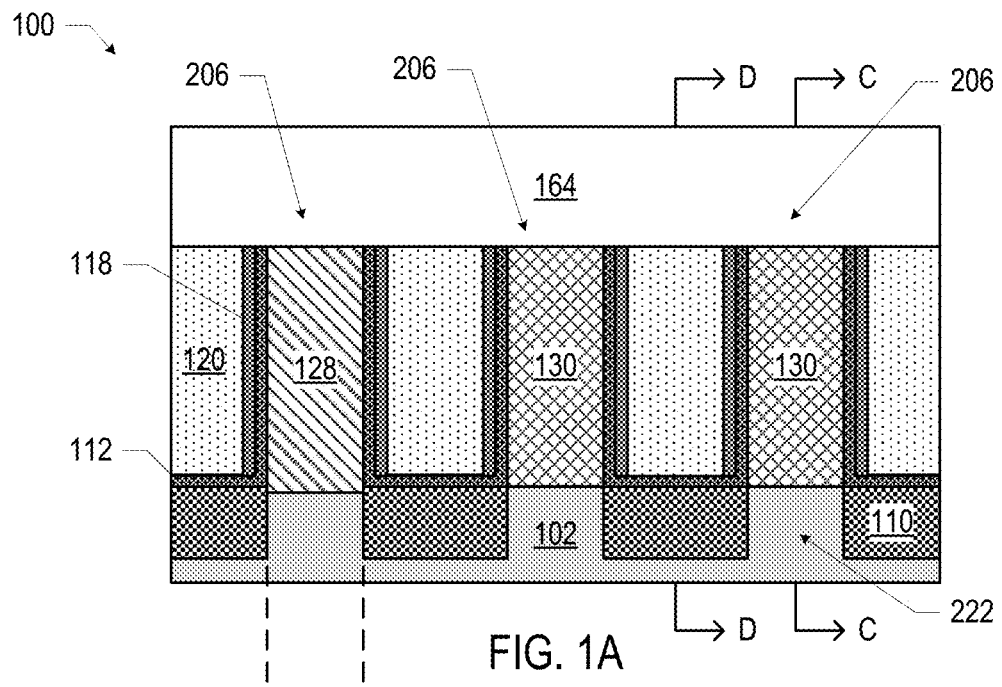
FIGS. 1A-1D are cross-sectional views of an integrated circuit (IC) structure, in accordance with various embodiments.

Discussed herein is device contact sizing in integrated circuit (IC) structures. In some embodiments, an IC structure may include: a first source/drain (S/D) contact in contact with a first S/D region, and a second S/D contact in contact with a second S/D region, wherein the first S/D region and the second S/D region have a same length, and the first S/D contact and the second S/D contact have different lengths.

Transistors formed using high volume manufacturing techniques may include a device region including alternating source/drain (S/D) regions and channel regions, with S/D contacts making electrical contact with the S/D regions and gate contacts making electrical contact with gates proximate to the channel regions. In some fabrication processes, such as self-aligned contact (SAC) processes, the S/D contacts along a device region may all have the same length; similarly, the gate contacts along a device region may all have the same length. However, it may be desirable to be able to achieve different lengths for various ones of the S/D contacts (or gate contacts) along a device region. For example, increasing the length of a contact may decrease its resistance, but may increase its Miller capacitance, and thus it may be desirable to set the length of a particular contact to achieve a desired balance between its resistance and capacitance (e.g., based on the role of that contact in the resulting circuitry).

Disclosed herein are novel IC structures and manufacturing techniques that may enable the use of device contacts (e.g., S/D contacts or gate contacts) with different lengths along a device region. For example, one or more S/D contacts in a device region may be fabricated to have a shorter length than other S/D contacts along the device region in order to reduce the capacitance of the one or more S/D contacts (in exchange for increasing the resistance of the one or more S/D contacts). In another example, one or more prospective S/D contacts may be fully obstructed (i.e., having zero length) in accordance with the structures and techniques disclosed herein; such "depopulated" S/D contacts may be useful for prospective S/D contacts in the interior of a device region (where no electrical contact to the associated S/D regions is needed) by reducing the undesirable parasitics associated with using a "dummy" S/D contact.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, the term "insulating"

means "electrically insulating" unless otherwise specified. For convenience, the phrase "FIG. 1" may be used to refer to the collection of drawings of FIGS. 1A-1D, the phrase "FIG. 2" may be used to refer to the collection of drawings of FIGS. 2A-2D, etc.

FIG. 1 provides cross-sectional views of an IC structure 100, in accordance with various embodiments. In particular, FIG. 1A is a cross-sectional view taken through the section A-A of FIGS. 10 and 1D (perpendicular to the longitudinal axis of a channel region 202, and across the source/drain regions 128/130 of different channel regions 202), FIG. 1B is a cross-sectional view taken through the section B-B of FIGS. 10 and 1D (perpendicular to the longitudinal axis of a channel region 202, and across a gate 204 spanning multiple channel regions 202), FIG. 10 is a cross-sectional view taken through the section C-C of FIGS. 1A and 1B (along the longitudinal axis of a channel region 202), FIG. 1D is a cross-sectional view taken through the section D-D of FIGS. 1A and 1B (between adjacent channel regions 202, parallel to the longitudinal axis of the channel regions 202).

The "A," "B," "C," and "D" sub-figures of FIGS. 2-48 share the same perspectives as those of the sub-figures "A," "B," "C," and "D" of FIG. 1, respectively. Although various ones of the accompanying drawings depict a particular number of device regions 206 (e.g., three), channel regions 202 (e.g., three) in a device region 206, and a particular arrangement of channel materials 106 (e.g., two wires) in a channel region 202, this is simply for ease of illustration, and an IC structure 100 may include more or fewer device regions 206 and/or channel regions 202, and/or other arrangements of channel materials 106. Further, although the accompanying drawings illustrate examples of S/D contacts 164 having different lengths 252, the teachings herein may also be applied to gate contacts (e.g., the length of gate contacts 140 along the longitudinal axis of a channel region 202).

A device region 206 may be oriented vertically relative to an underlying base 102, with multiple device regions 206 arrayed along the base 102. The base 102 may be a semiconductor substrate composed of semiconductor material systems including, for example, n-type or p-type materials systems (or a combination of both). The base 102 may include, for example, a crystalline substrate formed using a bulk silicon. The base 102 may include a layer of silicon dioxide on a bulk silicon or gallium arsenide substrate. The base 102 may include a converted layer (e.g., a silicon layer that has been converted to silicon dioxide during an oxygen-based annealing process). In some embodiments, the base 102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the base 102. Although a few examples of materials from which the base 102 may be formed are described here, any material or structure that may serve as a foundation for an IC structure 100 may be used. The base 102 may be part of a singulated die (e.g., the dies 1502 of FIG. 50) or a wafer (e.g., the wafer 1500 of FIG. 50). In some embodiments, the base 102 may itself include an interconnect layer, an insulation layer, a passivation layer, an etch stop layer, additional device layers, etc. As shown in FIG. 1, the base 102 may include pedestals 222, around which a dielectric material 110 may be disposed; the dielectric material 110 may include any suitable material, such as a shallow trench isolation (STI) material (e.g., an oxide material, such as silicon oxide).

Figure 1B:
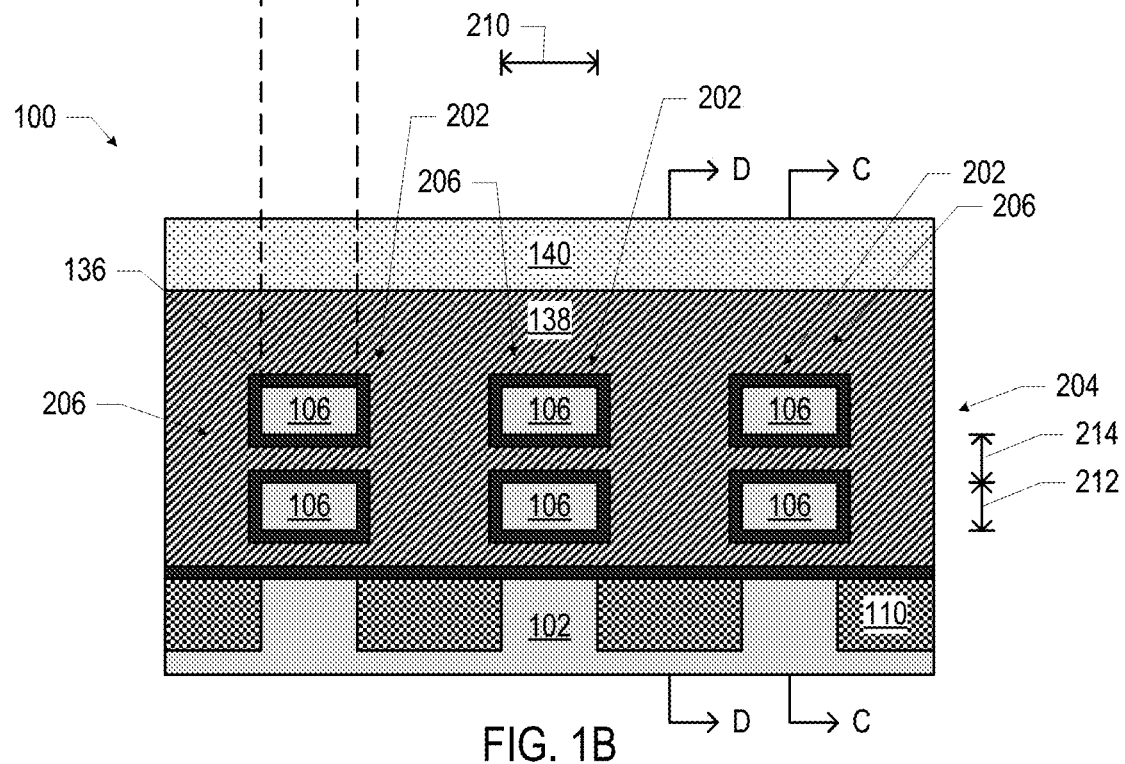
Figure 1C:
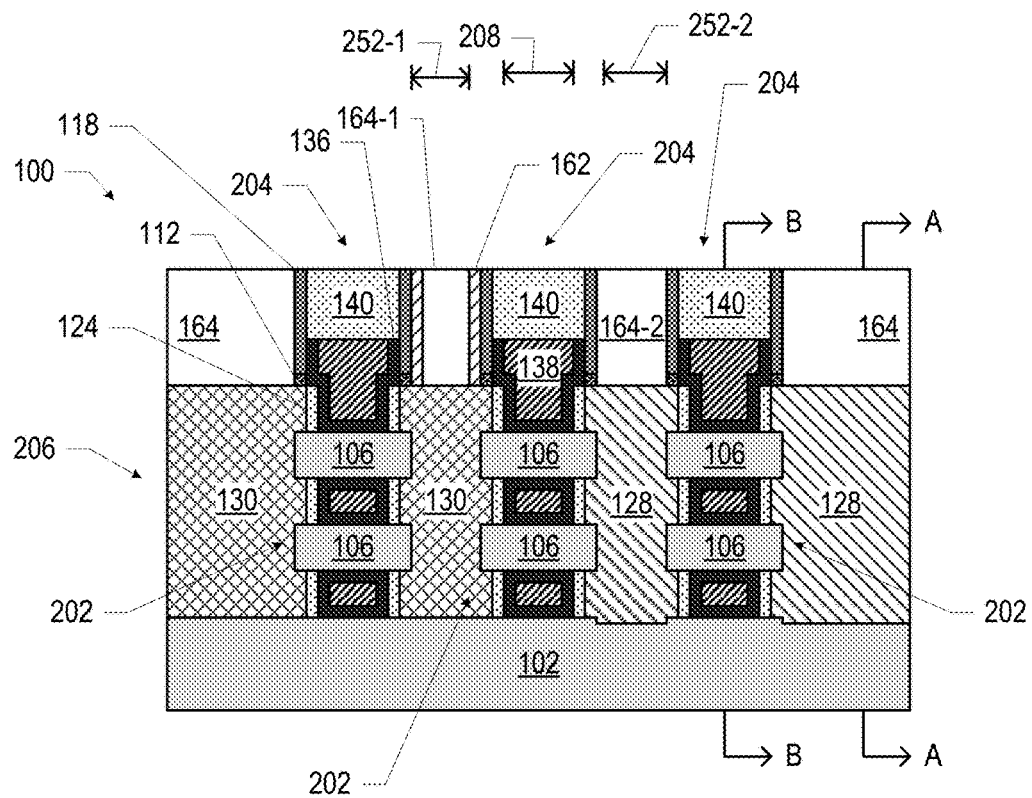
Figure 1D:
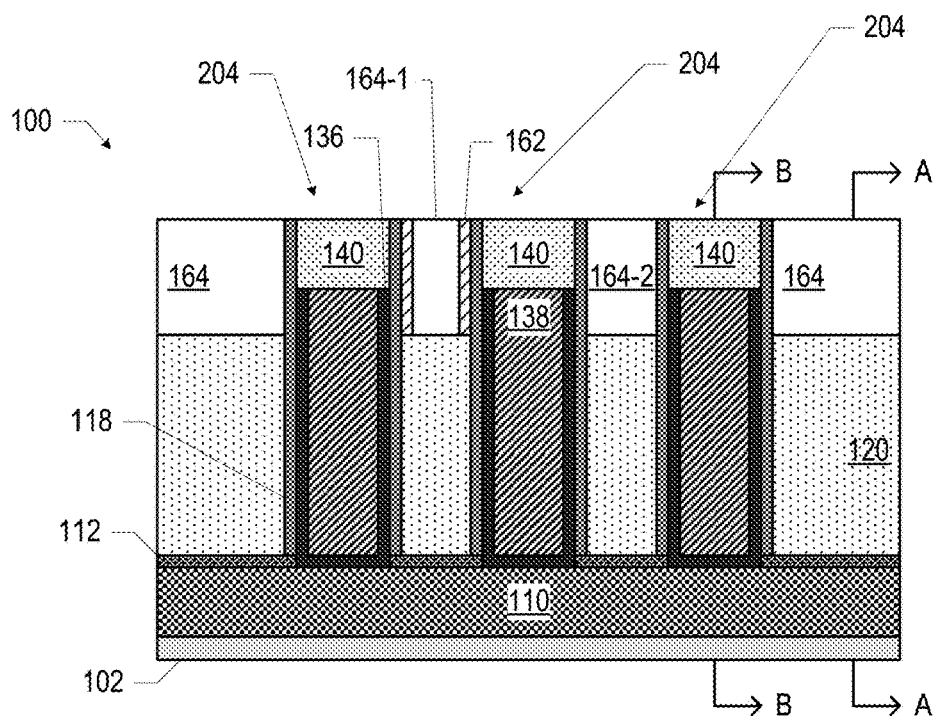
Figure 2A:
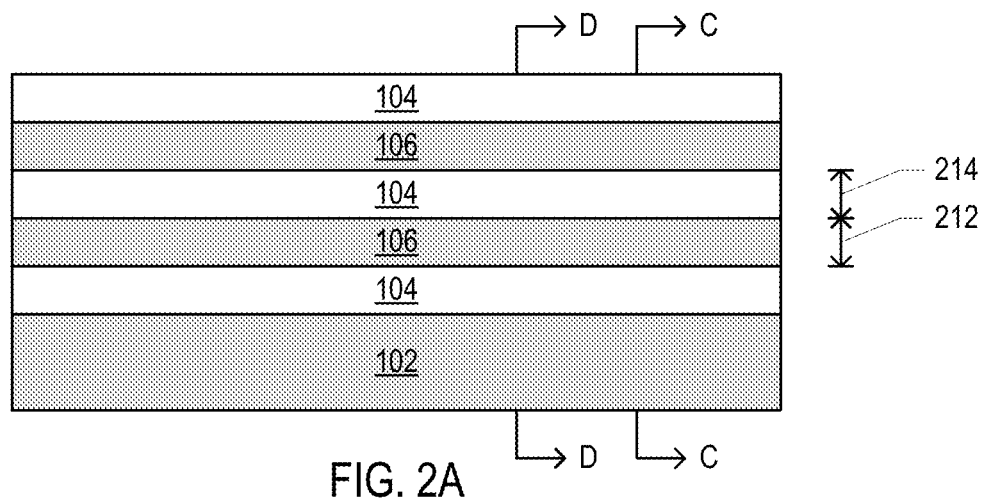
FIGS. 2A-2D, 3A-3D, 4A-4D, 5A-5D, 6A-6D, 7A-7D, 8A-8D, 9A-9D, 10A-10D, 11A-11D, 12A-12D, 13A-13D, 14A-14D, 15A-15D, 16A-16D, 17A-17D, 18A-18D, 19A-19D, 20A-20D, 21A-21D, 22A-22D, 23A-23D, 24A-24D, 25A-25D, 26A-26D, 27A-27D, 28A-28D, 29A-29D, 30A-30D, 31A-31D, 32A-32D, 33A-33D, 34A-34D, 35A-35D, 36A-36D, 37A-37D, 38A-38D, 39A-39D, 40A-40D, 41A-41D, 42A-42D, 43A-43D, and 44A-44D are cross-sectional views of stages in an example process of manufacturing the IC structure of FIGS. 1A-1D, in accordance with various embodiments.
Figure 2B:
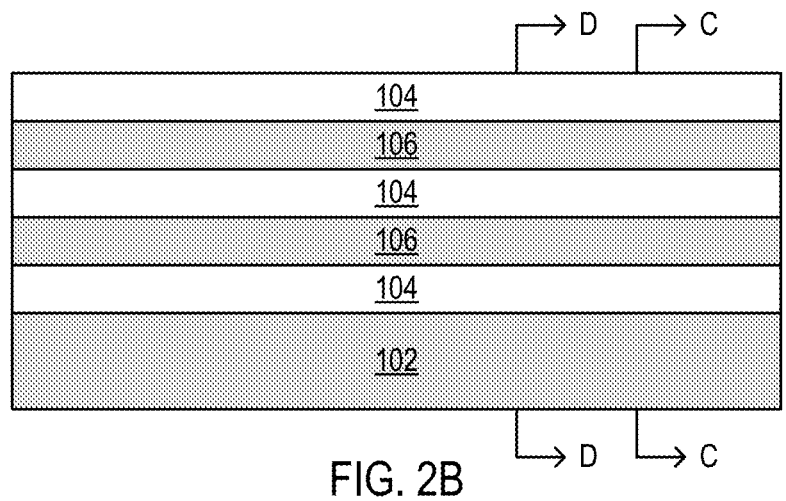
Figure 2C:
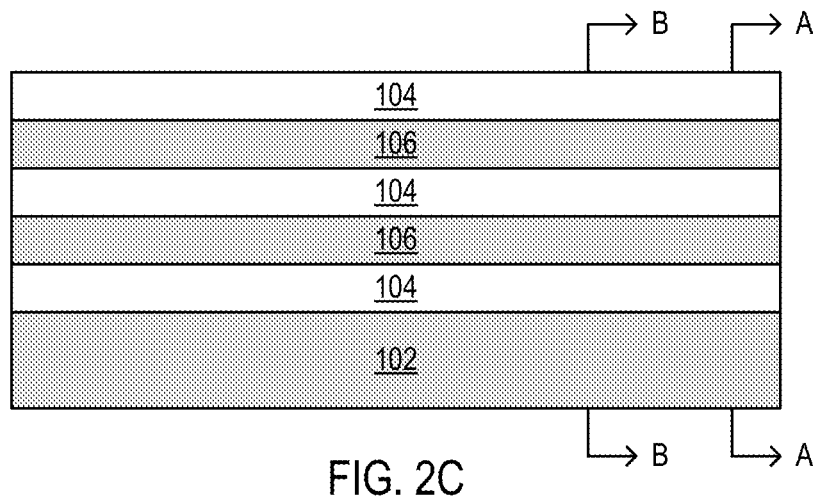
Figure 2D:
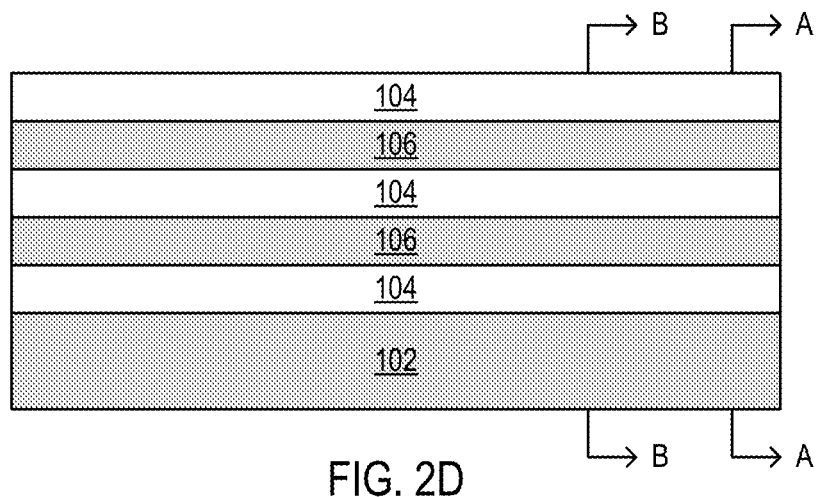
Figure 3A:
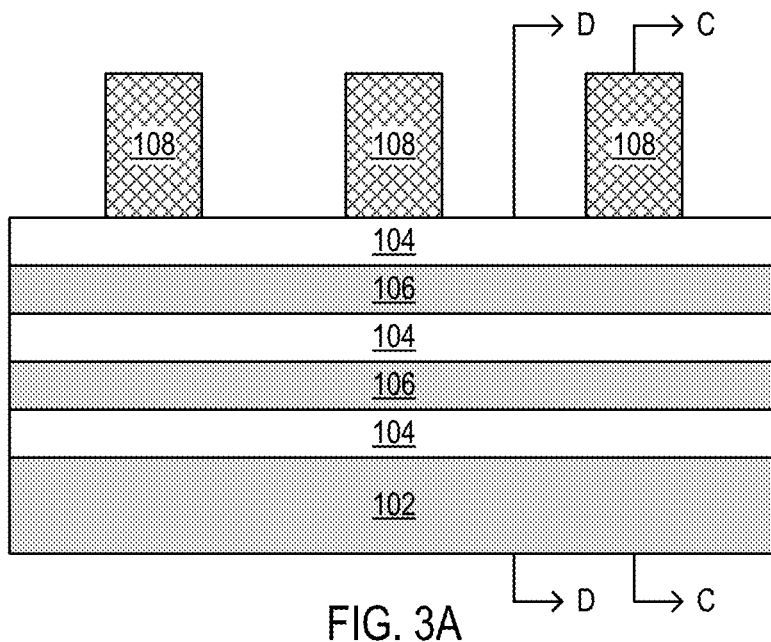
Figure 3B:
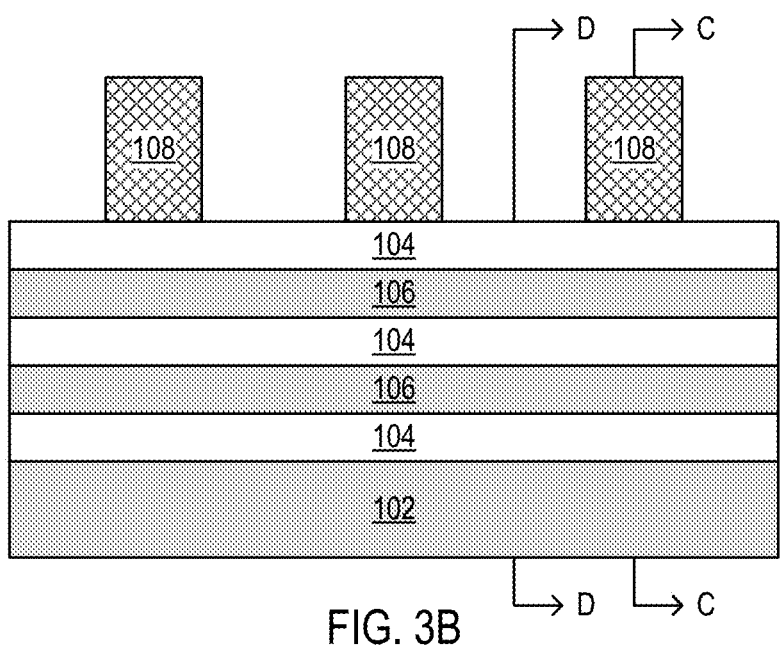
Figure 3C:
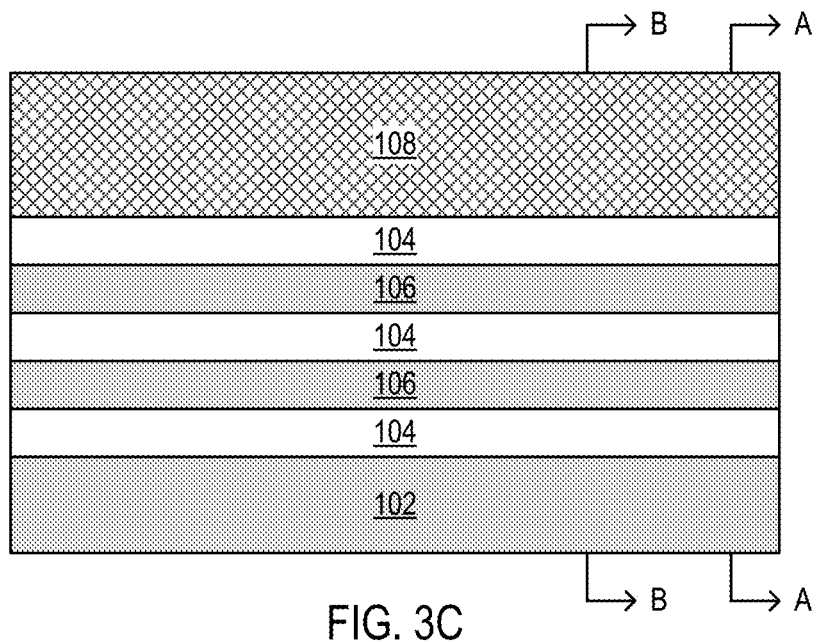
Figure 3D:
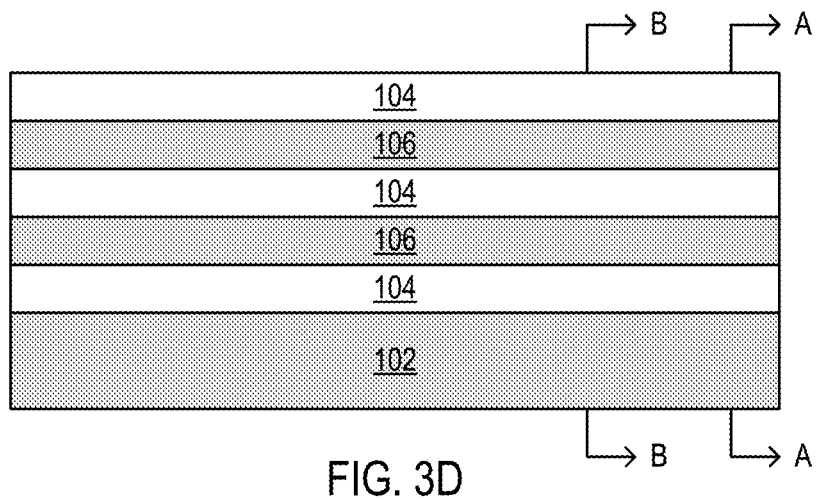
Figure 4A:
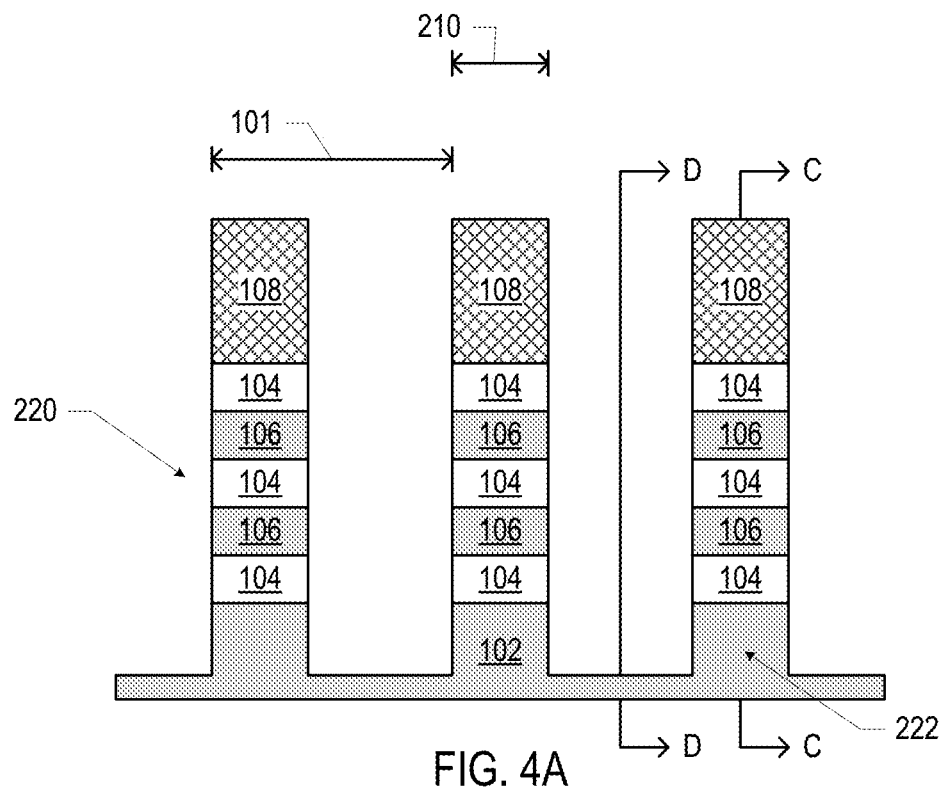
Figure 4B:
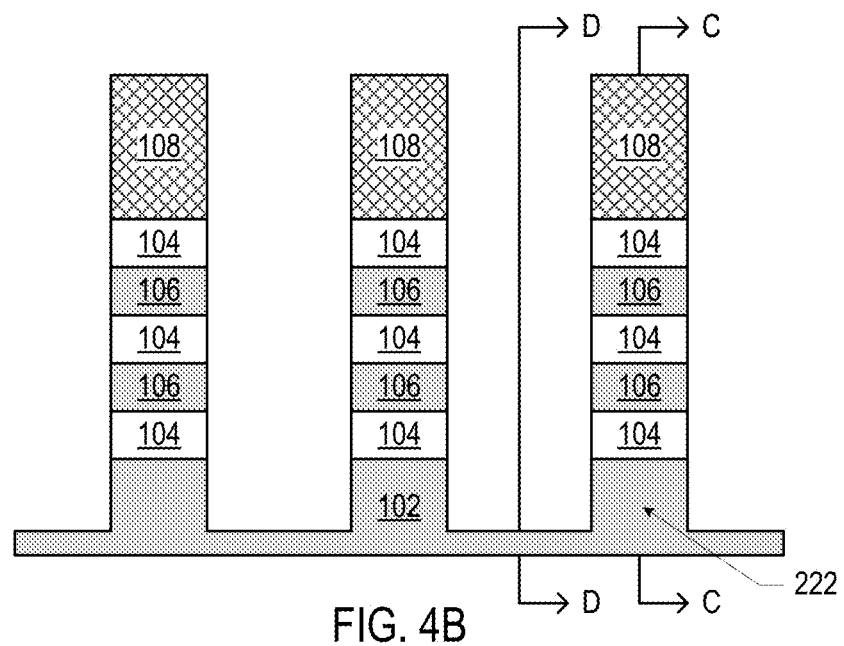
Figure 4C:
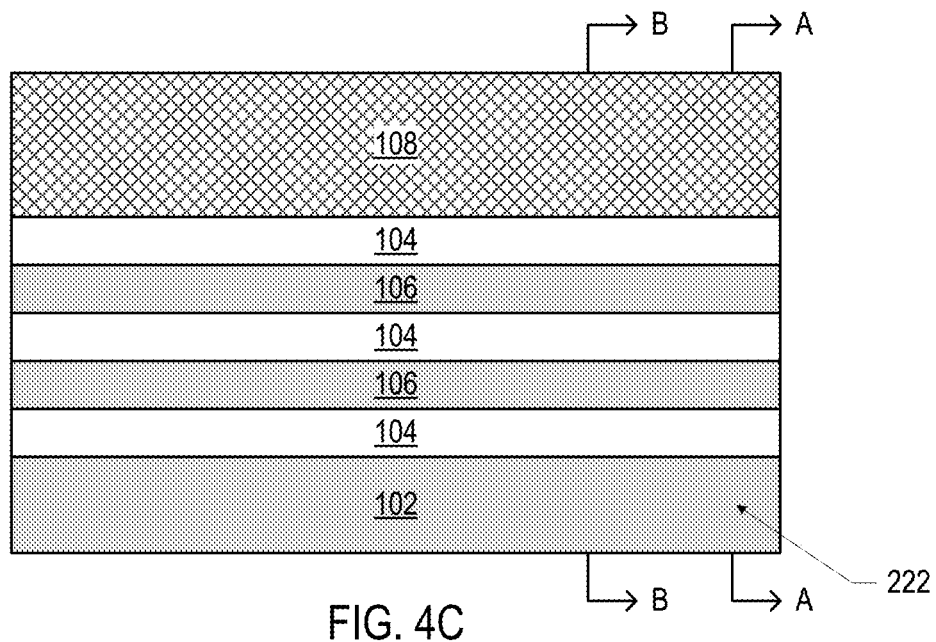
Figure 4D:
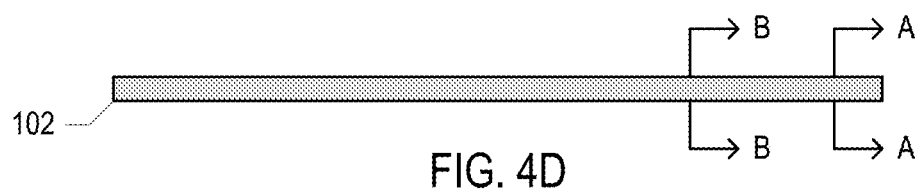
Figure 5A:
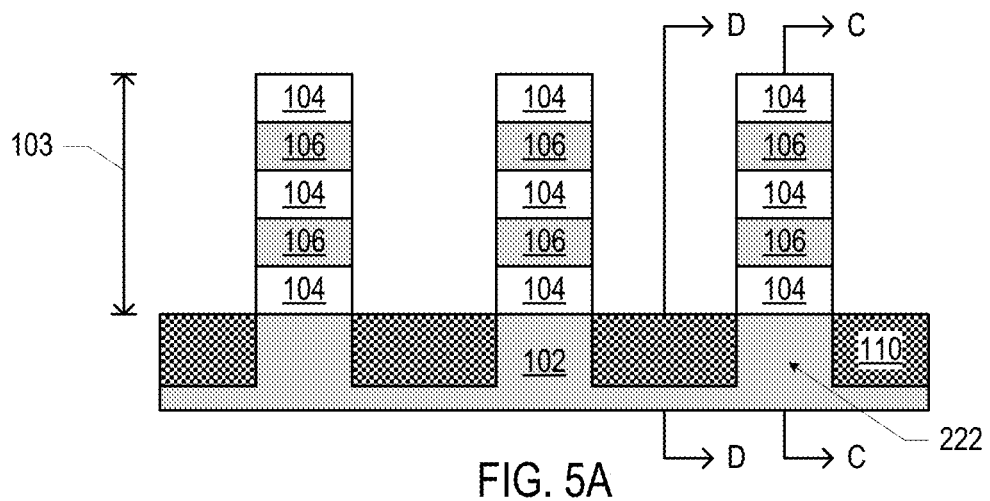
Figure 5B:
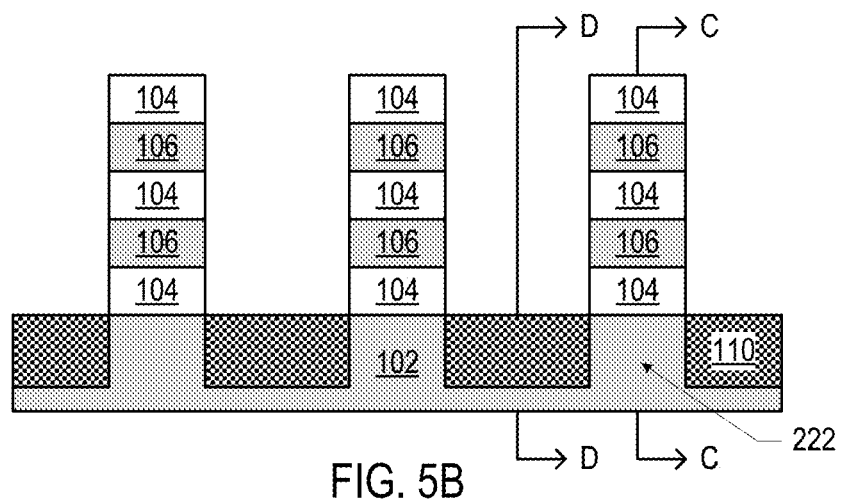
Figure 5C:
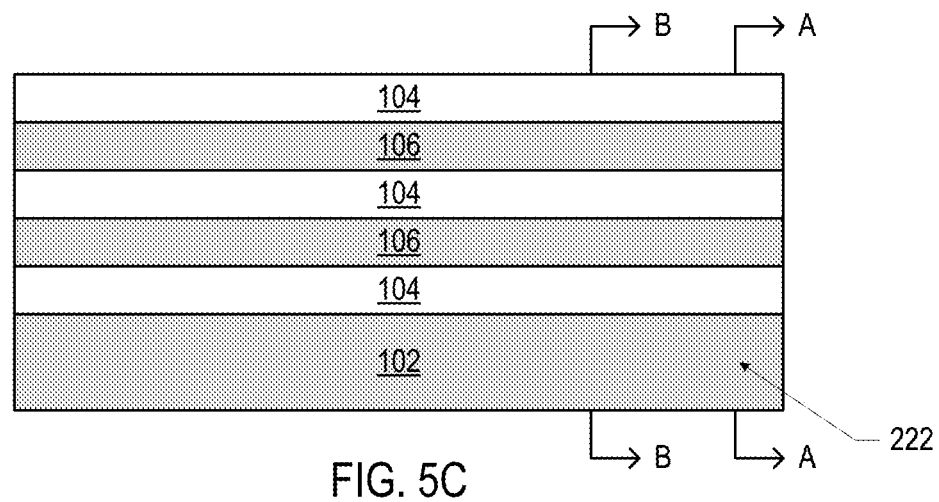
Figure 5D:
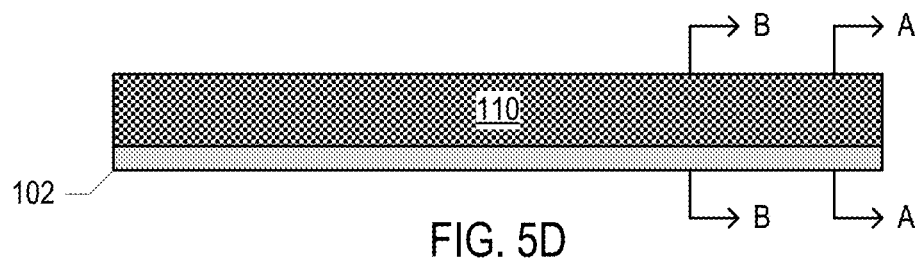
Figure 6A:
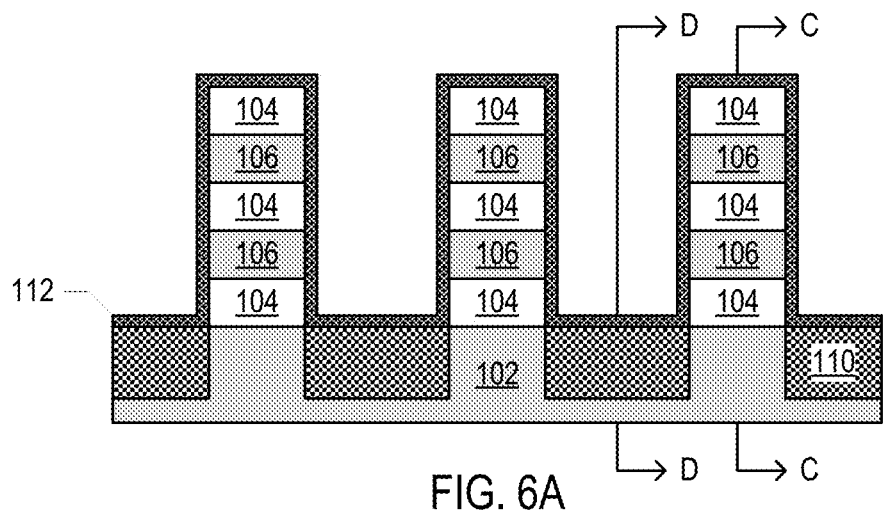
Figure 6B:
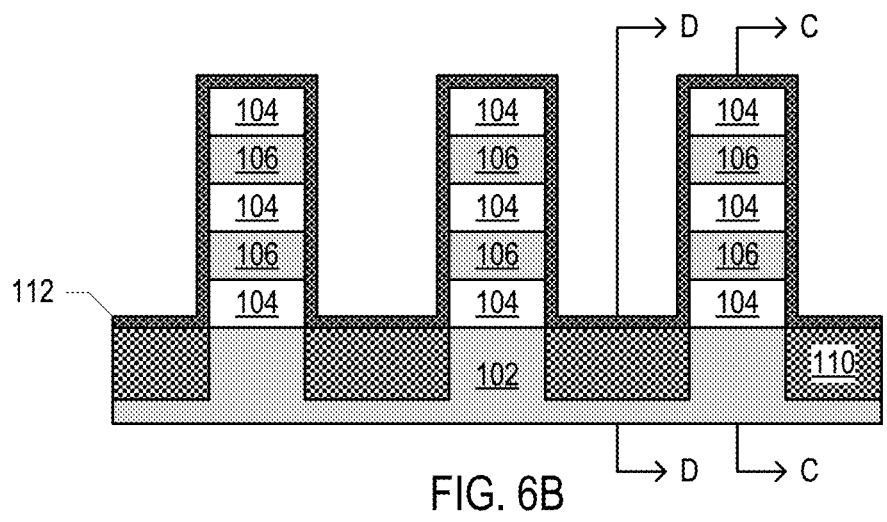
Figure 6C:
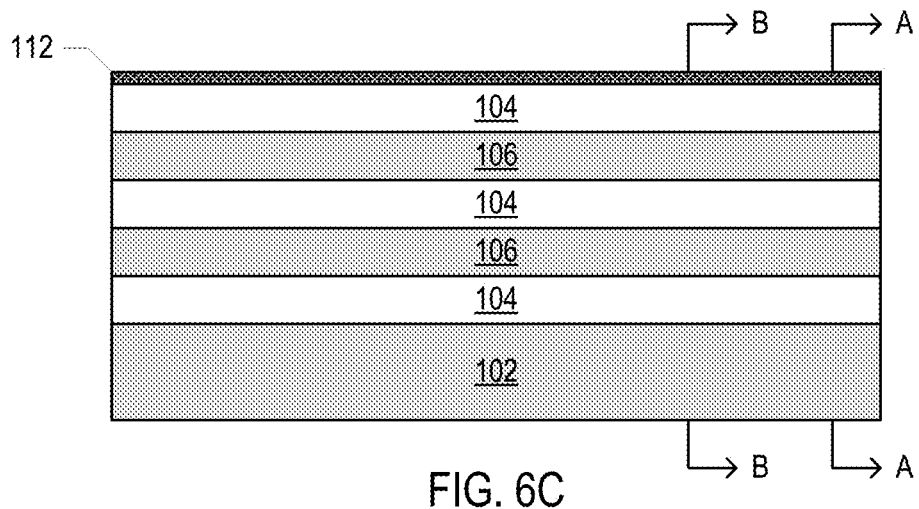
Figure 6D:
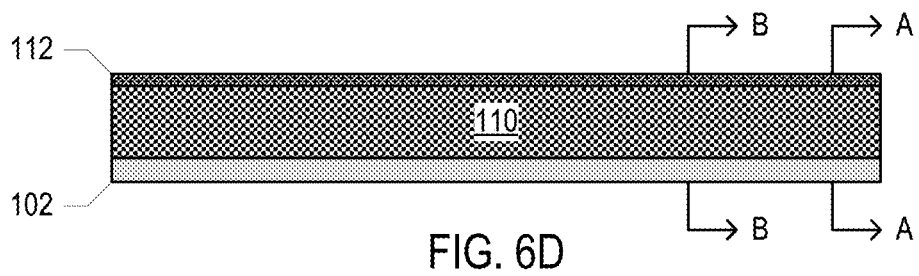
Figure 7A:
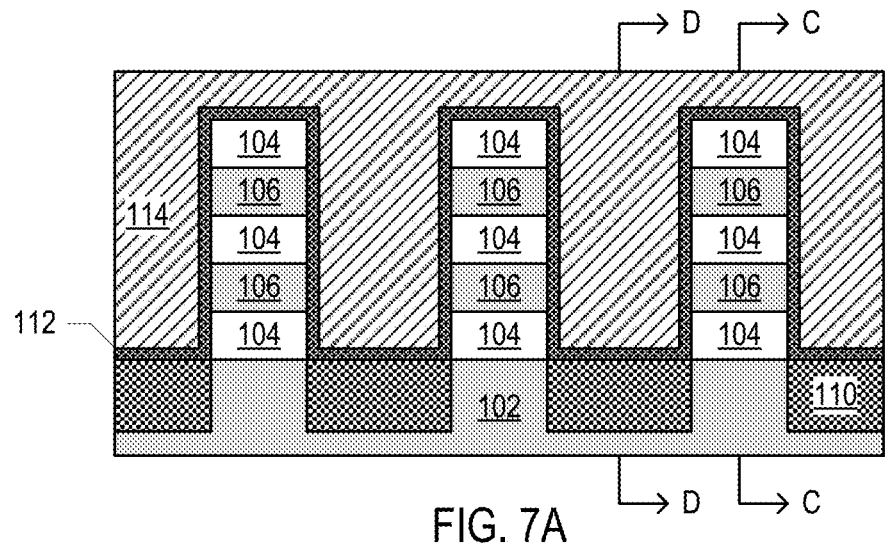
Figure 7B:
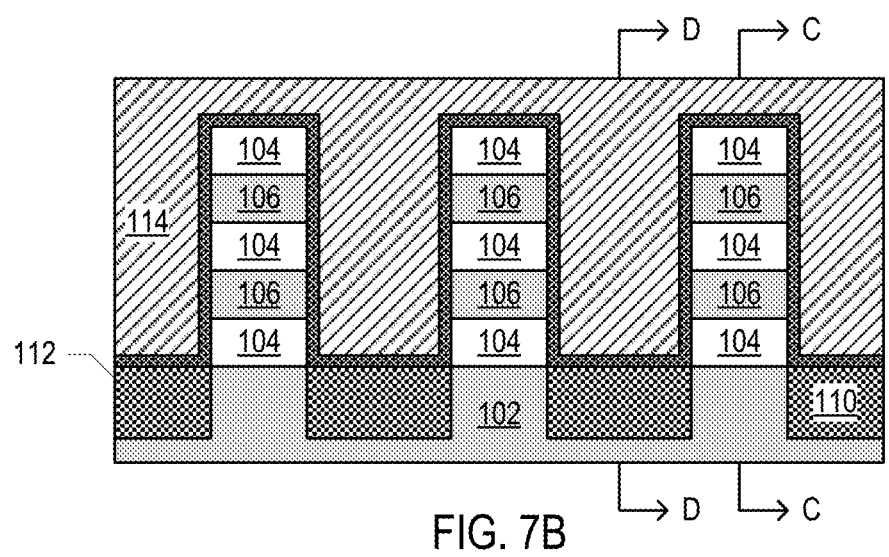
Figure 7C:
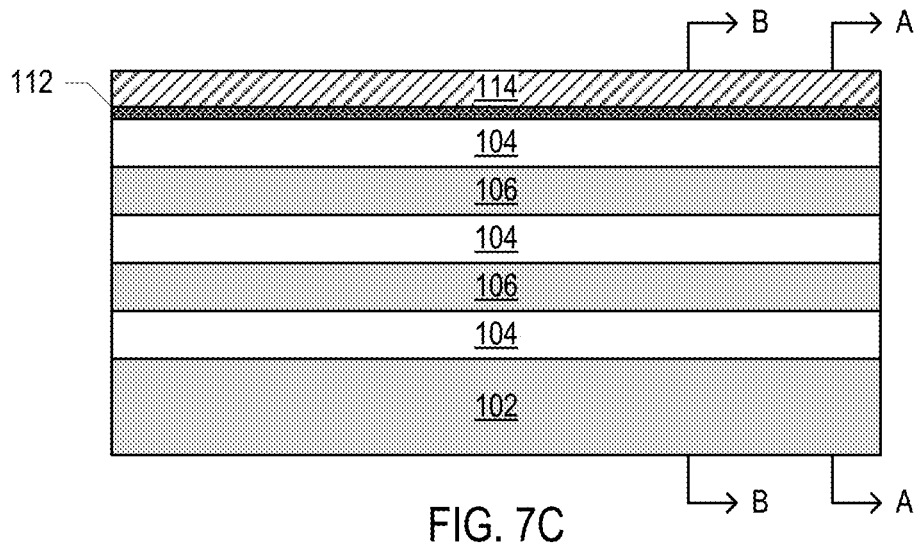
Figure 7D:
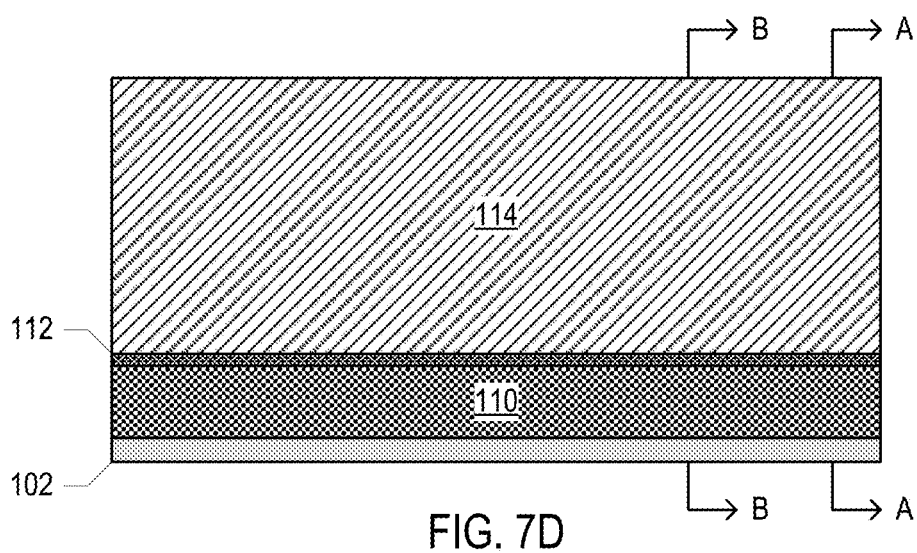
Figure 8A:
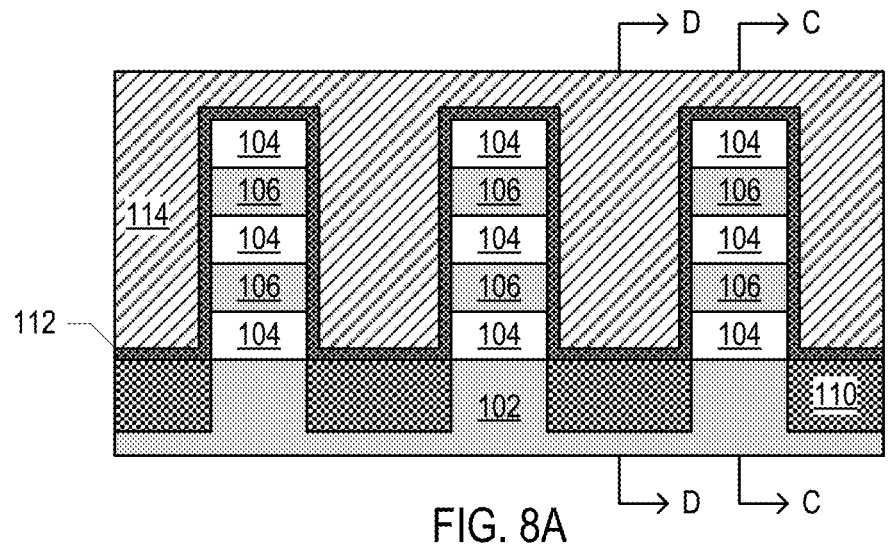
Figure 8B:
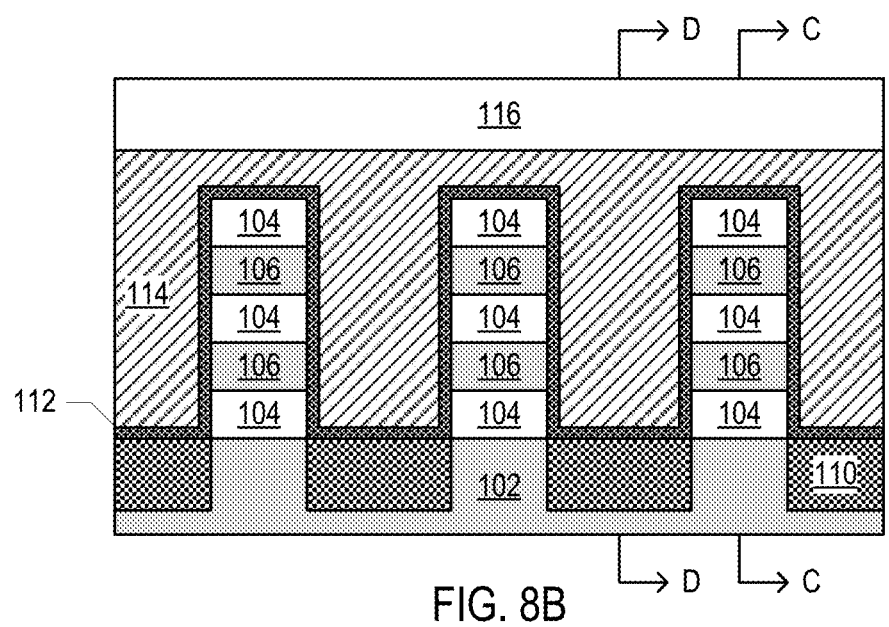
Figure 8C:
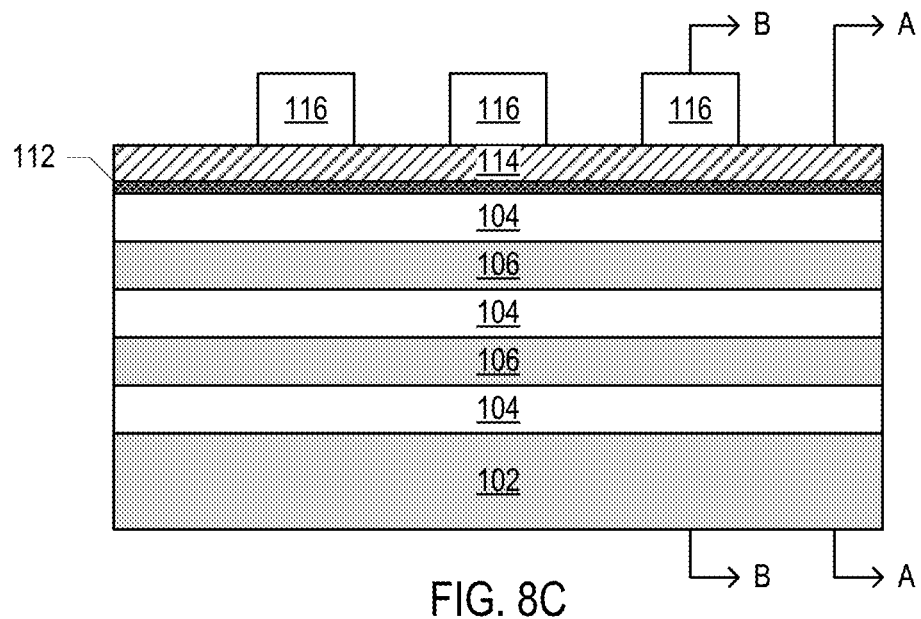
Figure 8D:
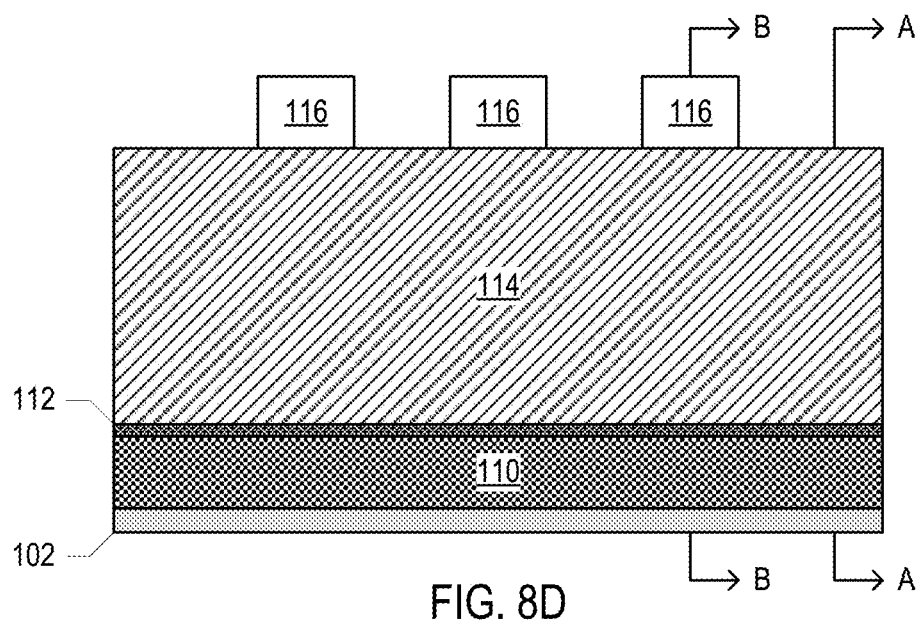
Figure 9A:
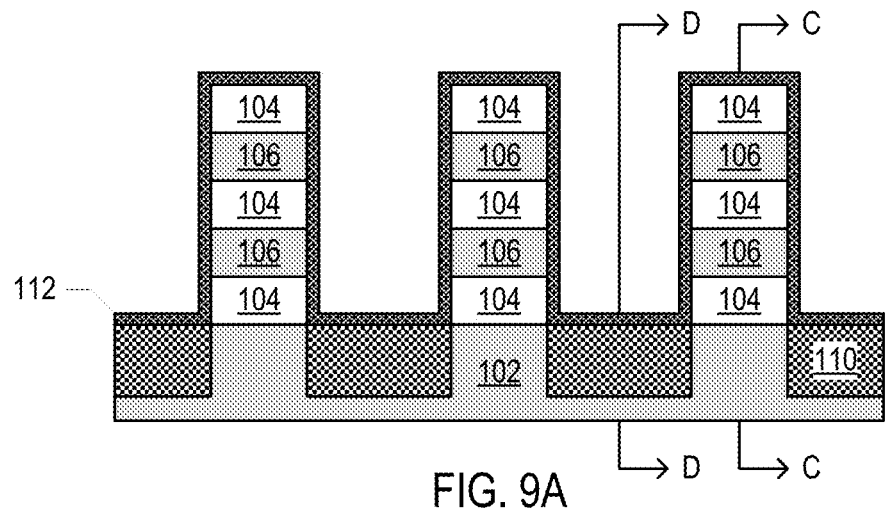
Figure 9B:
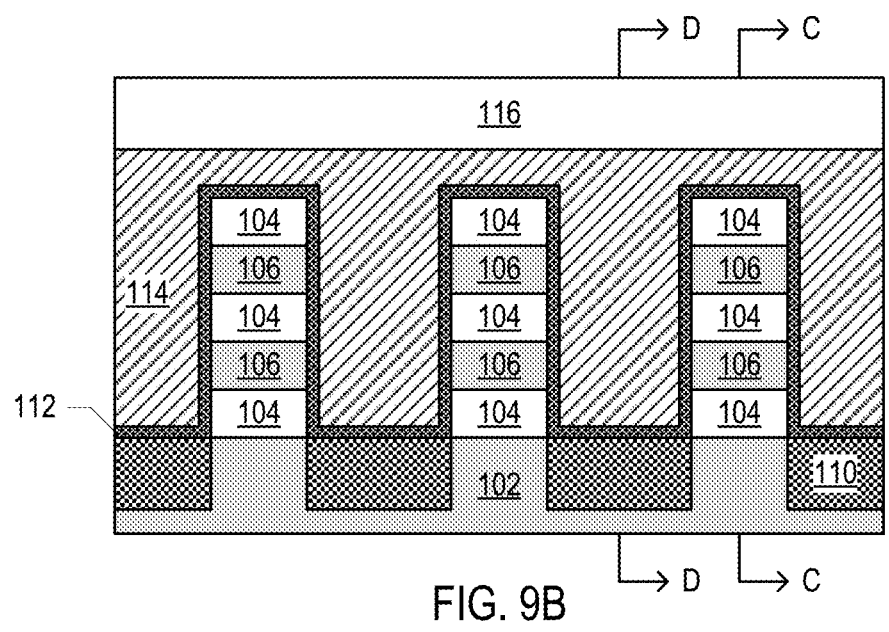
Figure 9C:
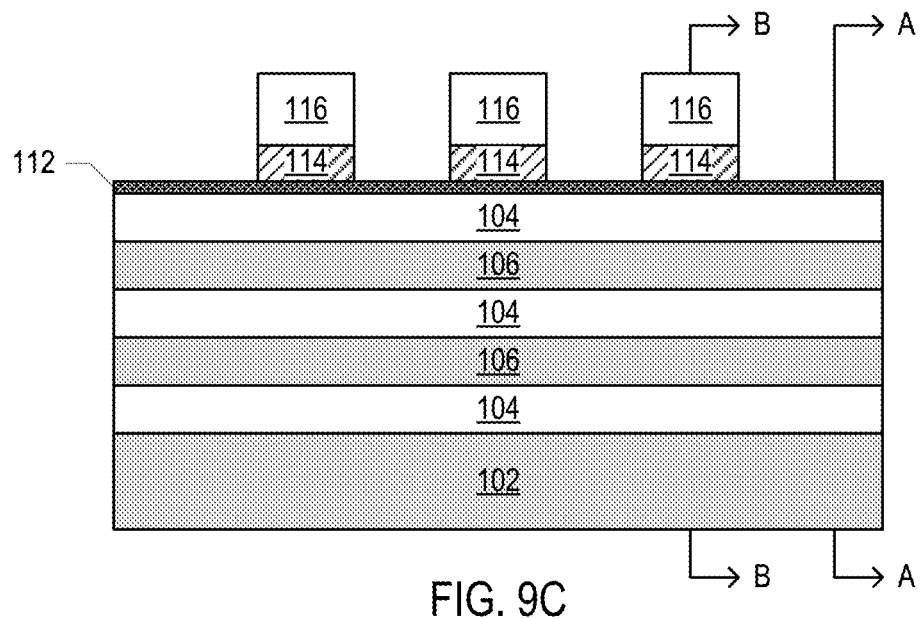
Figure 9D:
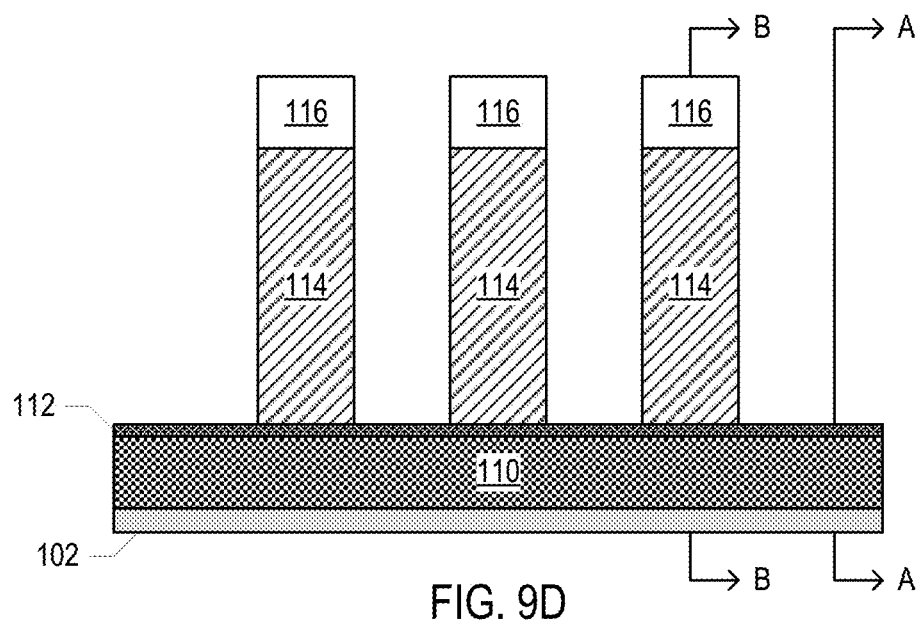
Figure 10A:
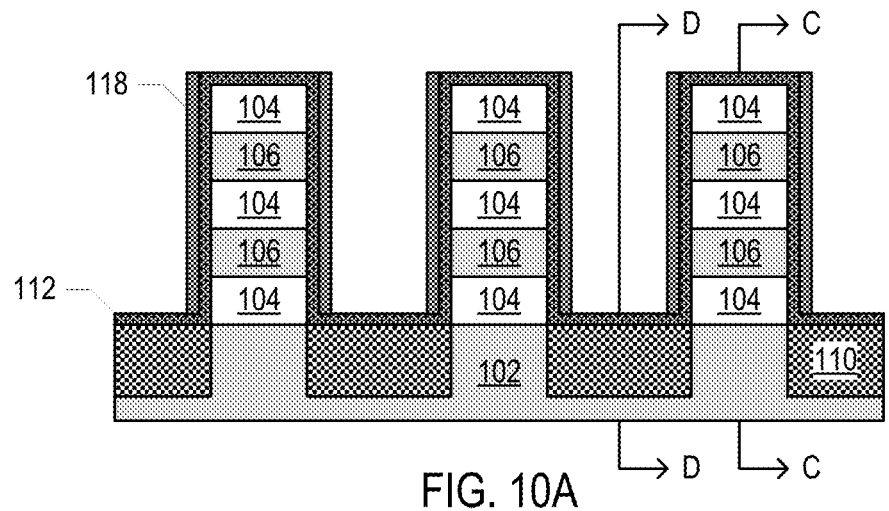
Figure 10B:
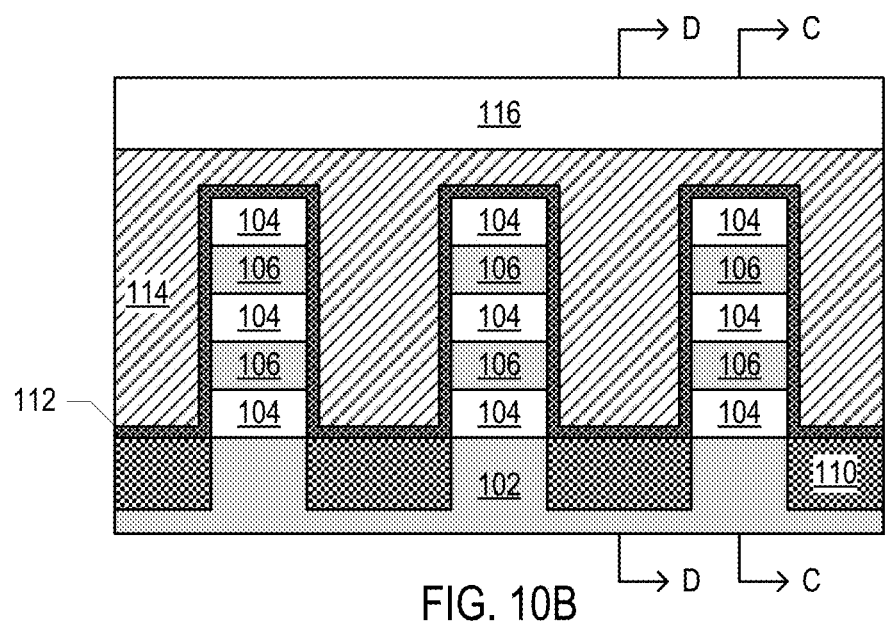
Figure 10C:
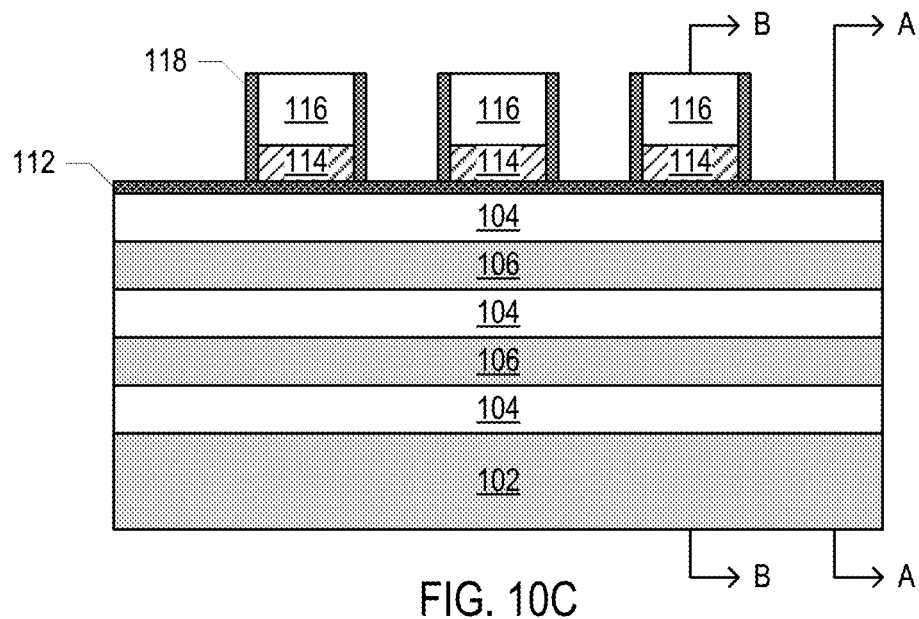
Figure 10D:
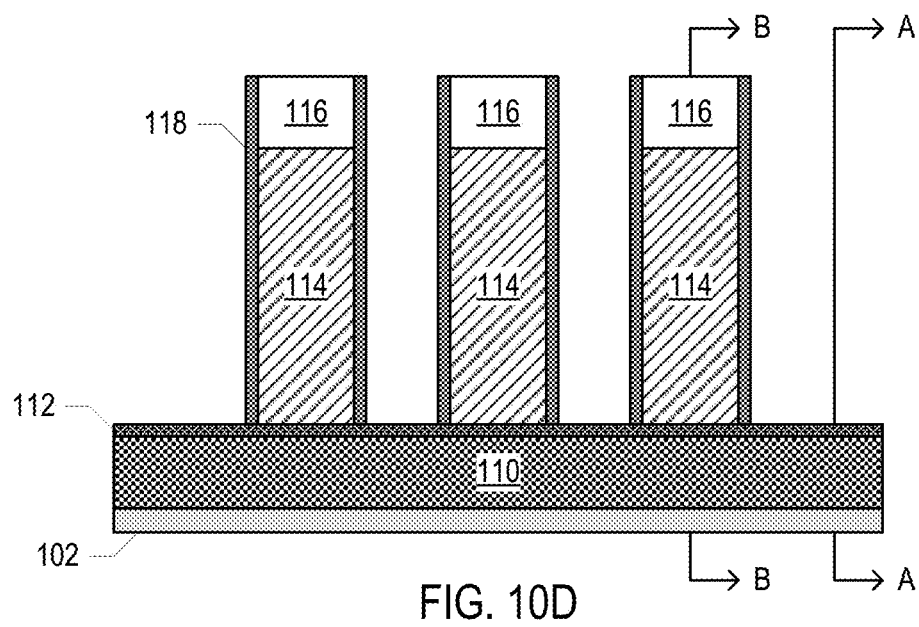
Figure 11A:
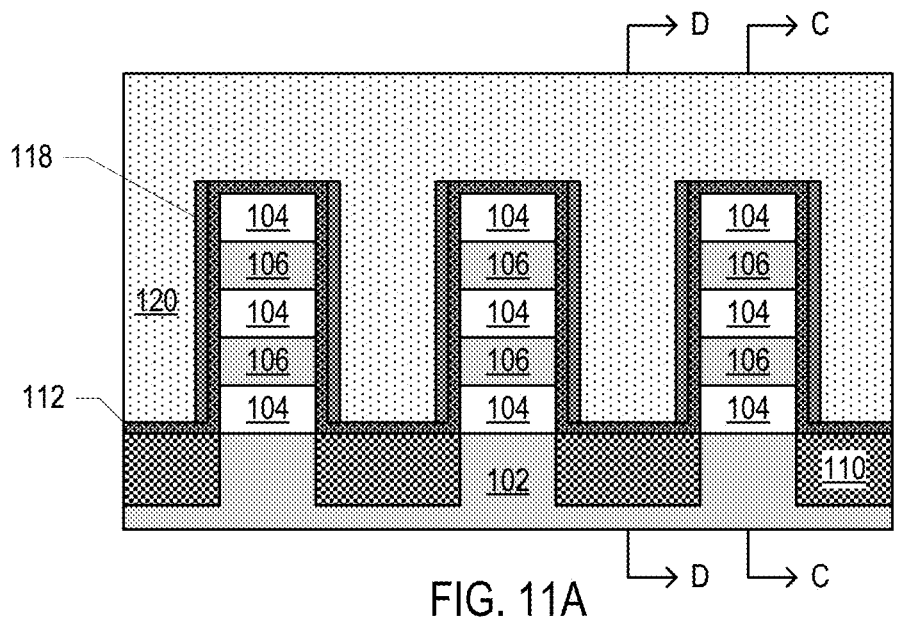
Figure 11B:
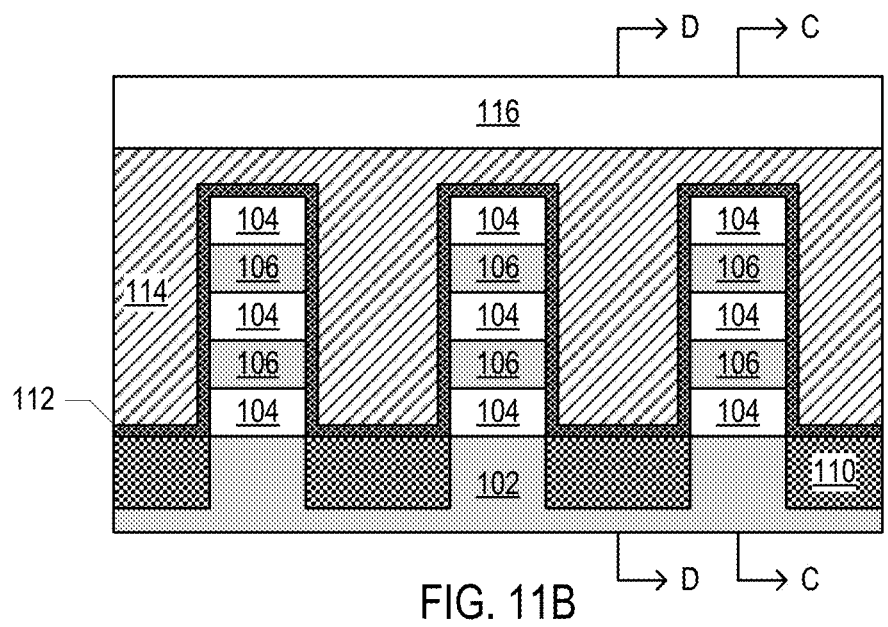
Figure 11C:
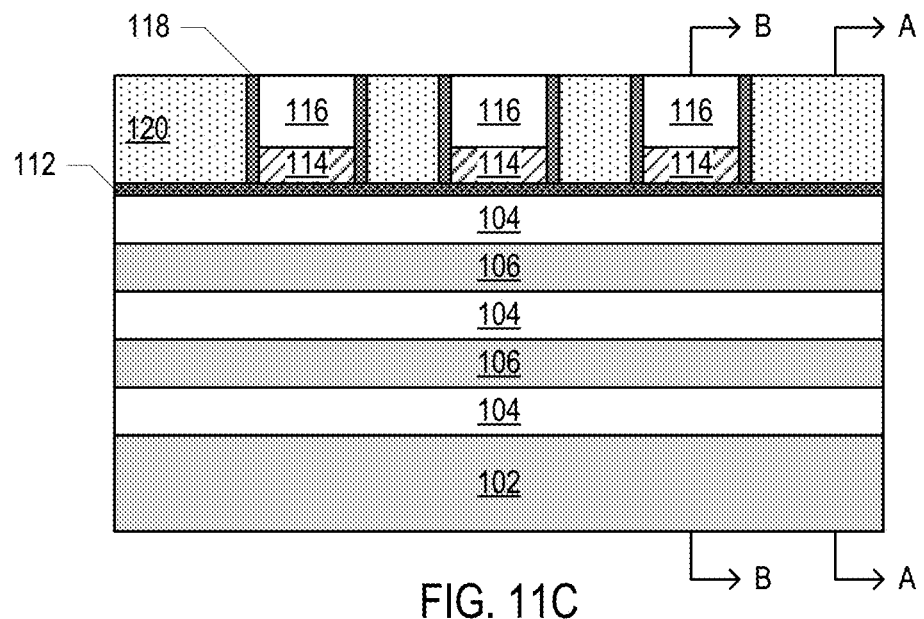
Figure 11D:
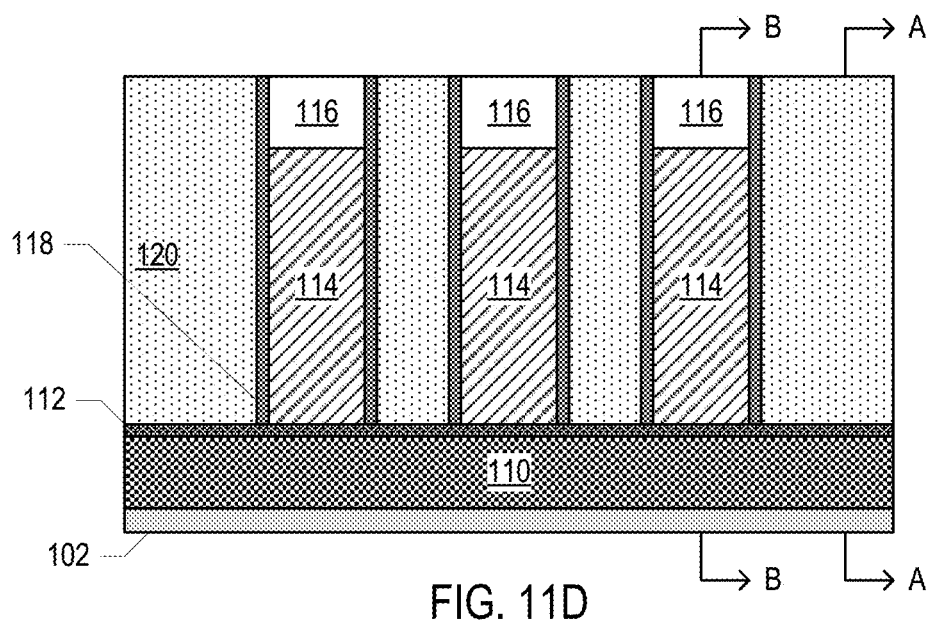
Figure 12A:
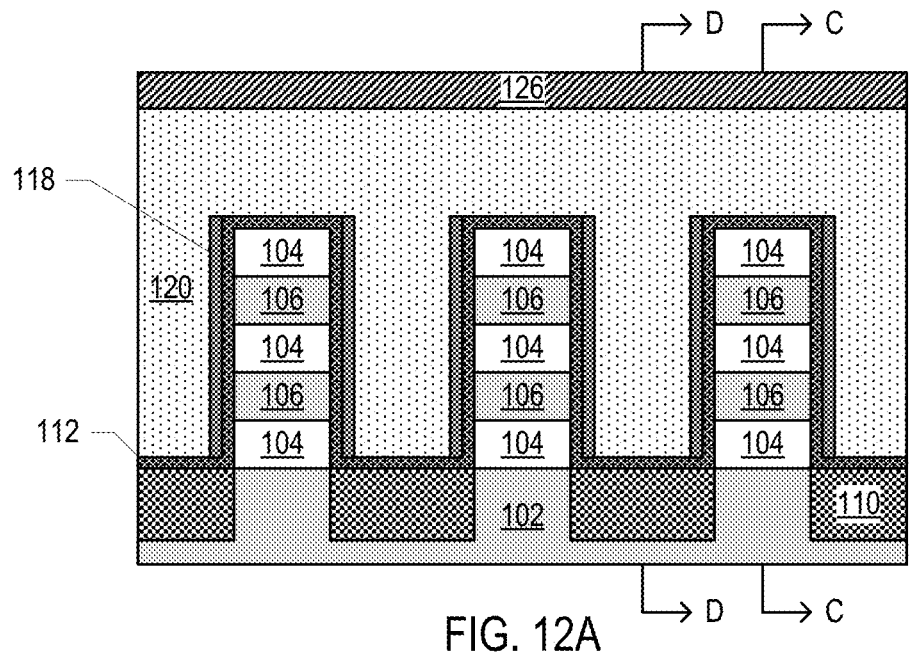
Figure 12B:
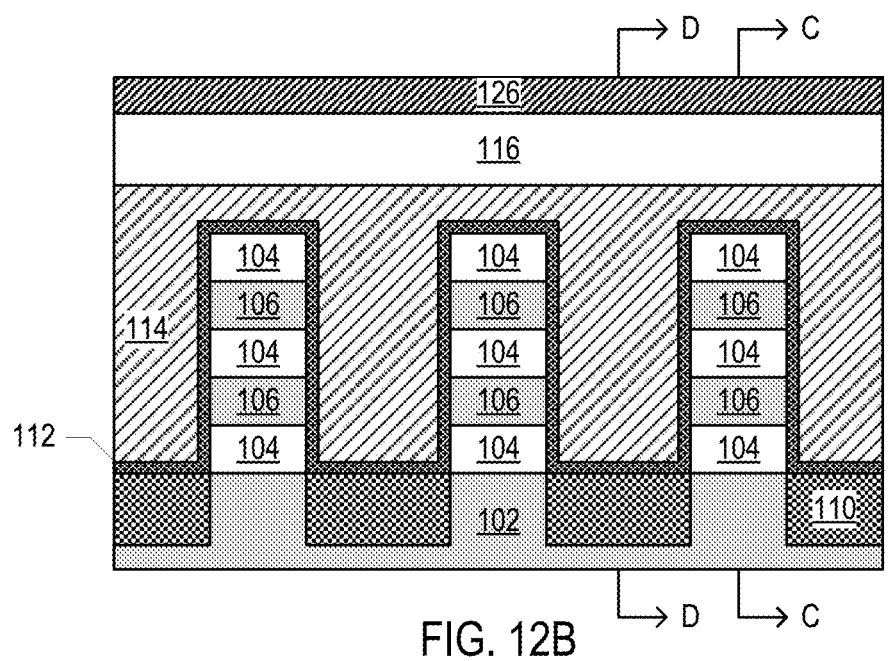
Figure 12C:
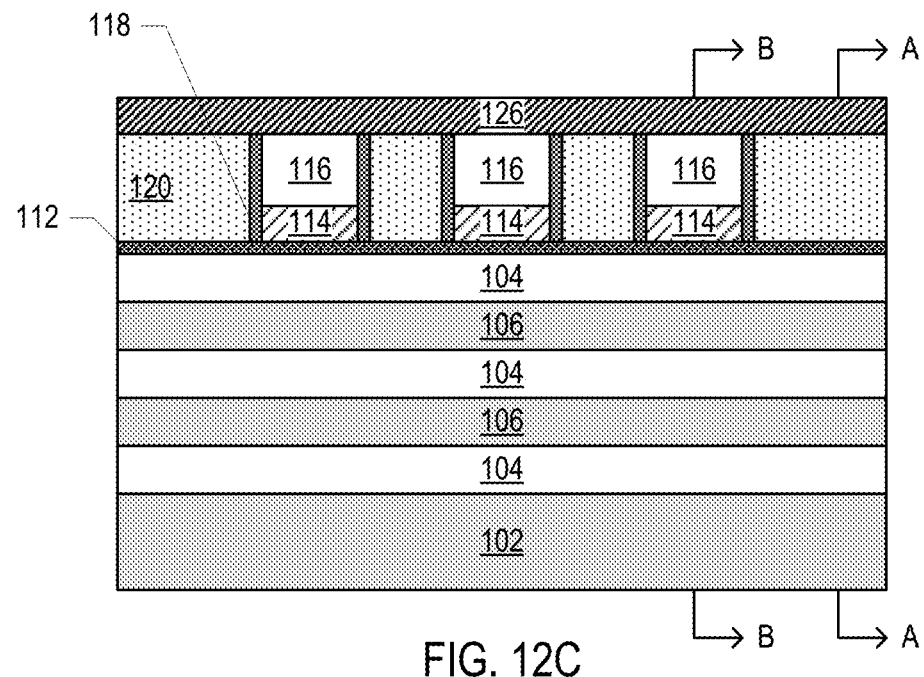
Figure 12D:
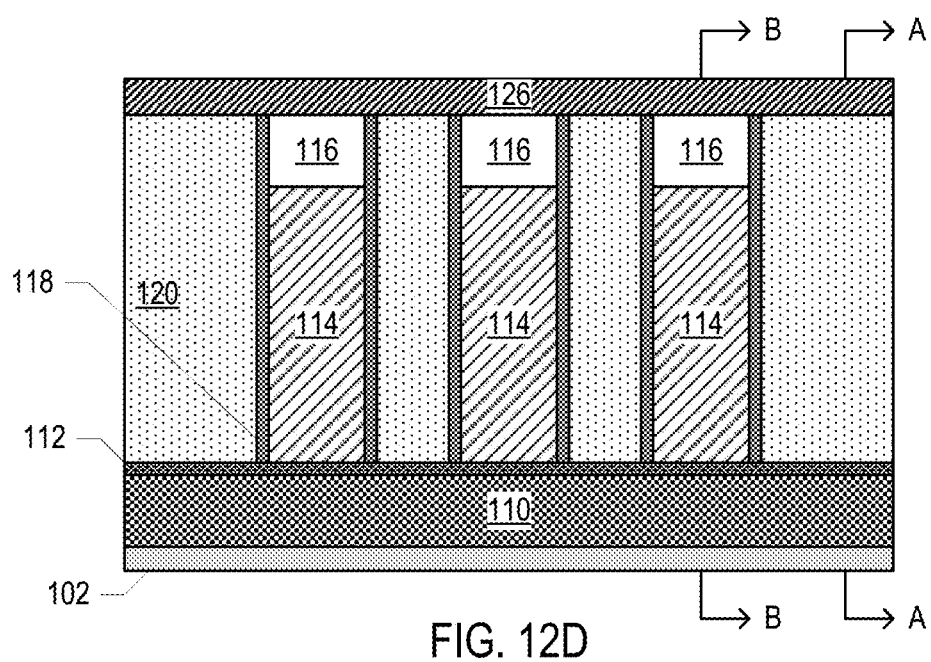
Figure 13A:
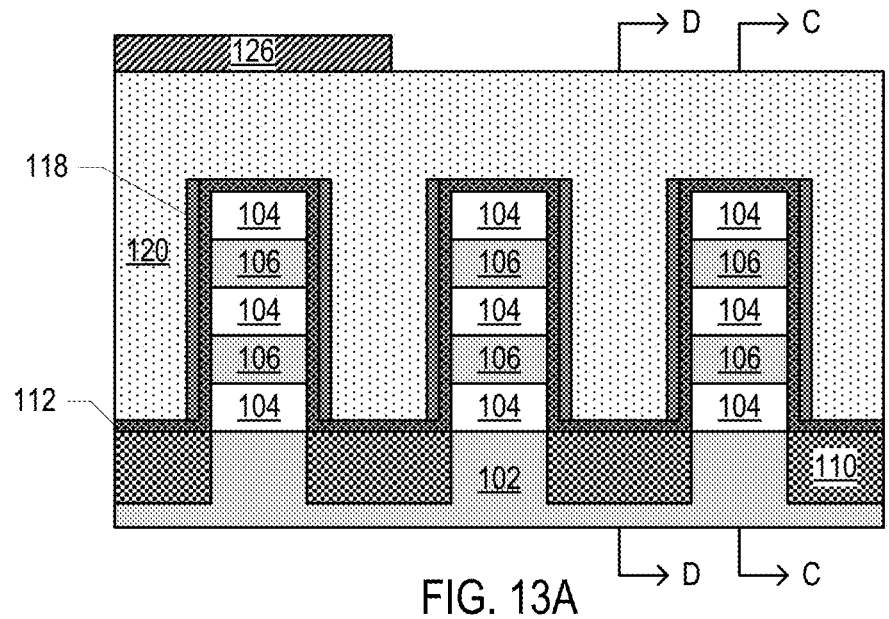
Figure 13B:
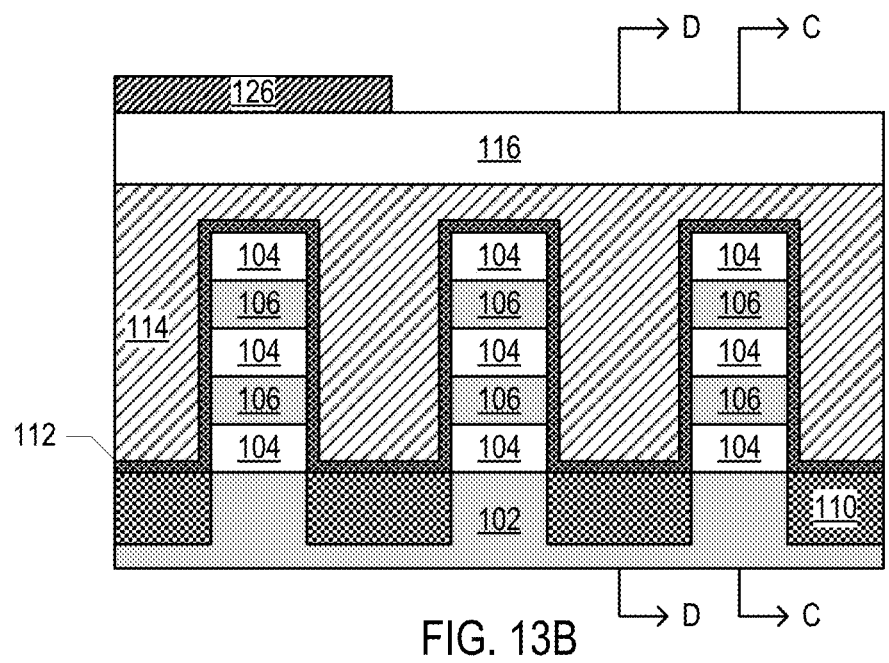
Figure 13C:
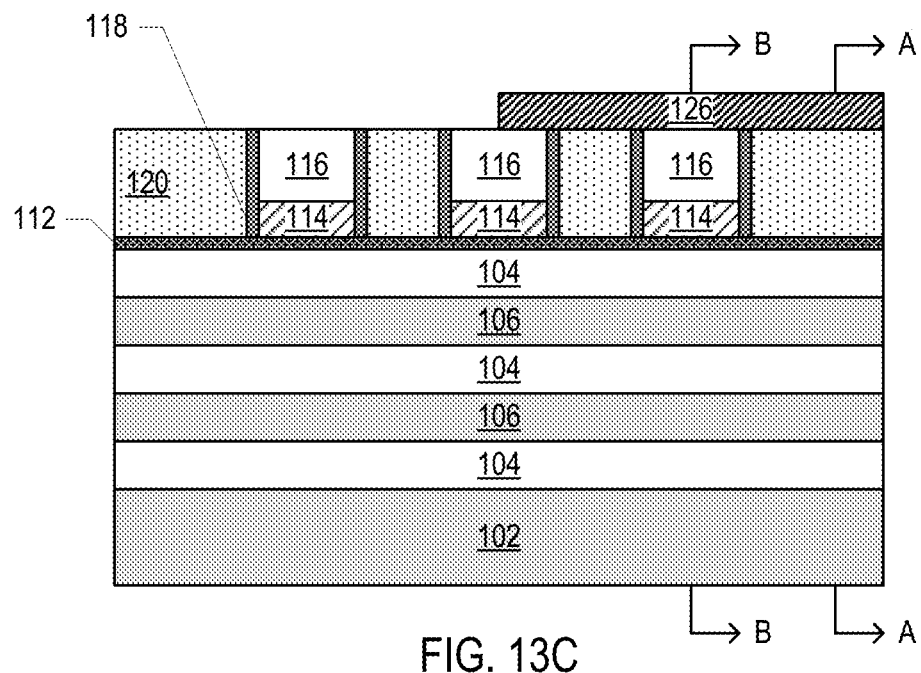
Figure 13D:
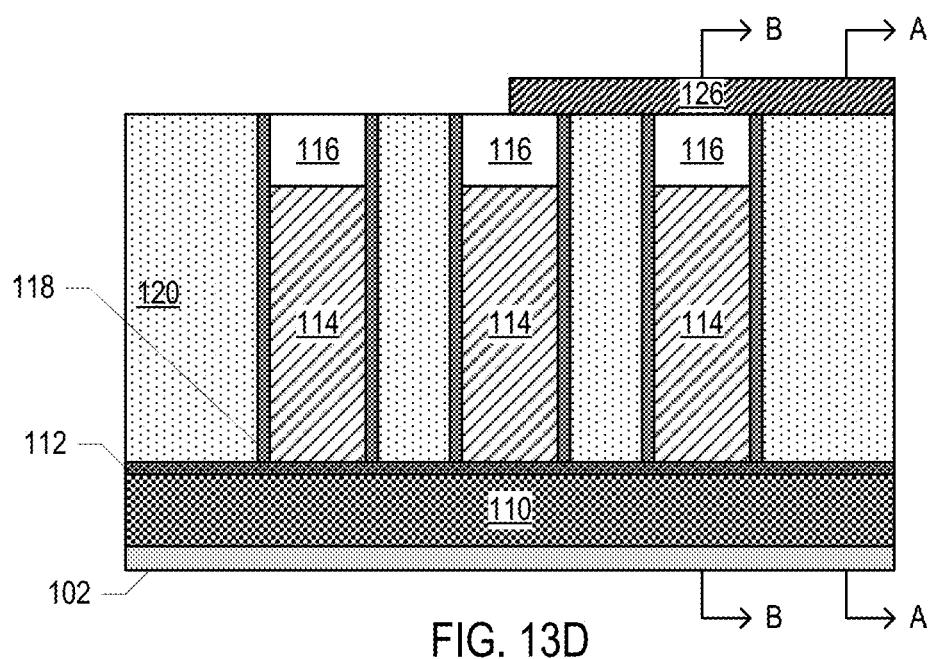
Figure 14A:
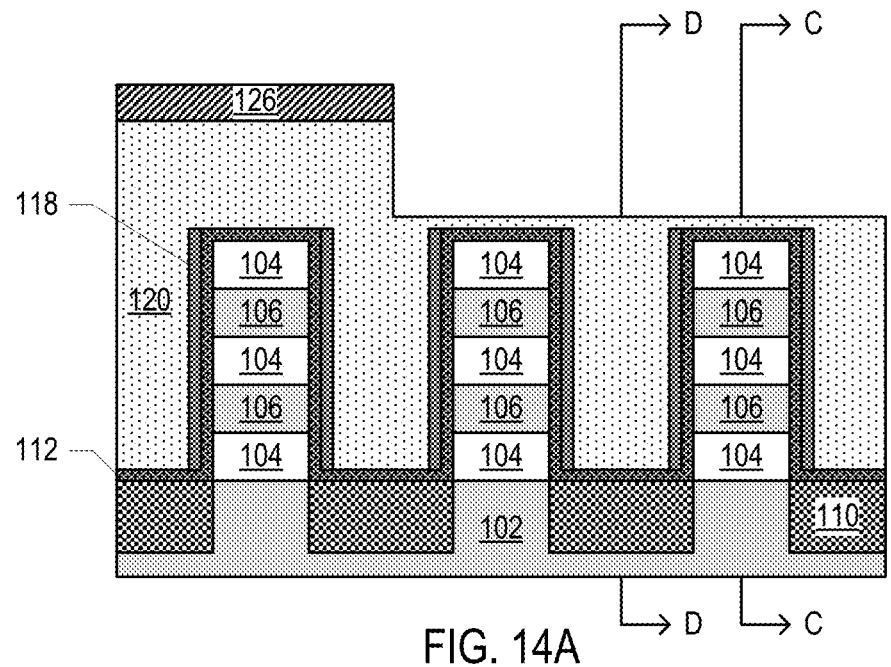
Figure 14B:
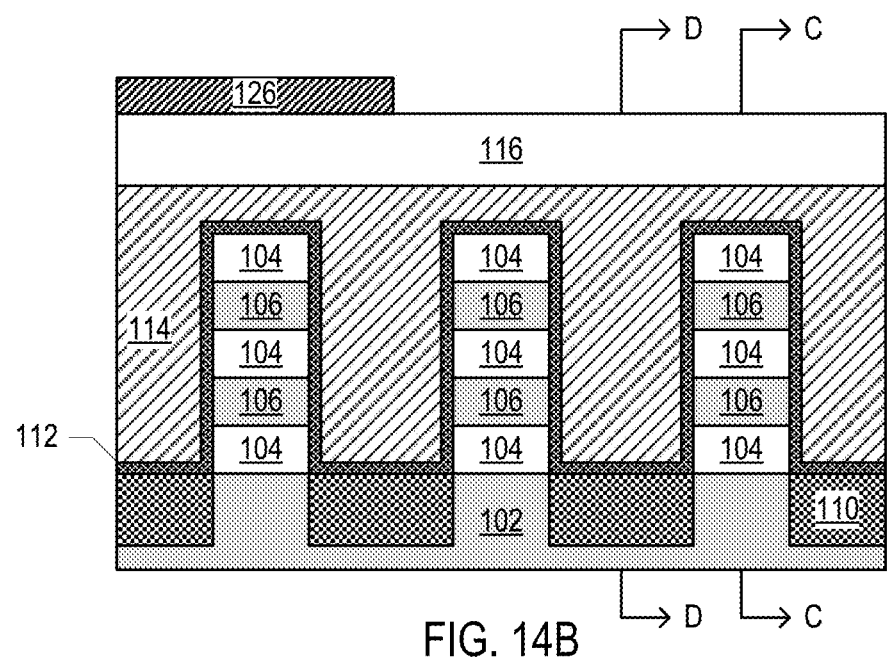
Figure 14C:
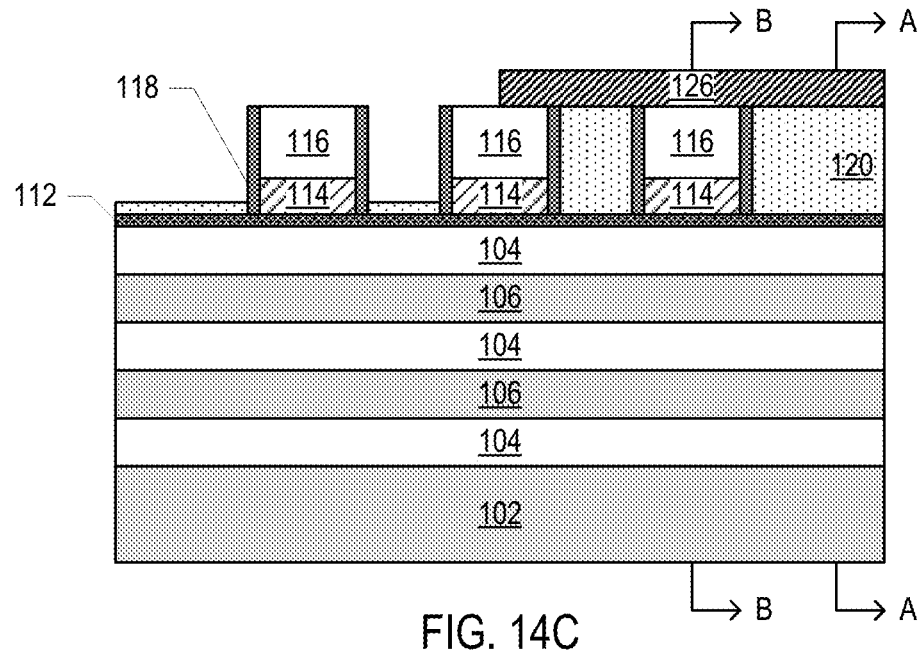
Figure 14D:
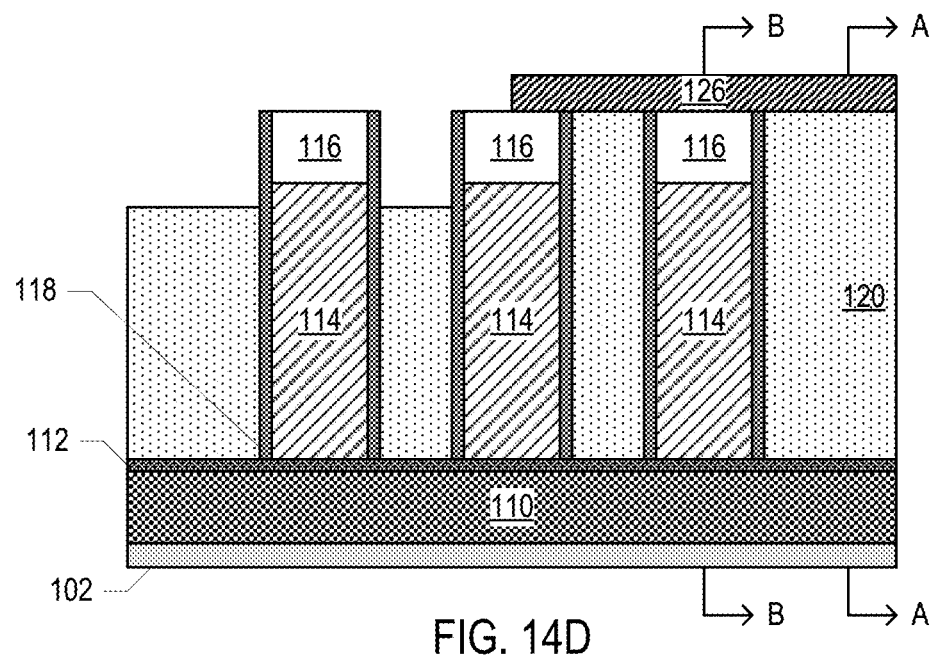
Figure 15A:
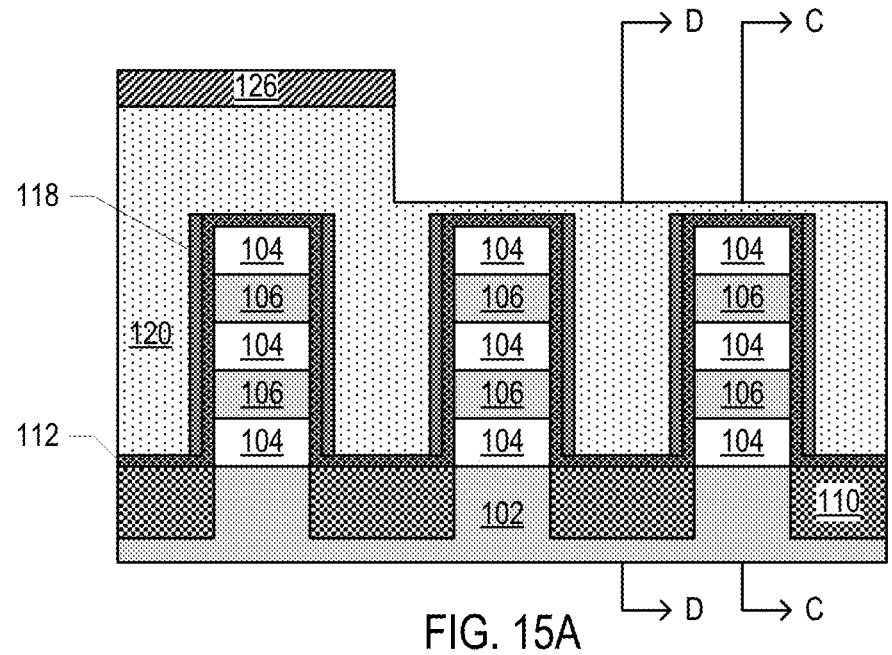
Figure 15B:
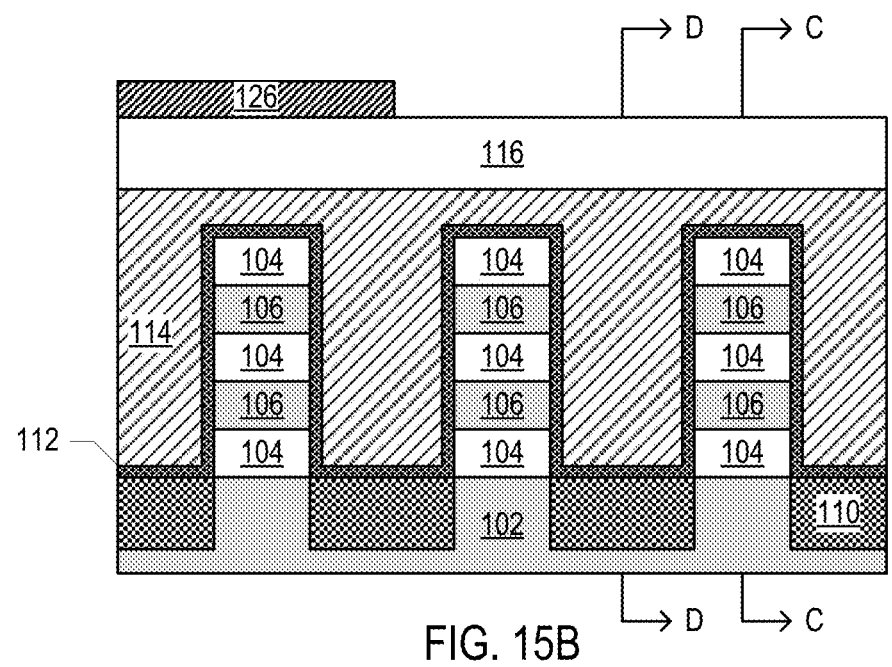
Figure 15C:
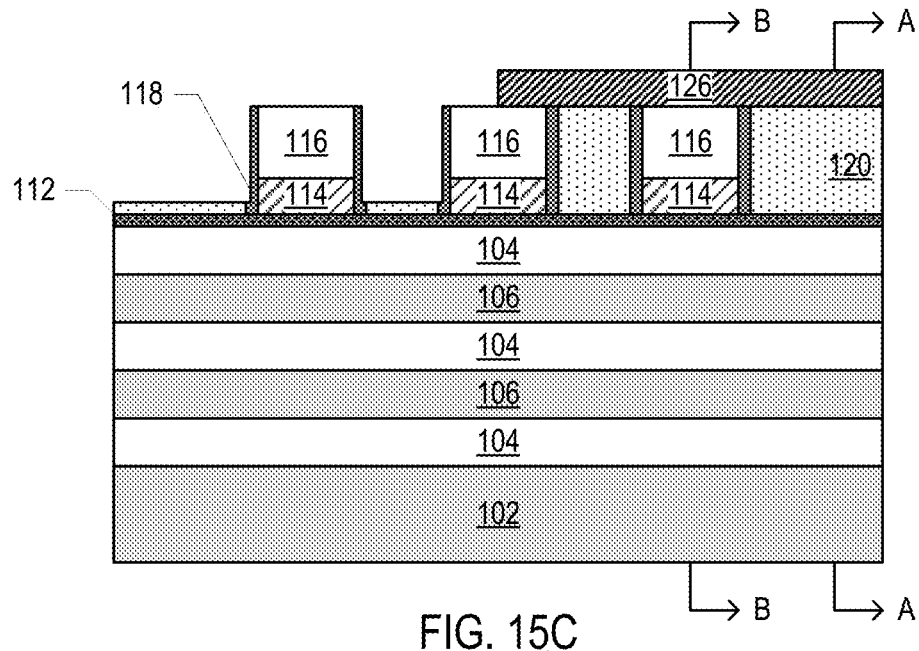
Figure 15D:
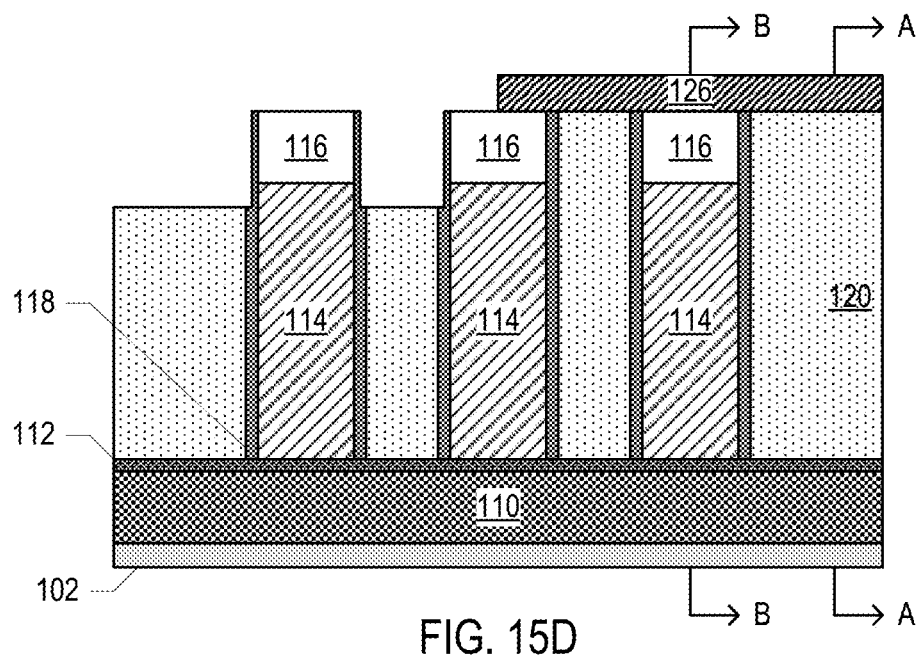
Figure 16A:
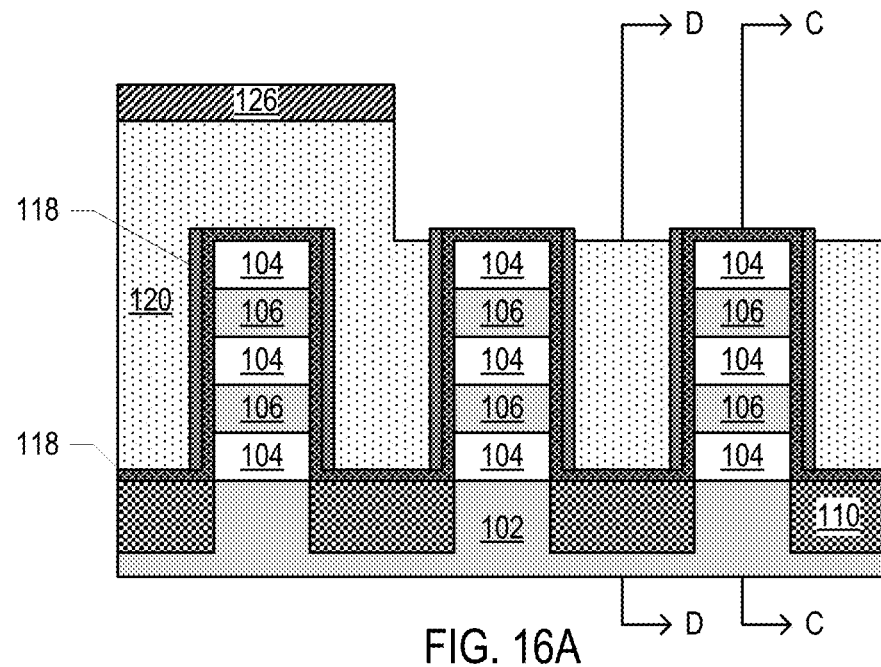
Figure 16B:
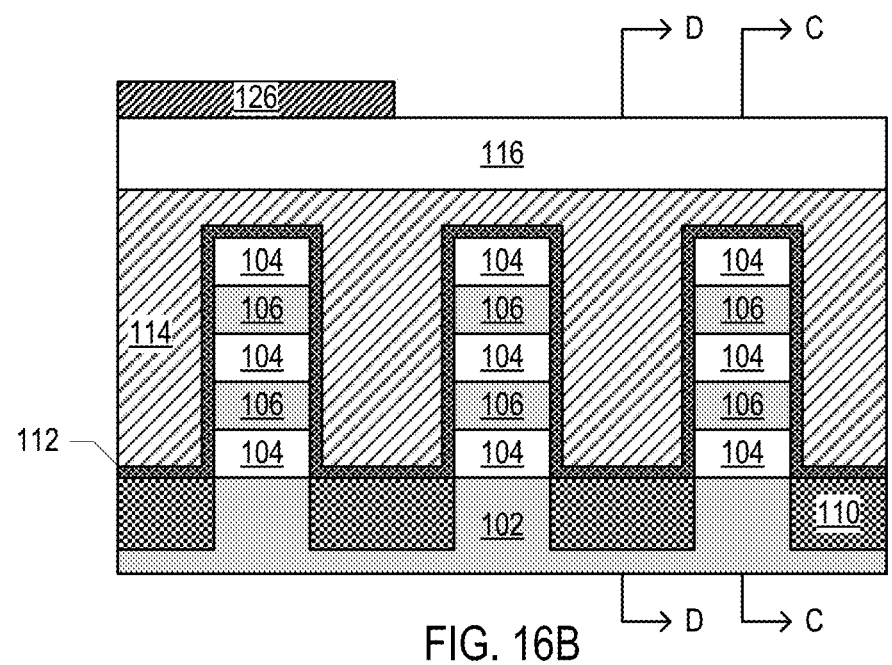
Figure 16C:
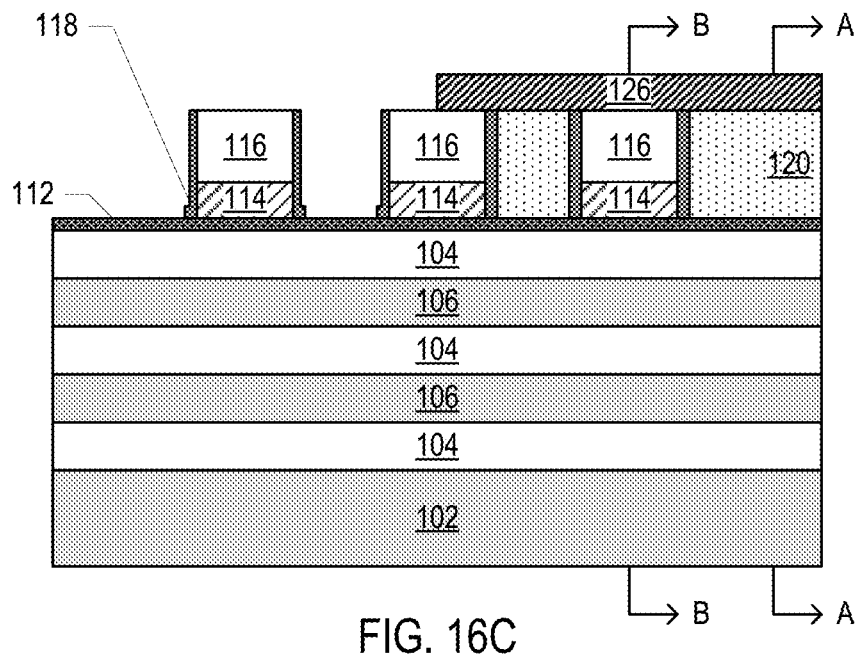
Figure 16D:
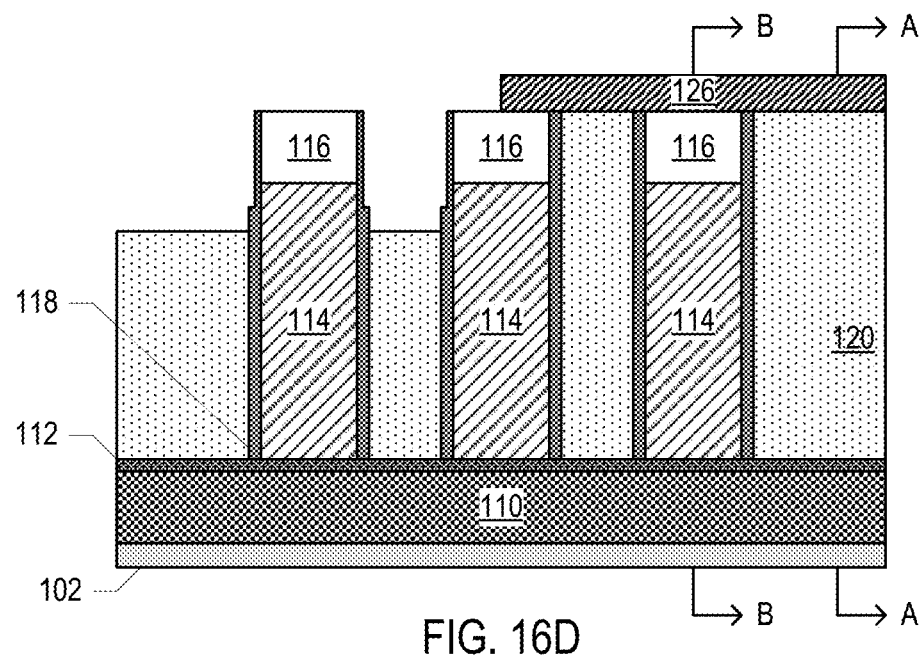
Figure 17A:
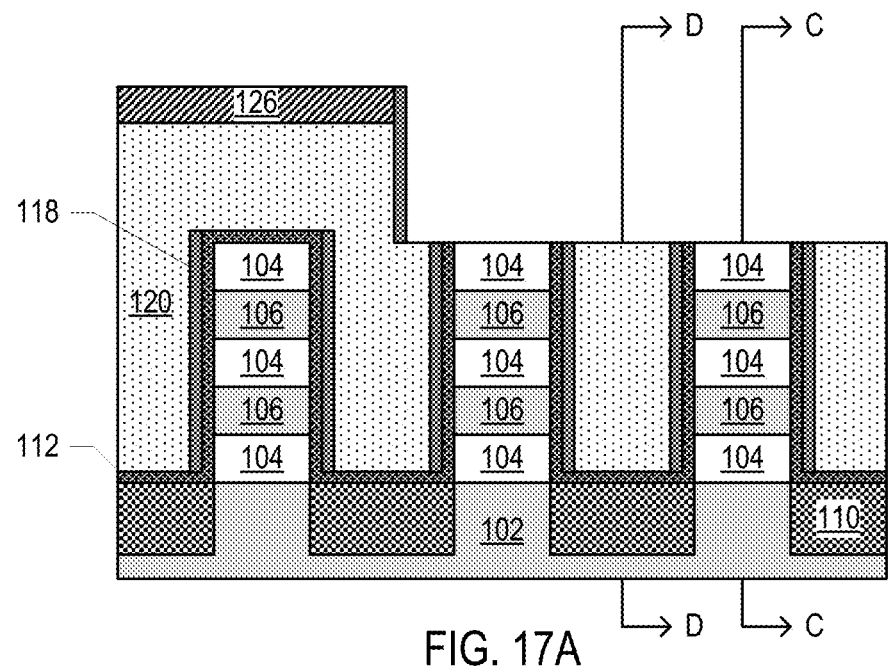
Figure 17B:
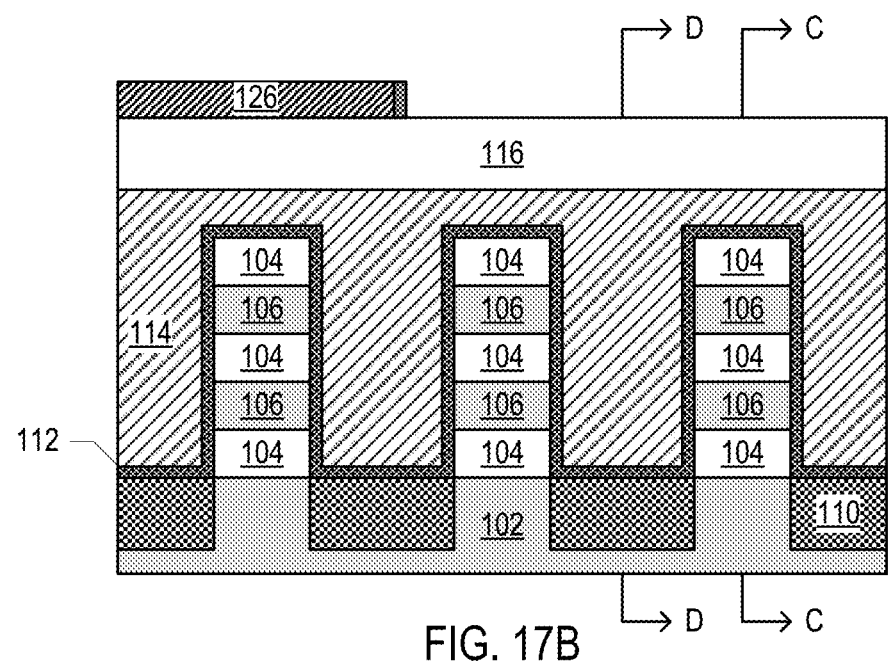
Figure 17C:
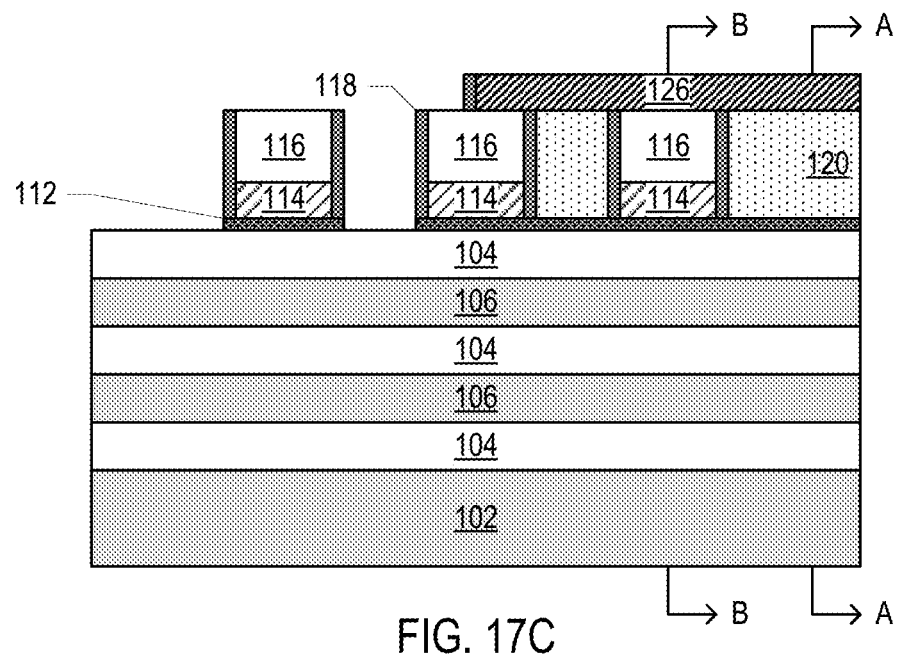
Figure 17D:
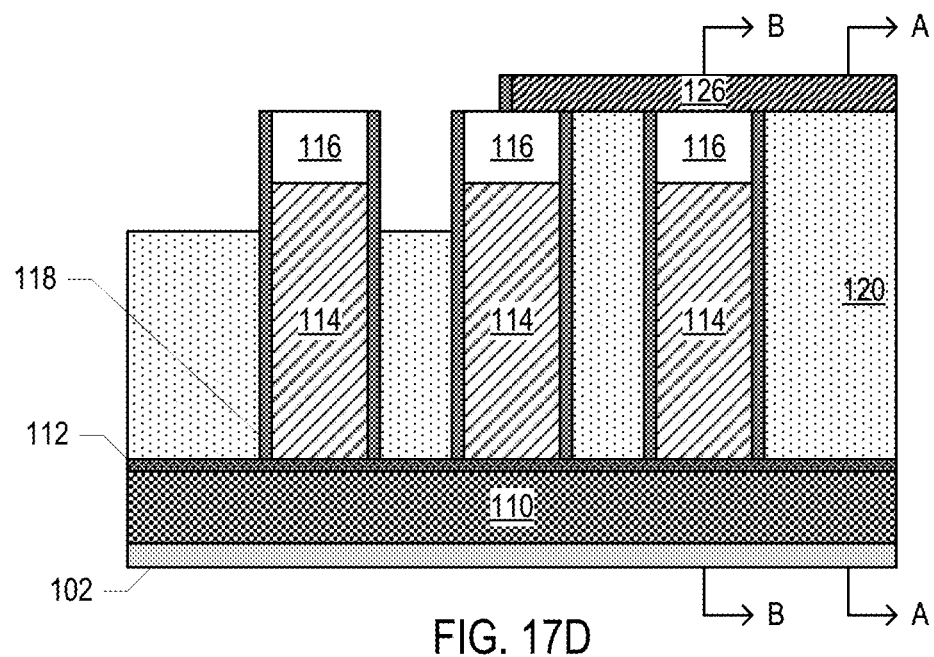
Figure 18A:
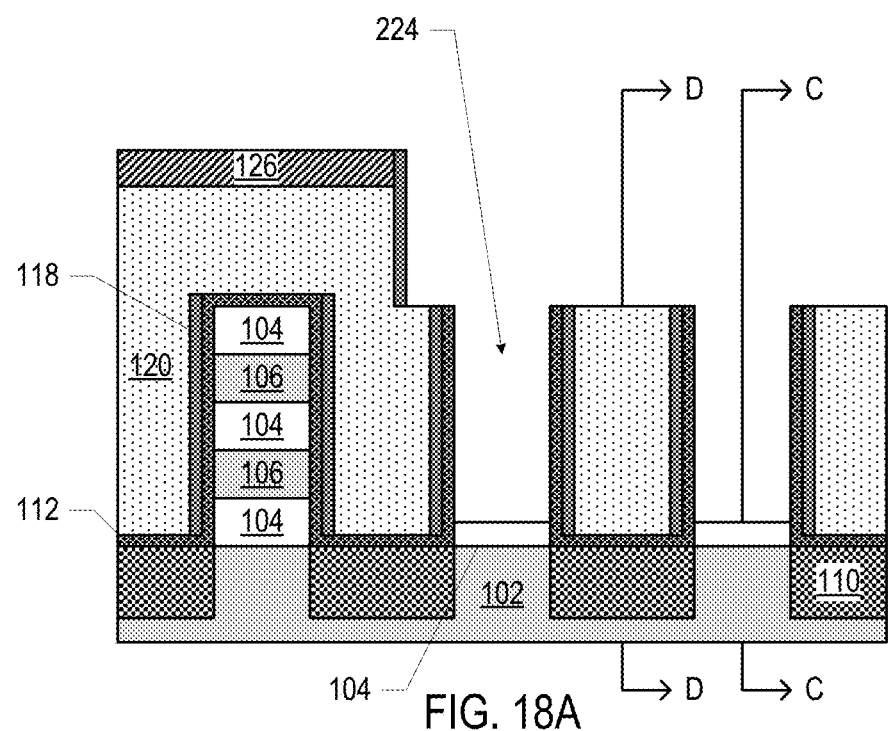
Figure 18B:
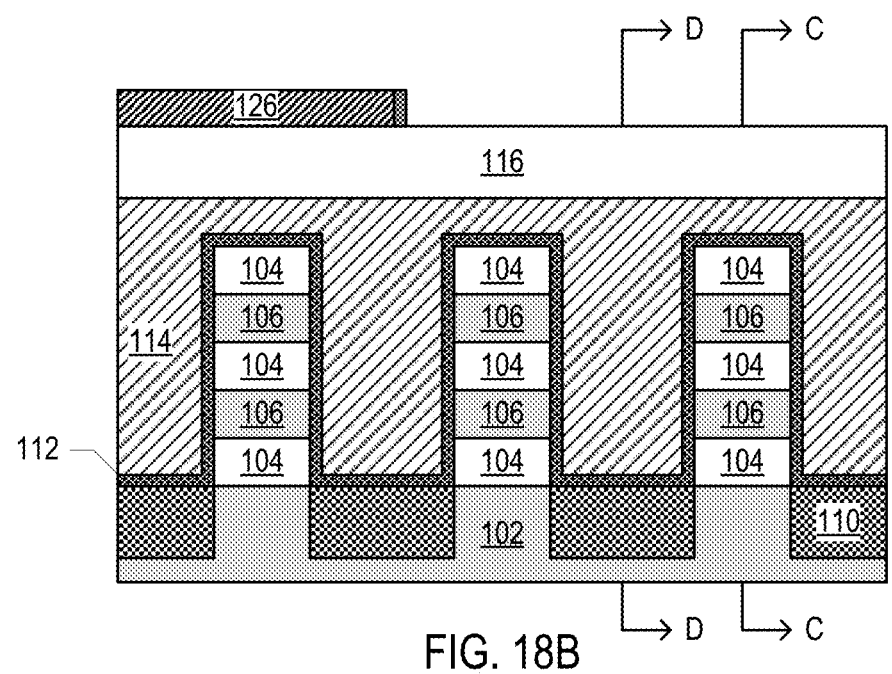
Figure 18C:
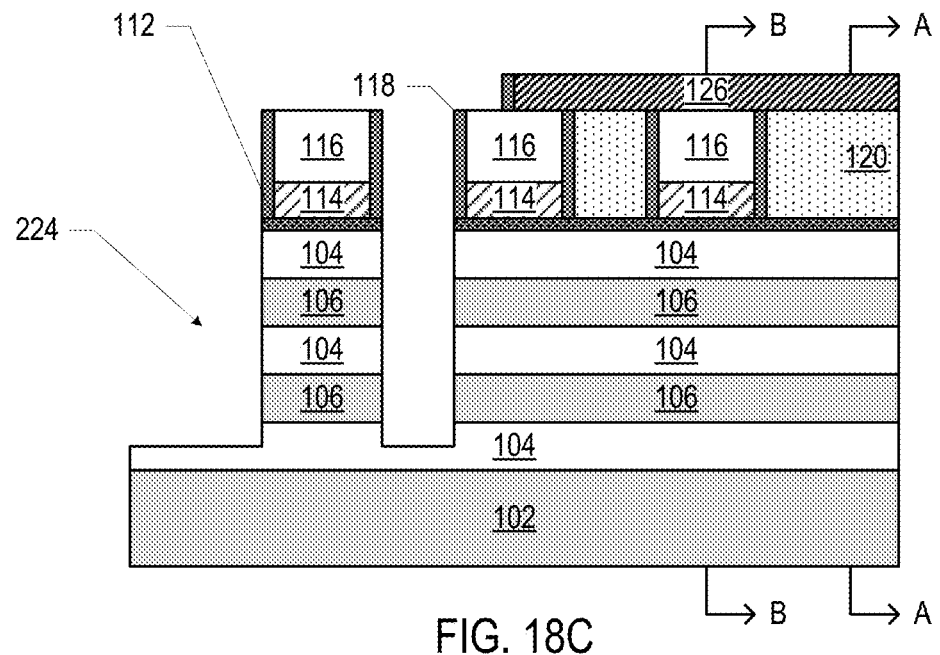
Figure 18D:
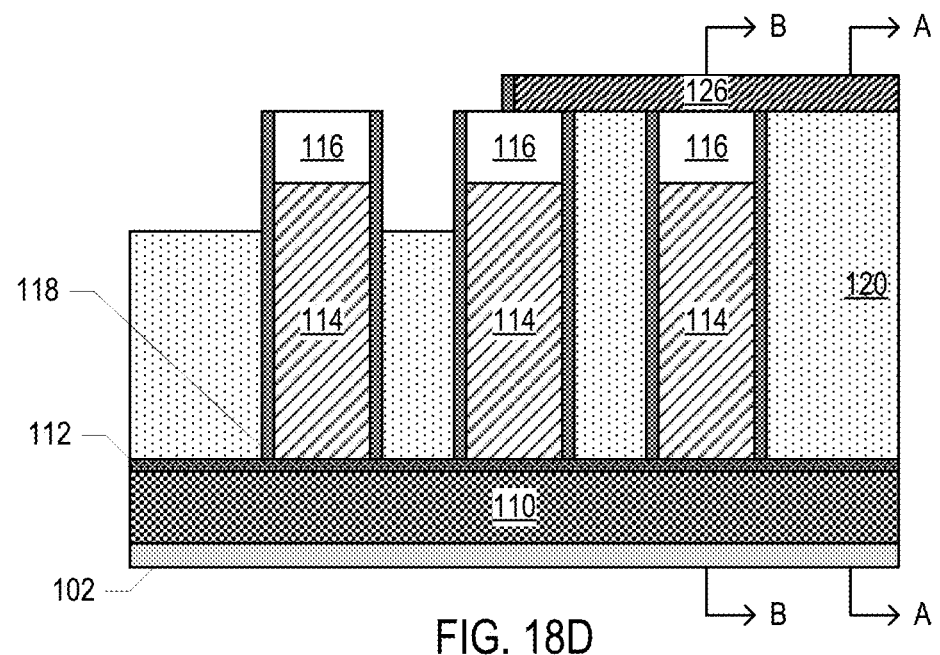

The IC structure 100 may include one or more device regions 206 having channel material 106 with a longitudinal axis (into the page from the perspective of FIGS. 1A and 1B, and left-right from the perspective of FIGS. 1C and 1D). The channel material 106 of a device region 206 may be arranged in any of a number of ways. For example, FIG. 1 illustrates the channel material 106 of the device regions 206 as including multiple semiconductor wires (e.g., nanowires or nanoribbons in gate-all-around (GAA), forksheet, double-gate, or pseudo double-gate transistors). Although various ones of the accompanying drawings depict a particular number of wires in the channel material 106 of a device region 206, this is simply for ease of illustration, and a device region 206 may include more or fewer wires as the channel material 106. In other embodiments, the channel material 106 of one or more of the device regions 206 may include a semiconductor fin instead of or in addition to one or more semiconductor wires; examples of such embodiments are discussed below with reference to FIG. 47. More generally, any of the IC structures 100 disclosed herein or substructures thereof (e.g., the S/D contacts 164 and/or the depopulated S/D contacts 254, discussed below) may be utilized in a transistor having any desired architecture, such as forksheet transistors, double-gate transistors, or pseudo double-gate transistors. In some embodiments, the channel material 106 may include silicon and/or germanium. In some embodiments, the channel material 106 may include indium antimonide, lead telluride, indium arsenide, indium phosphide, gallium arsenide, or gallium antimonide, or further materials classified as group II-VI, III-V, or IV. In some embodiments, the channel material 106 may include a semiconducting oxide (e.g., indium gallium zinc oxide). In some embodiments, the material composition of the channel material 106 used in different ones of the wires in a particular device region 206 may be different, or may be the same.

Source/drain (S/D) regions 128/130 may be in electrical contact with the longitudinal ends of the channel material 106, allowing current to flow from one S/D region 128/130 to another S/D region 128/130 through the channel material 106 (upon application of appropriate electrical potentials to the S/D regions 128/130 through the S/D contacts 164) during operation. Although FIG. 1A (and others of the accompanying drawings) depicts a single S/D contact 164 spanning ("shorting") multiple S/D regions 128/130, this is simply illustrative, and the S/D contacts 164 may be arranged so as to isolate and connect various ones of the S/D regions 128/130 as desired. As discussed further below with reference to FIGS. 2-44, the S/D regions 128 may have a particular dopant type (i.e., n-type or p-type) while the S/D regions 130 may have the opposite dopant type (i.e., p-type or n-type, respectively); the particular arrangement of S/D regions 128/130 in the accompanying drawings is simply illustrative, and any desired arrangement may be used (e.g., by appropriate selective masking). The S/D regions 128/130 may be laterally confined by insulating material regions including dielectric material 112, dielectric material 118, and dielectric material 120; these insulating material regions may provide barriers between S/D regions 128/130 in adjacent device regions 206. As shown in FIG. 1A, in some embodiments, the dielectric material 112 may have a U-shaped cross-section, with "spacers" formed of the dielectric material 118 thereon, and the dielectric material 120 therebetween.

In some embodiments, the S/D regions 128/130 may include a silicon alloy such as silicon germanium or silicon carbide. In some embodiments, S/D regions 128/130 may include dopants such as boron, arsenic, or phosphorous. In some embodiments, the S/D regions 128/130 may include one or more alternate semiconductor materials such as germanium or a group III-V material or alloy. For p-type metal oxide semiconductor (PMOS) transistors, S/D regions 128/130 may include, for example, group IV semiconductor materials such as silicon, germanium, silicon germanium, germanium tin, or silicon germanium alloyed with carbon. Example p-type dopants in silicon, silicon germanium, and germanium include boron, gallium, indium, and aluminum. For n-type metal oxide semiconductor (NMOS) transistors, S/D regions 128/130 may include, for example, group III-V semiconductor materials such as indium, aluminum, arsenic, phosphorous, gallium, and antimony, with some example compounds including indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide.

The channel material 106 may be in contact with a gate dielectric 136. In some embodiments, the gate dielectric 136 may surround the channel material 106 (e.g., when the channel material 106 includes wires, as shown in FIG. 1), while in other embodiments, the gate dielectric 136 may not surround the channel material 106 (e.g., when the channel material 106 includes a fin, as discussed below with reference to FIG. 47, or in forksheet, double-gate, or pseudo double-gate transistors). The gate dielectric 136 may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 136 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 136 to improve its quality when a high-k material is used.

The gate dielectric 136 may be disposed between the channel material 106 and a gate metal 138. In some embodiments, the gate metal 138 may surround the channel material 106 (e.g., when the channel material 106 includes wires, as shown in FIG. 1), while in other embodiments, the gate metal 138 may not surround the channel material 106 (e.g., when the channel material 106 includes a fin, as discussed below with reference to FIG. 47, or in forksheet, double-gate, or pseudo double-gate transistors). Together, the gate metal 138 and the gate dielectric 136 may provide a gate 204 for the associated channel material 106 in an associated channel region 202, with the electrical impedance of the channel material 106 modulated by the electrical potential applied to the associated gate 204 (through a gate contact 140). The gate metal 138 may include at least one p-type work function metal or n-type work function metal (or both), depending on whether the transistor of which it is a part is to be a PMOS or an NMOS transistor. In some implementations, the gate metal 138 may include a stack of two or more metal layers, where one or more metal layers are work function metal layers and at least one metal layer is a fill metal layer. Further metal layers may be included for other purposes, such as a barrier layer (e.g., tantalum, tantalum nitride, an aluminum-containing alloy, etc.). In some embodiments, a gate metal 138 may include a resistance-reducing cap layer (e.g., copper, gold, cobalt, or tungsten). For a PMOS transistor, metals that may be used for the gate metal 138 include, but are not limited to, ruthenium, palladium, platinum, cobalt, nickel, conductive metal oxides (e.g., ruthenium oxide), and any of the metals discussed herein with reference to an NMOS transistor (e.g., for work function tuning). For an NMOS transistor, metals that may be used for the gate metal 138 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate metal 138 may include grading (increasing or decreasing) of the concentration of one or more materials therein. Dielectric material 118 may separate the gate metal 138, the gate dielectric 136, and the gate contact 140 from the proximate S/D contact 164, and dielectric material 124 may separate the gate dielectric 136 from the proximate S/D regions 128/130. The dielectric materials 118 and 124 may include silicon nitride, silicon oxide, silicon carbide, silicon nitride doped with carbon, silicon oxide doped with carbon, silicon oxynitride, or silicon oxynitride doped with carbon, for example. Together, a channel material 106, gate dielectric 136, gate metal 138, and associated S/D regions 128/130 may form a transistor.

In the IC structure 100 of FIG. 1, different ones of the S/D contacts 164 may have different lengths 252. For example, FIG. 1 illustrates a particular example of an IC structure 100 in which at least two different S/D contacts 164 (e.g., the S/D contacts 164-1 and 164-2) have different lengths 252 (i.e., the lengths 252-1 and 252-2); this particular example is simply illustrative, and IC structures 100 may have any number of S/D contacts 164 with any number of different associated lengths 252, in accordance with the teachings herein. The length 252 of an S/D contact 164 may depend on the thickness (in the direction of the longitudinal axis of the channel region 202) of the dielectric material region between that S/D contact 164 and the adjacent gate contacts 140; the thicker the dielectric material region proximate an S/D contact 164, the smaller the length 252 of that S/D contact 164. For example, as shown in FIGS. 1C and 1D, the S/D contact 164-2 is spaced apart from adjacent gate contacts 140 by a layer of dielectric material 118 (forming "spacers" of the dielectric material 118 between the S/D contact 164-2 and the adjacent gate contacts 140), while the S/D contact 164-1 is spaced apart from adjacent gate contacts 140 by a layer of dielectric material 118 (forming "spacers" of the dielectric material 118 between the S/D contact 164-1 and the adjacent gate contacts 140) and a layer of dielectric material 162 (forming "spacers" of the dielectric material 162 between the S/D contact 164-2 and the dielectric material 118). The dielectric materials 118 and 162 together form a thicker dielectric material region between the S/D contact 164-1 and the adjacent gate contacts 140 (relative to the dielectric material region, which only includes the dielectric material 118 between the S/D contact 164-2 and the adjacent gate contacts 140), resulting in a smaller length 252-1 (relative to the length 252-2). The dielectric material 118 proximate to both the S/D contact 164-1 and the S/D contact 164-2 may have a same thickness; the additional thickness of the dielectric material 162 proximate to the S/D contact 164-1 may cause the smaller length 252-1 of the S/D contact 164-1, relative to the S/D contact 164-2.

Although FIG. 1 illustrates an embodiment in which a "smaller" S/D contact 164-1 only includes one additional layer of dielectric material (i.e., the dielectric material 162) between the S/D contact 164-1 and the adjacent gate contacts, any number of additional layers of dielectric material may be included in an IC structure 100 to adjust the lengths 252 of any desired arrangement of S/D contacts 164. For example, FIG. 45 illustrates an embodiment in which some S/D contacts 164 are bordered by two additional layers of dielectric material (i.e., the dielectric materials 162 and 166, as discussed further below).

The dimensions of the elements of the IC structure of FIG. 1 (and others of the embodiments disclosed herein) may take any suitable form. For example, in some embodiments, a gate length 208 of a gate 204 may be between 3 nanometers and 100 nanometers; different ones of the gates 204 in a device region 206 may have the same gate length 208, or different gate lengths 208, as desired. In some embodiments, the width 210 of the channel material 106 may be between 3 nanometers and 30 nanometers. In some embodiments, the thickness 212 of the channel material 106 may be between 1 nanometer and 500 nanometers (e.g., between 40 nanometers and 400 nanometers when the channel material 106 is a fin, and between 5 nanometers and 40 nanometers when the channel material 106 is a wire). In some embodiments in which a channel region 202 includes semiconductor wires, the spacing 214 between adjacent ones of the wires in a channel region 202 may be between 5 nanometers and 40 nanometers.

In some embodiments, the IC structure 100 may be part of a memory device, and transistors of the IC structure 100 may store information in the IC structure 100 or facilitate access to (e.g., read and/or write) storage elements of the memory device. In some embodiments, the IC structure 100 may be part of a processing device. In some embodiments, the IC structure 100 may be part of a device that includes memory and logic devices (e.g., in a single die 1502, as discussed below), such as a processor and cache. More generally, the IC structures 100 disclosed herein may be part of memory devices, logic devices, or both.

FIGS. 2-44 illustrate stages in an example process for manufacturing the IC structure 100 of FIG. 1. Although the operations of the process may be illustrated with reference to particular embodiments of the IC structures 100 disclosed herein, the process of FIGS. 2-44 and variants thereof may be used to form any suitable IC structure. Operations are illustrated a particular number of times and in a particular order in FIGS. 2-44, but the operations may be reordered and/or repeated as desired (e.g., with different operations performed in parallel when manufacturing multiple IC structures 100 simultaneously).

FIG. 2 illustrates an assembly including a base 102 and a stack of material layers on the base 102. The stack of material layers may include one or more layers of the channel material 106 spaced apart from each other (and from the base 102) by intervening layers of sacrificial material 104. The size and arrangement of the material layers in the stack of the assembly of FIG. 2 corresponds to the desired size and arrangement of the channel material 106 in the IC structure 100, as will be discussed further below, and thus the material layers in the assembly of FIG. 2 may vary from the particular embodiment illustrated in FIG. 2. For example, the thickness of a layer of channel material 106 may correspond to the channel thickness 212 discussed above (though the thickness of the layer of channel material 106 may differ from the final channel thickness 212 due to material lost during processing, etc.), and the thickness of a layer of sacrificial material 104 may correspond to the wire spacing 214 discussed above (though the thickness of the layer of sacrificial material 104 may differ from the final wire spacing 214 due to material lost during processing, etc.). The sacrificial material 104 may be any material that may be appropriately selectively removed in later processing operations (as discussed below). For example, the sacrificial material 104 may be silicon germanium, and the channel material 106 may be silicon. In another example, the sacrificial material 104 may be silicon dioxide and the channel material 106 may be silicon or germanium. In another example, the sacrificial material 104 may be gallium arsenide and the channel material 106 may be indium gallium arsenide, germanium, or silicon germanium. The assembly of FIG. 2 may be formed using any suitable deposition techniques, such as chemical vapor deposition (CVD), metalorganic vapor phase epitaxy (MOVPE), molecular-beam epitaxy (MBE), physical vapor deposition (PVD), atomic layer deposition (ALD), or a layer transfer process.

FIG. 3 illustrates an assembly subsequent to forming a patterned hardmask 108 on the assembly of FIG. 2. Forming the patterned hardmask 108 may include depositing the hardmask (using any suitable method) and then selectively removing portions of the hardmask 108 (e.g., using lithographic techniques) to form the patterned hardmask 108. In some embodiments, the pattern of the patterned hardmask 108 may first be formed in another material on the initially deposited hardmask, and then the pattern may be transferred from the other material into the hardmask 108. The locations of the hardmask 108 may correspond to the device regions 206 in the IC structure 100, as discussed further below. In the embodiment of FIG. 3, the hardmask 108 may be patterned into multiple parallel rectangular portions (corresponding to the fins 220 discussed below).

FIG. 4 illustrates an assembly subsequent to forming fins 220 in the material stack of the assembly of FIG. 2, in accordance with the pattern of the patterned hardmask 108. Etch techniques may be used to form the fins 220, including wet and/or dry etch schemes, as well as isotropic and/or anisotropic etch schemes. The fins 220 may include the sacrificial material 104 and the channel material 106, as well as a portion of the base 102; the portion of the base 102 included in the fins 220 provides a pedestal 222. The width of the fins 220 may be equal to the width 210 of the channel material 106, as discussed above. Any suitable number of fins 220 may be included in the assembly of FIG. 4 (e.g., more or fewer than 3). Although the fins 220 depicted in FIG. 4 (and others of the accompanying drawings) are perfectly rectangular, this is simply for ease of illustration, and in practical manufacturing settings, the shape of the fins 220 may not be perfectly rectangular. For example, the fins 220 may be tapered, widening toward the base 102. The top surface of the fins 220 may not be flat, but may be curved, rounding into the side surfaces of the fins 220, and these non-idealities may carry over into subsequent processing operations. In some embodiments, the pitch 101 of the fins 220 may be between 20 nanometers and 50 nanometers (e.g., between 20 nanometers and 40 nanometers).

FIG. 5 illustrates an assembly subsequent to forming a dielectric material 110 on the base 102 of the assembly of FIG. 4, between the fins 220. The dielectric material 110 may include any suitable material, such as an STI material (e.g., an oxide material, such as silicon oxide). The dielectric material 110 may be formed by blanket depositing the dielectric material 110 and then recessing the dielectric material 110 back to a desired thickness. In some embodiments, the thickness of the dielectric material 110 may be selected so that the top surface of the dielectric material 110 is approximately coplanar with the top surface of the pedestals 222. In some embodiments, the height 103 of a fin 220 above the top surface of the dielectric material 110 may be between 40 nanometers and 100 nanometers (e.g., between 50 nanometers and 70 nanometers).

FIG. 6 illustrates an assembly subsequent to forming a conformal layer of a dielectric material 112 over the assembly of FIG. 5. The dielectric material 112 may be formed using any suitable technique (e.g., ALD). The dielectric material 112 may include any suitable material (e.g., silicon oxide).

FIG. 7 illustrates an assembly subsequent to forming a dielectric material 114 over the assembly of FIG. 6. The dielectric material 114 may extend over the top surfaces of the fins 220, as shown, and may serve as a "dummy gate." The dielectric material 114 may include any suitable material (e.g., polysilicon).

FIG. 8 illustrates an assembly subsequent to forming a patterned hardmask 116 on the assembly of FIG. 7. The hardmask 116 may include any suitable materials (e.g., silicon nitride, carbon-doped silicon oxide, or carbon-doped silicon oxynitride). The hardmask 116 may be patterned into strips that are oriented perpendicular to the longitudinal axis of the fins 220 (into and out of the page in accordance with the perspective of FIGS. 8C and 8D), corresponding to the locations of the gates 204 in the IC structure 100, as discussed further below.

FIG. 9 illustrates an assembly subsequent to etching the dielectric material 114 (the "dummy gate") of the assembly of FIG. 8 using the patterned hardmask 116 as a mask. The locations of the remaining dielectric material 114 may correspond to the locations of the gates 204 in the IC structure 100, as discussed further below.

FIG. 10 illustrates an assembly subsequent to depositing a conformal layer of dielectric material 118 on the assembly of FIG. 9, and then performing a directional "downward" etch to remove the dielectric material 118 on horizontal surfaces, leaving the dielectric material 118 as "spacers" on side faces of exposed surfaces, as shown. The dielectric material 118 may be deposited to any desired thickness using any suitable technique (e.g., ALD). The dielectric material 118 may include any suitable dielectric material (e.g., silicon oxycarbonitride). The dielectric material 118 may border the fins 220 in the volumes that will be replaced by the S/D regions 128/130, as discussed below.

FIG. 11 illustrates an assembly subsequent to depositing a dielectric material 120 on the assembly of FIG. 10. The dielectric material 120 may be blanket deposited over the assembly of FIG. 10 and then the dielectric material 120 may be polished (e.g., by chemical mechanical polishing (CMP)) or otherwise recessed back so that the top surface of the dielectric material 120 is coplanar with the top surface of the patterned hardmask 116, as shown in FIGS. 11D and 11O. The dielectric material 120 may include any suitable material (e.g., an oxide, such as silicon oxide).

FIG. 12 illustrates an assembly subsequent to depositing a hardmask 126 on the assembly of FIG. 11. The hardmask 126 may have any suitable material composition; for example, in some embodiments, the hardmask 126 may include titanium nitride.

FIG. 13 illustrates an assembly subsequent to patterning the hardmask 126 of the assembly of FIG. 12 so as to selectively remove the hardmask 126 in areas that will correspond to the S/D regions 130, while otherwise leaving the hardmask 126 in place. Any suitable patterning technique (e.g., a lithographic technique) may be used to pattern the hardmask 126. The particular arrangement of the S/D regions 130 in an IC structure 100 (and thus the particular layout of the patterned hardmask 126) depicted in various ones of the accompanying figures is simply illustrative, and any desired arrangement may be used; FIG. 48 depicts an IC structure 100 with a different arrangement of S/D regions 130, for example.

FIG. 14 illustrates an assembly subsequent to recessing the exposed dielectric material 120 of the assembly of FIG. 13 (i.e., the dielectric material 120 not protected by the hardmask 126). Any suitable selective etch technique may be used to recess the exposed dielectric material 120, such as an isotropic etch. In the areas not protected by the hardmask 126, the dielectric material 120 may remain.

FIG. 15 illustrates an assembly subsequent to removing some of the dielectric material 118 exposed in the assembly of FIG. 14. This operation may enlarge the "canyons" between adjacent portions of hardmask 116/dielectric material 114, facilitating subsequent operations. In some embodiments, the removal of some of the dielectric material 118 may be achieved by a partial isotropic etch (e.g., a nitride partial isotropic etch when the dielectric material 118 includes a nitride).

FIG. 16 illustrates an assembly subsequent to further recessing the exposed dielectric material 120 of the assembly of FIG. 15 (i.e., the dielectric material 120 not protected by the hardmask 126). Any suitable selective etch technique may be used to recess the exposed dielectric material 120, such as an isotropic etch. In the areas not protected by the hardmask 126, the dielectric material 120 may remain.

FIG. 17 illustrates an assembly subsequent to conformally depositing additional dielectric material 118 on the assembly of FIG. 16, and then performing another directional "downward" etch to remove the dielectric material 118 on horizontal surfaces, "repairing" the dielectric material 118 as "spacers" on side faces of exposed surfaces, as shown. The etch of FIG. 17 (e.g., a reactive ion etch (RIE)) may also remove the dielectric material 112 from the top faces of the sacrificial material 104, as shown.

FIG. 18 illustrates an assembly subsequent to removing the portions of the sacrificial material 104 and the channel material 106 in the assembly of FIG. 17 that are not covered by the hardmask 126 to form open volumes 224 (e.g., using any suitable etch techniques). These open volumes 224 may correspond to the locations of the S/D regions 130 in the IC structure 100, as discussed further below, and are self-aligned to the dielectric material 112, as shown.

Figure 19A:
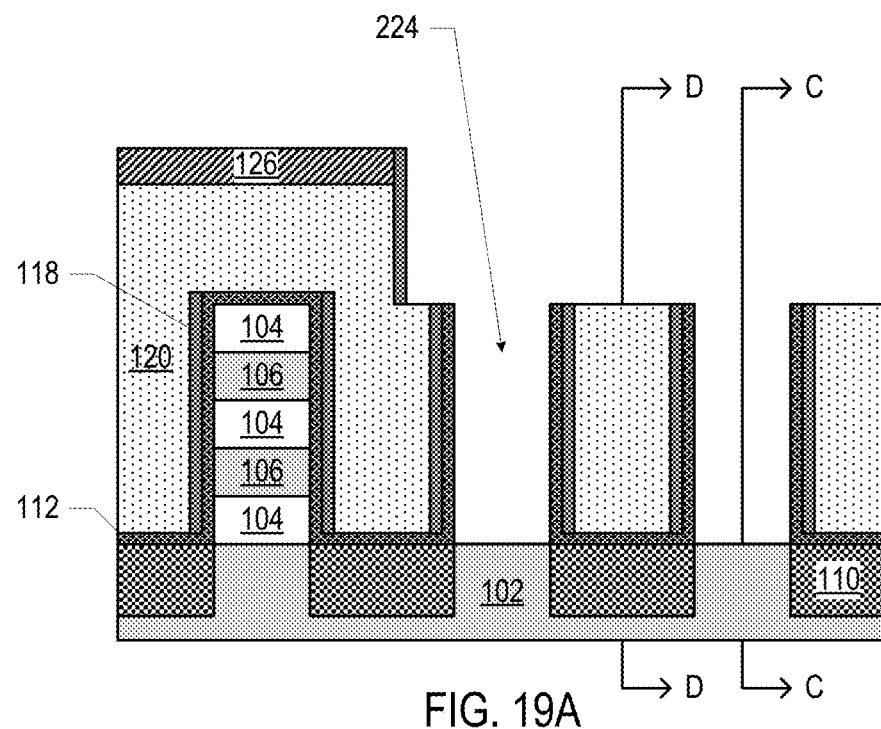
Figure 19B:
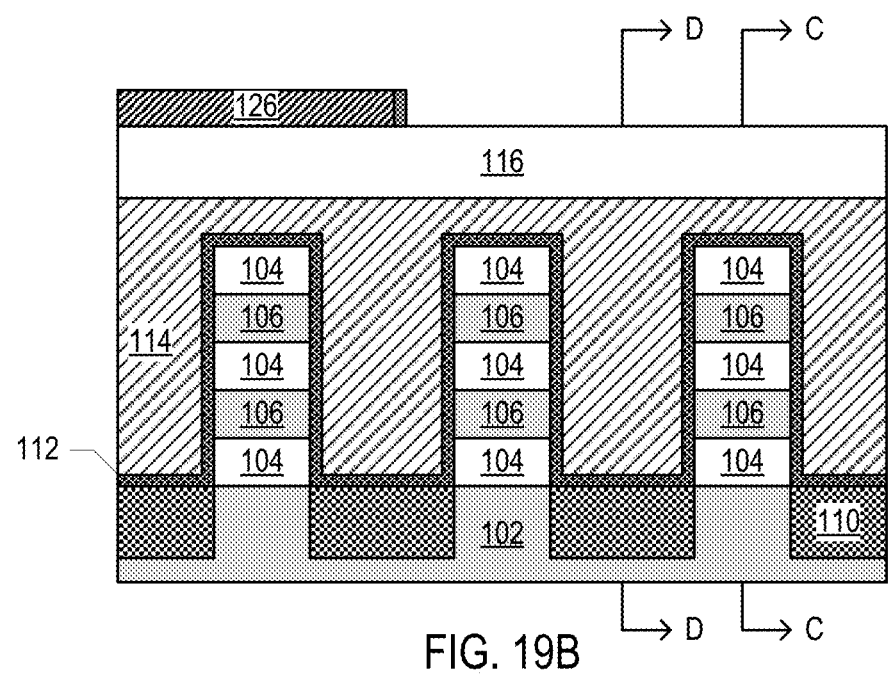
Figure 19C:
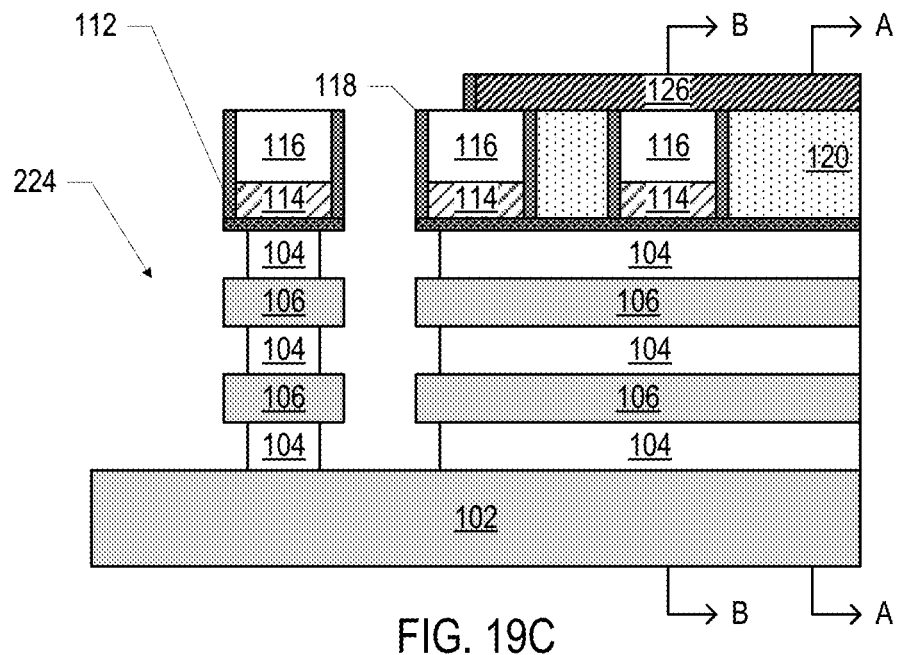
Figure 19D:
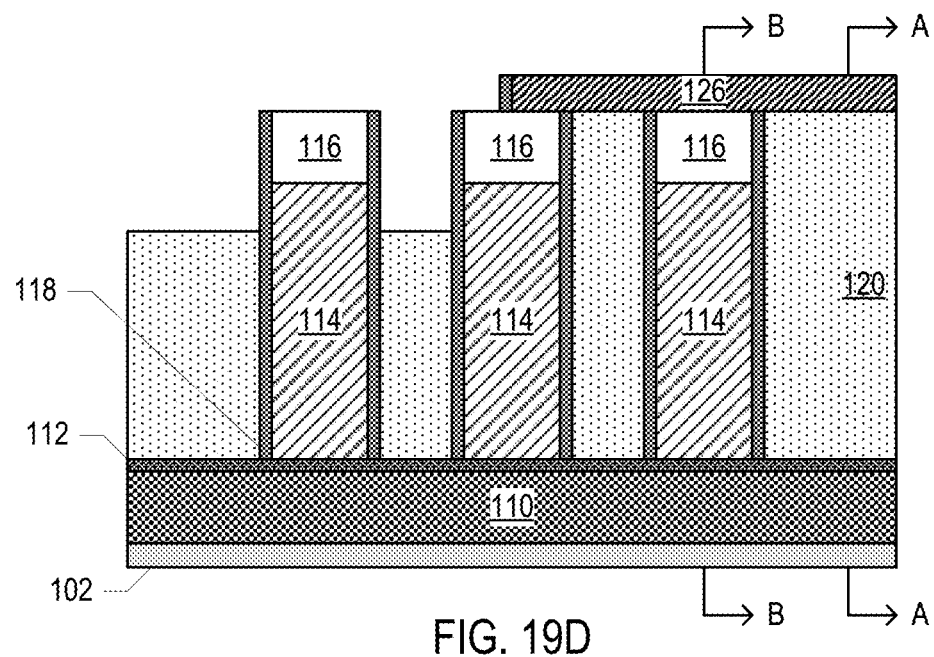
Figure 20A:
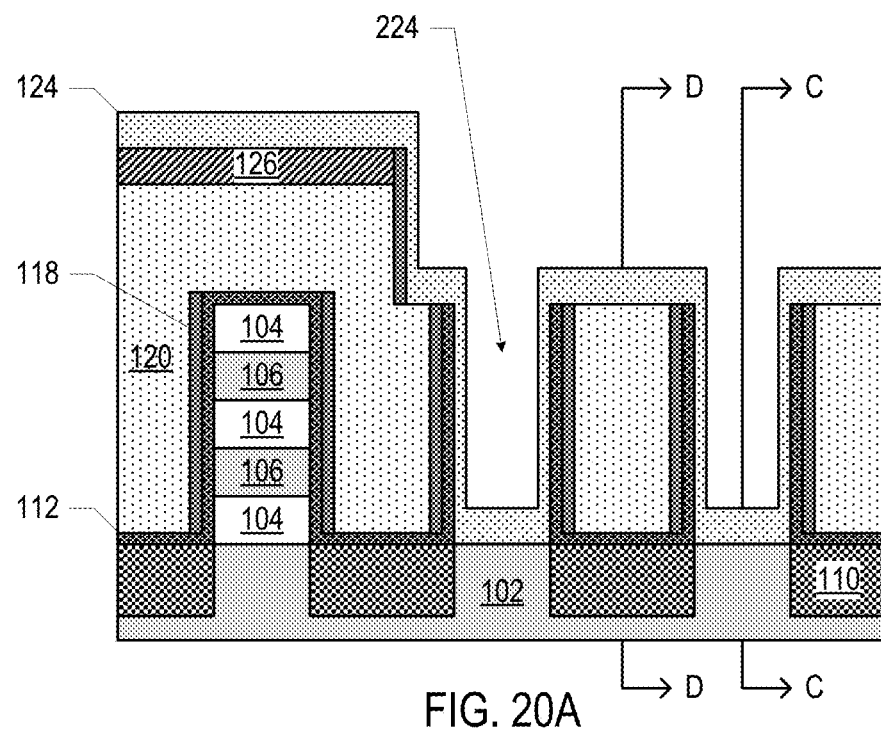
Figure 20B:
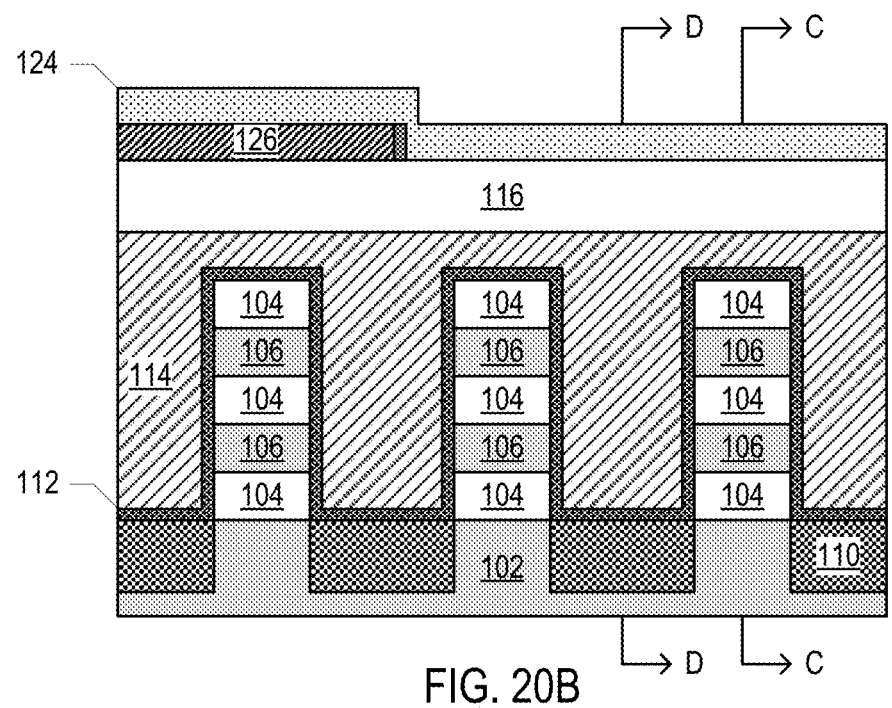
Figure 20C:
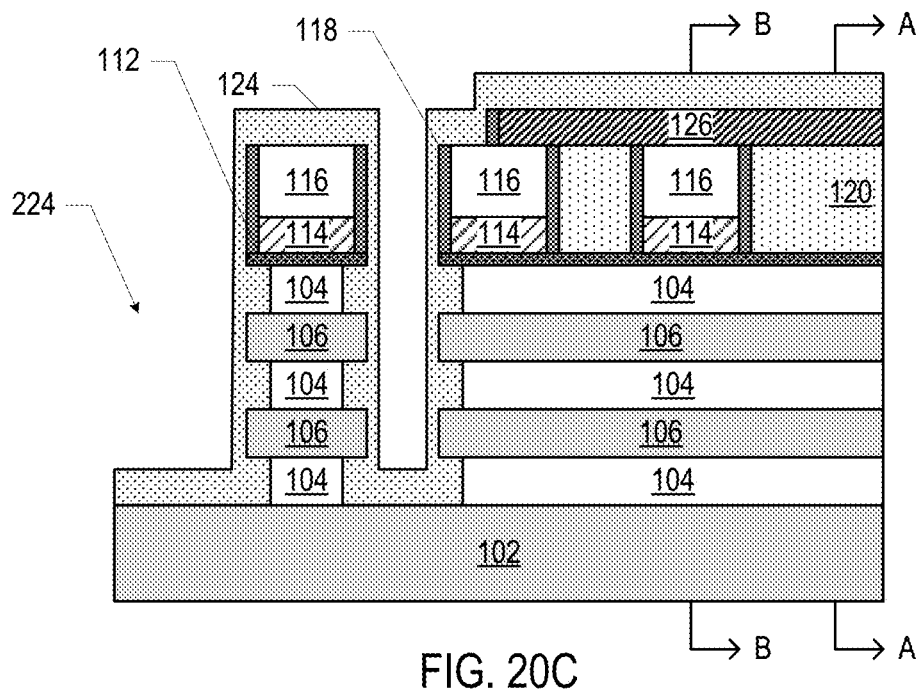
Figure 20D:
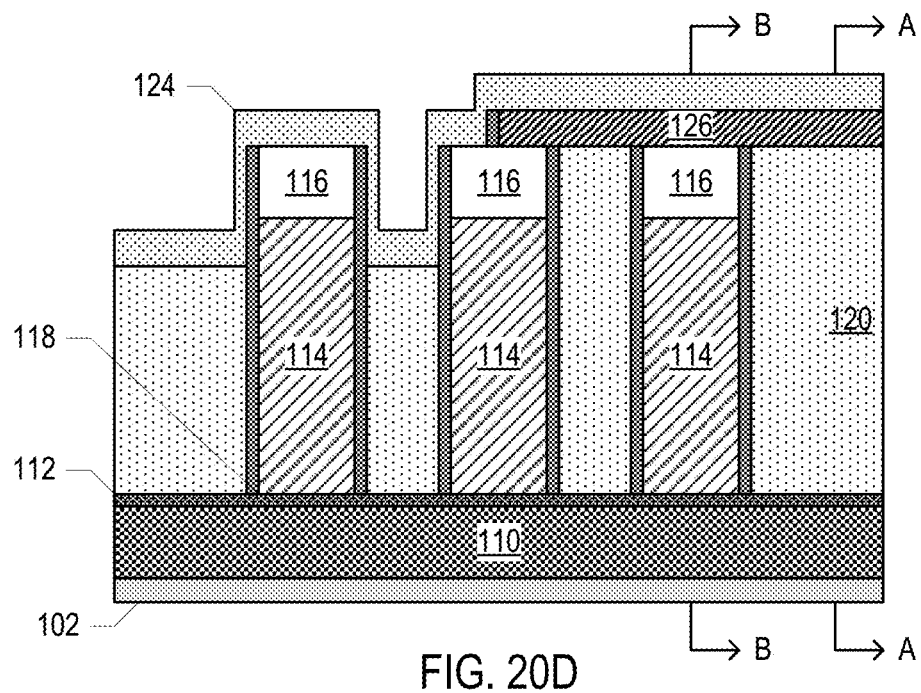
Figure 21A:
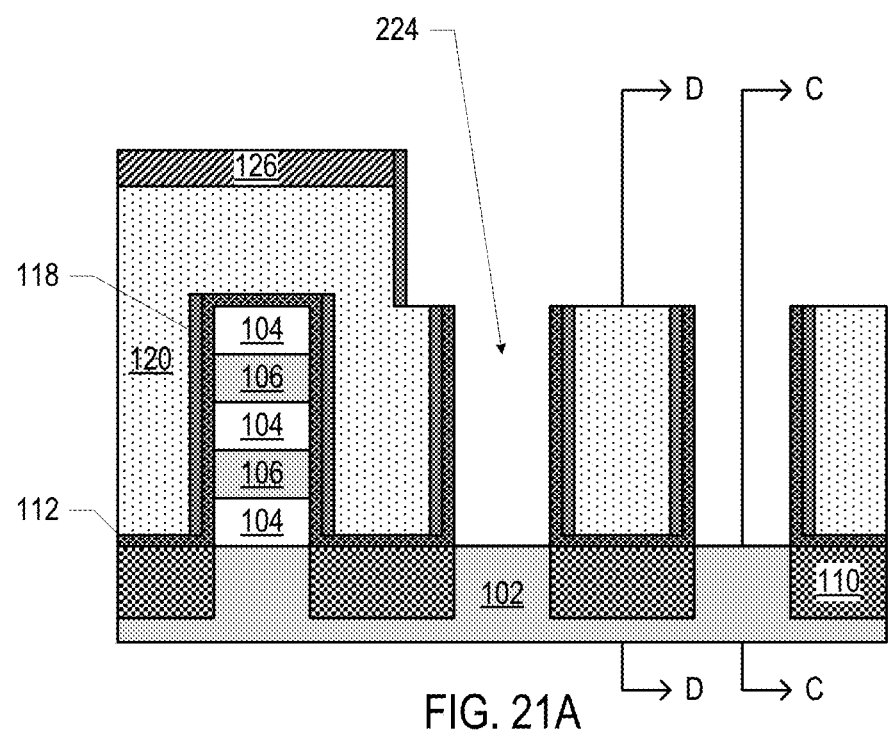
Figure 21B:
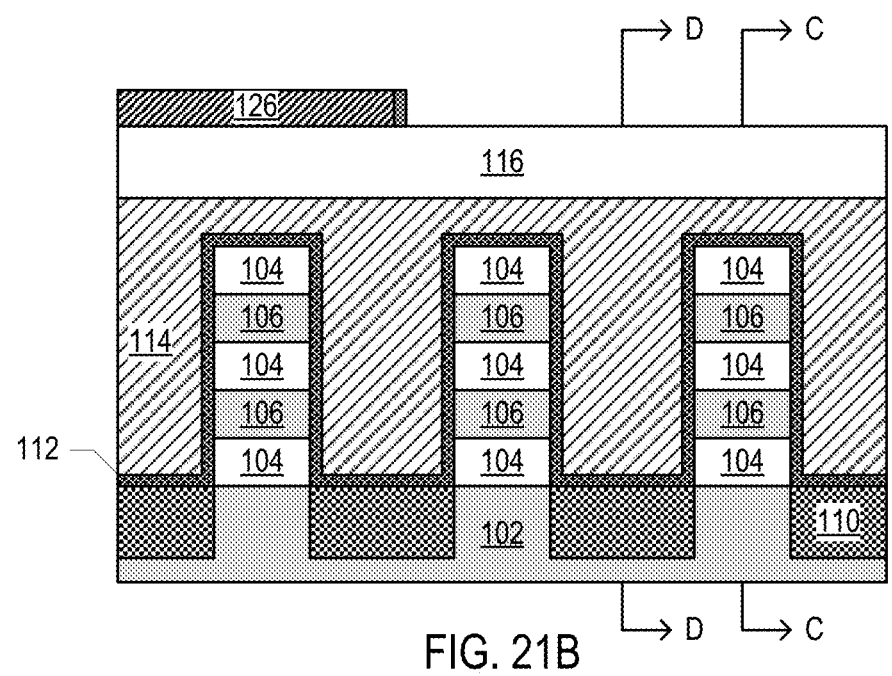
Figure 21C:
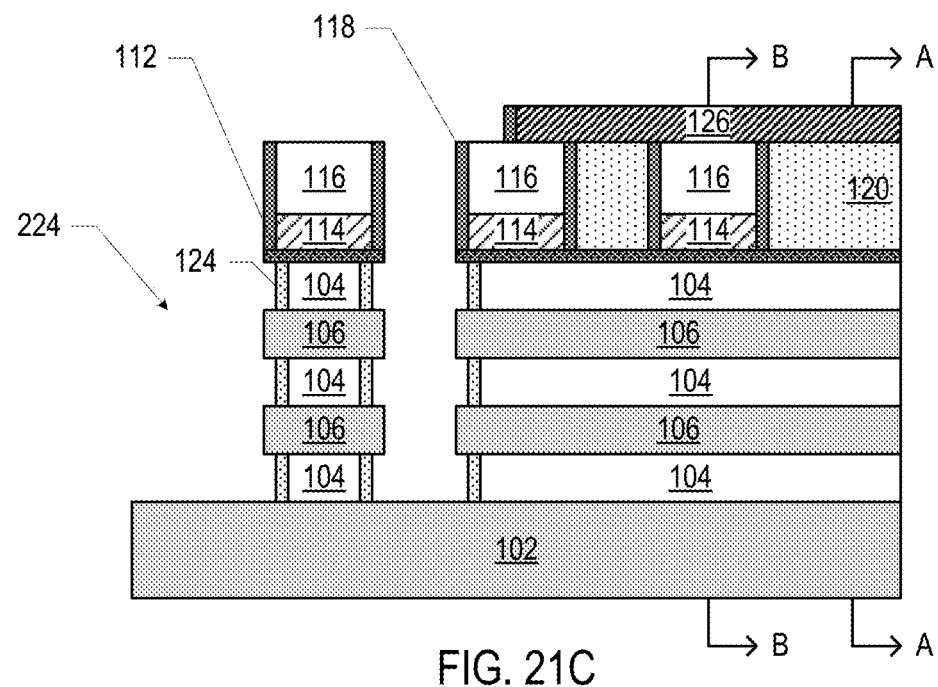
Figure 21D:
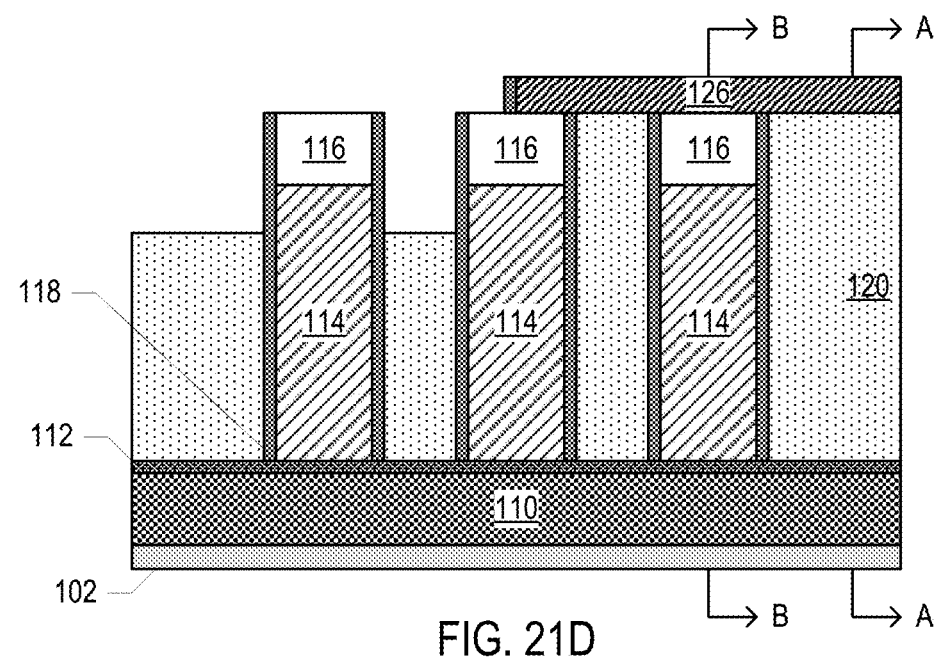
Figure 22A:
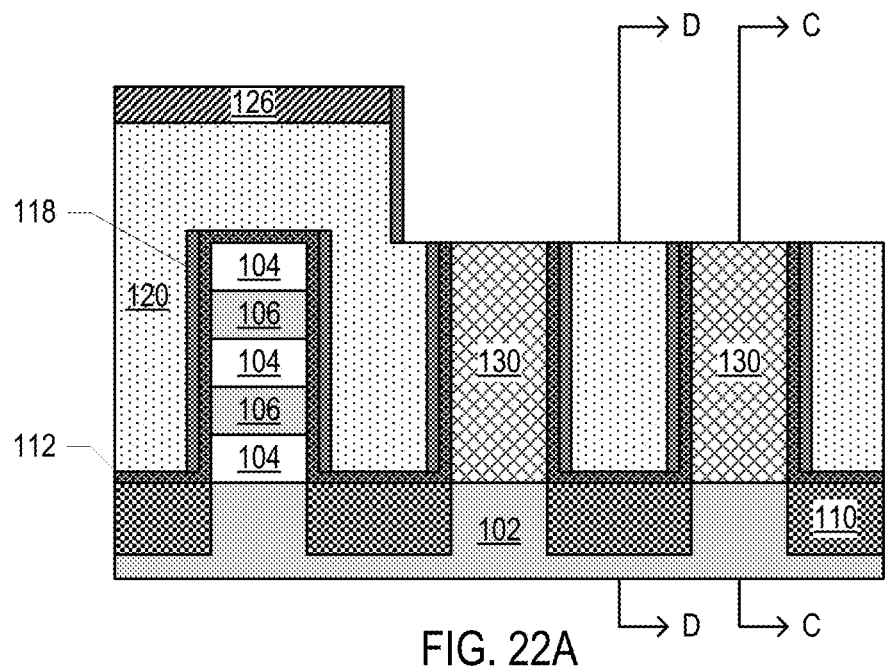
Figure 22B:
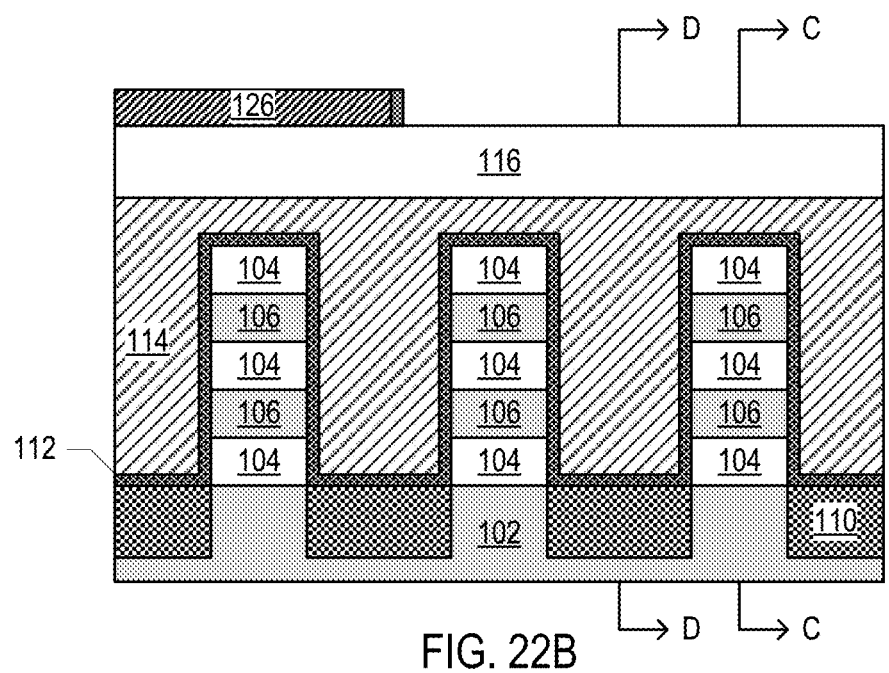
Figure 22C:
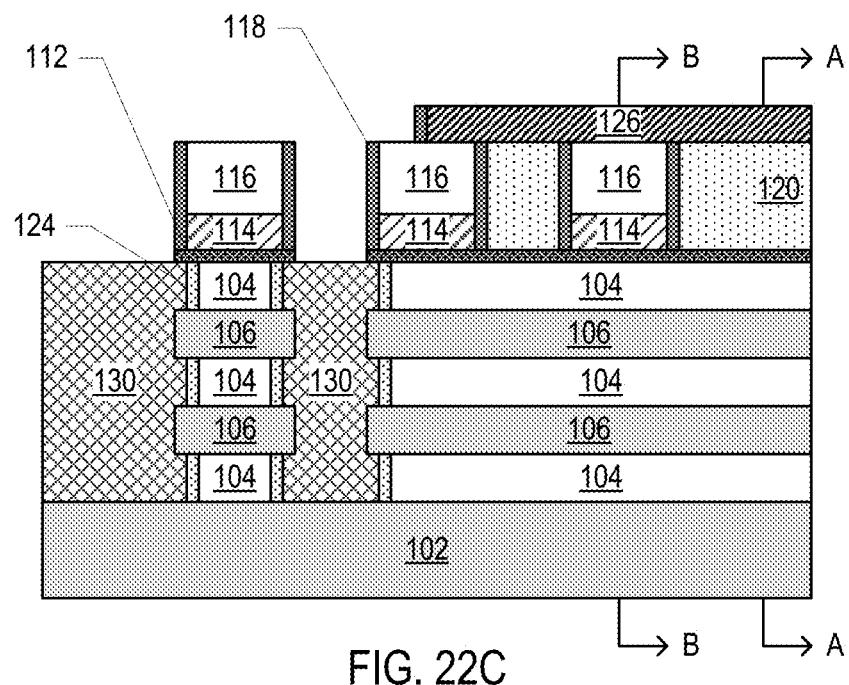
Figure 22D:
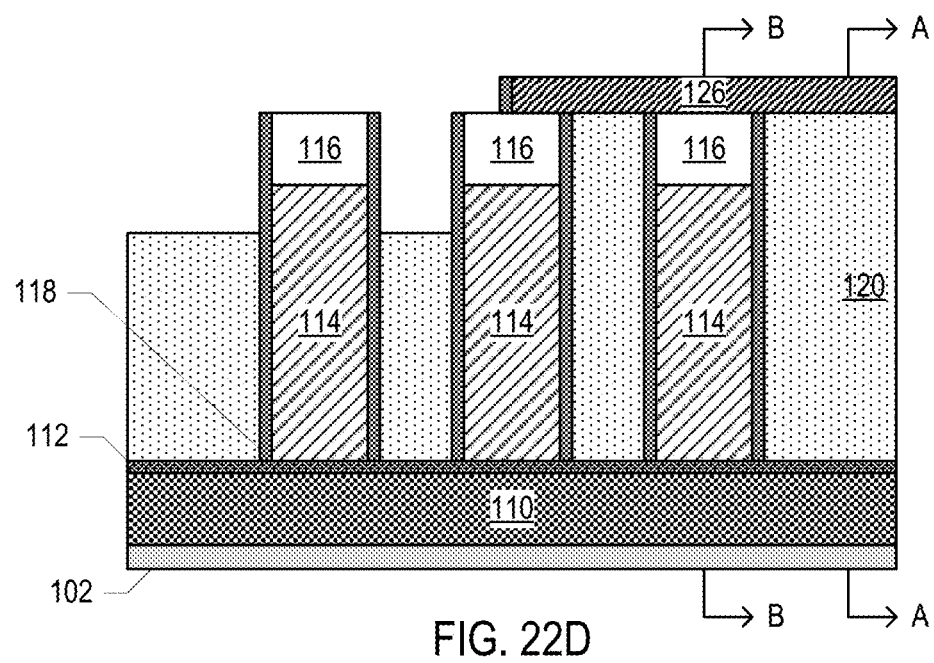
Figure 23A:
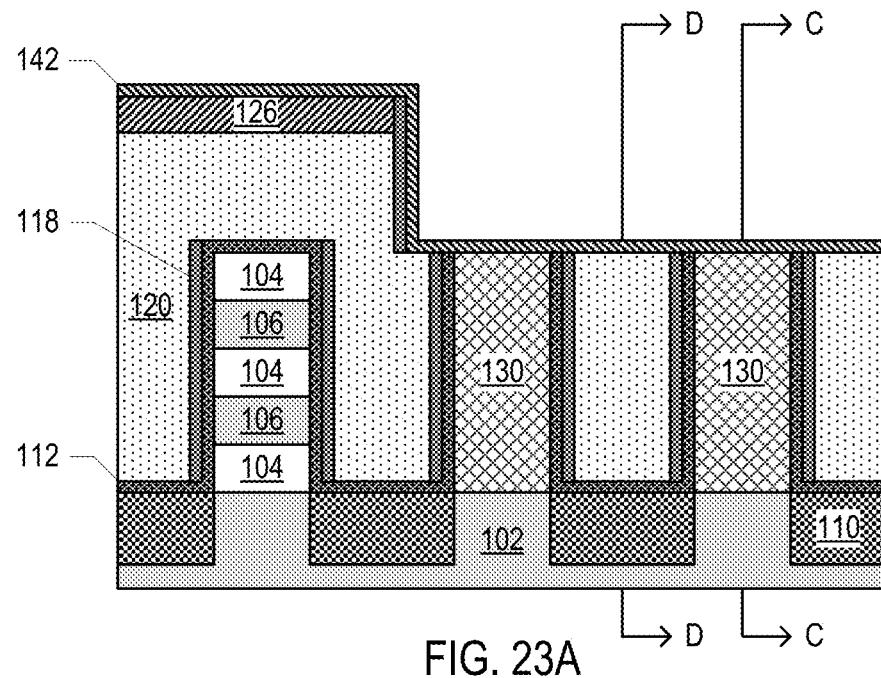
Figure 23B:
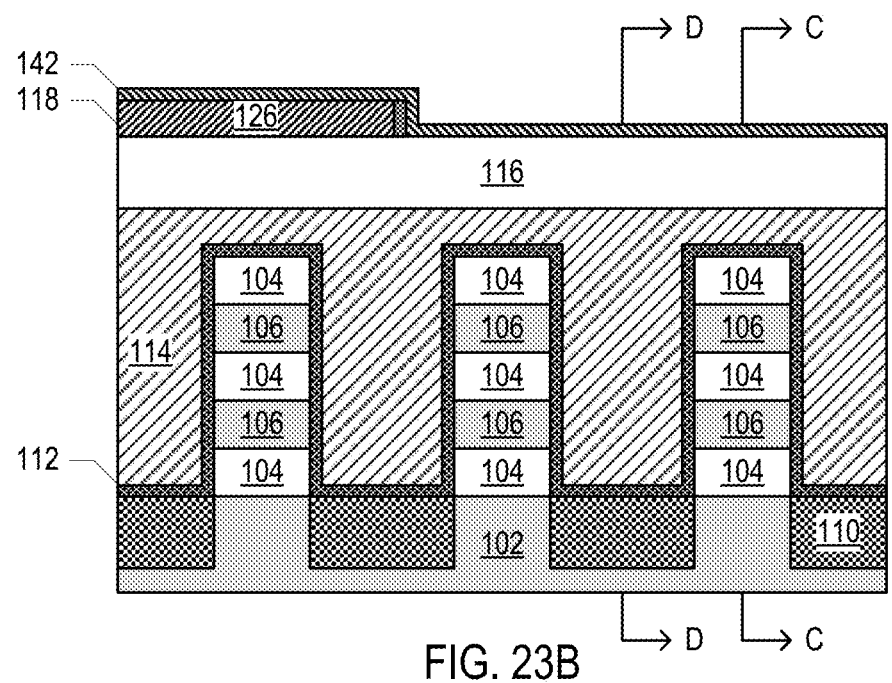
Figure 23C:
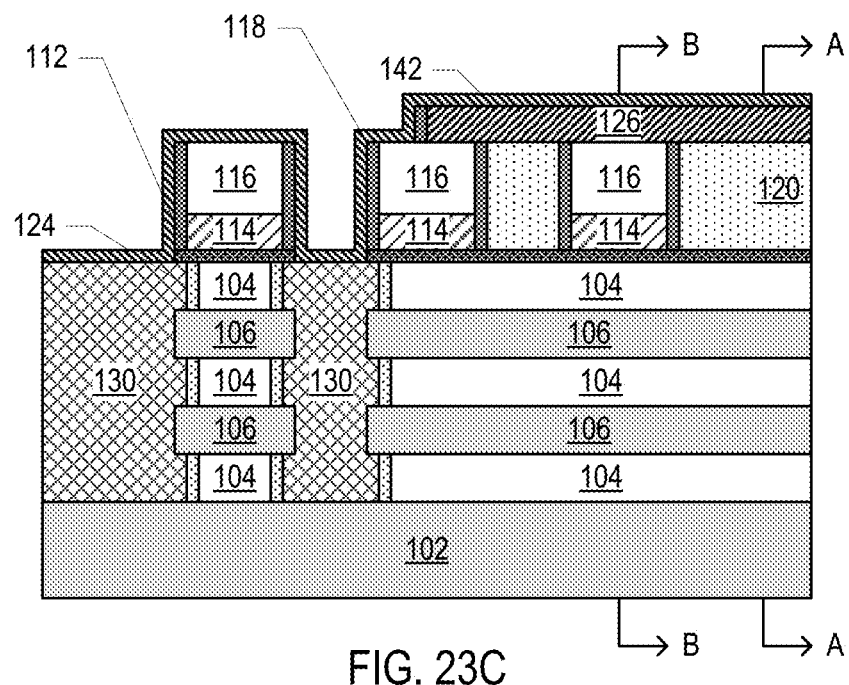
Figure 23D:
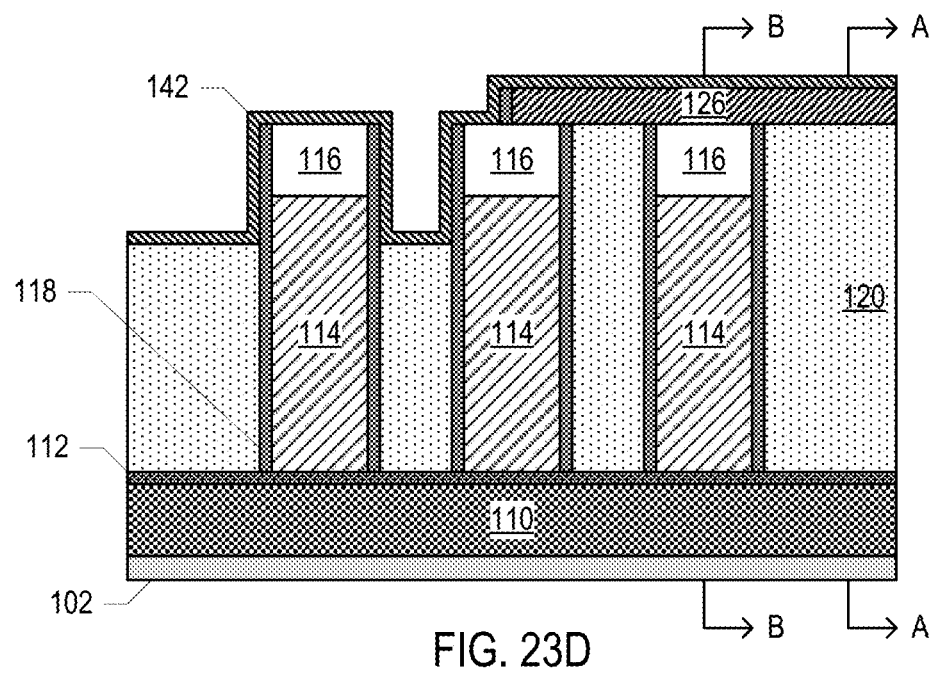
Figure 24A:
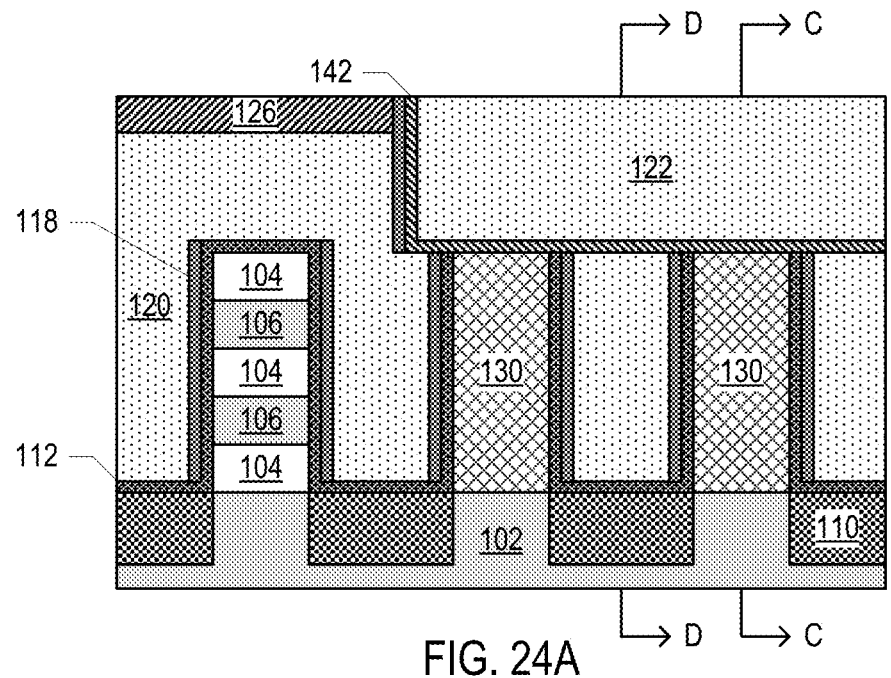
Figure 24B:
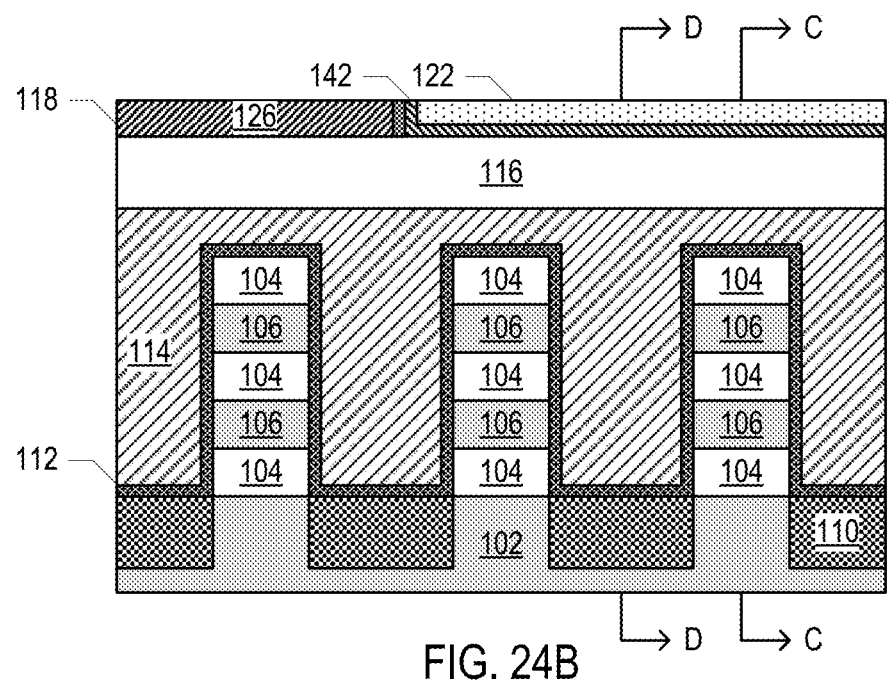
Figure 24C:
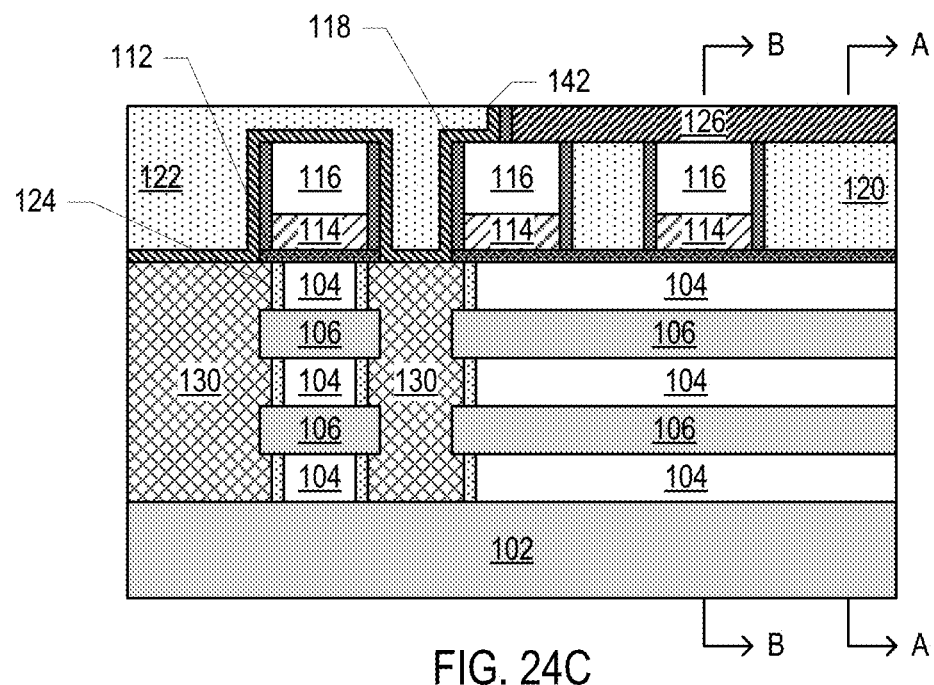
Figure 24D:
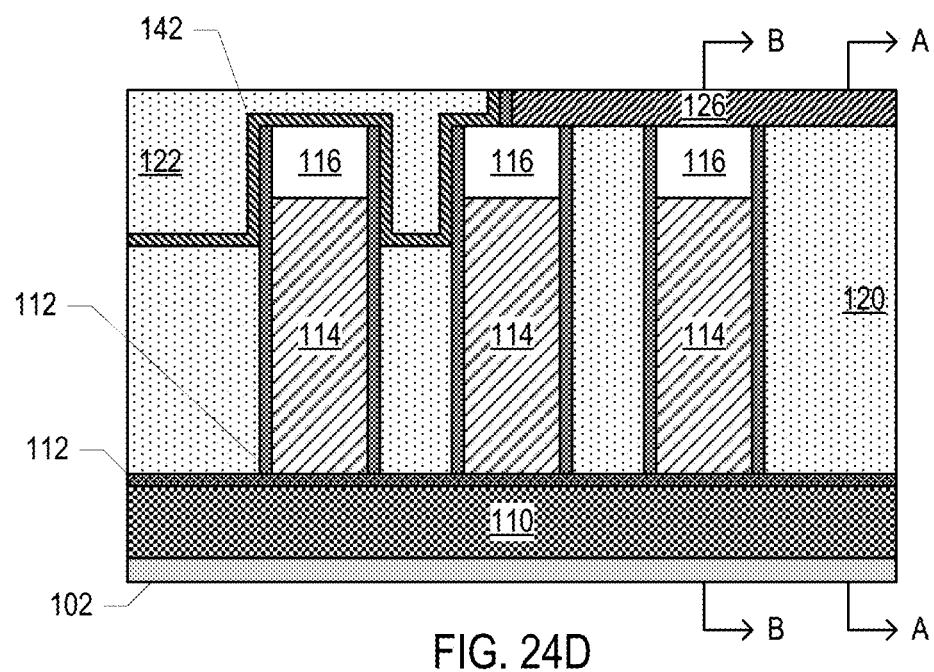
Figure 25A:
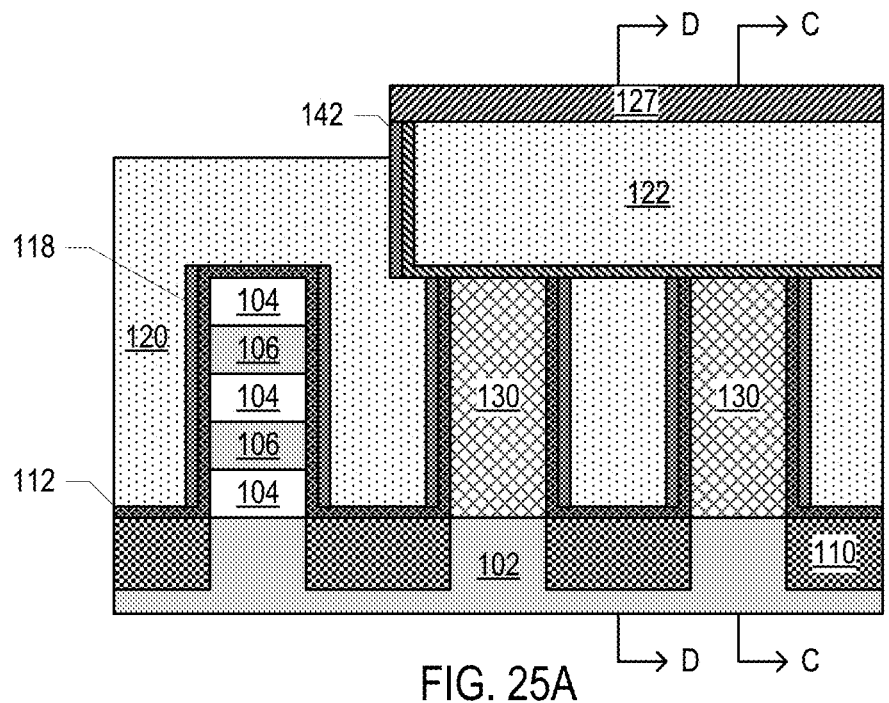
Figure 25B:
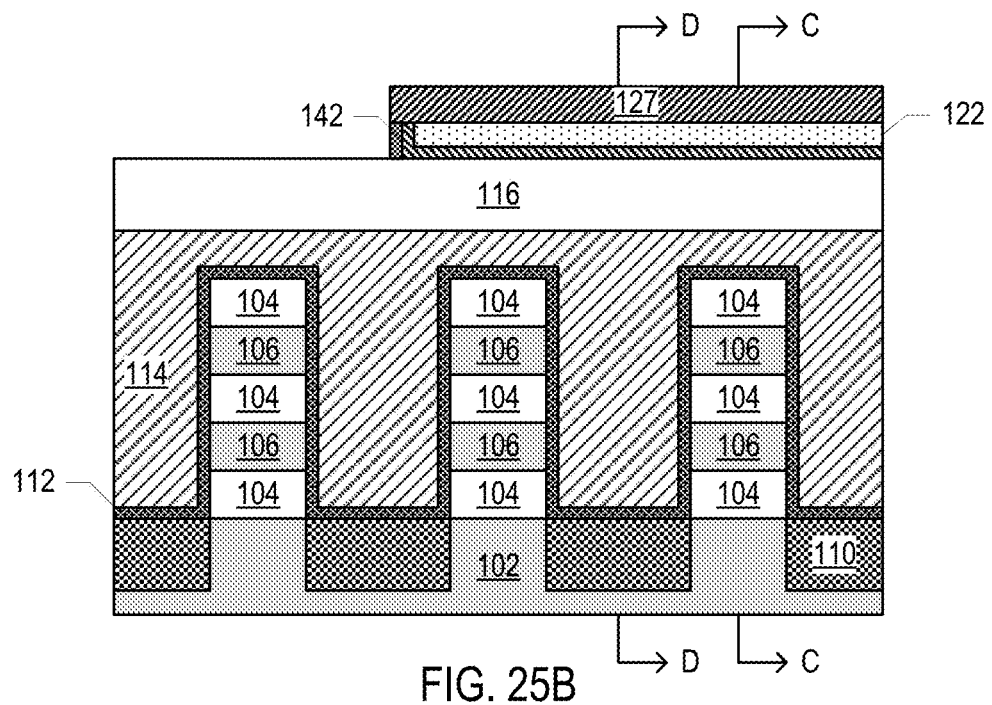
Figure 25C:
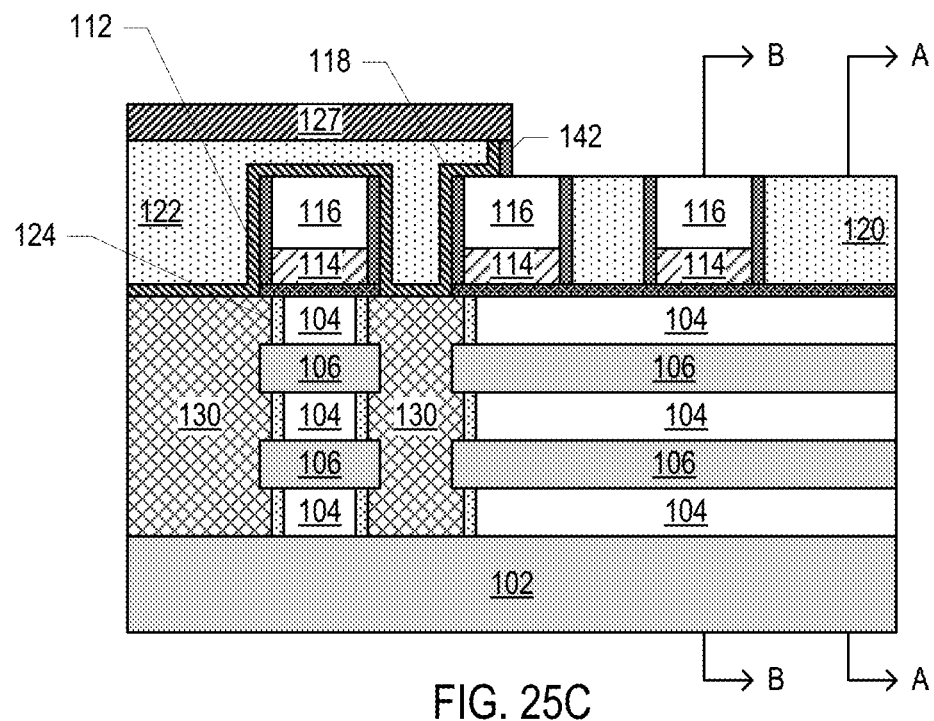
Figure 25D:
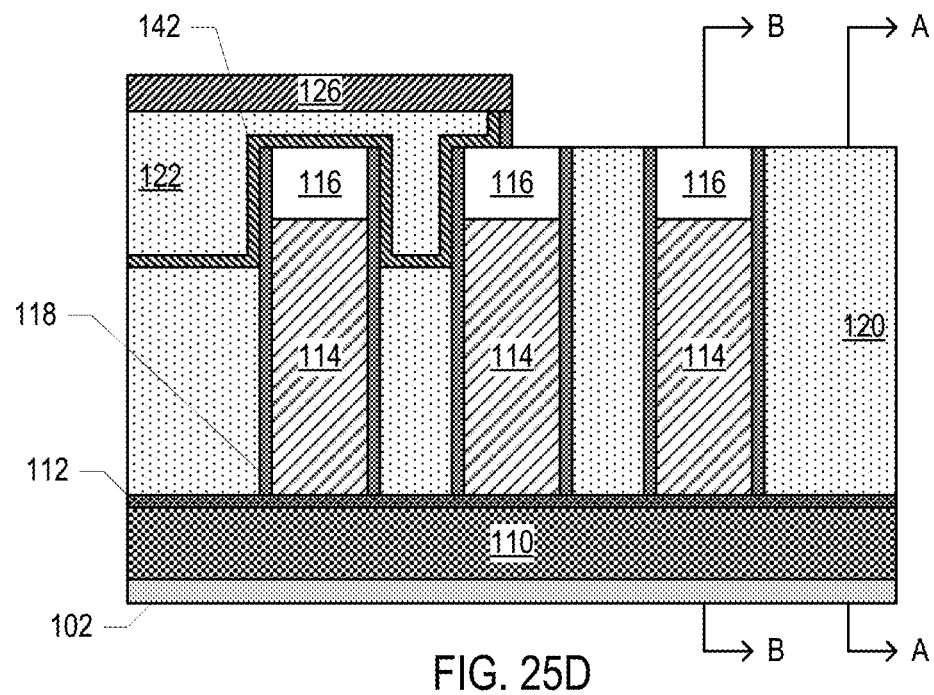
Figure 26A:
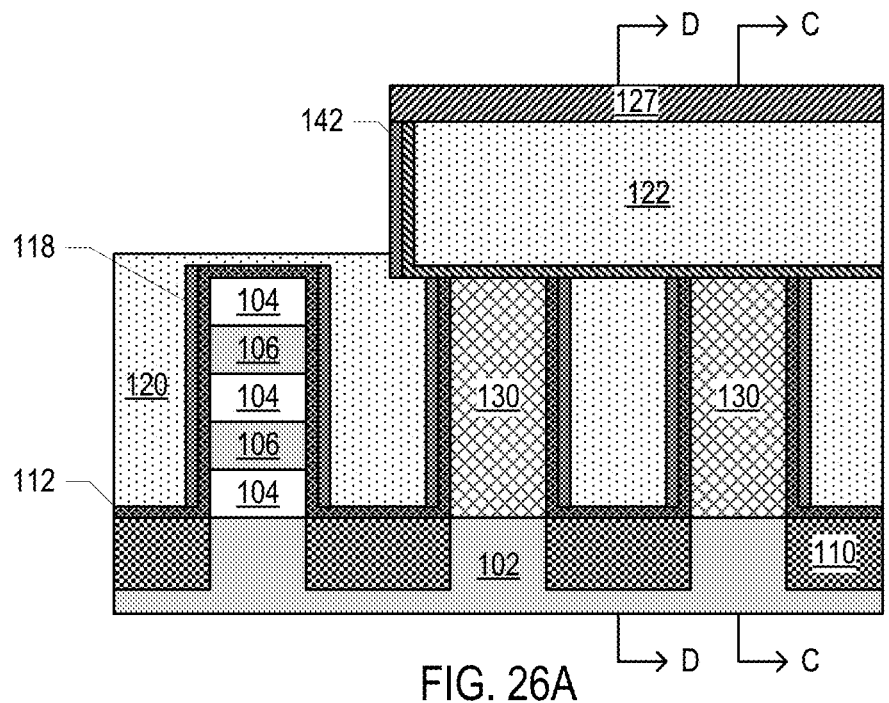
Figure 26B:
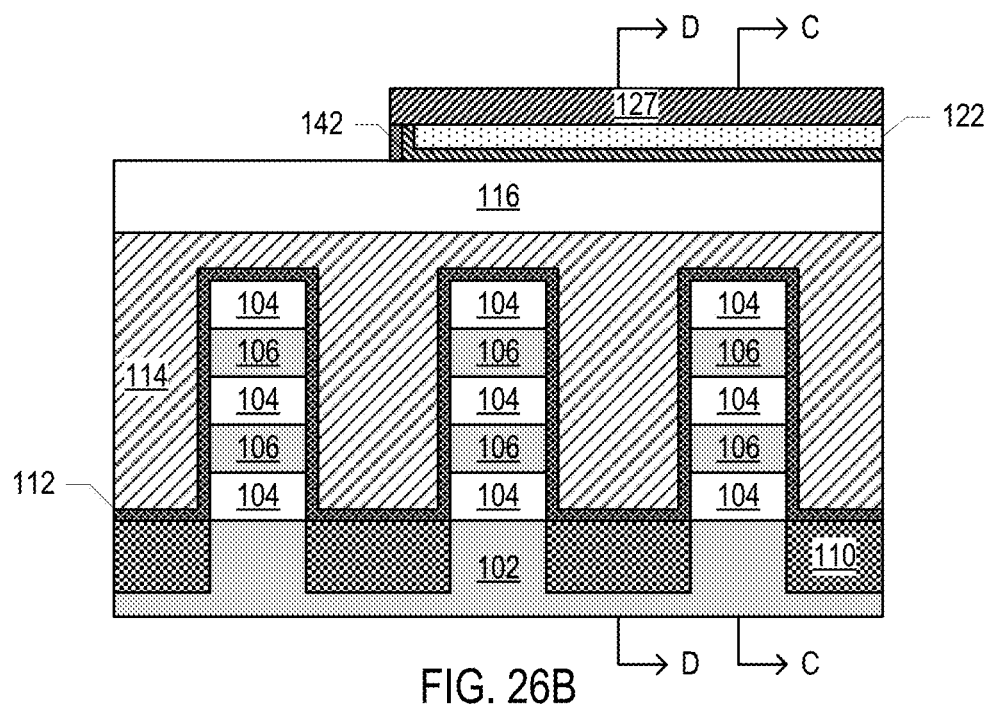
Figure 26C:
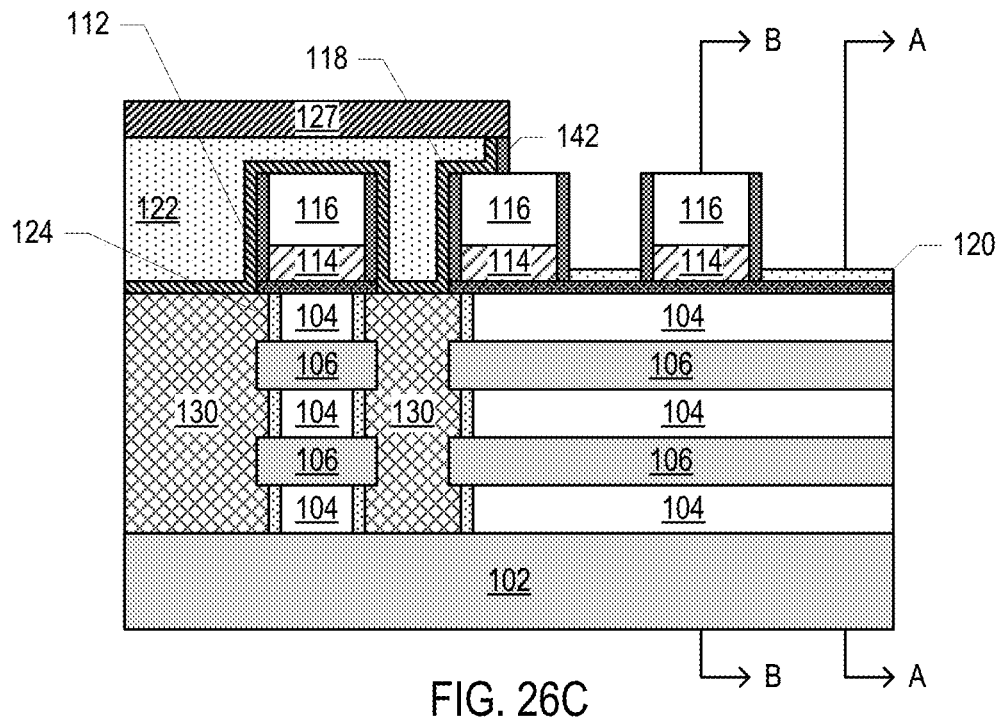
Figure 26D:
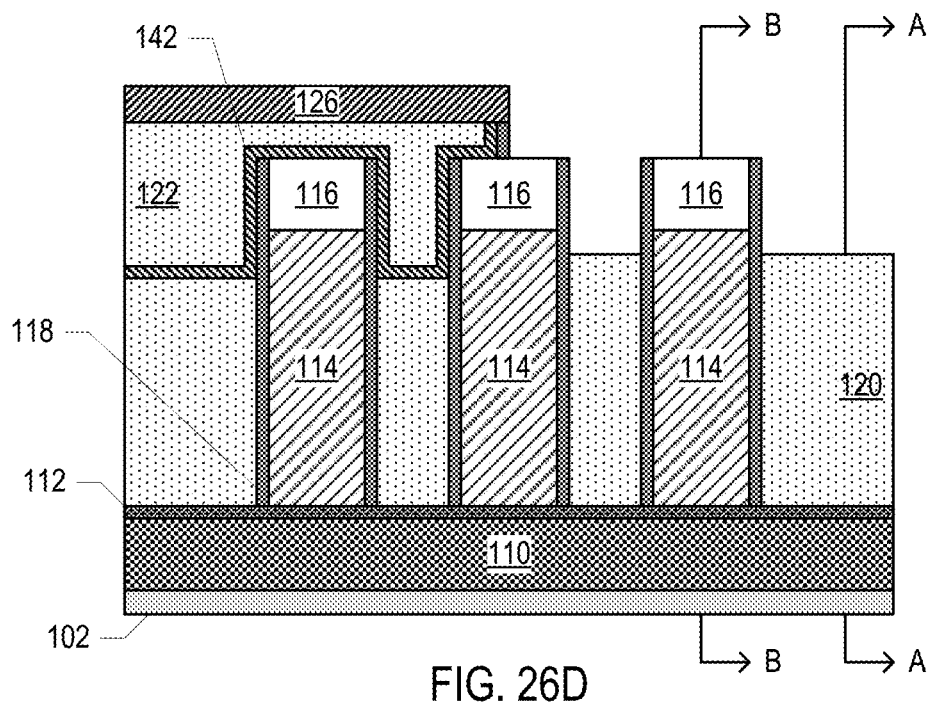
Figure 27A:
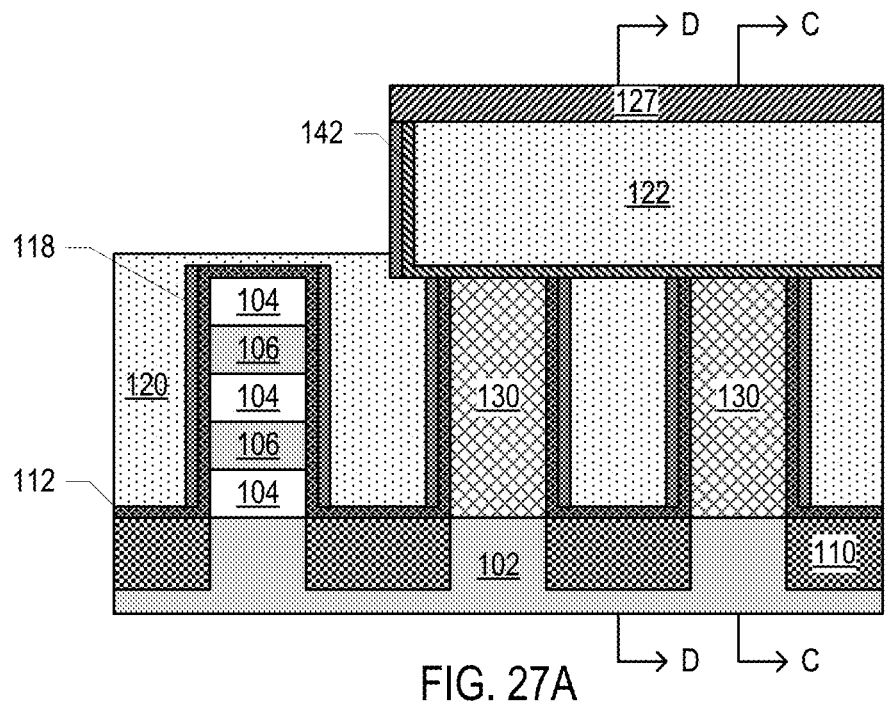
Figure 27B:
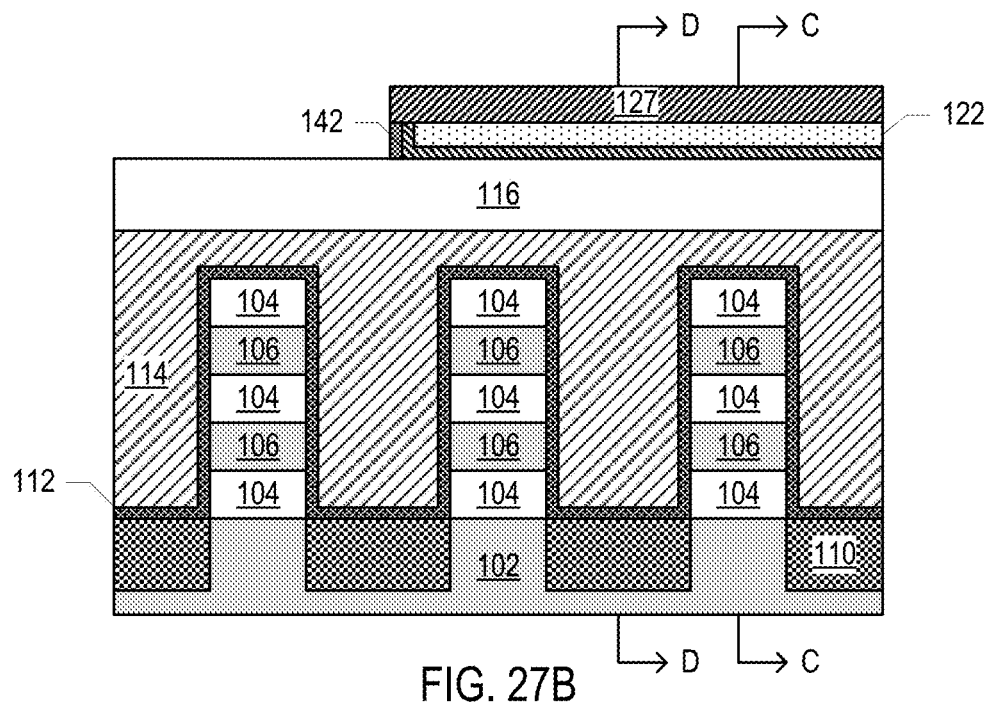
Figure 27C:
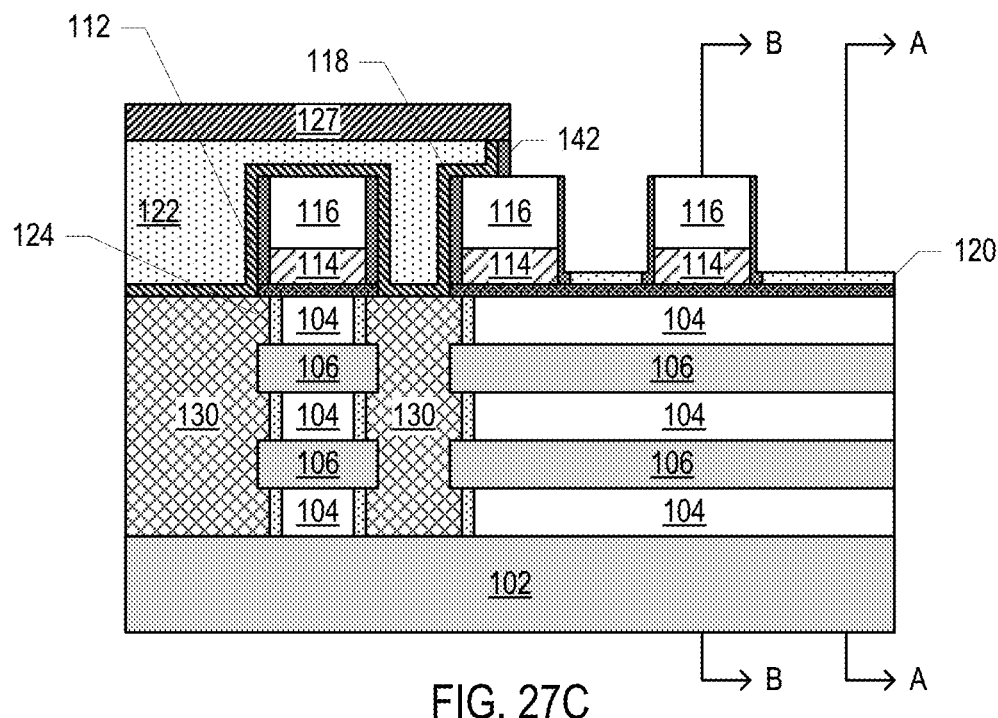
Figure 27D:
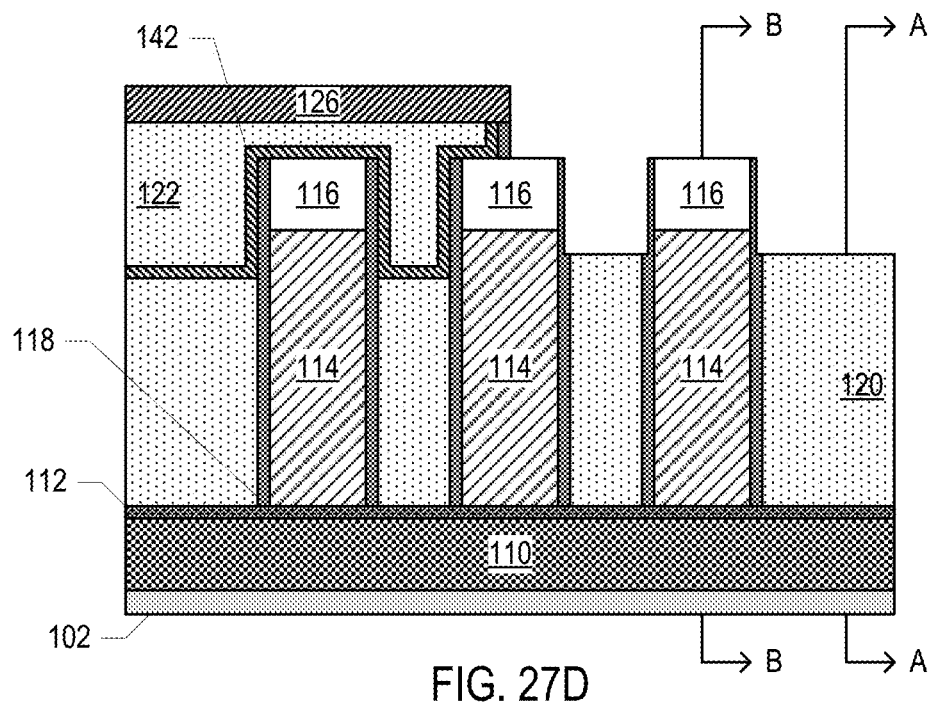
Figure 28A:
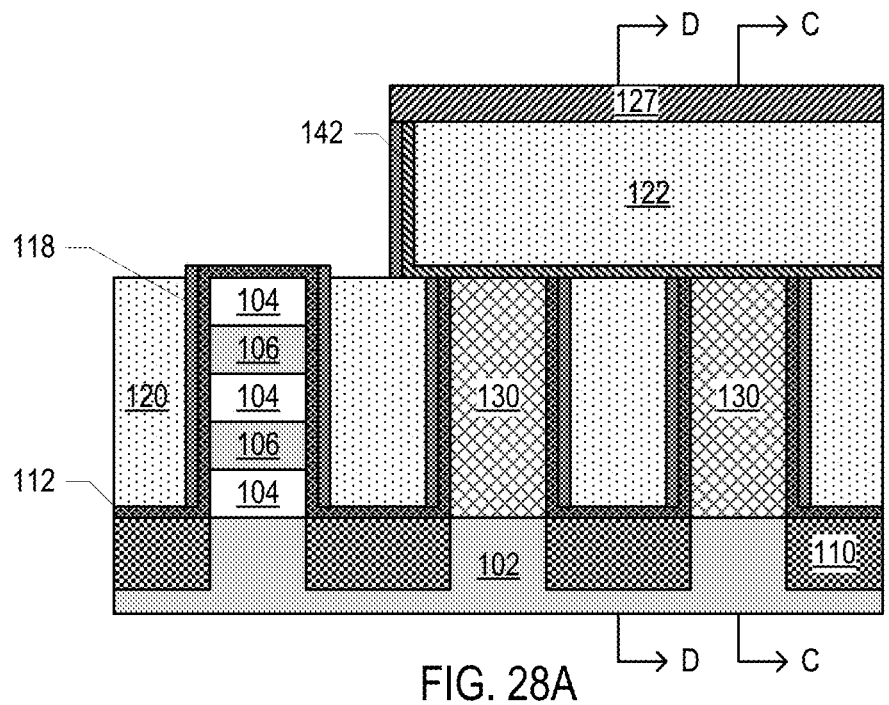
Figure 28B:
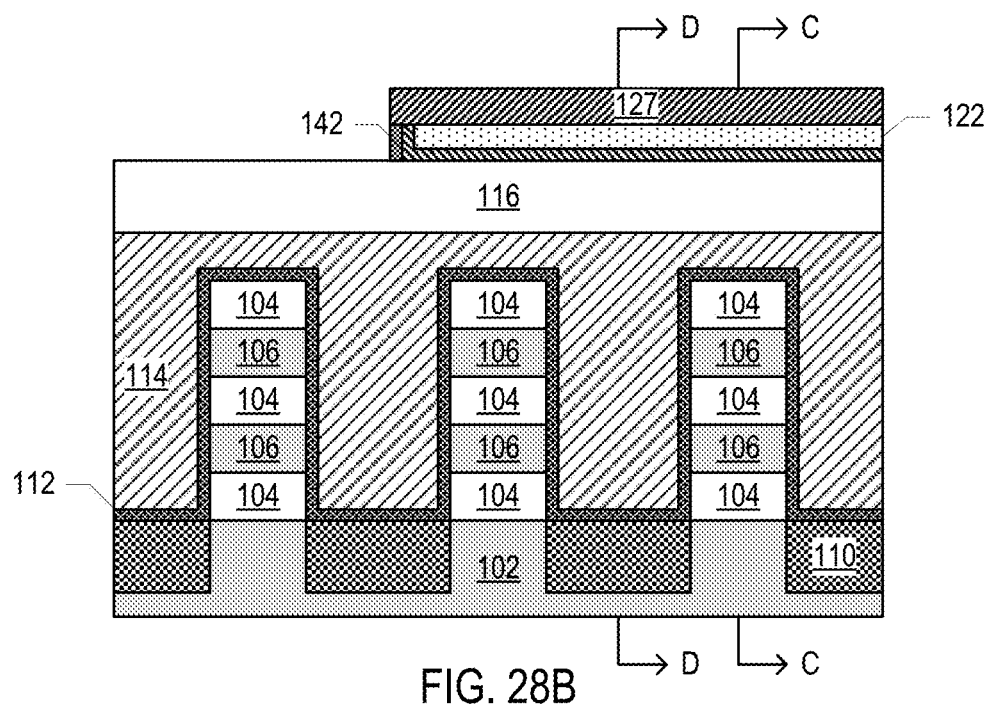
Figure 28C:
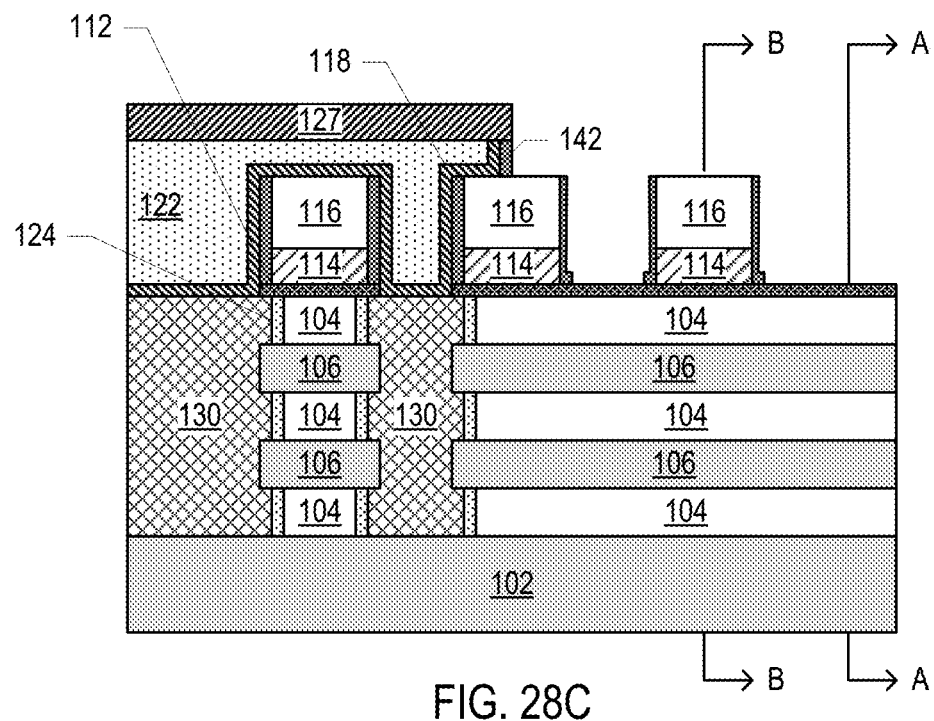
Figure 28D:
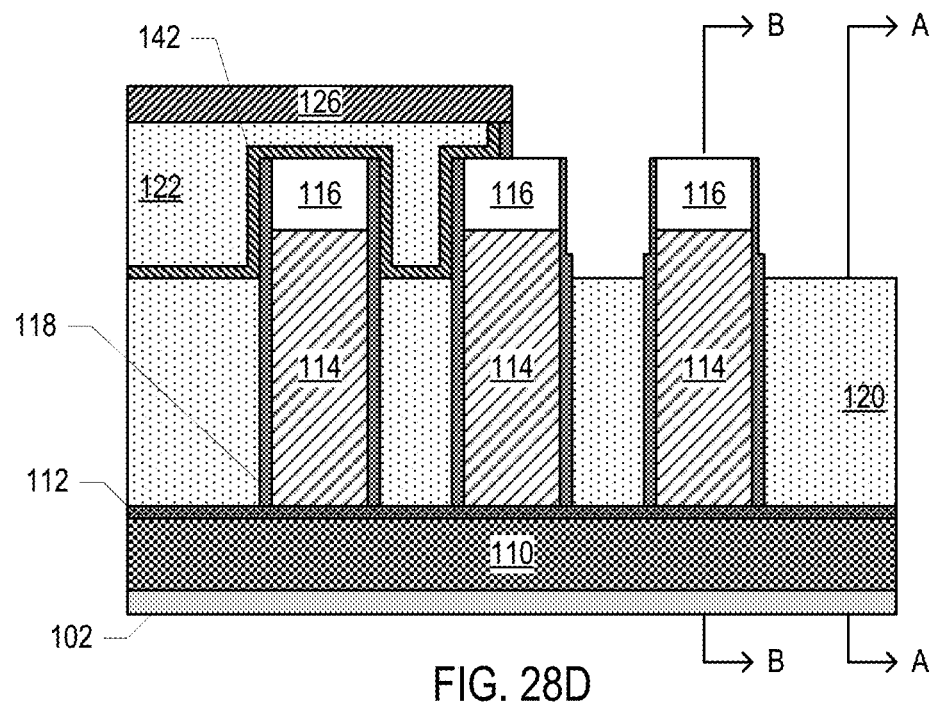
Figure 29A:
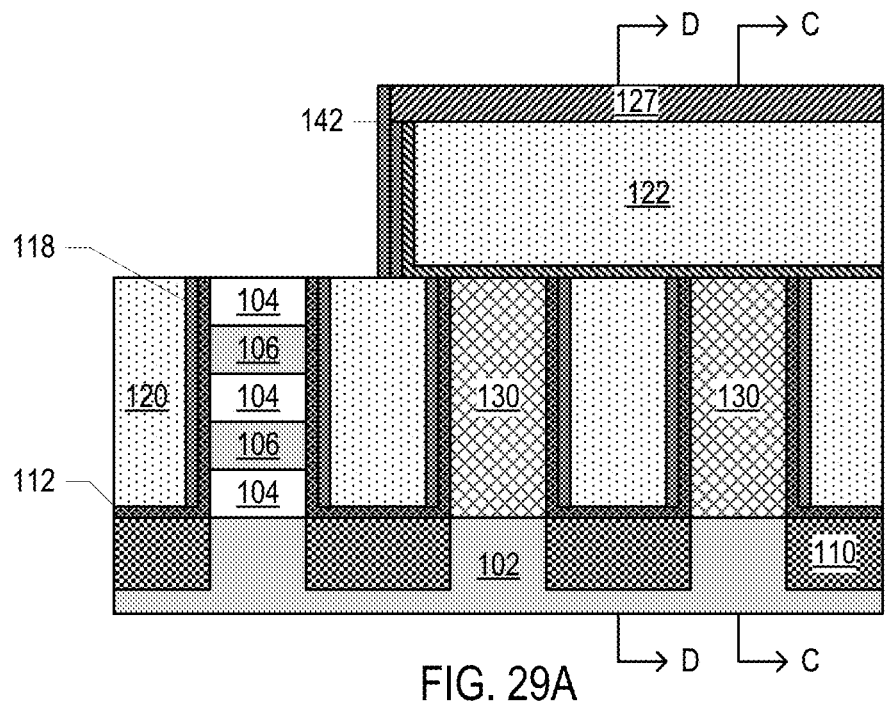
Figure 29B:
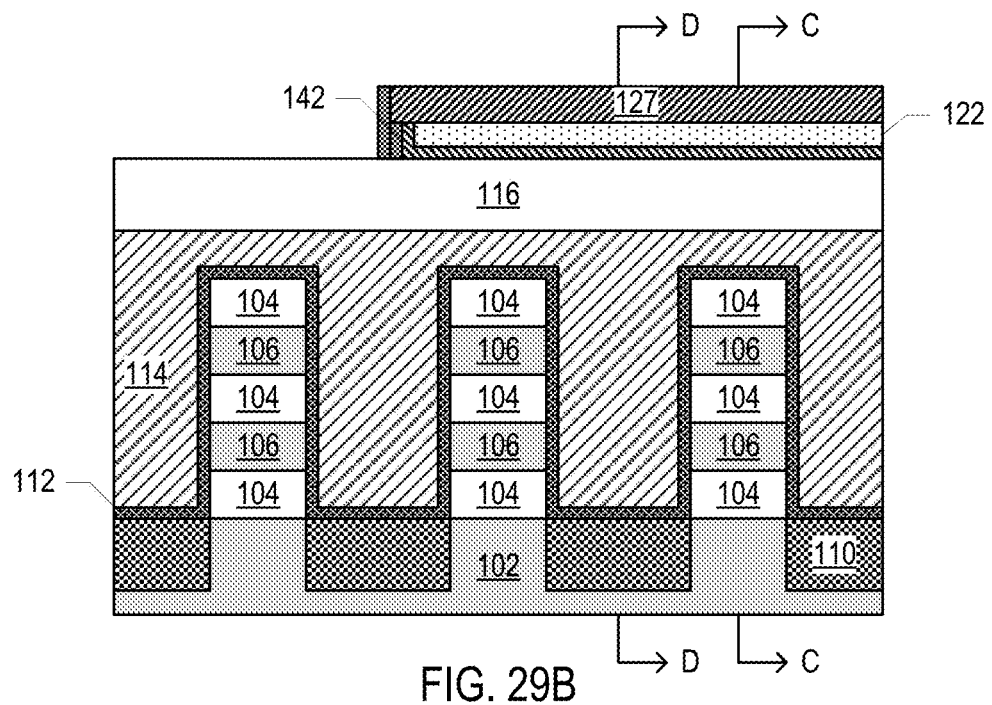
Figure 29C:
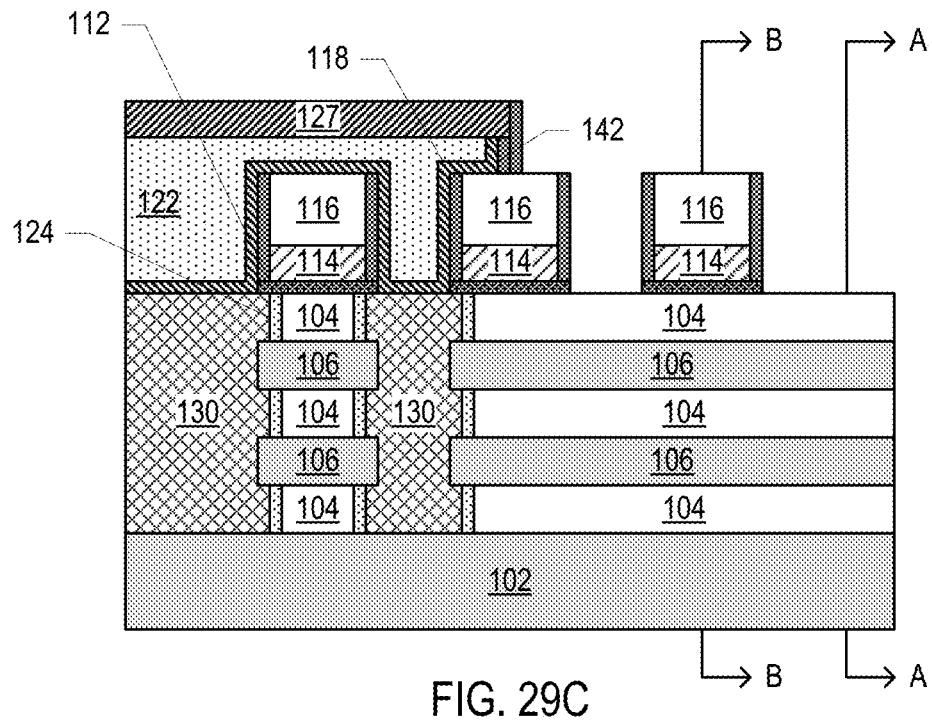
Figure 29D:
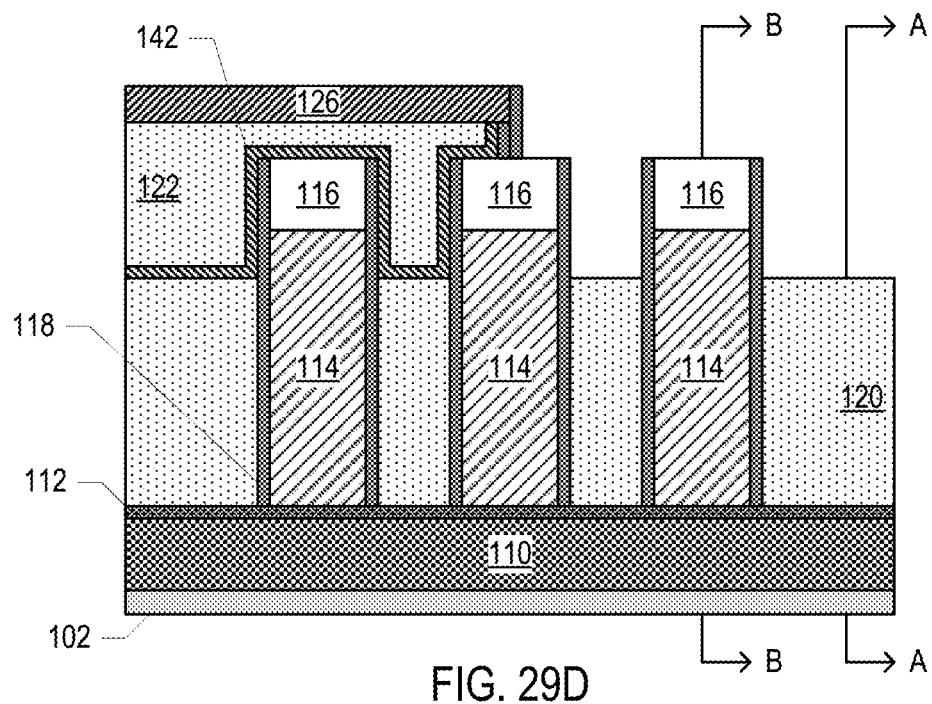
Figure 30A:
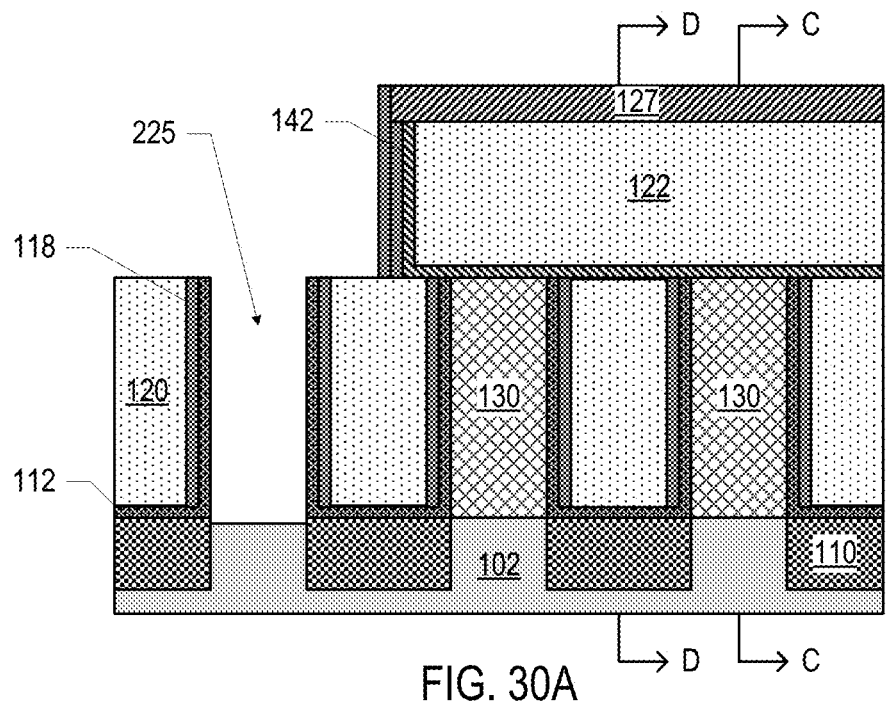
Figure 30B:
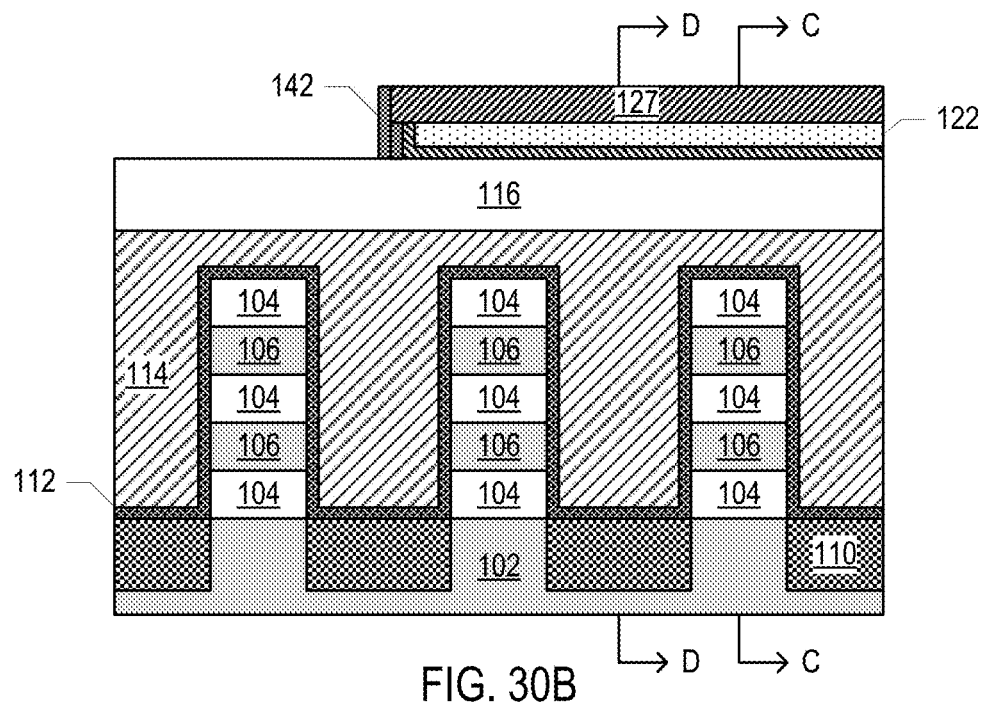
Figure 30C:
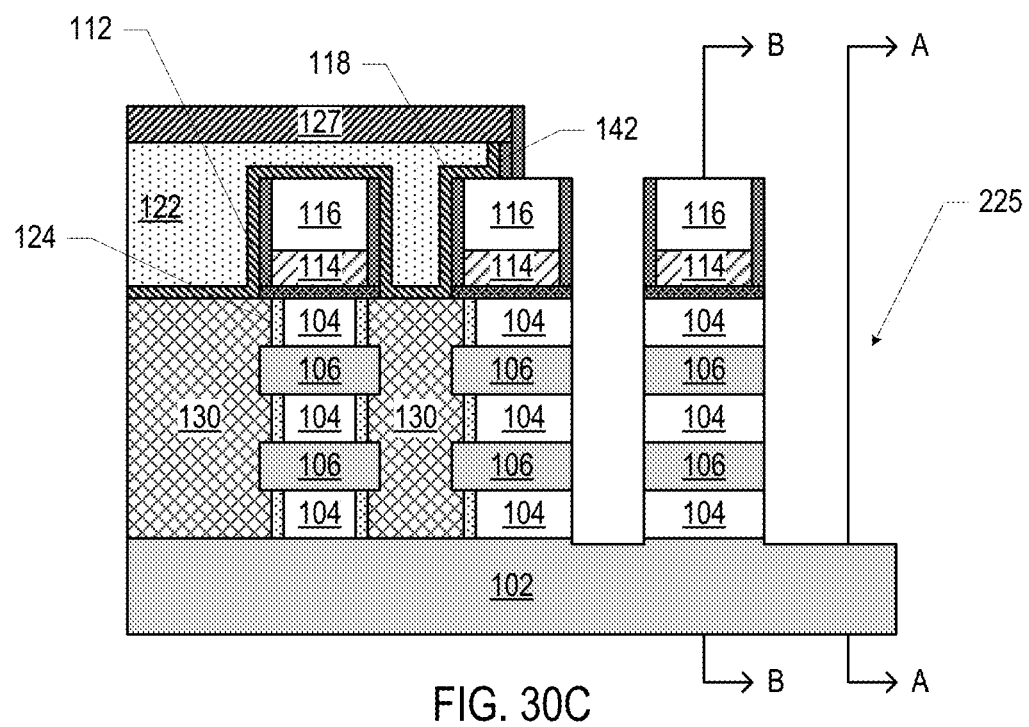
Figure 30D:
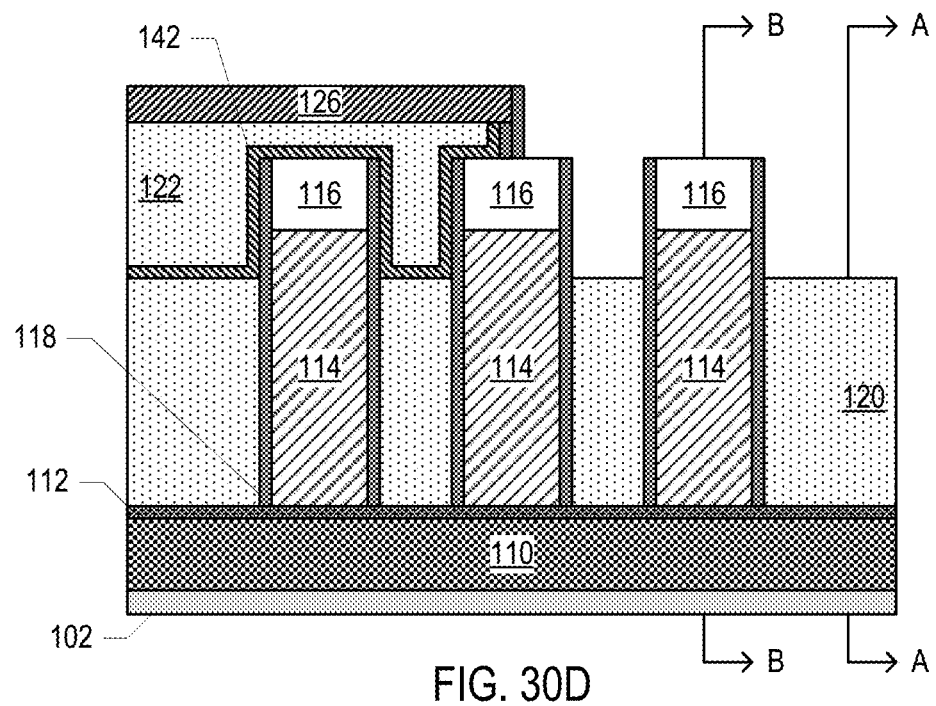
Figure 31A:
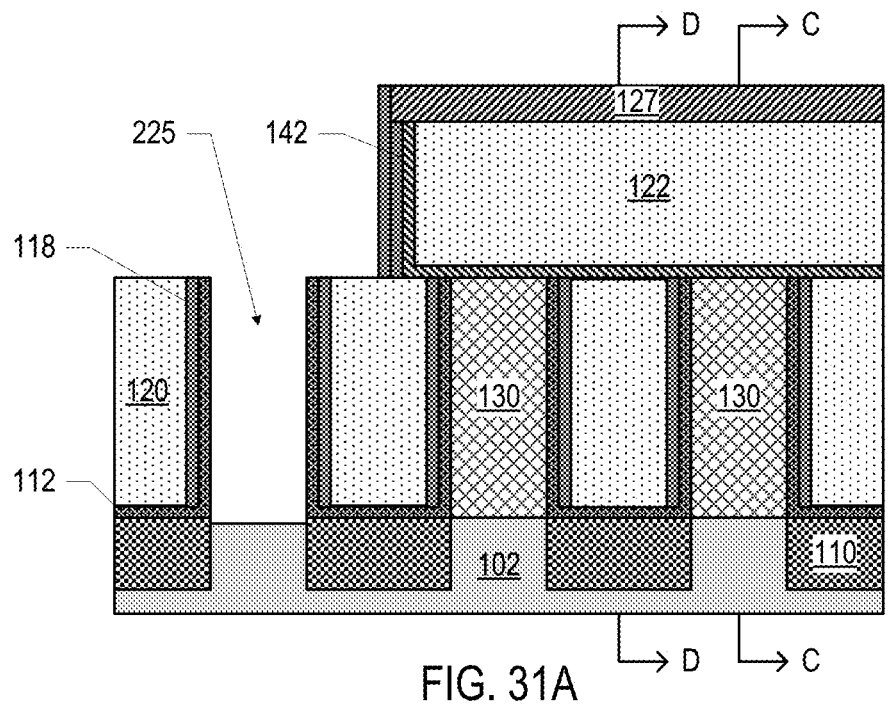
Figure 31B:
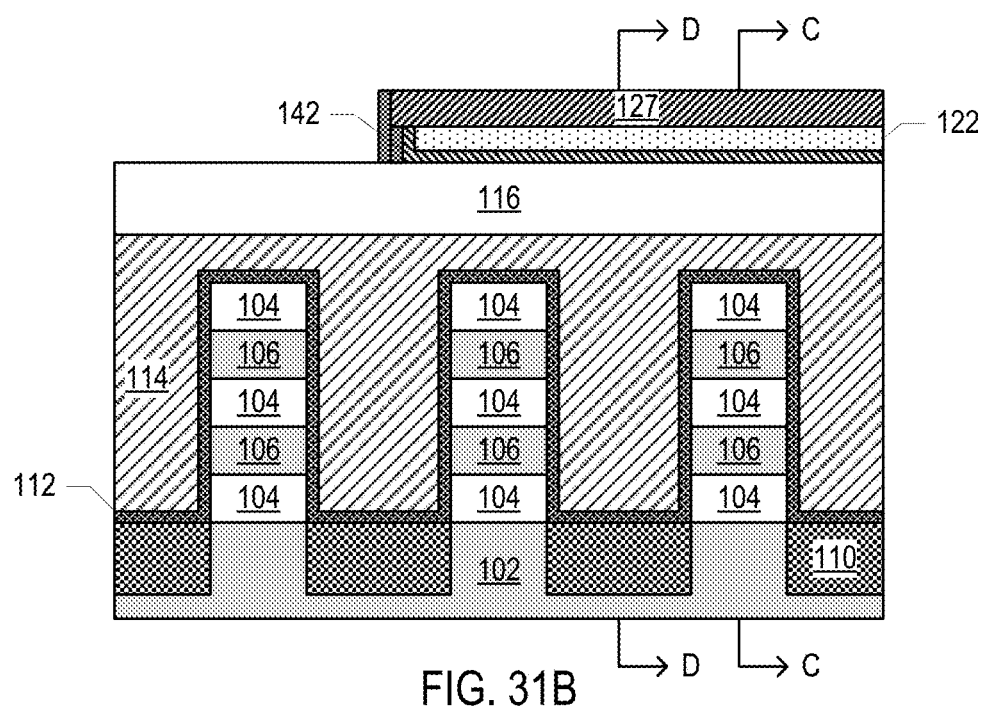
Figure 31C:
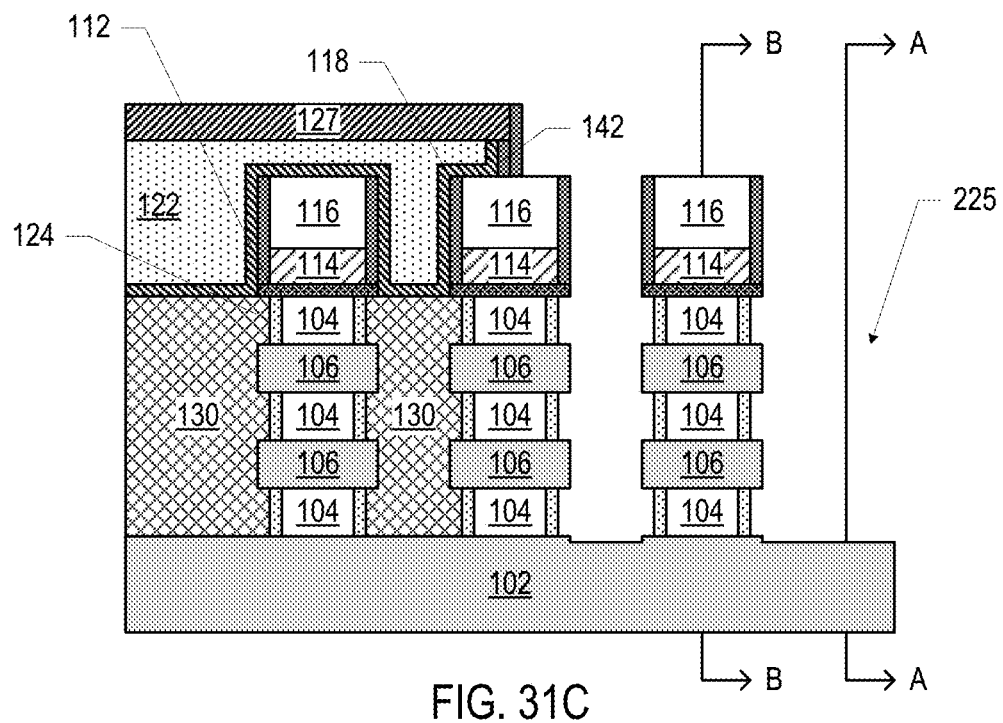
Figure 31D:
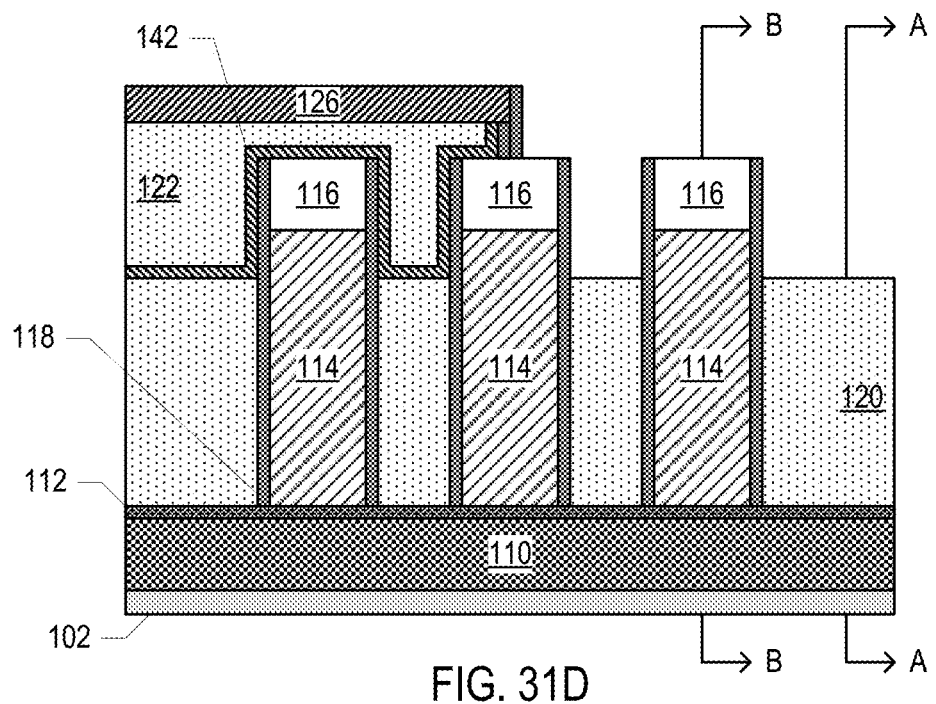
Figure 32A:
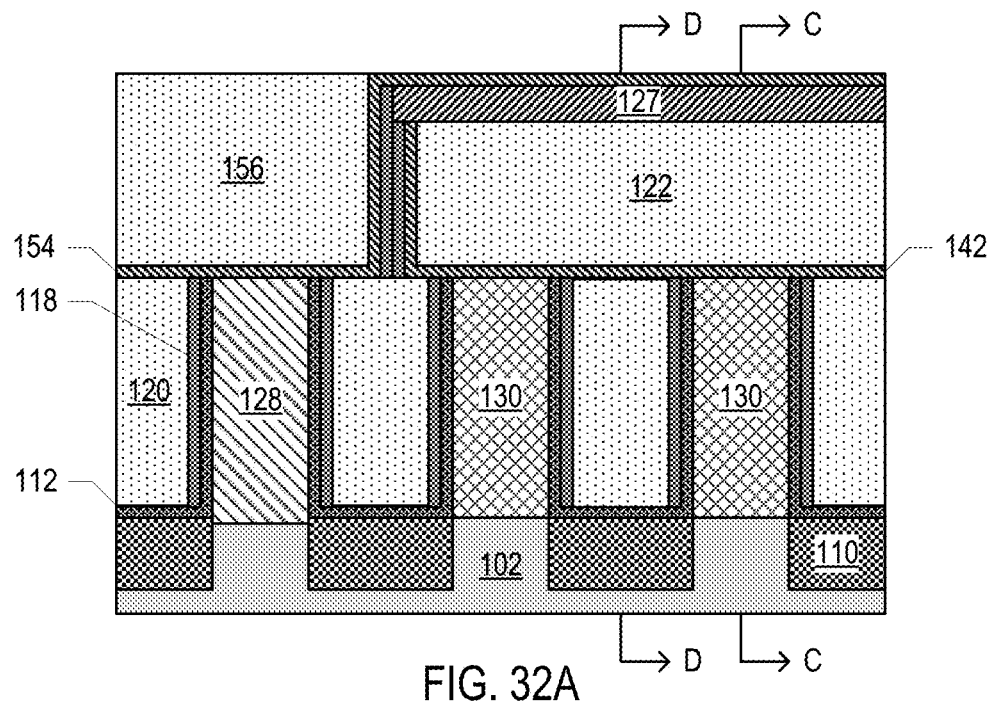
Figure 32B:
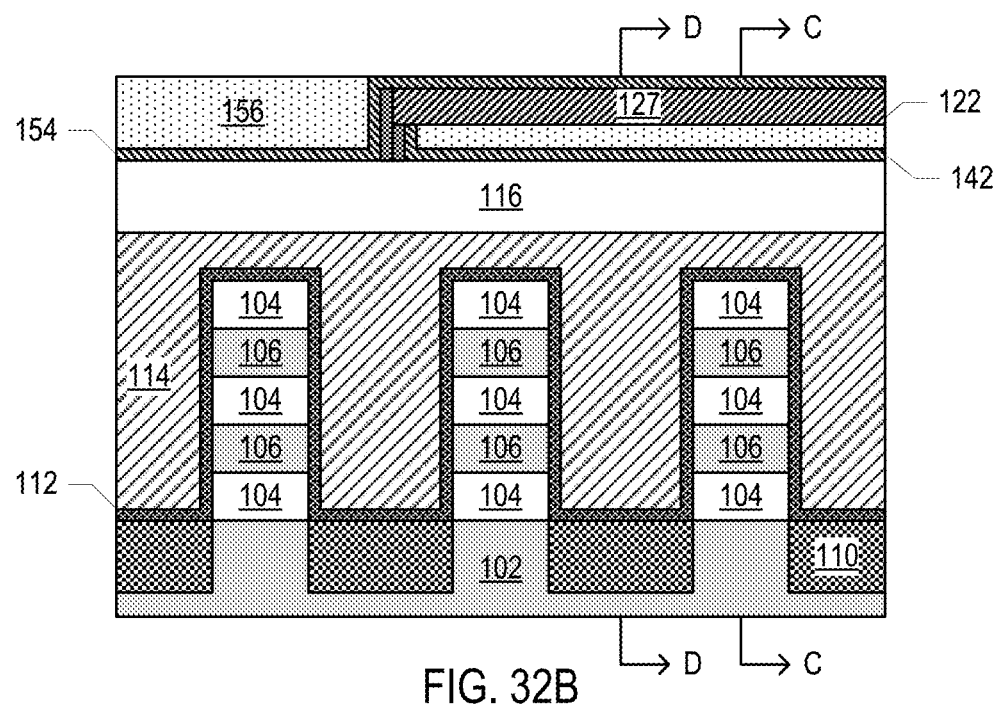
Figure 32C:
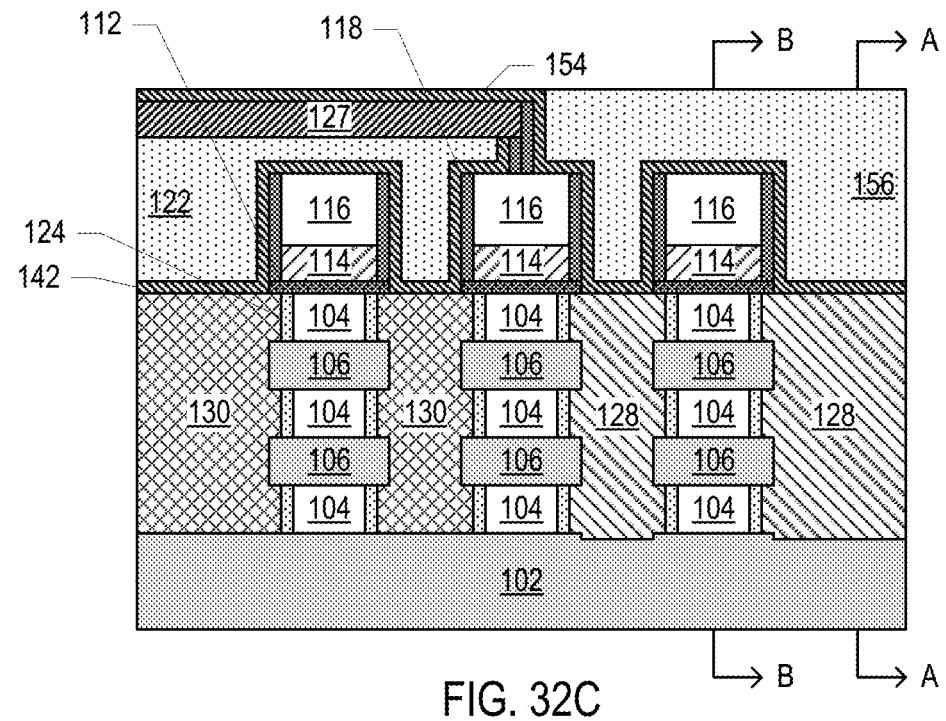
Figure 32D:
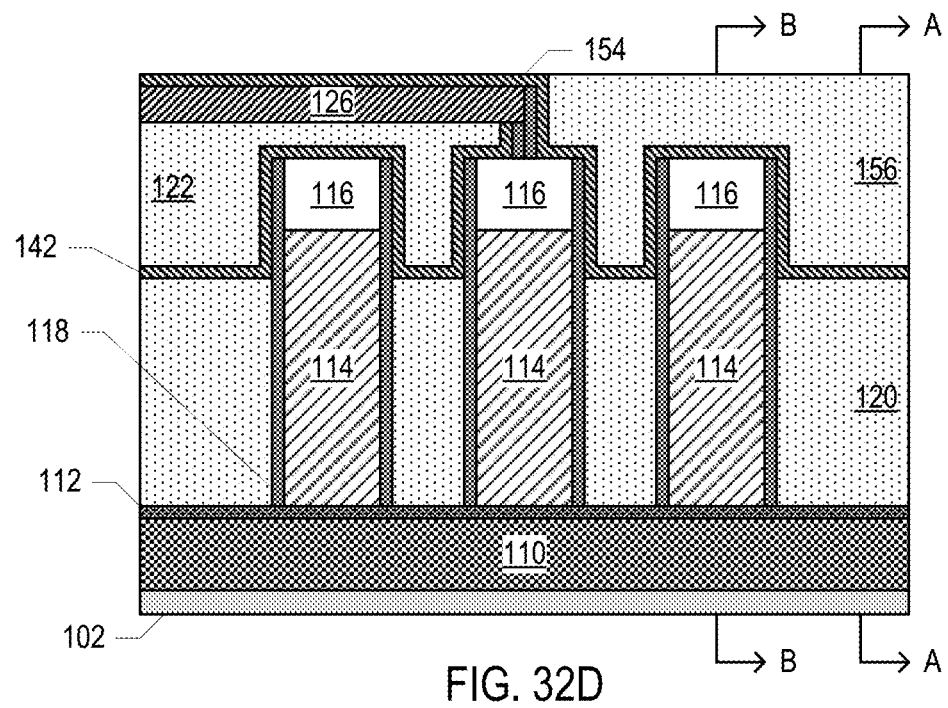
Figure 33A:
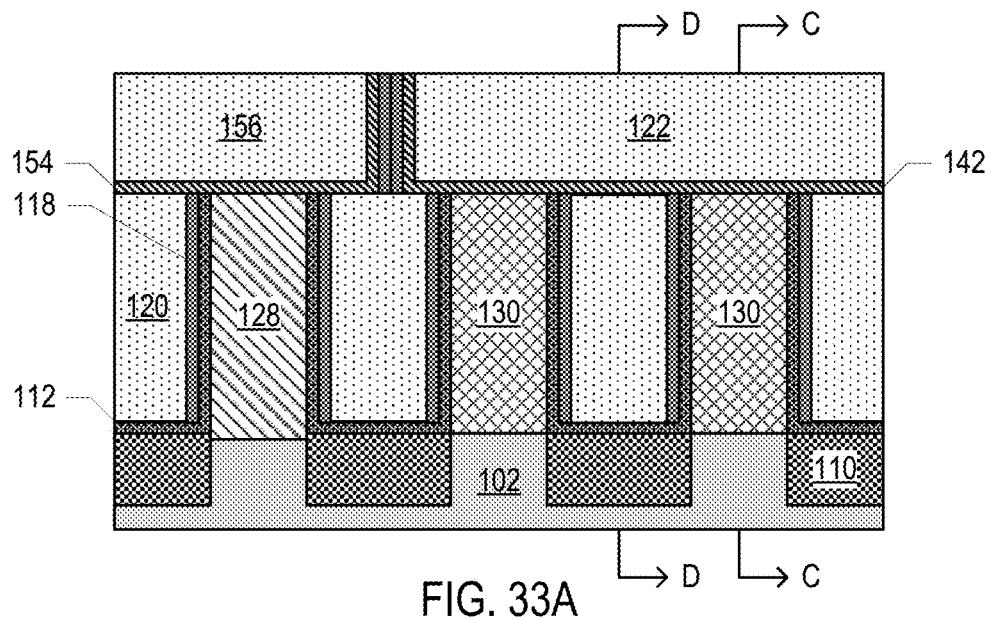
Figure 33B:
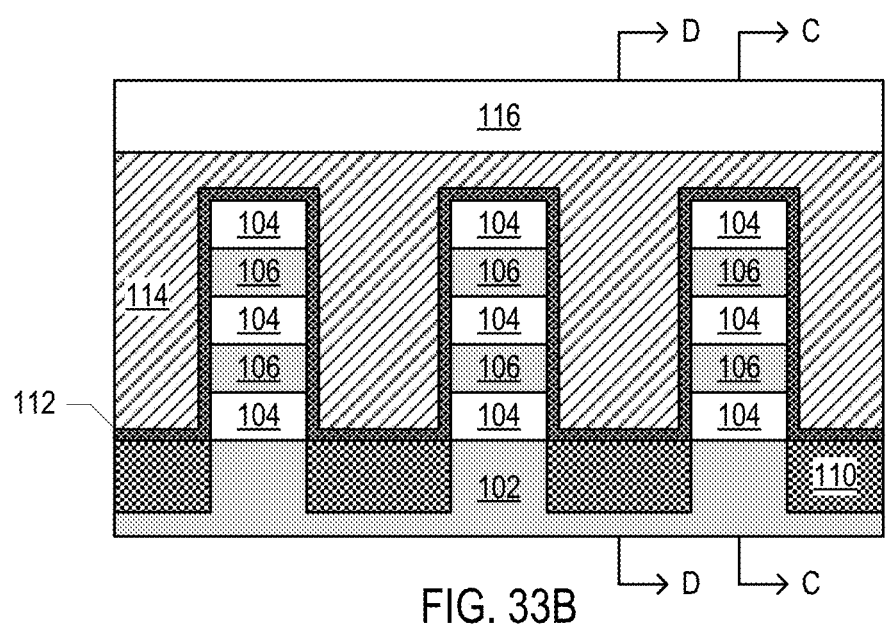
Figure 33C:
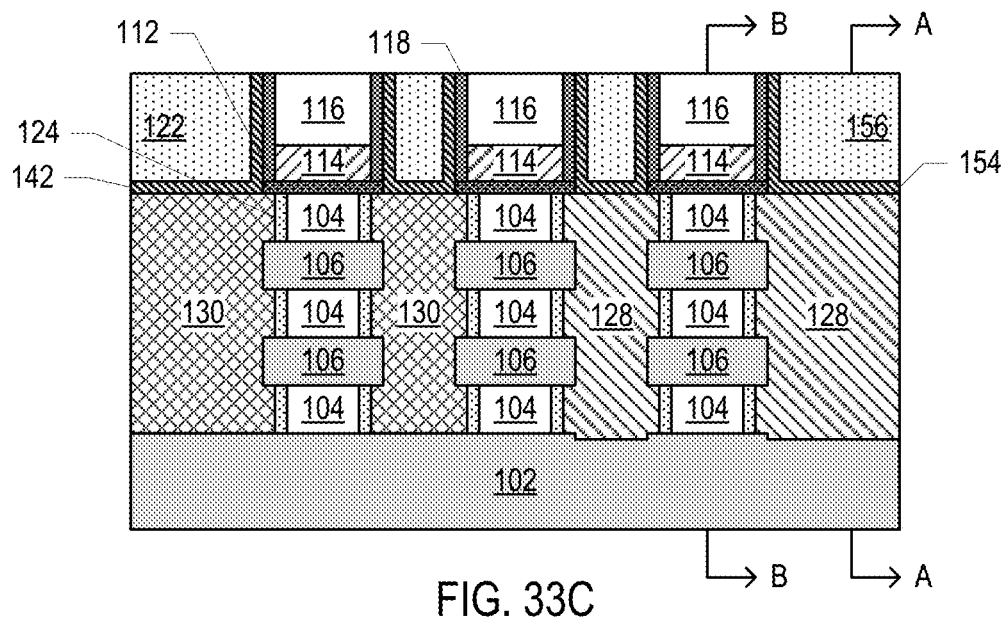
Figure 33D:
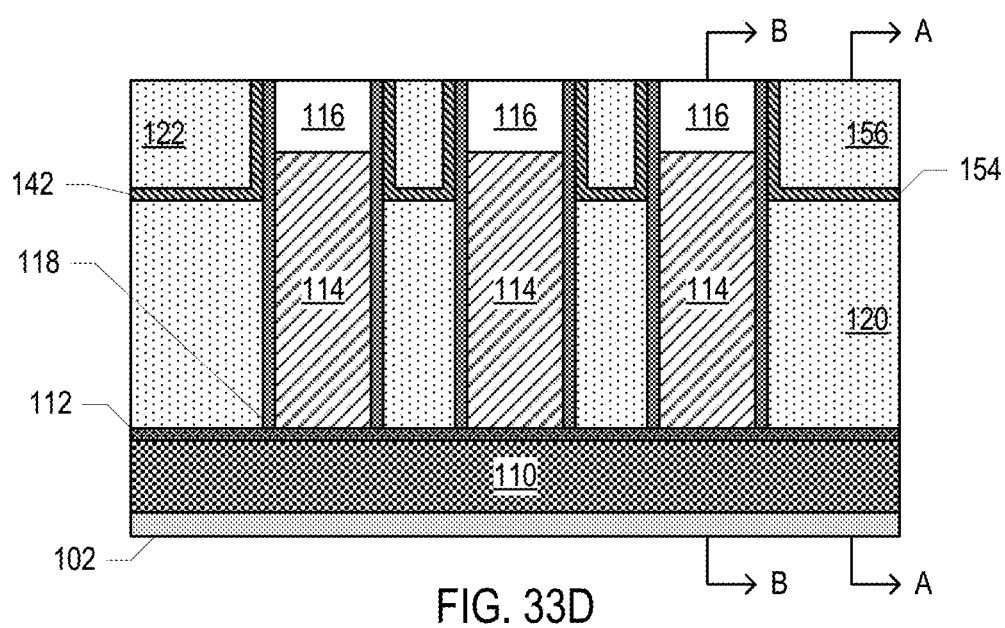
Figure 34A:
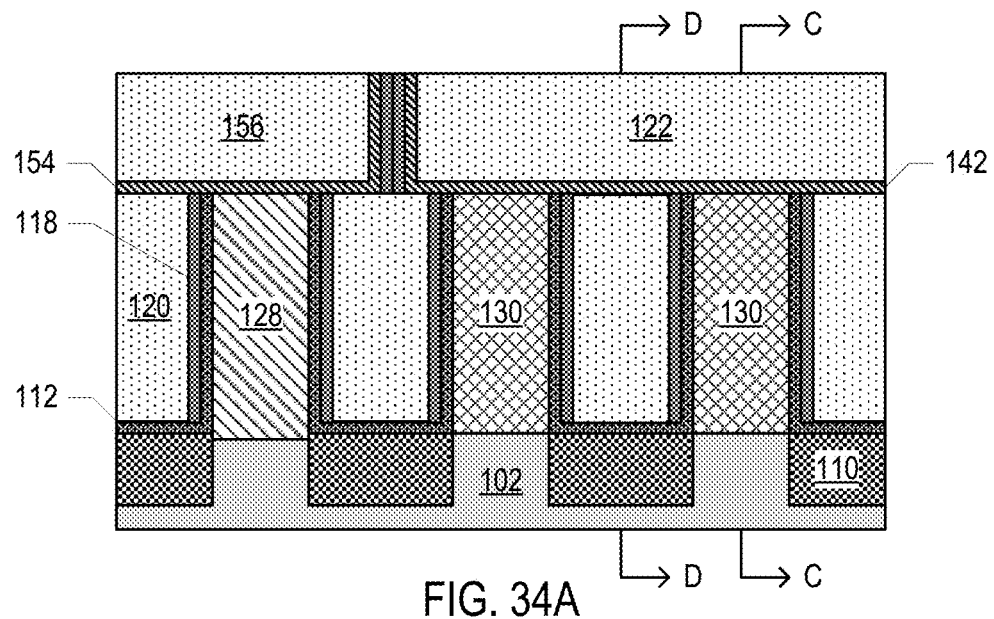
Figure 34B:
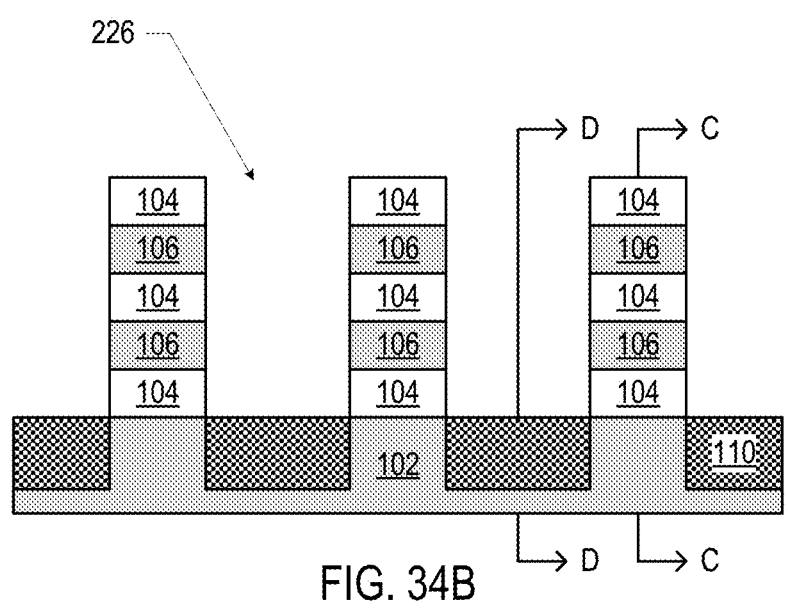
Figure 34C:
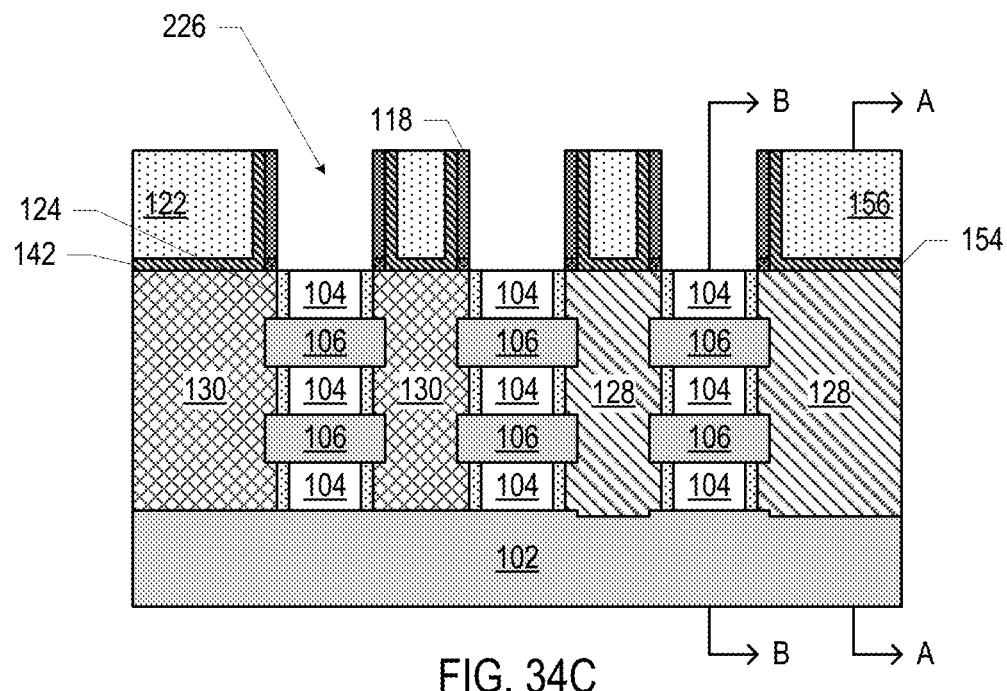
Figure 34D:
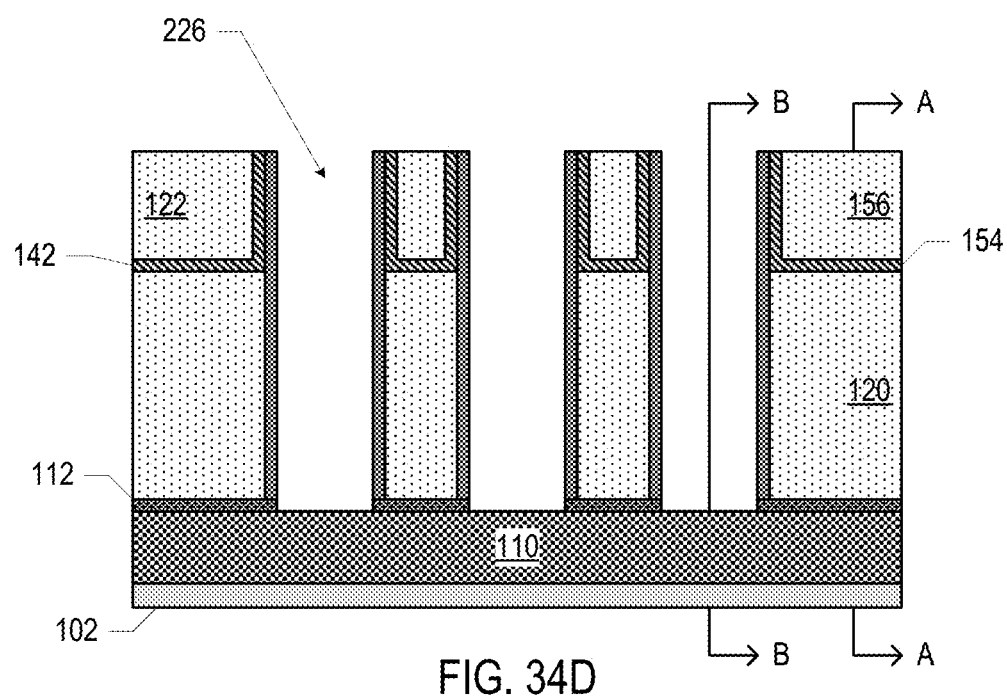
Figure 35A:
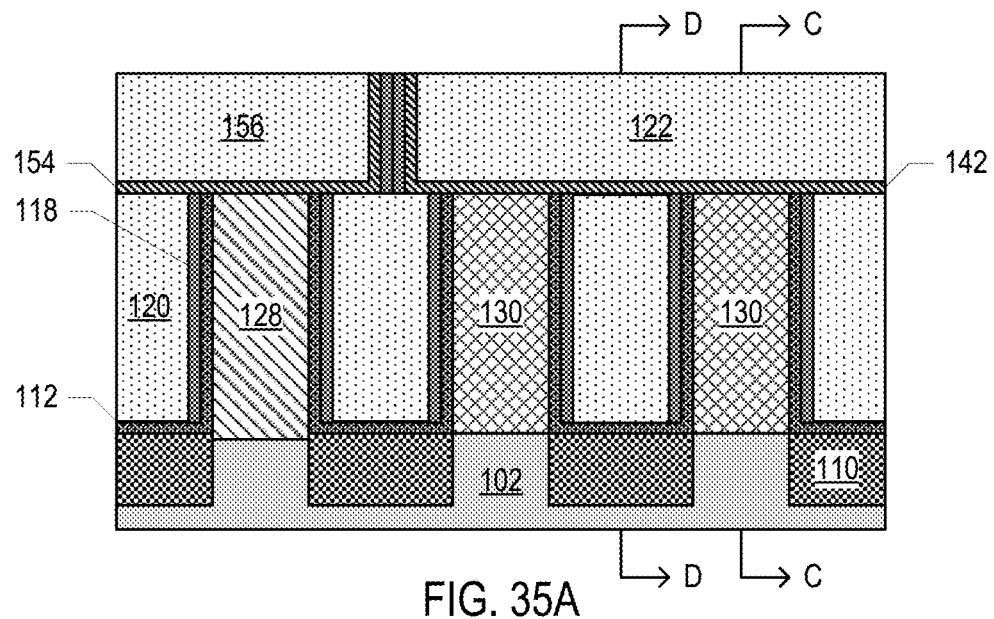
Figure 35B:
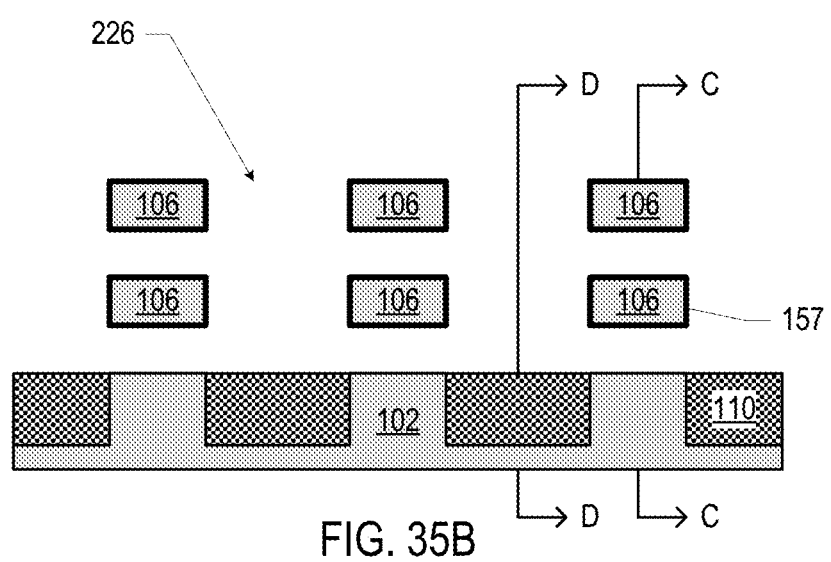
Figure 35C:
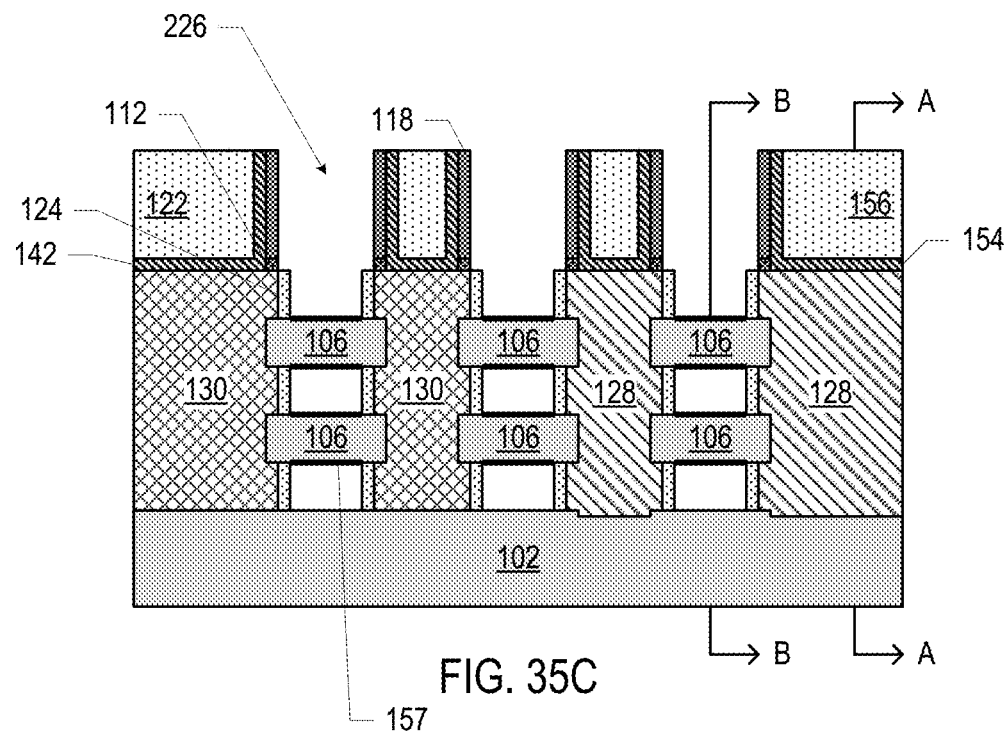
Figure 35D:
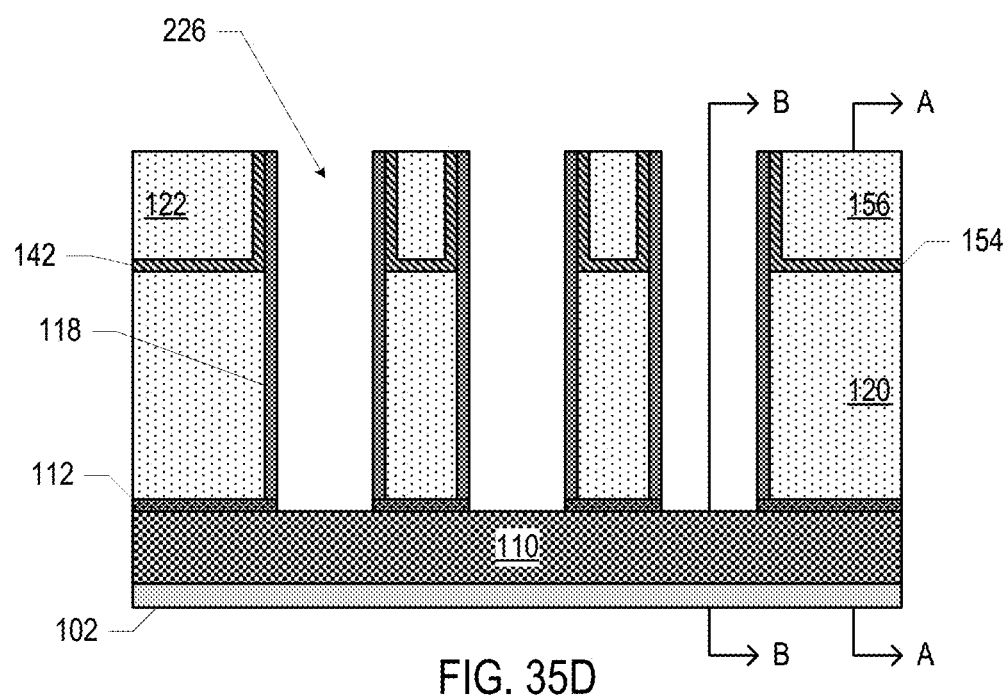
Figure 36A:
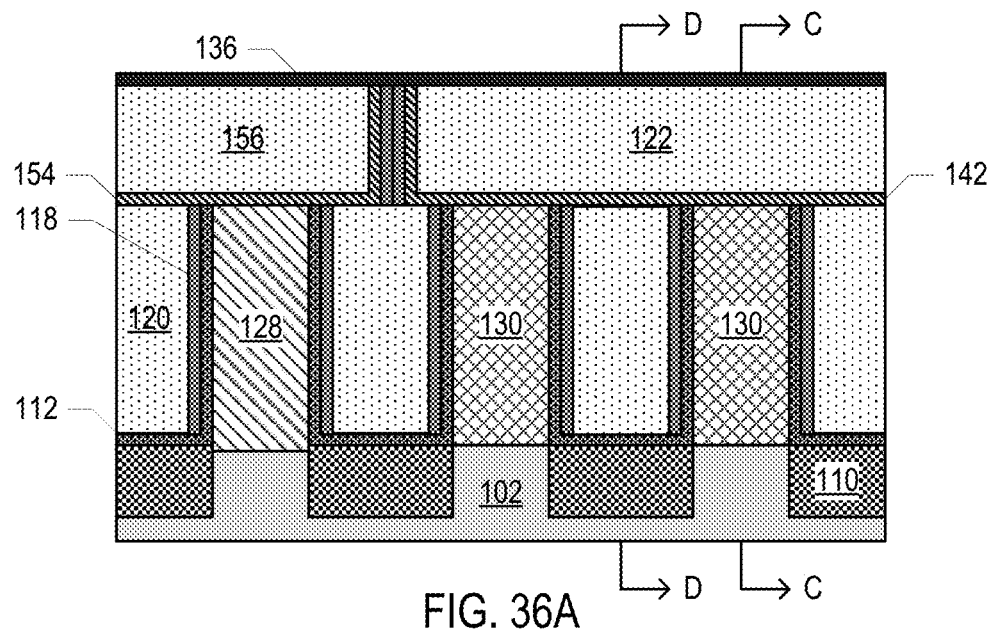
Figure 36B:
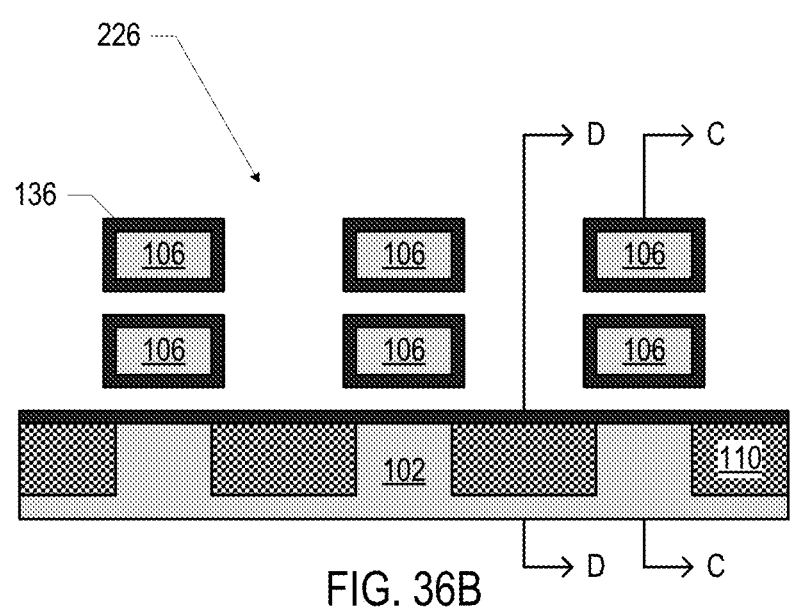
Figure 36C:
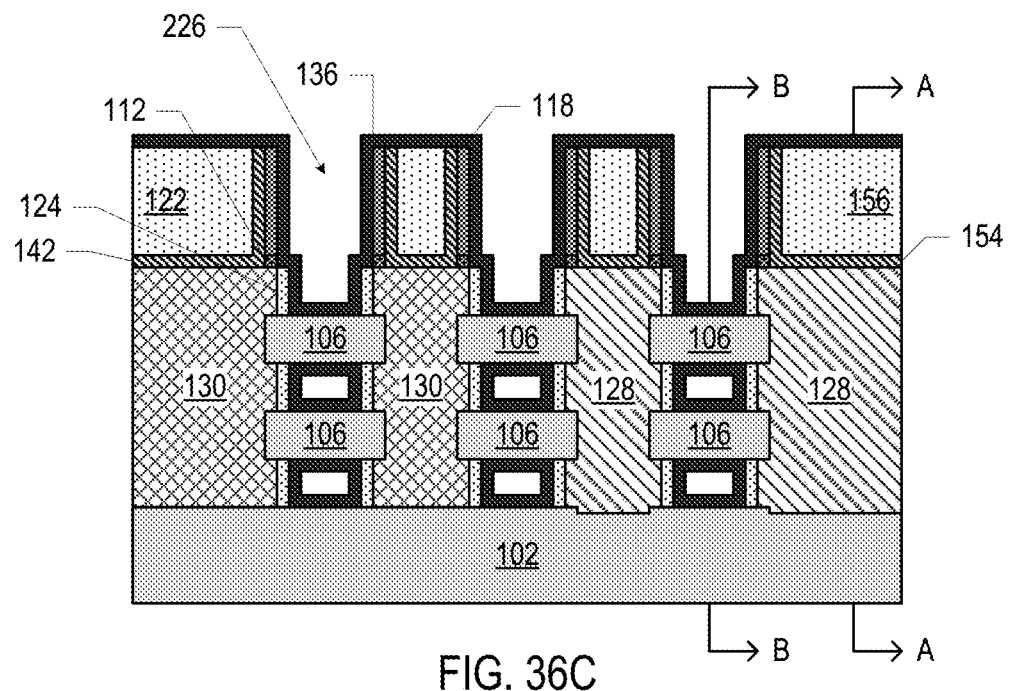
Figure 36D:
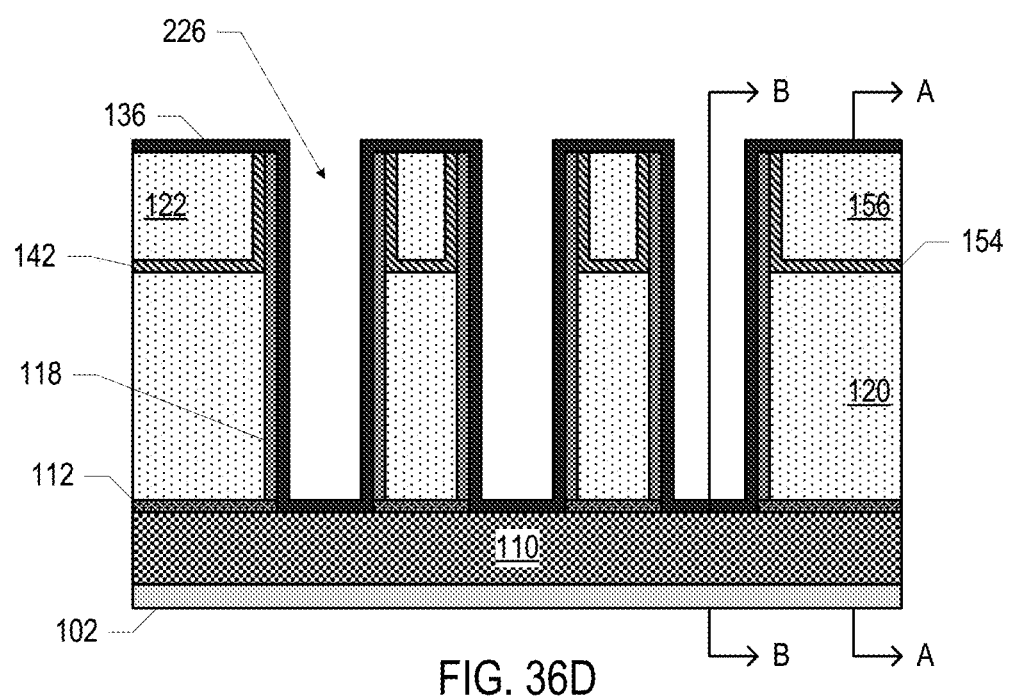
Figure 37A:
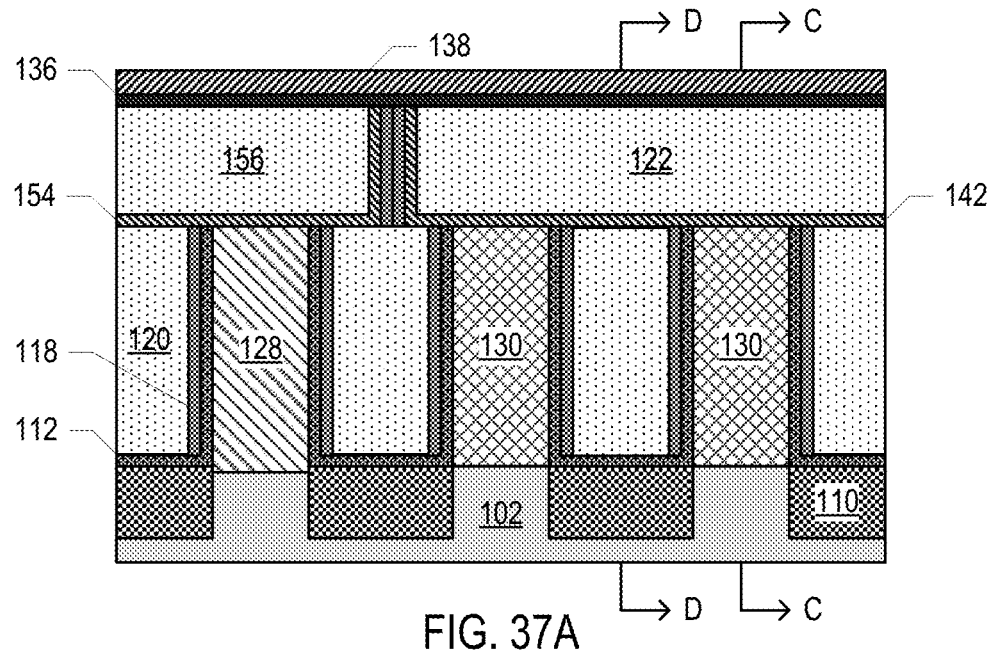
Figure 37B:
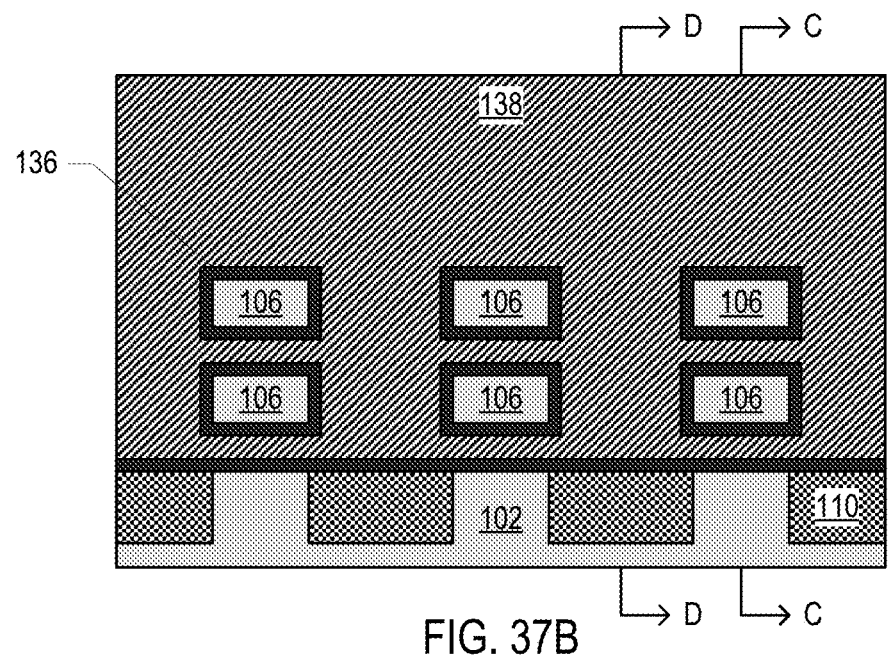
Figure 37C:
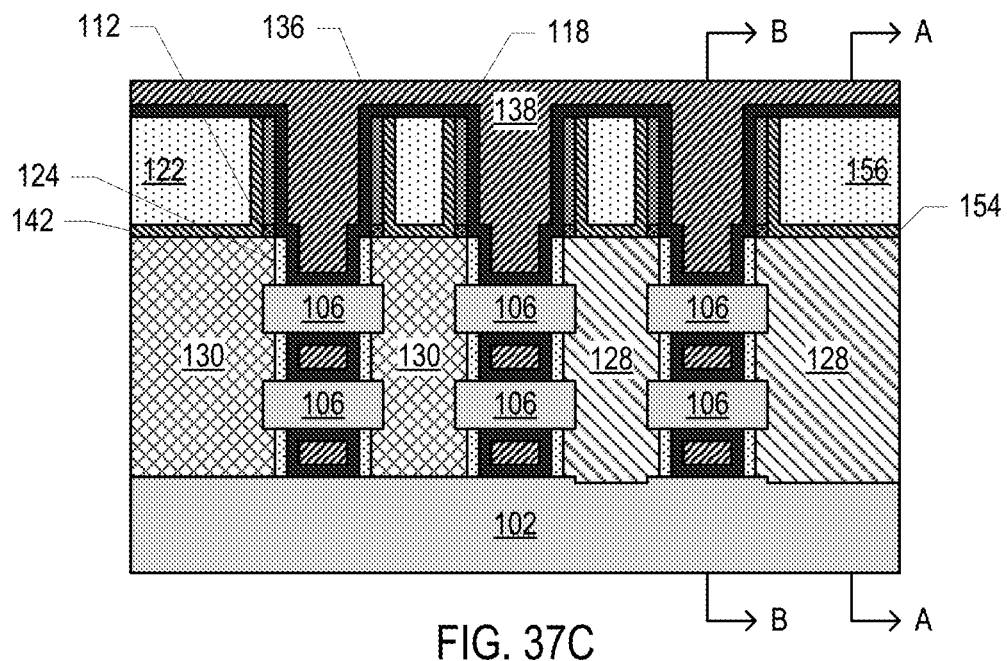
Figure 37D:
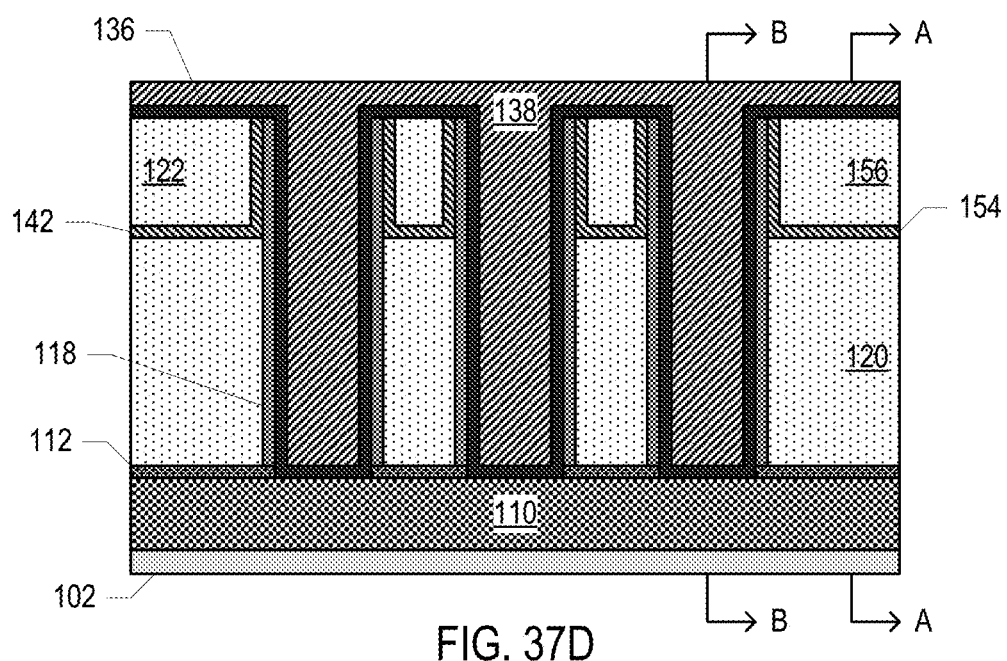
Figure 38A:
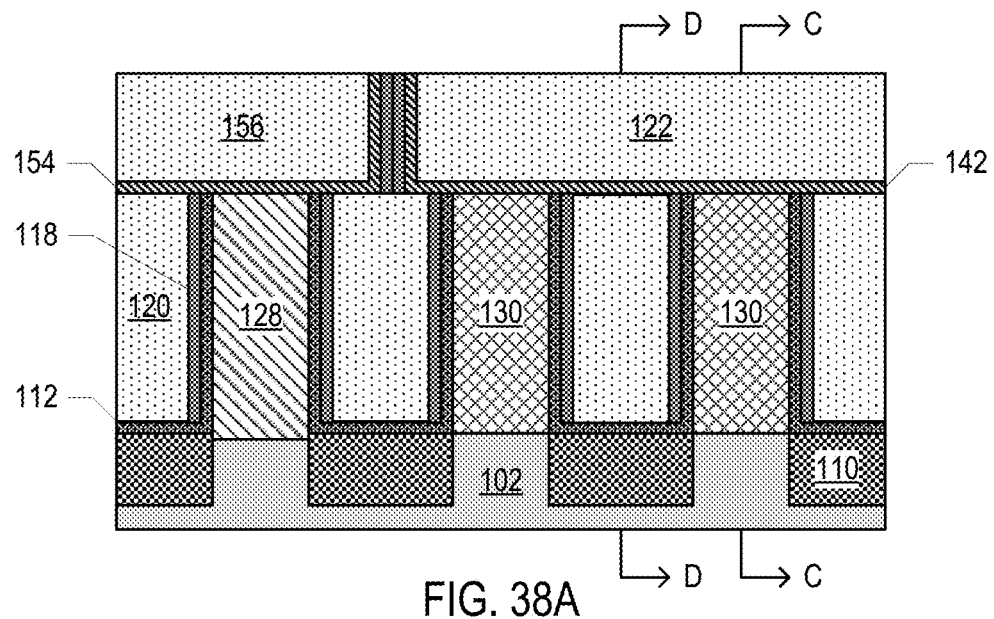
Figure 38B:
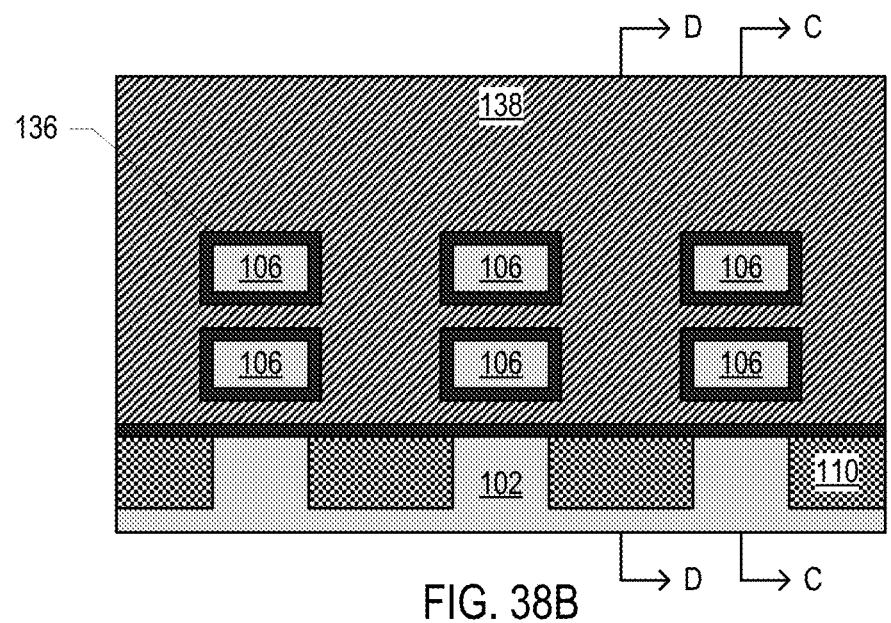
Figure 38C:
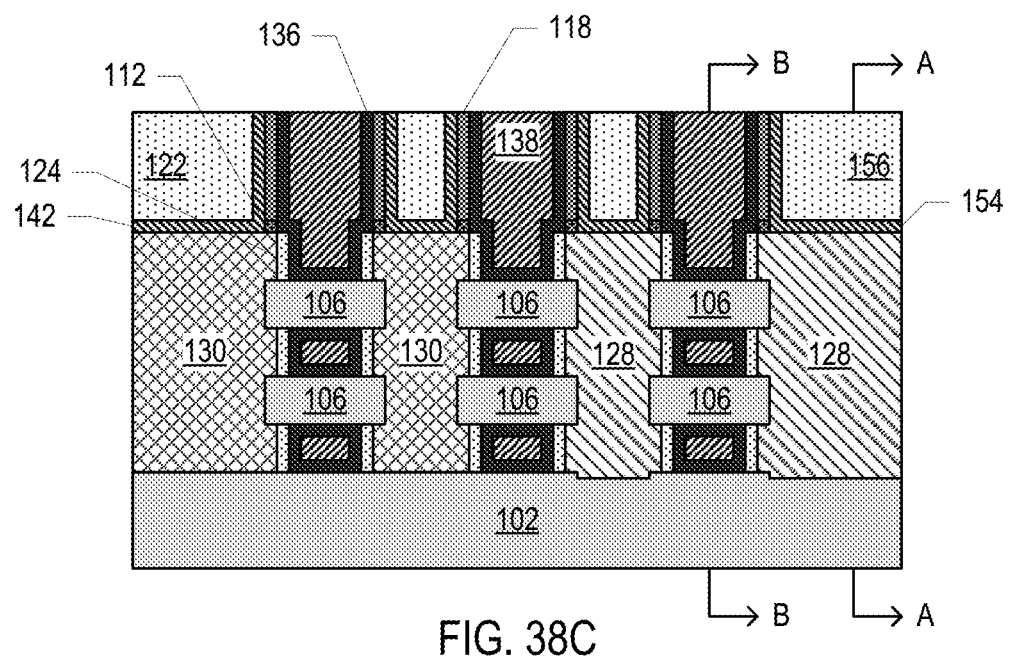
Figure 38D:
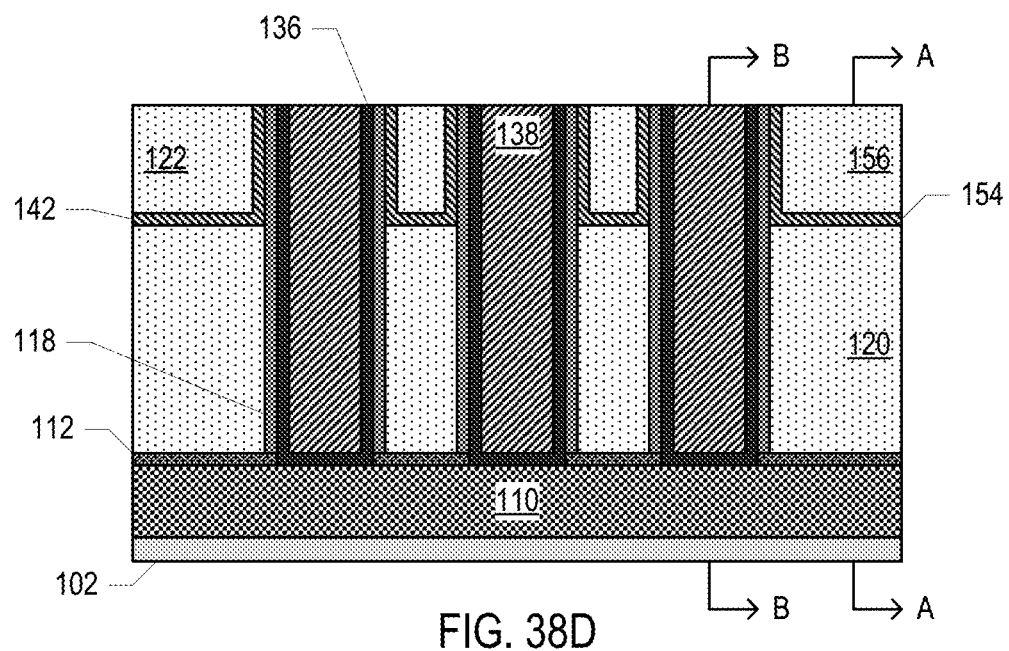
Figure 39A:
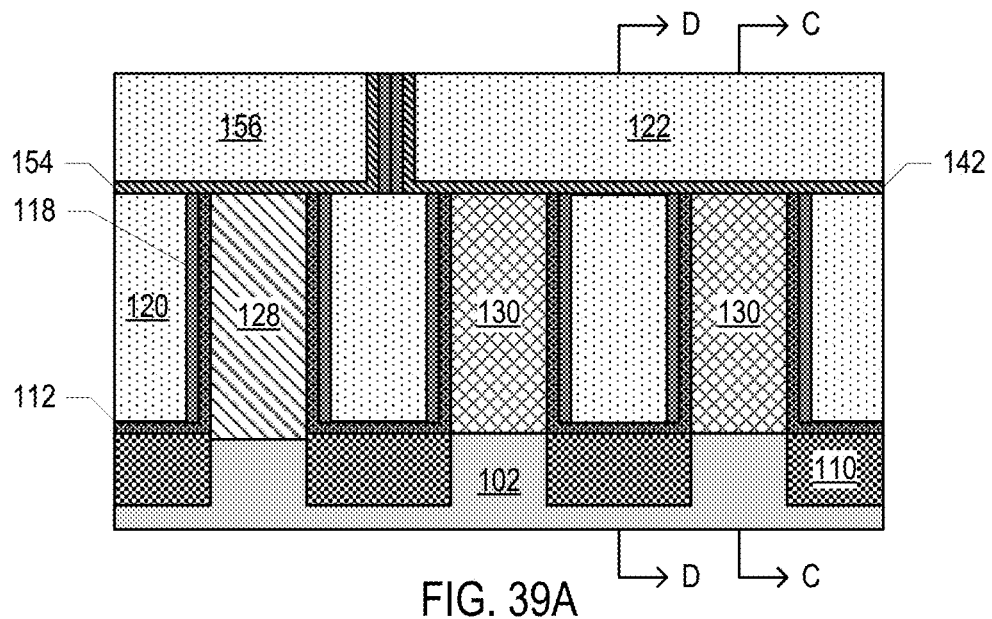
Figure 39B:
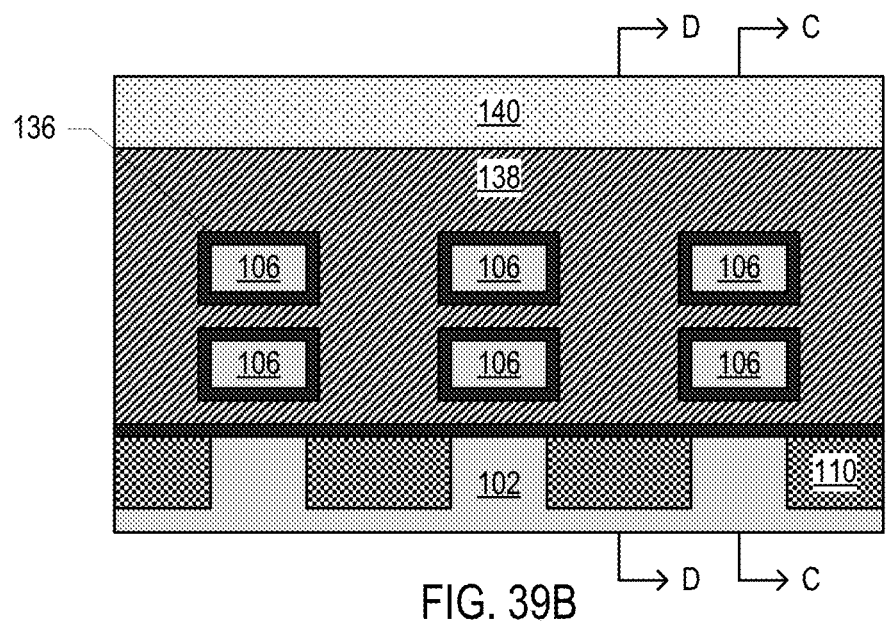
Figure 39C:
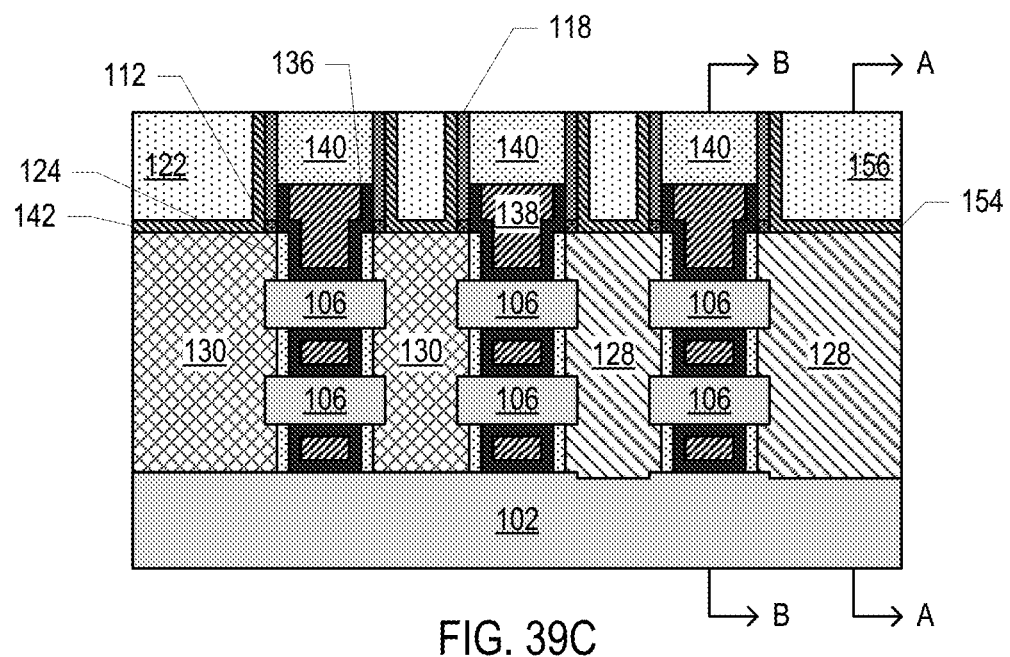
Figure 39D:
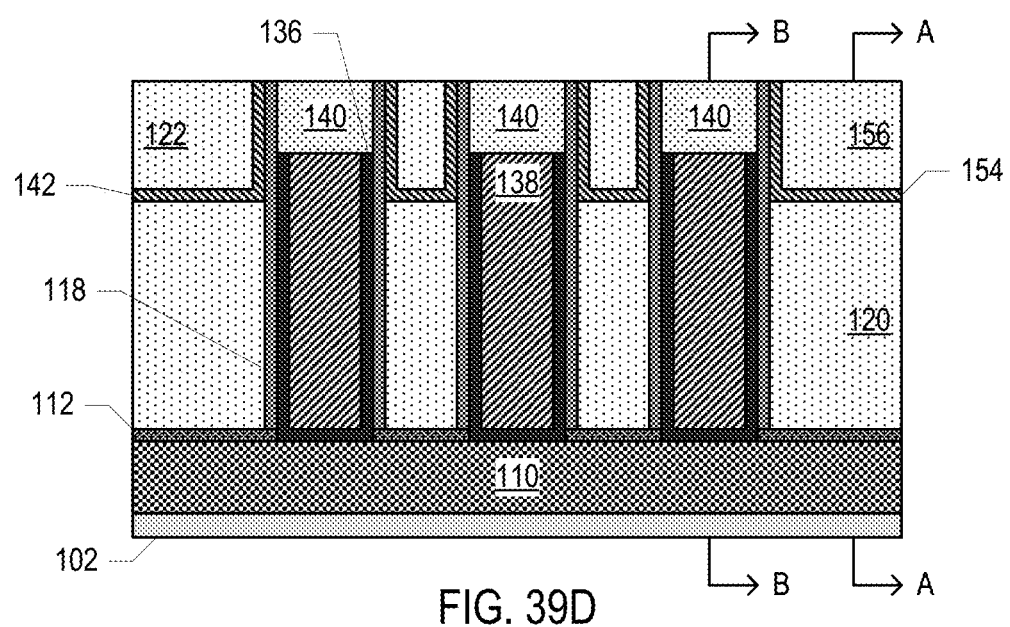
Figure 40A:
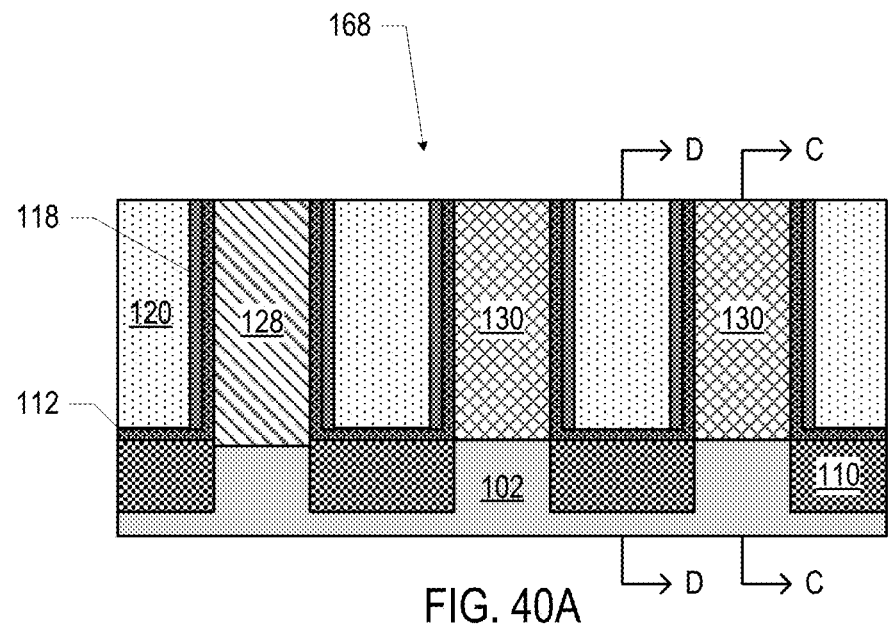
Figure 40B:
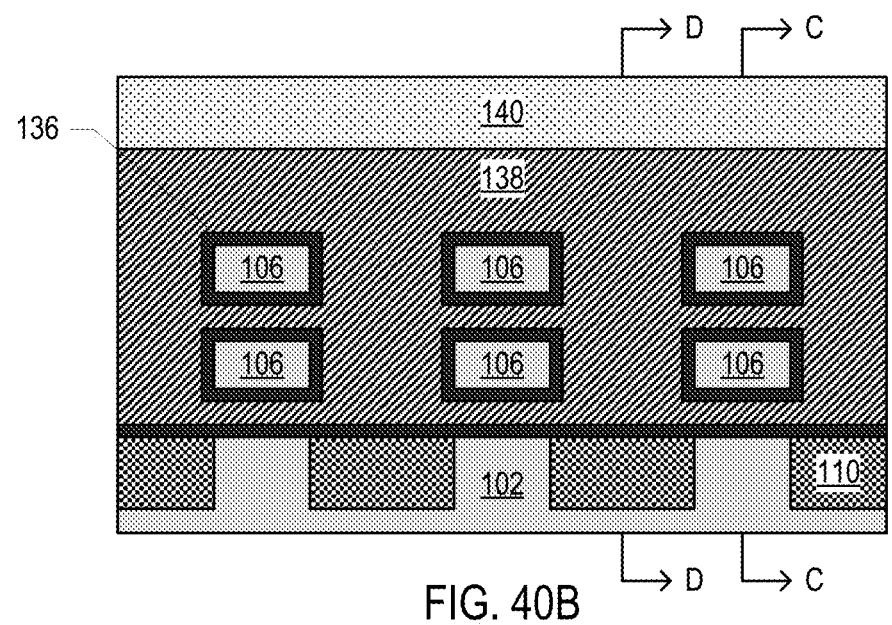
Figure 40C:
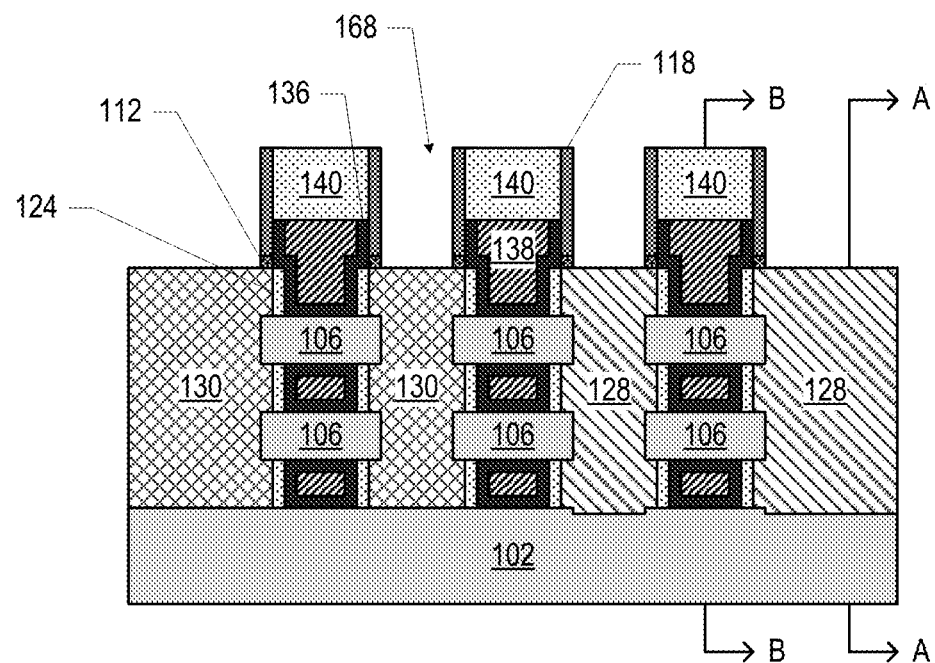
Figure 40D:
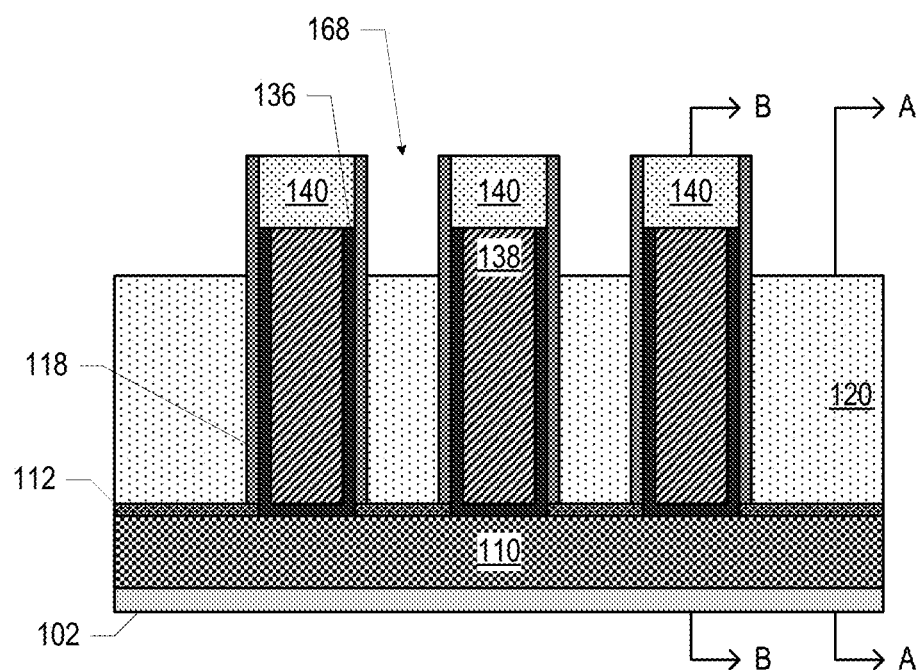
Figure 41A:
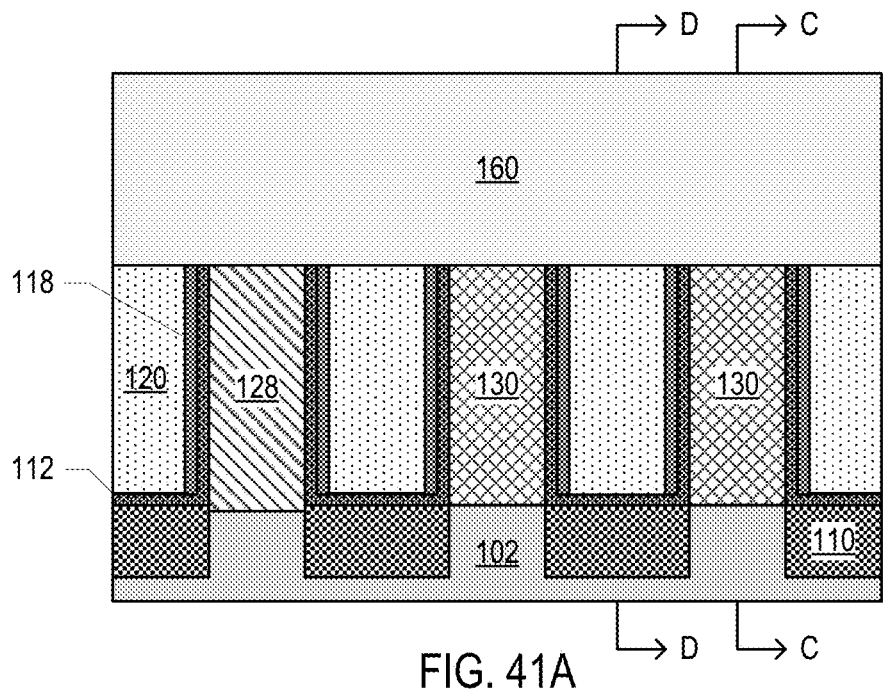
Figure 41B:
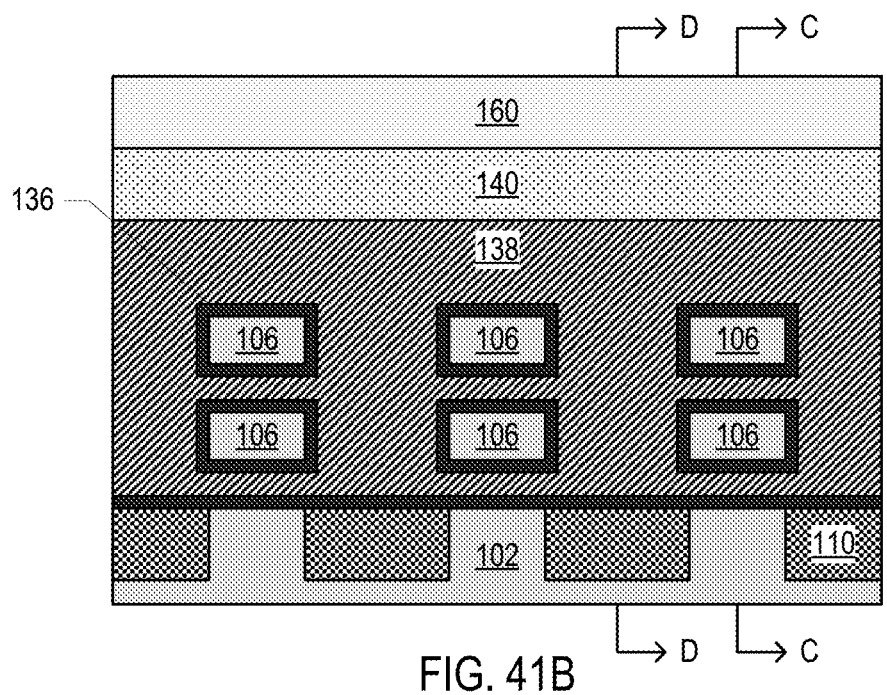
Figure 41C:
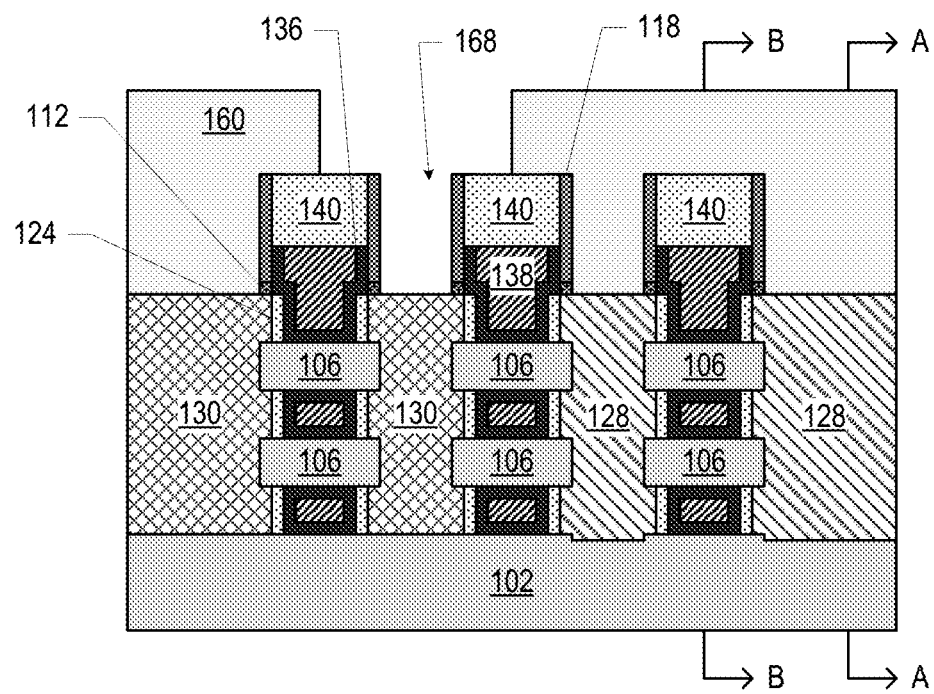
Figure 41D:
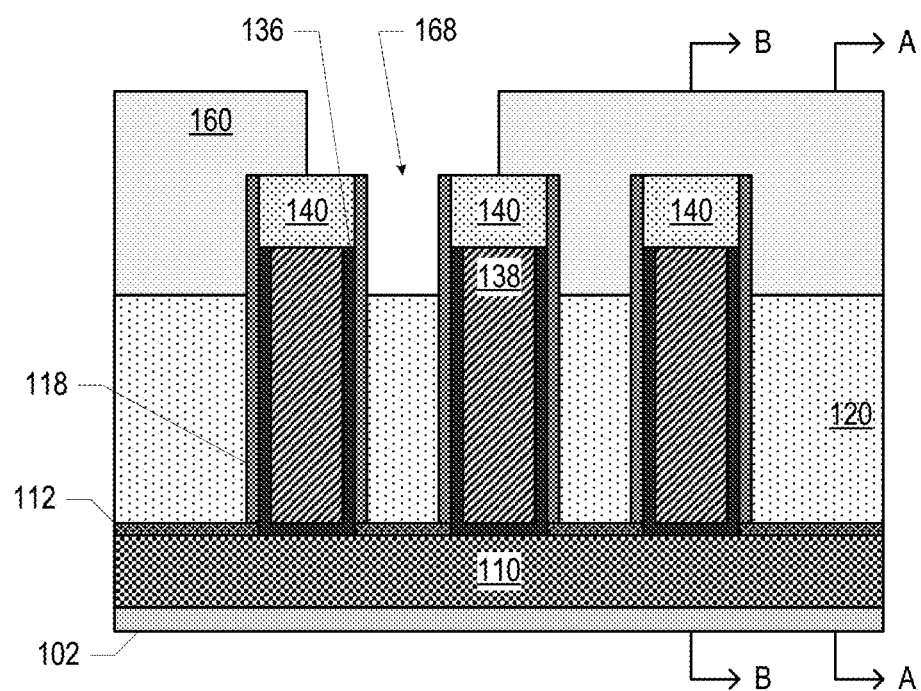
Figure 42A:
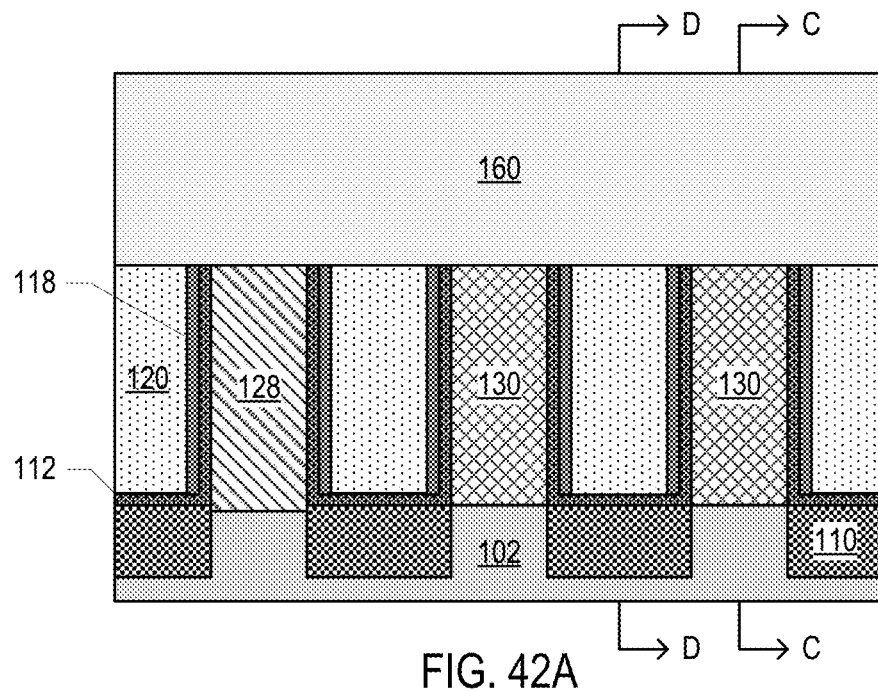
Figure 42B:
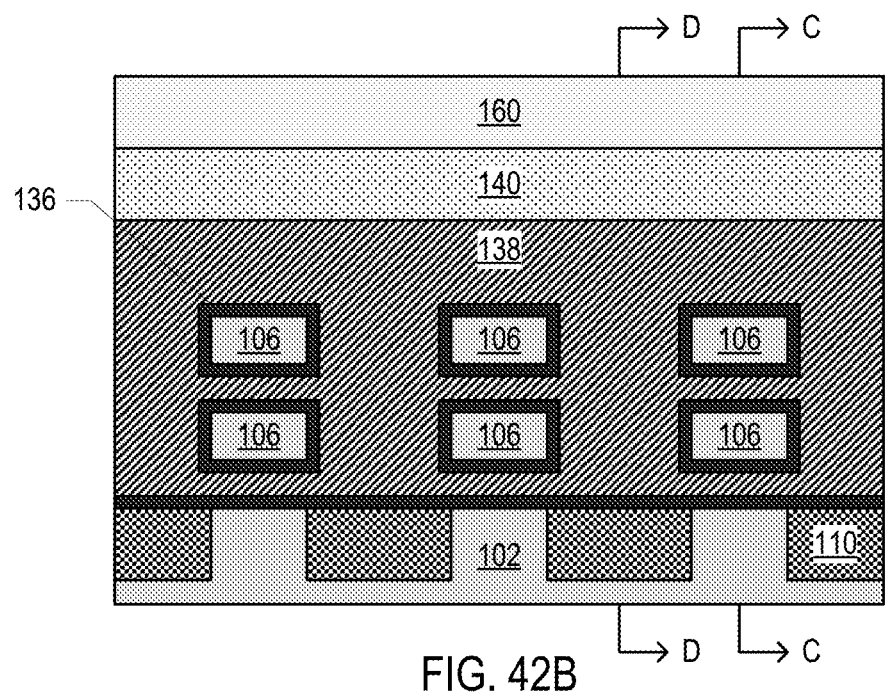
Figure 42C:
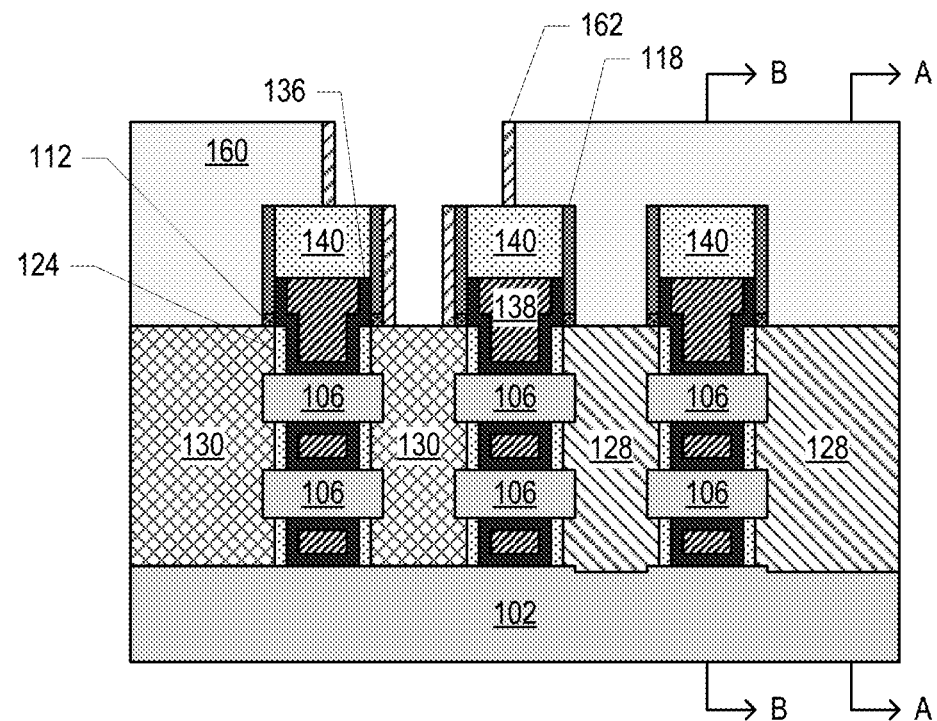
Figure 42D:
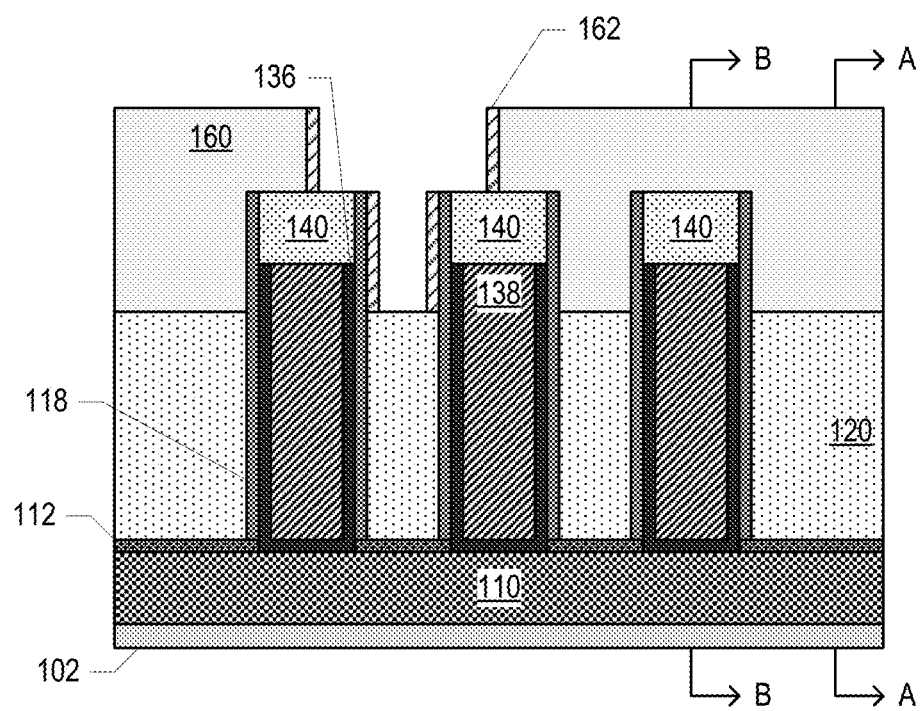
Figure 43A:
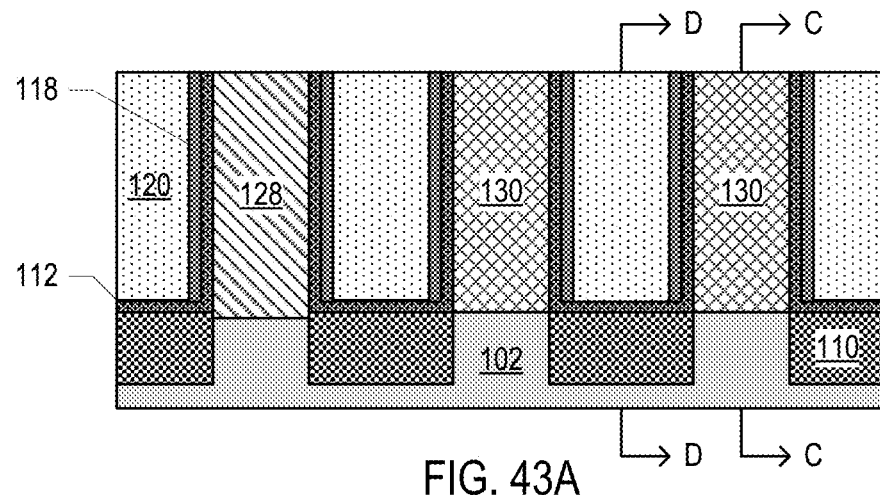
Figure 43B:
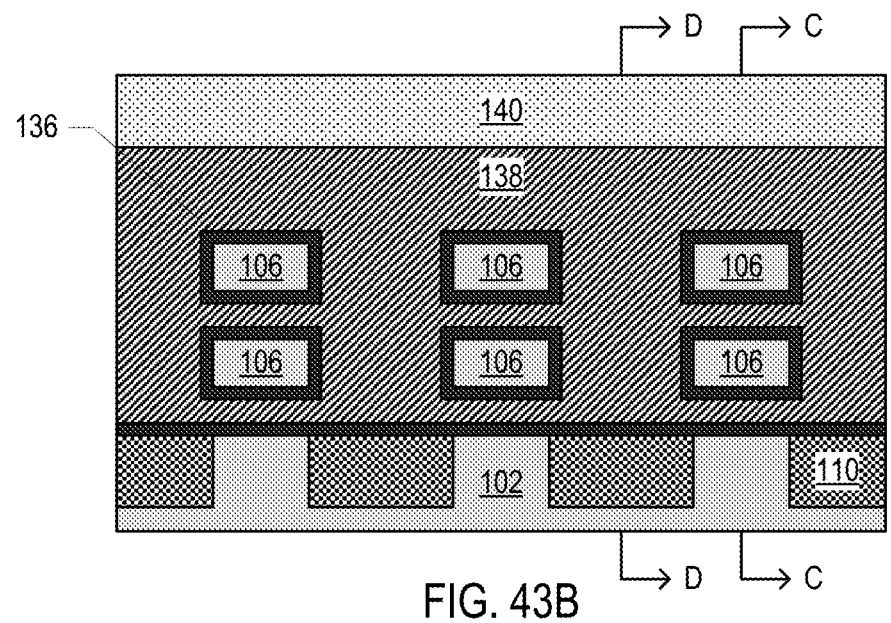
Figure 43C:
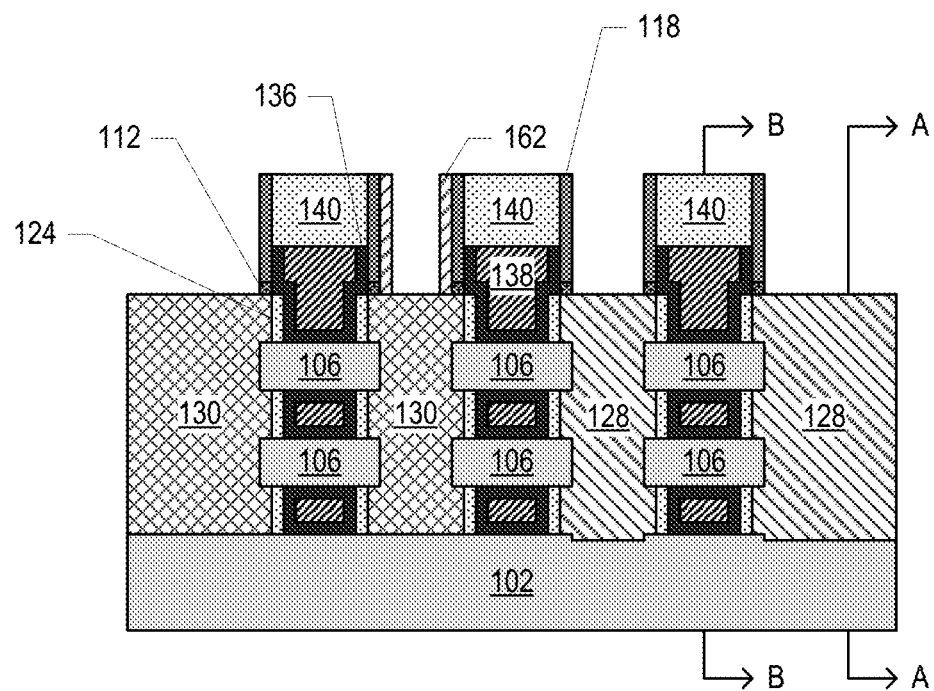
Figure 43D:
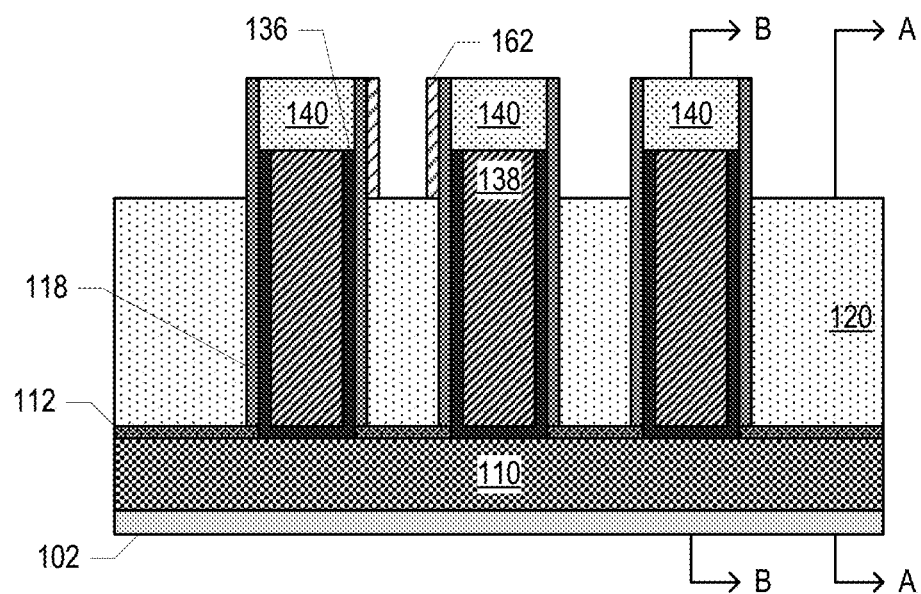
Figure 44A:
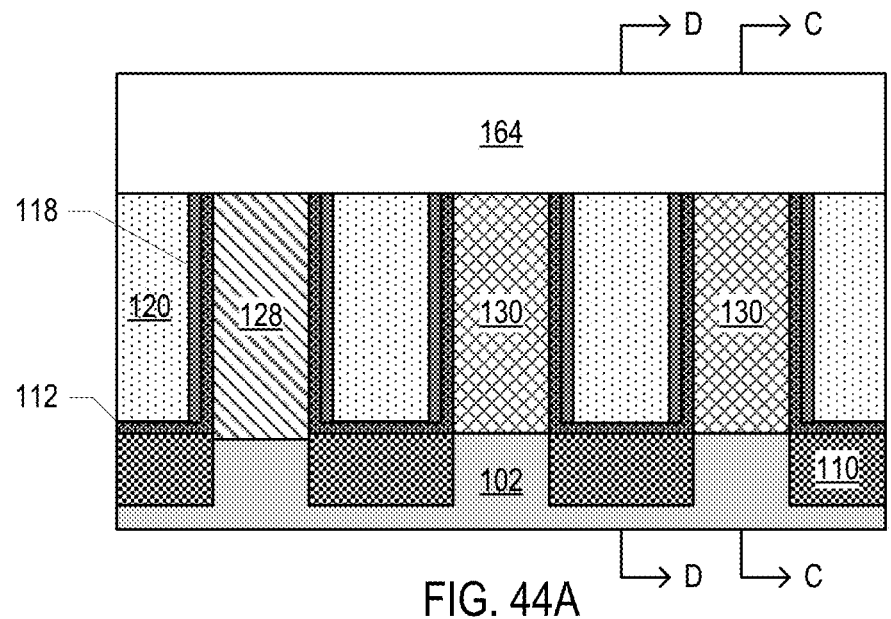
Figure 44B:
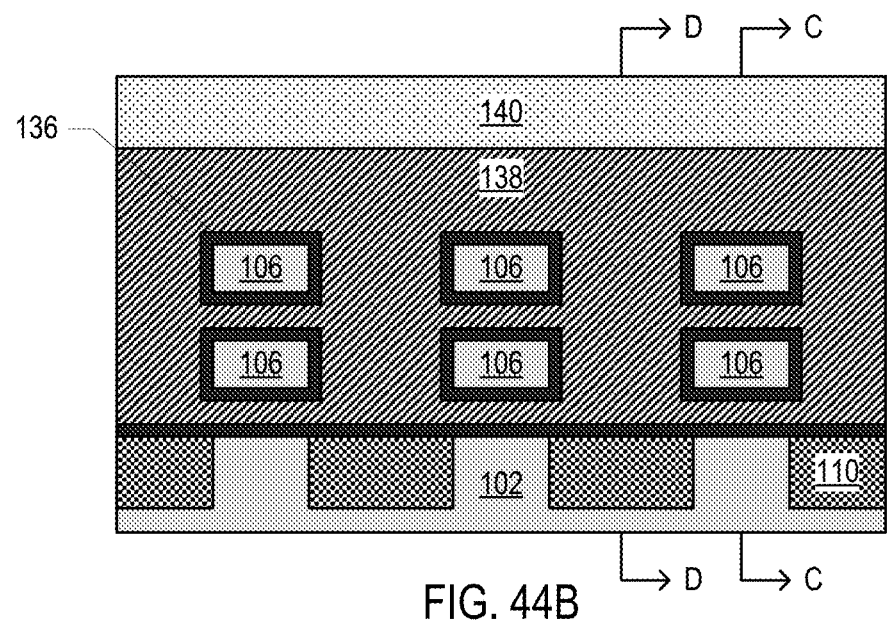
Figure 44C:
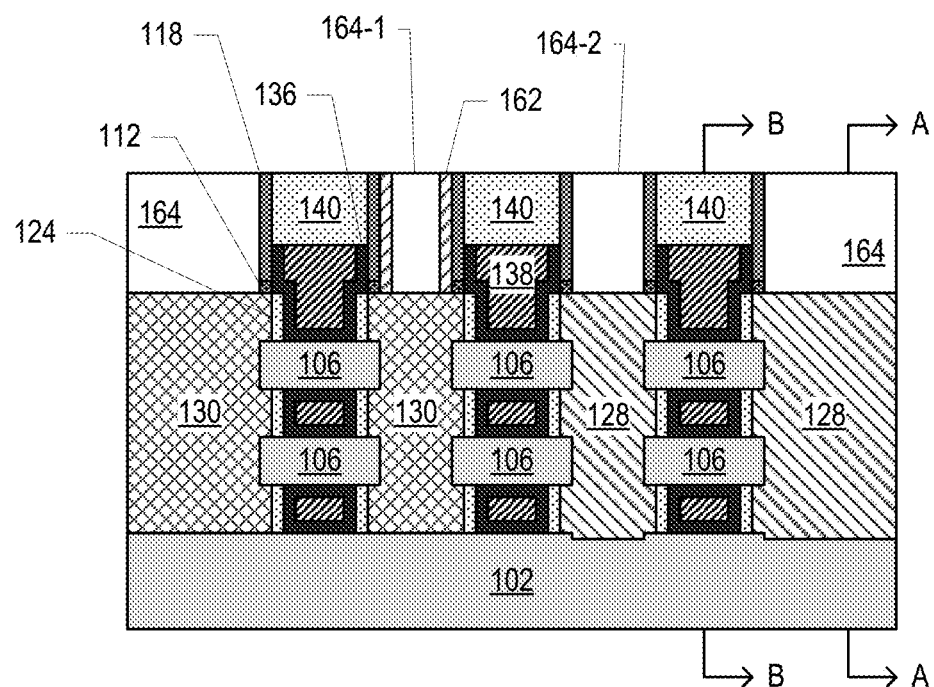
Figure 44D:
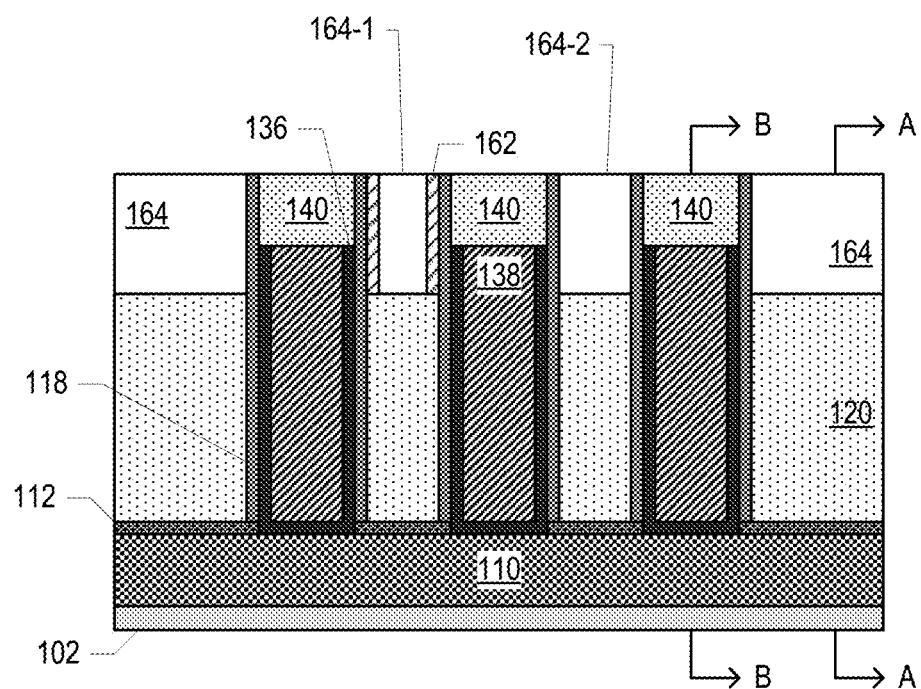
Figure 45A:
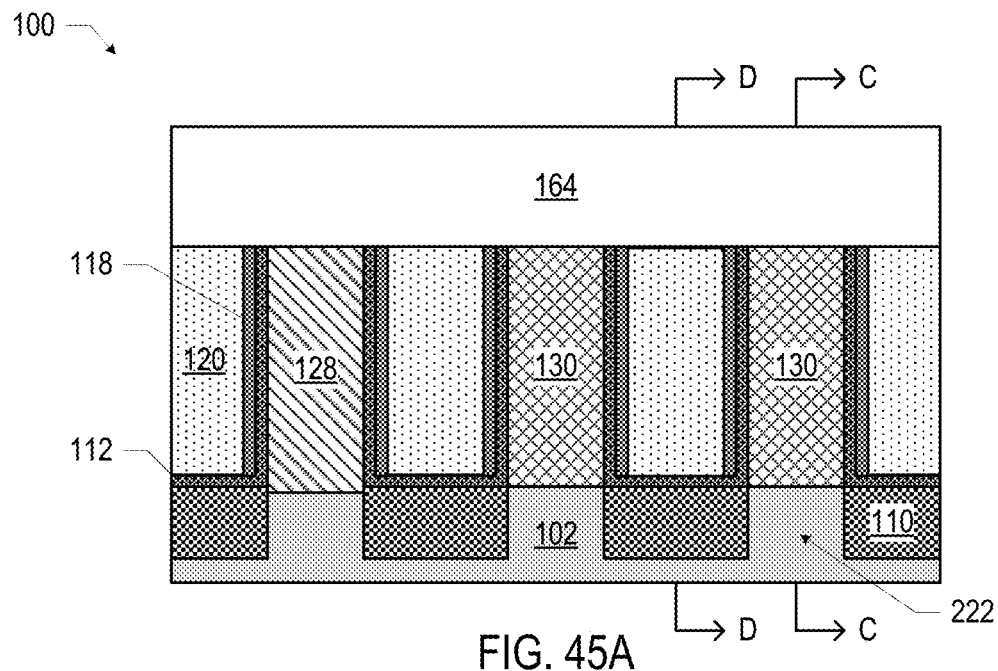
FIGS. 45A-45D, 46A-46D, 47A-47D, and 48A-48D are cross-sectional views of other IC structures, in accordance with various embodiments.
Figure 45B:
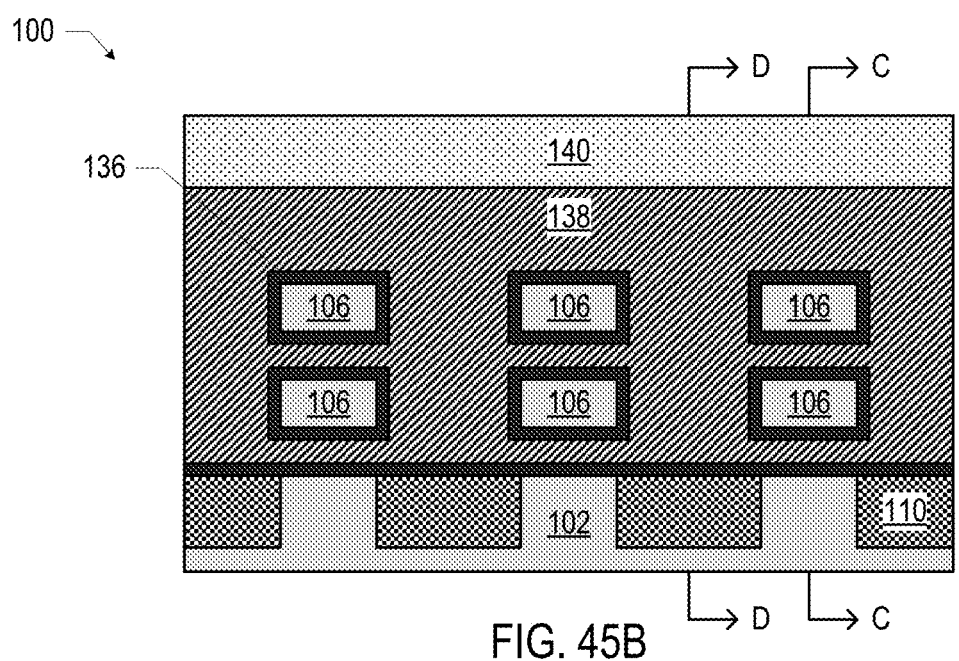
Figure 45C:
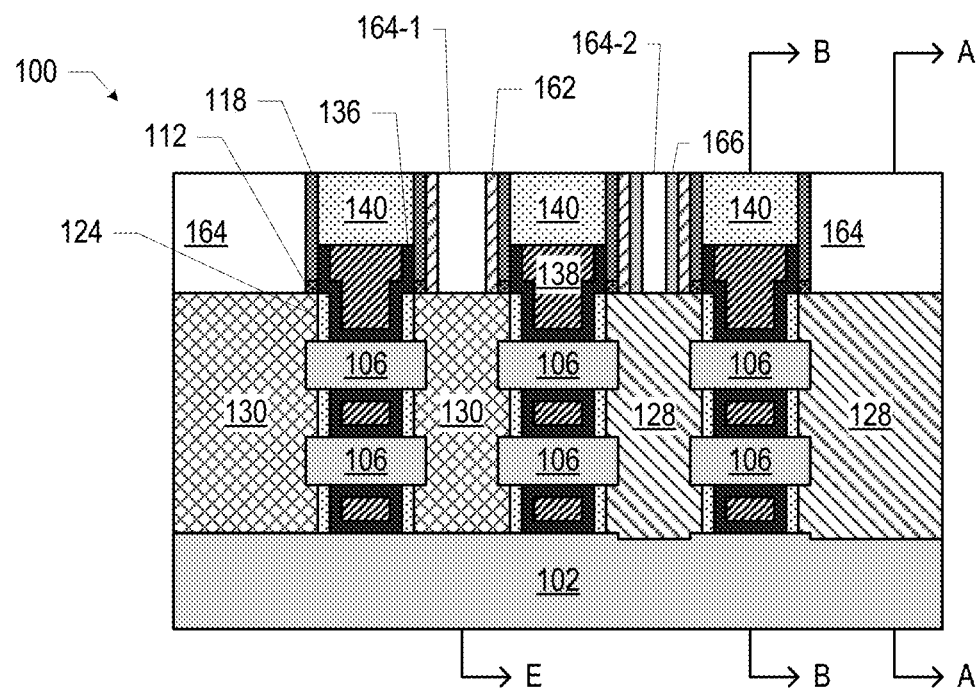
Figure 45D:
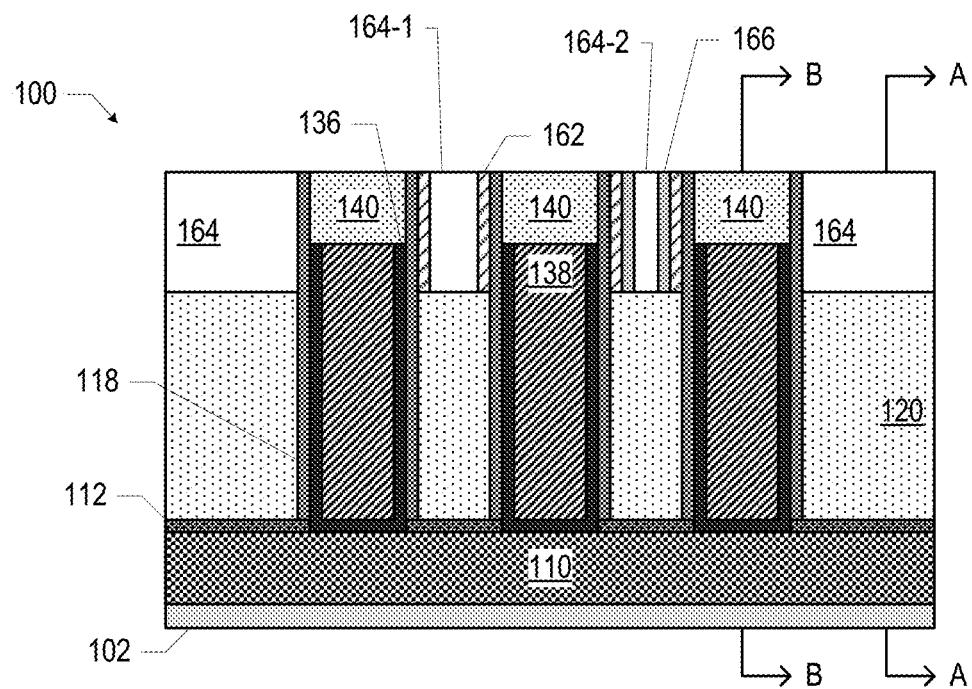
Figure 46A:
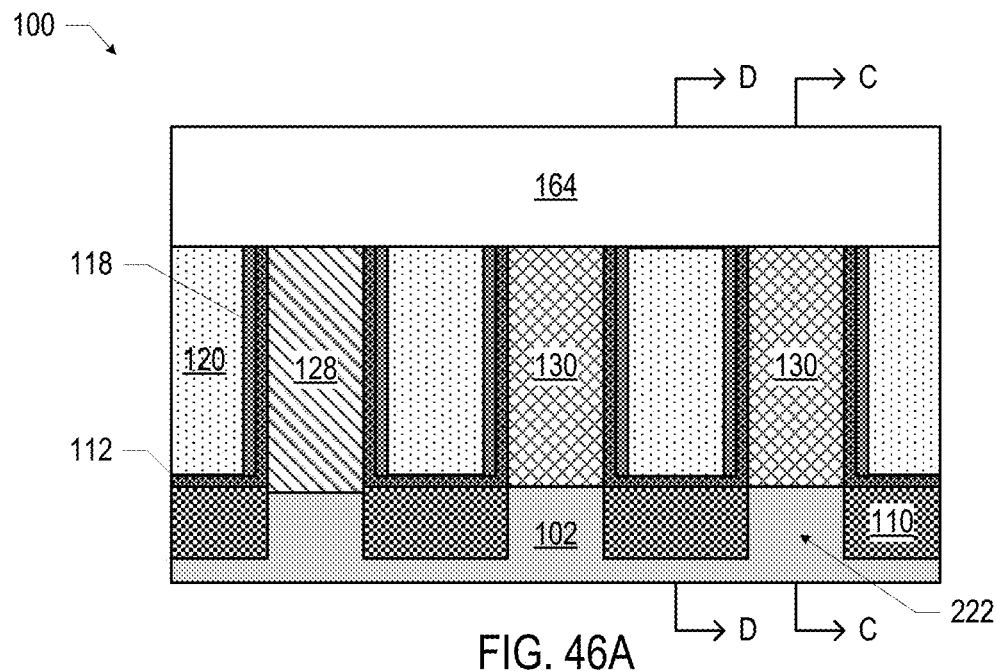
Figure 46B:
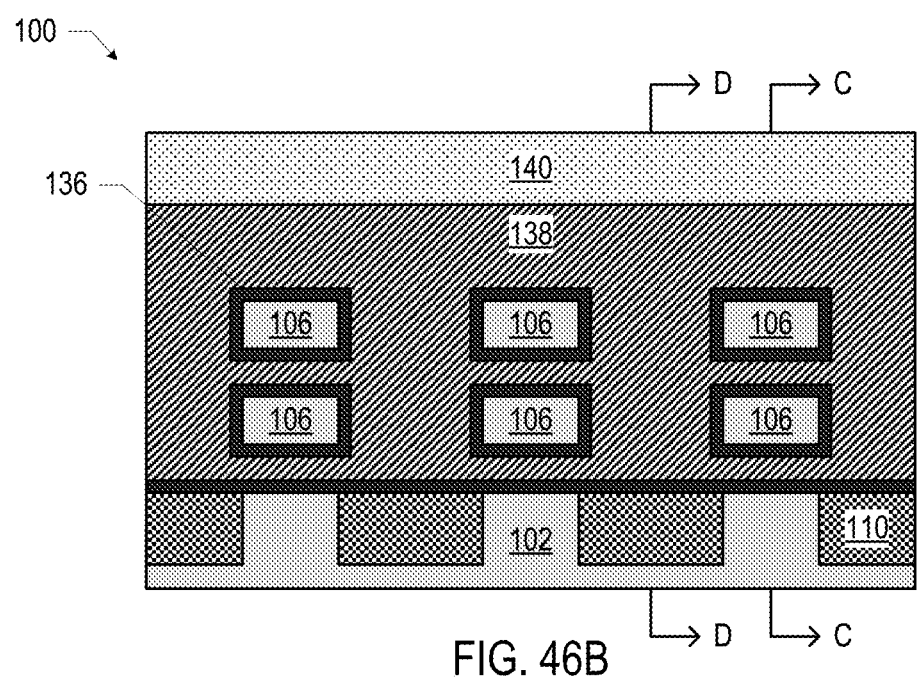
Figure 46C:
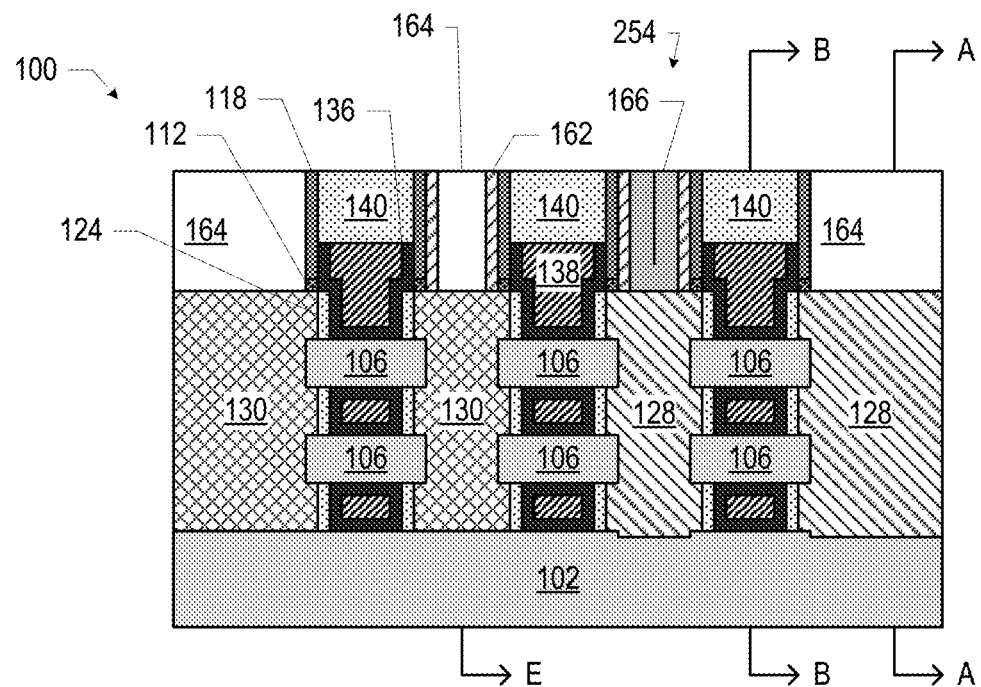
Figure 46D:
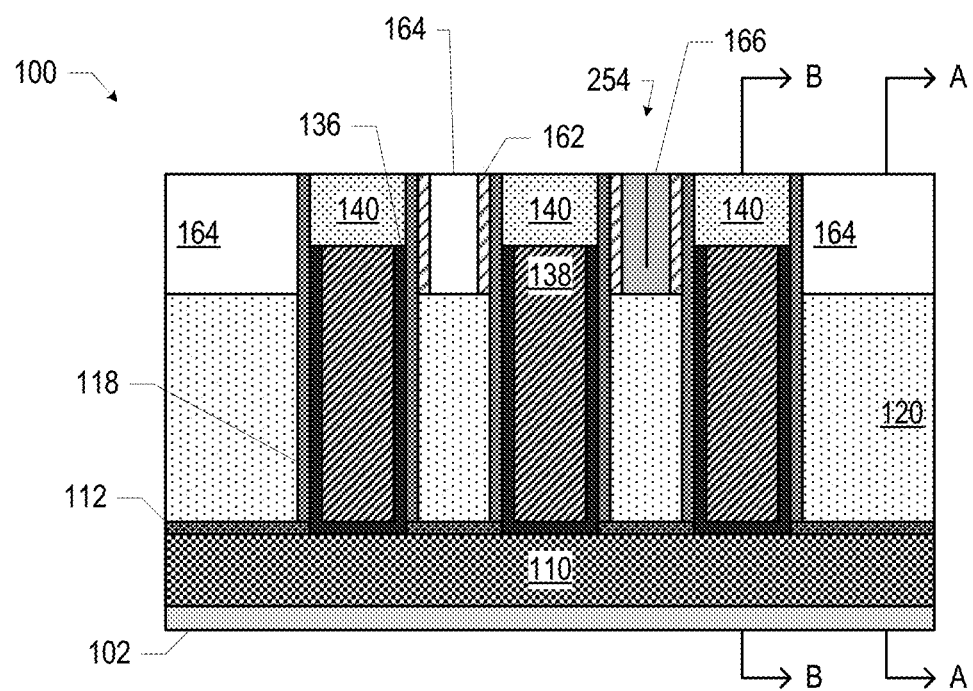
Figure 47A:
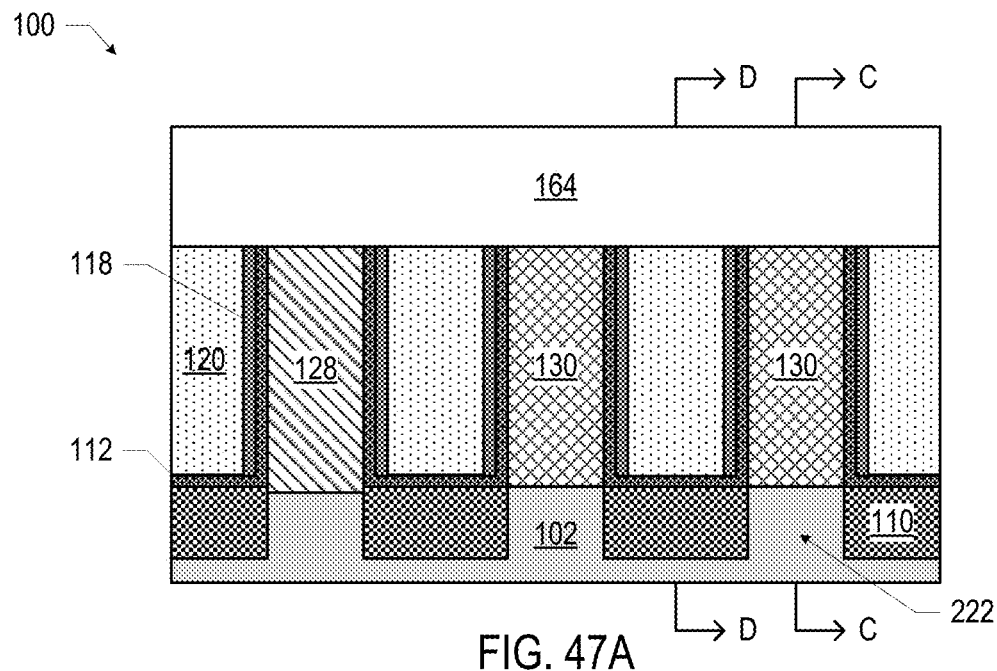
Figure 47B:
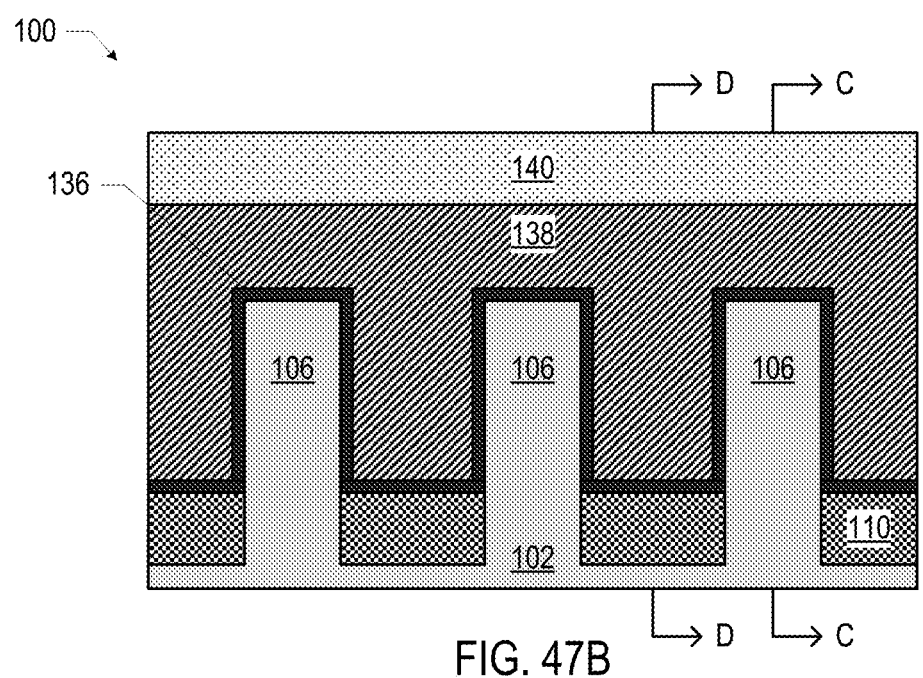
Figure 47C:
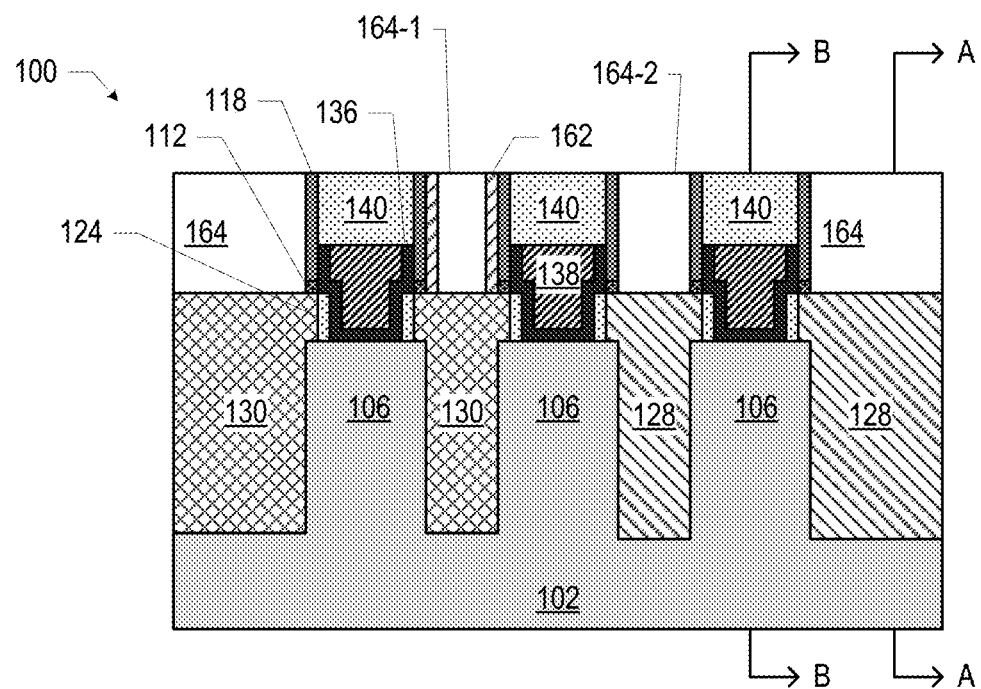
Figure 47D:
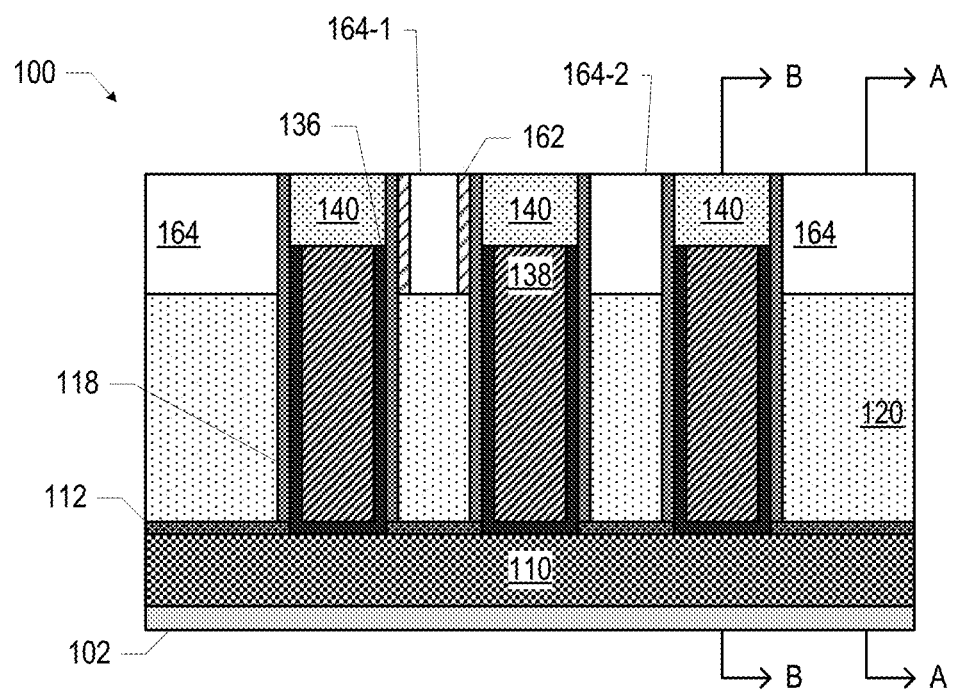
Figure 48A:
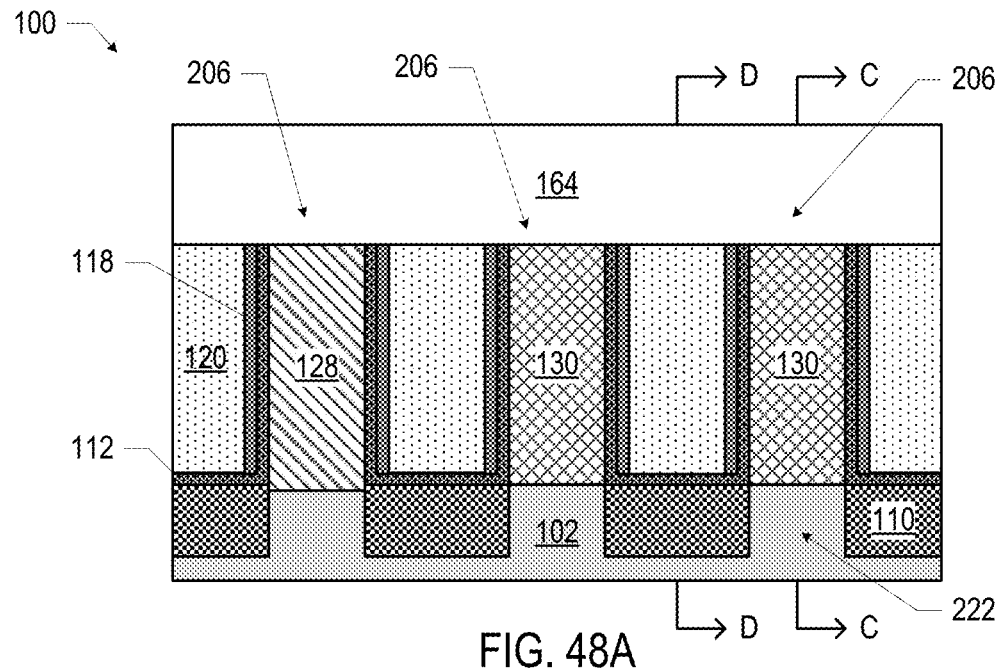
Figure 48B:
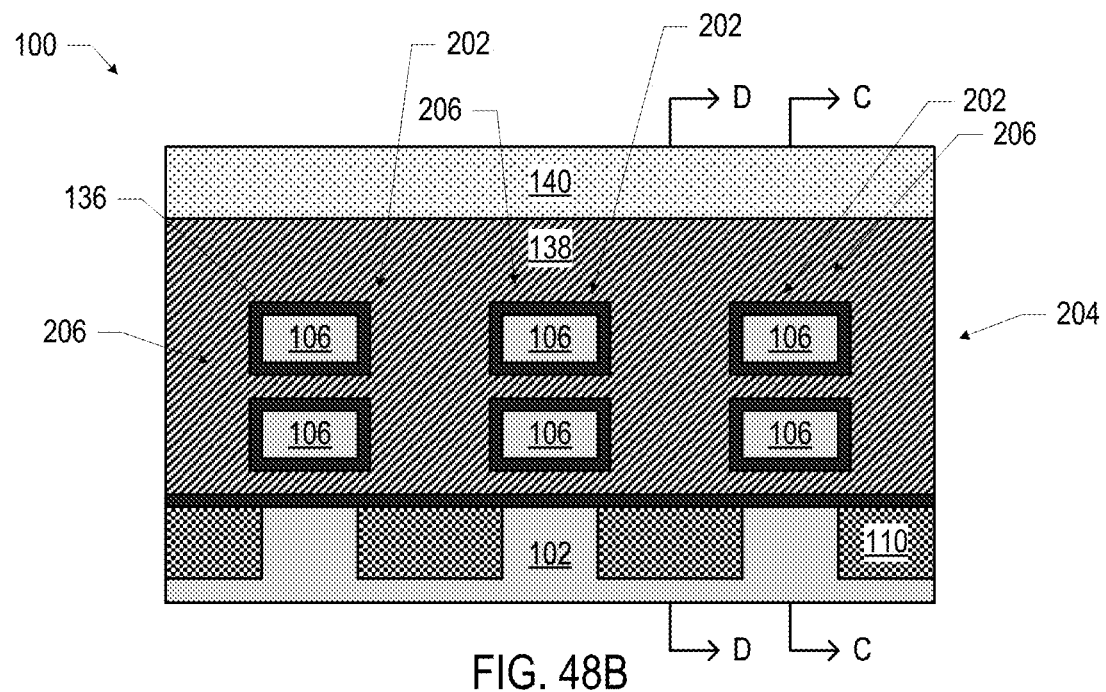
Figure 48C:
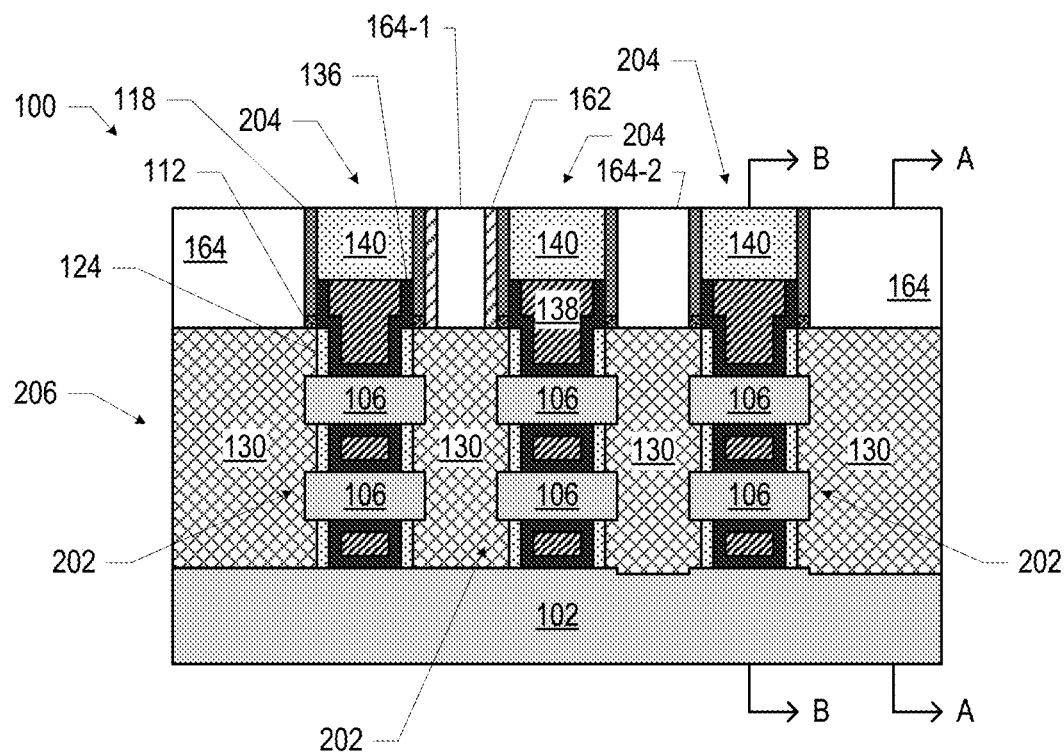
Figure 48D:
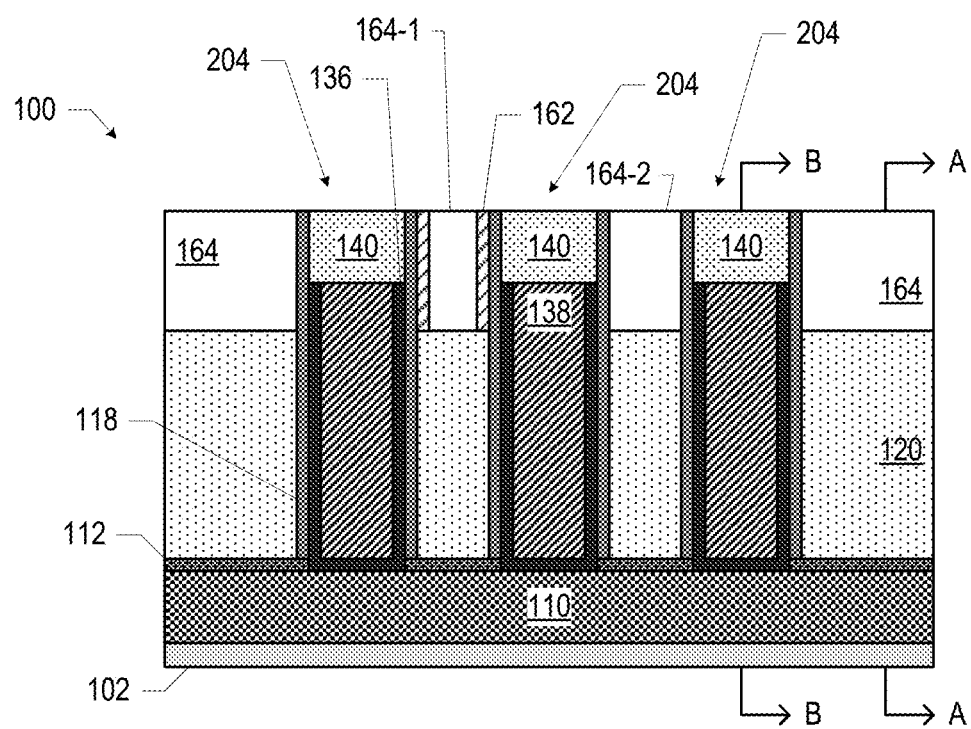

FIG. 19 illustrates an assembly subsequent to recessing the exposed sacrificial material 104 of the assembly of FIG. 18, without simultaneously recessing the exposed channel material 106 (as shown in FIG. 19C). Any suitable selective etch technique may be used. Since this partial lateral recess of the exposed sacrificial material 104 is self-aligned to the exposed channel material 106, the recess of the exposed sacrificial material 104 may be uniform across the width of the channel material 106 (i.e., left-right from the perspective of FIG. 19A).

FIG. 20 illustrates an assembly subsequent to conformally depositing a dielectric material 124 over the assembly of FIG. 19. The dielectric material 124 may include any suitable material (e.g., a low-k dielectric material) and may be deposited so as to fill the recesses formed by recessing the exposed sacrificial material 104 (as discussed above with reference to FIG. 19). In some embodiments, conformally depositing the dielectric material 124 may include multiple rounds of deposition (e.g., three rounds) of one or more dielectric materials.

FIG. 21 illustrates an assembly subsequent to recessing the dielectric material 124 of the assembly of FIG. 20. Any suitable selective etch technique may be used to recess the exposed dielectric material 124, such as an isotropic etch. The dielectric material 124 may remain on side surfaces of the sacrificial material 104 proximate to the open volumes 224, as shown in FIG. 21C. The amount of recess may be such that the recessed surface of the dielectric material 124 is flush with (not shown) or slightly beyond the side surface of the channel material 106, as shown in FIG. 21C. Excessive recess of the exposed dielectric material 124 beyond the side surface of the channel material 106 may result in device performance degradation (e.g., due to elevated parasitic contact-to-gate coupling capacitance) and/or device defect (e.g., due to contact-to-gate short).

FIG. 22 illustrates an assembly subsequent to forming the S/D regions 130 in the open volumes 224 of the assembly of FIG. 21. The S/D regions 130 may be formed by epitaxial growth that seeds from the exposed surfaces of the base 102 and the channel material 106, and the lateral extent of the S/D regions 130 (e.g., in the left-right direction of FIG. 22A) may be limited by the dielectric material 112 bordering the open volumes 224. In some embodiments, the S/D regions 130 may include an n-type epitaxial material (e.g., heavily in-situ phosphorous-doped material for use in an NMOS transistor). In some embodiments, the epitaxial growth of the S/D regions 130 may include an initial nucleation operation to provide a seed layer, followed by a primary epitaxy operation in which the remainder of the S/D regions 130 are formed on the seed layer.

FIG. 23 illustrates an assembly subsequent to depositing a conformal layer of a dielectric material 142 on the assembly of FIG. 22. The dielectric material 142 may be a contact etch stop layer (CESL), and may be formed of any suitable material (e.g., silicon nitride).

FIG. 24 illustrates an assembly subsequent to depositing a dielectric material 122 on the assembly of FIG. 23, and then polishing the dielectric material 122 and the dielectric material 142 to expose the hardmask 126. In some embodiments, the dielectric material 122 may be a pre-metal dielectric (PMD), such as an oxide material (e.g., silicon oxide).

FIG. 25 illustrates an assembly subsequent to removing the hardmask 126 from the assembly of FIG. 24, then depositing and patterning a hardmask 127. The hardmask 127 may have any suitable material composition; for example, in some embodiments, the hardmask 127 may include titanium nitride. The hardmask 127 may be patterned so as to selectively remove the hardmask 127 in areas that will correspond to the S/D regions 128, while otherwise leaving the hardmask 127 in place. Any suitable patterning technique (e.g., a lithographic technique) may be used to pattern the hardmask 127. As noted above, the particular arrangement of the S/D regions 128 in an IC structure 100 (and thus the particular layout of the patterned hardmask 127) depicted in various ones of the accompanying figures is simply illustrative, and any desired arrangement may be used; FIG. 48 depicts an IC structure 100 with a different arrangement of S/D regions 128, for example.

FIG. 26 illustrates an assembly subsequent to recessing the exposed dielectric material 120 (i.e., the dielectric material 120 not protected by the hardmask 127) of the assembly of FIG. 25. Any suitable selective etch technique may be used to recess the exposed dielectric material 120, such as an isotropic etch.

FIG. 27 illustrates an assembly subsequent to removing some of the dielectric material 118 exposed in the assembly of FIG. 26. This operation may enlarge the "canyons" between adjacent portions of hardmask 116/dielectric material 114, facilitating subsequent operations. In some embodiments, the removal of some of the dielectric material 118 may be achieved by a partial isotropic etch (e.g., a nitride partial isotropic etch when the dielectric material 118 includes a nitride).

FIG. 28 illustrates an assembly subsequent to further recessing the exposed dielectric material 120 of the assembly of FIG. 27 (i.e., the dielectric material 120 not protected by the hardmask 127). Any suitable selective etch technique may be used to recess the exposed dielectric material 120, such as an isotropic etch.

FIG. 29 illustrates an assembly subsequent to conformally depositing additional dielectric material 118 on the assembly of FIG. 28, and then performing another directional "downward" etch to remove the dielectric material 118 on horizontal surfaces, "repairing" the dielectric material 118 as "spacers" on side faces of exposed surfaces, as shown. The etch of FIG. 29 (e.g., an RIE) may also remove the dielectric material 112 from the top faces of the sacrificial material 104, as shown.

FIG. 30 illustrates an assembly subsequent to removing the portions of the sacrificial material 104 and the channel material 106 in the assembly of FIG. 29 that are not covered by the hardmask 127 to form open volumes 225 (e.g., using any suitable etch techniques). These open volumes 225 may correspond to the locations of the S/D regions 128 in the IC structure 100, as discussed further below, and are self-aligned to the dielectric material 112, as shown.

FIG. 31 illustrates an assembly subsequent to recessing the exposed sacrificial material 104 of the assembly of FIG. 30, without simultaneously recessing the exposed channel material 106, conformally depositing a dielectric material 124, and recessing the dielectric material 124. These operations may take any of the forms discussed above with reference to FIGS. 19-21. The dielectric material 124 may remain on side surfaces of the sacrificial material 104 proximate to the open volumes 225, as shown in FIG. 31C.

FIG. 32 illustrates an assembly subsequent to forming the S/D regions 128 in the open volumes 225 of the assembly of FIG. 31, depositing a conformal layer of a dielectric material 154, and depositing a dielectric material 156. The S/D regions 128 may be formed by epitaxial growth that seeds from the exposed surfaces of the base 102 and the channel material 106, and the lateral extent of the S/D regions 128 (e.g., in the left-right direction of FIG. 32A) may be limited by the dielectric material 112 bordering the open volumes 225. In some embodiments, the S/D regions 130 may include a p-type epitaxial material (e.g., heavily in-situ boron-doped material for use in a PMOS transistor). In some embodiments, the epitaxial growth of the S/D regions 128 may include an initial nucleation operation to provide a seed layer, followed by a primary epitaxy operation in which the remainder of the S/D regions 128 are formed on the seed layer. In some implementations, the S/D regions 128 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the S/D regions 128 may be formed using one or more alternate semiconductor materials such as germanium or a group III-V material or alloy. The dielectric material 154 may be a CESL, and may be formed of any suitable material (e.g., silicon nitride). In some embodiments, the dielectric material 156 may be a PMD, such as an oxide material (e.g., silicon oxide).

FIG. 33 illustrates an assembly subsequent to polishing the hardmask 127, the dielectric material 122, the dielectric material 142, the dielectric material 154, and the dielectric material 156 of the assembly of FIG. 32 (e.g., using a CMP technique) to expose the hardmask 116 above the channel regions 202.

FIG. 34 illustrates an assembly subsequent to removing the hardmask 116, the dielectric material 114 (the "dummy gate"), and the dielectric material 112 from the assembly of FIG. 33 to form open volumes 226. Any suitable etch techniques may be used.

FIG. 35 illustrates an assembly subsequent to "release" of the channel material 106 of the assembly of FIG. 34 by removal of the sacrificial material 104. Any suitable etch technique may be used. The release operations may cause a thin layer of oxide 157 (e.g., silicon oxide, when the channel material 106 includes silicon) on the exposed surfaces of the channel material 106.

FIG. 36 illustrates an assembly subsequent to performing a clean operation that removes the oxide 157 from the assembly of FIG. 35, and then forming a conformal gate dielectric 136 over the resulting assembly. The gate dielectric 136 may be formed using any suitable technique (e.g., ALD), and may include any of the materials discussed herein with reference to the gate dielectric 136.

FIG. 37 illustrates an assembly subsequent to forming a gate metal 138 over the assembly of FIG. 36. The gate metal 138 may include any one or more material layers, such as any of the materials discussed herein with reference to the gate metal 138.

FIG. 38 illustrates an assembly subsequent to polishing the gate metal 138 and the gate dielectric 136 of the assembly of FIG. 37 to remove the gate metal 138 and the gate dielectric 136 over the dielectric material 122 and the dielectric material 156. Any suitable polishing technique, such as a CMP technique, may be used.

FIG. 39 illustrates an assembly subsequent to recessing the gate metal 138 and the gate dielectric 136 (e.g., using one or more etch techniques) to form recesses in the assembly of FIG. 38, and then forming gate contacts 140 in the recesses. The gate contacts 140 may include any one or more materials (e.g., an adhesion liner, a barrier liner, one or more fill metals, etc.).

FIG. 40 illustrates an assembly subsequent to removing the dielectric materials 122, 142, 154, and 156 from the assembly of FIG. 39 to form recesses 168. The recesses 168 may correspond to the locations of prospective S/D contacts 164, as discussed further below. Any suitable etch techniques may be used to remove the dielectric materials 122, 142, 154, and 156.

FIG. 41 illustrates an assembly subsequent to depositing and patterning a mask material 160 on the assembly of FIG. 40 so as to expose only those recesses 168 that are to correspond to S/D contacts 164 whose adjacent dielectric material regions are to be thicker than the dielectric material 118 (and thus whose lengths 252 are to be smaller). For example, FIG. 41 illustrates only one exposed recess 168 (the recess 168 corresponding to the S/D contact 164-1 of FIG. 1), but the mask material 160 may be patterned so as to expose any number and arrangement of recesses 168.

FIG. 42 illustrates an assembly subsequent to conformally depositing a dielectric material 162 on the assembly of FIG. 41, and then performing a directional "downward" etch to remove the dielectric material 162 on horizontal surfaces, leaving the dielectric material 162 as "spacers" on side faces of exposed surfaces, as shown. In some embodiments, the dielectric material 162 may have a same material composition as the dielectric material 118, while in other embodiments, the dielectric material 162 may have a different material composition. In this manner, the dielectric material regions that will be adjacent to the S/D contact 164-1 are "thickened" relative to the dielectric material regions that will be adjacent to other "masked" S/D contacts 164.

FIG. 43 illustrates an assembly subsequent to planarizing the assembly of FIG. 42 to remove the dielectric material 162 and the mask material 160 above the gate contacts 140, and then patterning the remaining mask material 160 to form recesses. Any suitable technique may be used to pattern the mask material 160 (e.g., a lithographic technique). The assembly of FIG. 43 may include recesses in locations corresponding to the S/D contacts 164, as shown.

FIG. 44 illustrates an assembly subsequent to forming S/D contacts 164 in the recesses of the assembly of FIG. 43. The S/D contacts 164 may include any one or more materials (e.g., an adhesion liner, a barrier liner, one or more fill metals, etc.). The assembly of FIG. 44 may take the form of the IC structure 100 of FIG. 1. In particular, the assembly of FIG. 44 may include at least some S/D contacts 164 having different lengths 252, as shown.

The operations of FIGS. 41-43 may be repeated as often as desired to selectively form additional spacers of dielectric material in the recesses 168, and thereby create S/D contacts 164 having different lengths 252. For example, FIG. 45 illustrates an IC structure in which the S/D contact 164-1 has adjacent dielectric material regions including two layers of dielectric materials (dielectric materials 118 and 162), while the S/D contact 164-2 has adjacent dielectric material regions including three layers of dielectric materials (dielectric materials 118, 162, and 166). Additional dielectric materials, such as the dielectric material 166, may have a same material composition as the dielectric material 118 or the dielectric material 162, or different material compositions. The various dielectric material layers 162 and 166 may have any desired thickness, as well.

In some embodiments, the thickness of a spacer of dielectric material in a recess 168 may be selected to be thick enough so as to completely obstruct the recess 168, and thereby "depopulate" a prospective S/D contact 164. FIG. 46 illustrates an IC structure 100 including a depopulated S/D contact 254, closed off by additional dielectric materials 162 and 166. As noted above, such "depopulated" S/D contacts may be useful for prospective S/D contacts in the interior of a device region 206 (where no electrical contact to the associated S/D regions 128/130 is needed) by reducing the undesirable parasitics associated with using a "dummy" S/D contact (i.e., an S/D contact 164 that is present, but is not utilized). Although FIG. 46 illustrates an embodiment in which two additional layers of dielectric material (the dielectric materials 162 and 166) are used to depopulate a prospective S/D contact, a depopulated S/D contact 254 may be fabricated using a single additional layer of dielectric material or more than two additional layers of dielectric material. Note that the spacers of the dielectric material 166 in the depopulated S/D contact 254 may be provided by a single, continuous U-shaped portion of the dielectric material 166, with a seam in the middle, as shown.

As noted above, in some embodiments, the channel material 106 may have any desired arrangement. For example, FIG. 47 illustrates an IC structure 100 in which the channel material 106 is arranged as a fin, instead of as one or more nanowires; in other embodiments, the channel material 106 may include a fin and nanowires, or other arrangements. An IC structure 100 like that of FIG. 47 may be manufactured using the manufacturing processes disclosed herein as appropriate (e.g., omitting the "release" operations, etc.).

As noted above, the particular arrangement of the S/D regions 128/130 in an IC structure 100 depicted in various ones of the accompanying figures is simply illustrative, and any desired arrangement may be used. FIG. 48 depicts an IC structure 100 with a different arrangement of S/D regions 128/130, for example. In particular, the IC structure 100 of FIG. 48 may be fabricated by patterning the hardmasks 126/127 so that the boundary between S/D regions 128 and S/D regions 130 is between and parallel to adjacent channel regions 202. Any other desired arrangement of S/D regions 128/130 may be implemented in accordance with the present disclosure.

Figure 49:
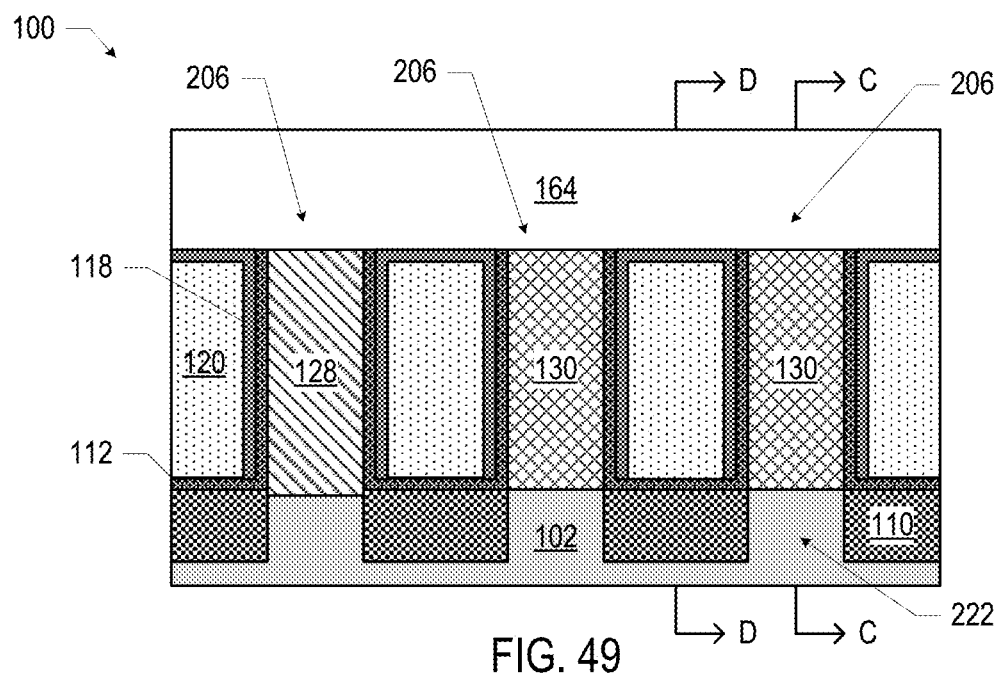
FIG. 49 is a cross-sectional view of another IC structure, in accordance with various embodiments.

In some embodiments, the repeated deposition and etching operations around the dielectric material 118 may be performed such that a "cap" of the dielectric material 118 extends over the dielectric material 120. FIG. 49 is a side, cross-sectional view of such an IC structure 100, sharing the perspective of the "A" sub-figures herein. The resulting dielectric material 118 may have the same of an upside down "U" and may be nested in the U-shaped dielectric material 112. Any of the embodiments disclosed herein may include a dielectric material 118 having the structure of FIG. 49.

The IC structures 100 disclosed herein may be included in any suitable electronic component. FIGS. 50-54 illustrate various examples of apparatuses that may include any of the IC structures 100 disclosed herein.

Figure 50:
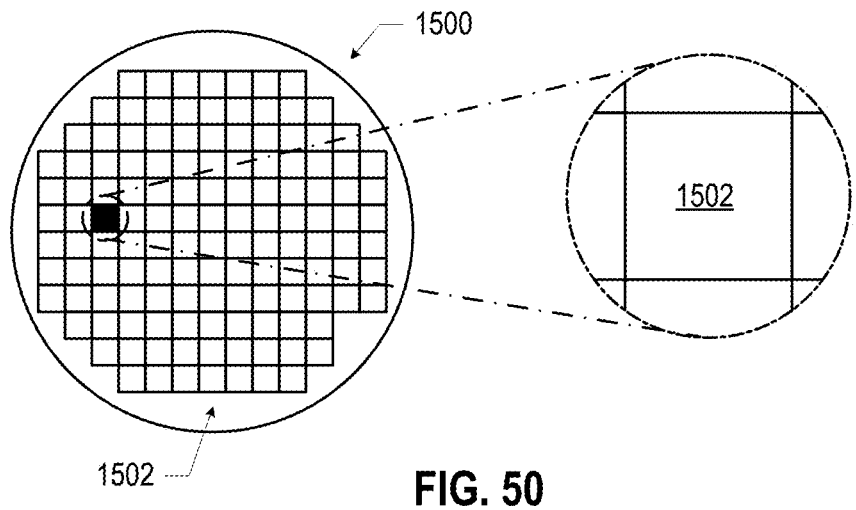
FIG. 50 is a top view of a wafer and dies that may include an IC structure in accordance with any of the embodiments disclosed herein.

FIG. 50 is a top view of a wafer 1500 and dies 1502 that may include one or more IC structures 100 in accordance with any of the embodiments disclosed herein. The wafer 1500 may be composed of semiconductor material and may include one or more dies 1502 having IC structures (e.g., the IC structures 100 disclosed herein) formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as discussed below with reference to FIG. 51), one or more transistors (e.g., some of the transistors discussed below with reference to FIG. 51) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 54) or other logic that is configured to store information in the memory devices or execute instructions stored in the memory array.

Figure 51:
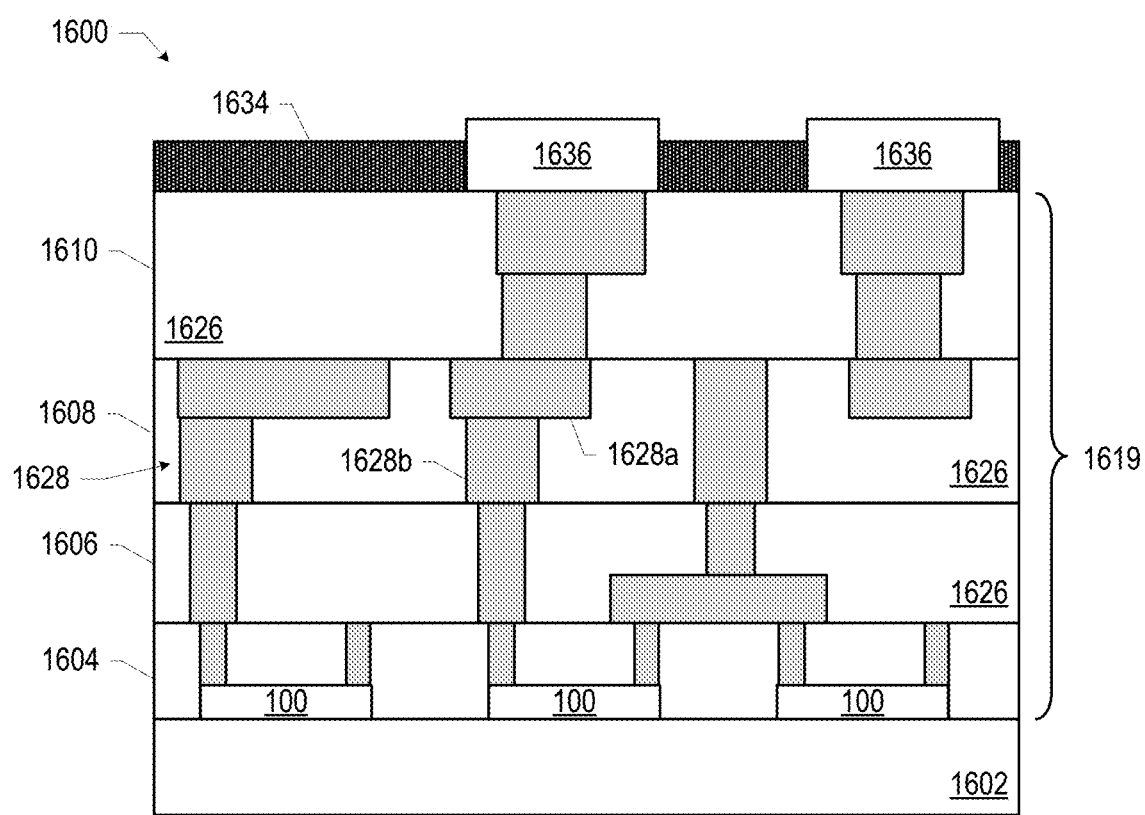
FIG. 51 is a side, cross-sectional view of an IC component that may include an IC structure in accordance with any of the embodiments disclosed herein.

FIG. 51 is a side, cross-sectional view of an IC component 1600 that may include one or more IC structures 100 in accordance with any of the embodiments disclosed herein. One or more of the IC components 1600 may be included in one or more dies 1502 (FIG. 50). The IC component 1600 may be formed on a substrate 1602 (e.g., the wafer 1500 of FIG. 50) and may be included in a die (e.g., the die 1502 of FIG. 50). The substrate 1602 may take the form of any of the embodiments of the base 102 disclosed herein.

The IC component 1600 may include one or more device layers 1604 disposed on the substrate 1602. The device layer 1604 may include features of one or more IC structures 100, other transistors, diodes, or other devices formed on the substrate 1602. The device layer 1604 may include, for example, source and/or drain (S/D) regions, gates to control current flow between the S/D regions, S/D contacts to route electrical signals to/from the S/D regions, and gate contacts to route electrical signals to/from the S/D regions (e.g., in accordance with any of the embodiments discussed above with reference to the IC structures 100). The transistors that may be included in a device layer 1604 are not limited to any particular type or configuration, and may include any one or more of, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors (e.g., as discussed above with reference to the IC structures 100).

Electrical signals, such as power and/or input/output (I/O) signals, may be routed to and/or from the devices (e.g., the IC structures 100) of the device layer 1604 through one or more interconnect layers disposed on the device layer 1604 (illustrated in FIG. 51 as interconnect layers 1606-1610). For example, electrically conductive features of the device layer 1604 (e.g., the gate contacts and the S/D contacts) may be electrically coupled with the interconnect structures 1628 of the interconnect layers 1606-1610. The one or more interconnect layers 1606-1610 may form a metallization stack (also referred to as an "ILD stack") 1619 of the IC component 1600. Although FIG. 51 depicts an ILD stack 1619 at only one face of the device layer 1604, in other embodiments, an IC component 1600 may include two ILD stacks 1619 such that the device layer 1604 is between the two ILD stacks 1619.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 51). Although a particular number of interconnect layers 1606-1610 is depicted in FIG. 51, embodiments of the present disclosure include IC components having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 51. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 51. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts or gate contacts) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC component 1600 (i.e., farther away from the device layer 1604) may be thicker.

The IC component 1600 may include a solder resist material 1634 (e.g., polyimide or similar material) and one or more conductive contacts 1636 formed on the interconnect layers 1606-1610. In FIG. 51, the conductive contacts 1636 are illustrated as taking the form of bond pads. The conductive contacts 1636 may be electrically coupled with the interconnect structures 1628 and configured to route the electrical signals of device layer 1604 to other external devices. For example, solder bonds may be formed on the one or more conductive contacts 1636 to mechanically and/or electrically couple a chip including the IC component 1600 with another component (e.g., a circuit board). The IC component 1600 may include additional or alternate structures to route the electrical signals from the interconnect layers 1606-1610; for example, the conductive contacts 1636 may include other analogous features (e.g., posts) that route the electrical signals to external components. In embodiments in which the IC component 1600 includes an ILD stack 1619 at each opposing face of the device layer 1604, the IC component 1600 may include conductive contacts 1636 on each of the ILD stacks 1619 (allowing interconnections to the IC component 1600 to be made on two opposing faces of the IC component 1600).

Figure 52:
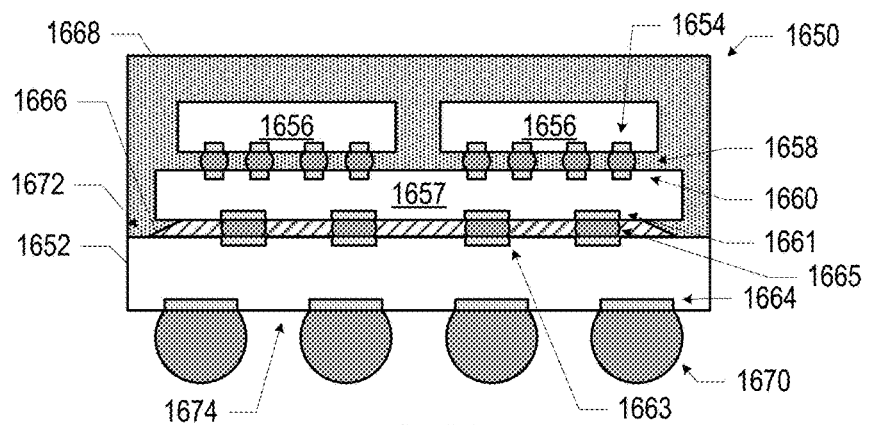
FIG. 52 is a side, cross-sectional view of an IC package that may include an IC structure in accordance with any of the embodiments disclosed herein.

FIG. 52 is a side, cross-sectional view of an example IC package 1650 that may include one or more IC structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 51.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 52 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 52 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 52 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 53.

The dies 1656 may take the form of any of the embodiments of the die 1502 discussed herein (e.g., may include any of the embodiments of the IC component 1600). In embodiments in which the IC package 1650 includes multiple dies 1656, the IC package 1650 may be referred to as a multi-chip package (MCP). The dies 1656 may include circuitry to perform any desired functionality. For example, one or more of the dies 1656 may be logic dies (e.g., silicon-based dies), and one or more of the dies 1656 may be memory dies (e.g., high bandwidth memory). In some embodiments, the die 1656 may include one or more IC structures 100 (e.g., as discussed above with reference to FIG. 50 and FIG. 51).

Although the IC package 1650 illustrated in FIG. 52 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 52, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 53:
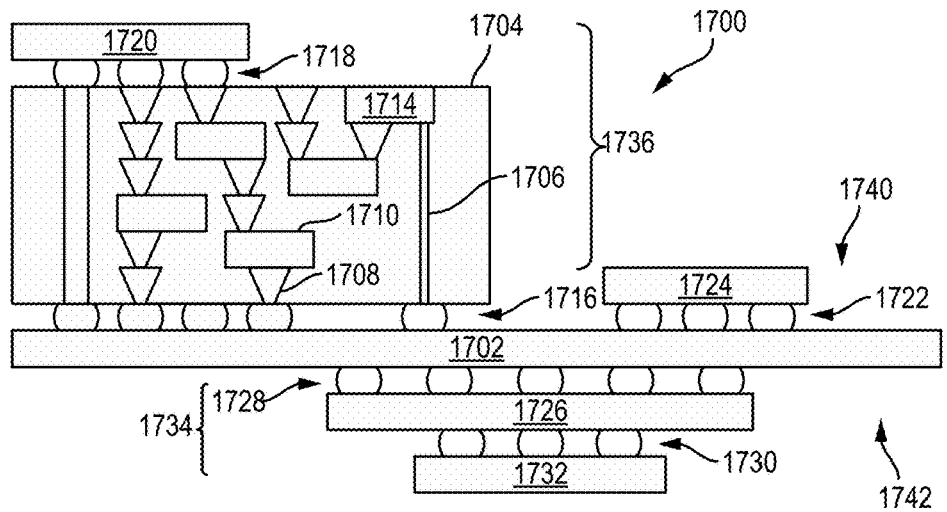
FIG. 53 is a side, cross-sectional view of an IC component assembly that may include an IC structure in accordance with any of the embodiments disclosed herein.

FIG. 53 is a side, cross-sectional view of an IC component assembly 1700 that may include one or more IC packages or other electronic components (e.g., a die) including one or more IC structures 100 in accordance with any of the embodiments disclosed herein. The IC component assembly 1700 includes a number of components disposed on a circuit board 1702 (which may be, e.g., a motherboard). The IC component assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC component assembly 1700 may take the form of any of the embodiments of the IC package 1650 discussed above with reference to FIG. 52 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC component assembly 1700 illustrated in FIG. 53 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 53), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 53, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 50), an IC component (e.g., the IC component 1600 of FIG. 51), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 53, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC component assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC component assembly 1700 illustrated in FIG. 53 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 54:
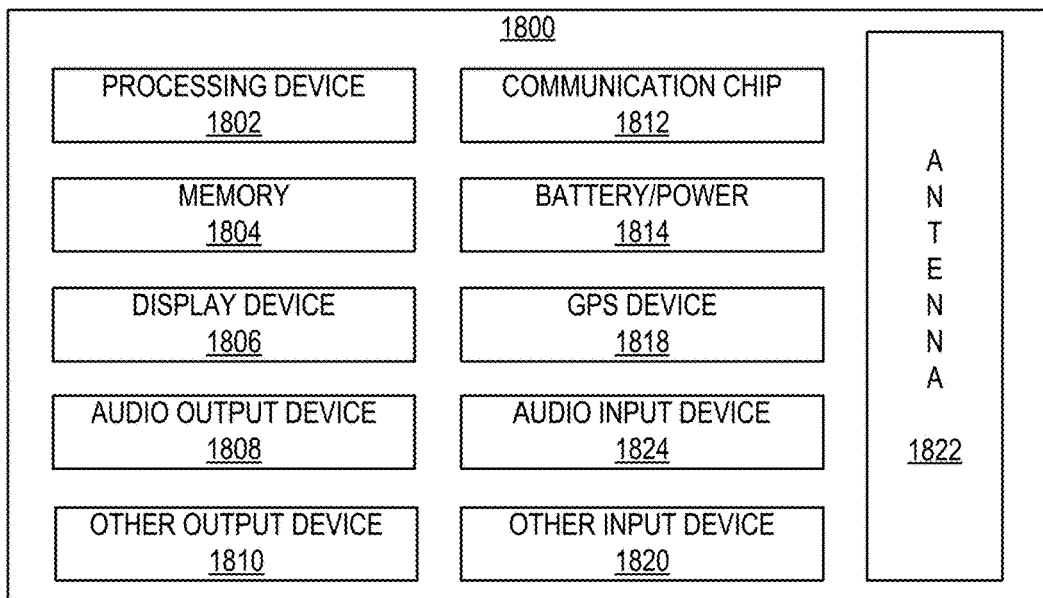
FIG. 54 is a block diagram of an example electrical device that may include an IC structure in accordance with any of the embodiments disclosed herein.

FIG. 54 is a block diagram of an example electrical device 1800 that may include one or more IC structures 100 in accordance with any of the embodiments disclosed herein. For example, any suitable ones of the components of the electrical device 1800 may include one or more of the IC component assemblies 1700, IC packages 1650, IC components 1600, or dies 1502 disclosed herein. A number of components are illustrated in FIG. 54 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 54, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a first source/drain (S/D) contact in contact with a first S/D region; and a second S/D contact in contact with a second S/D region; wherein the first S/D region and the second S/D region have a same length, and the first S/D contact and the second S/D contact have different lengths.

Example 2 includes the subject matter of Example 1, and further specifies that the first S/D contact is spaced apart from an adjacent gate contact by a single dielectric spacer, and the second S/D contact is spaced apart from an adjacent gate contact by two or more dielectric spacers.

Example 3 includes the subject matter of Example 2, and further specifies that individual ones of the dielectric spacers have a thickness between 2 nanometers and 10 nanometers.

Example 4 includes the subject matter of any of Examples 1-3, and further specifies that the first S/D contact and the second S/D contact have a single gate contact between them.

Example 5 includes the subject matter of any of Examples 1-4, and further includes: a third S/D contact in contact with a third S/D region; wherein the second S/D contact is between the first S/D contact and the third S/D contact, and the third S/D contact has a same length as the first S/D contact.

Example 6 includes the subject matter of Example 5, and further specifies that a length of the second S/D contact is less than a length of the first S/D contact and the third S/D contact.

Example 7 includes the subject matter of any of Examples 1-6, and further specifies that a first dielectric layer is between the first S/D contact and a first gate contact adjacent to the first S/D contact, the first dielectric layer is between the second S/D contact and a second gate contact adjacent to the second S/D contact, and a second dielectric layer is between the second S/D contact and the second gate contact.

Example 8 includes the subject matter of any of Examples 1-7, and further includes: a channel region in contact with the first S/D region.

Example 9 includes the subject matter of Example 8, and further specifies that the channel region includes a semiconductor fin.

Example 10 includes the subject matter of any of Examples 8-9, and further specifies that the channel region includes one or more semiconductor wires.

Example 11 is an integrated circuit (IC) structure, including: a first source/drain (S/D) contact; a second S/D contact; and a gate contact between the first S/D contact and the second S/D contact; wherein the first S/D contact is spaced apart from the gate contact by a first dielectric region having a first thickness, the second S/D contact is spaced apart from the gate contact by a second dielectric region having a second thickness, and the second thickness is different from the first thickness.

Example 12 includes the subject matter of Example 11, and further specifies that the first dielectric region includes fewer dielectric spacer layers than the second dielectric region.

Example 13 includes the subject matter of Example 12, and further specifies that individual ones of the dielectric spacer layers have a thickness between 2 nanometers and 10 nanometers.

Example 14 includes the subject matter of any of Examples 11-13, and further specifies that the gate contact is a first gate contact, and the IC structure further includes: a third S/D contact; and a second gate contact between the second S/D contact and the third S/D contact; wherein the third S/D contact is spaced apart from the second gate contact by a third dielectric region having a third thickness, and the third thickness is different from the second thickness.

Example 15 includes the subject matter of Example 14, and further specifies that the third thickness is equal to the first thickness.

Example 16 includes the subject matter of any of Examples 14-15, and further specifies that the second thickness is greater than the first thickness, and the second thickness is greater than the third thickness.

Example 17 includes the subject matter of any of Examples 11-16, and further specifies that the first dielectric region includes a first dielectric layer between the first S/D contact and the gate contact, the second dielectric region includes the first dielectric layer between the second S/D contact and the gate contact, and the second dielectric region includes a second dielectric layer between the second S/D contact and the first dielectric layer.

Example 18 includes the subject matter of any of Examples 11-17, and further includes: a channel region in contact with the first S/D region.

Example 19 includes the subject matter of Example 18, and further specifies that the channel region includes a semiconductor fin.

Example 20 includes the subject matter of any of Examples 18-19, and further specifies that the channel region includes one or more semiconductor wires.

Example 21 is an integrated circuit (IC) structure, including: a first gate contact; a second gate contact adjacent to the first gate contact; and a region between the first gate contact and the second gate contact, wherein the region includes a first spacer on the first gate contact, a second spacer on the second gate contact, a third spacer on the first spacer, and a fourth spacer on the second spacer.

Example 22 includes the subject matter of Example 21, and further specifies that the third spacer contacts the fourth spacer.

Example 23 includes the subject matter of Example 22, and further specifies that the third spacer and the fourth spacer are portions of a continuous portion of dielectric material.

Example 24 includes the subject matter of Example 23, and further specifies that the continuous portion of dielectric material has a U-shaped cross-section.

Example 25 includes the subject matter of Example 21, and further includes: a source/drain (S/D) contact between the third spacer and the fourth spacer.

Example 26 includes the subject matter of any of Examples 21-25, and further specifies that at least one of the spacers has a thickness between 2 nanometers and 10 nanometers.

Example 27 includes the subject matter of any of Examples 21-26, and further includes: a channel region associated with the first gate contact.

Example 28 includes the subject matter of Example 27, and further specifies that the channel region includes a semiconductor fin.

Example 29 includes the subject matter of any of Examples 27-28, and further specifies that the channel region includes one or more semiconductor wires.

Example 30 is an electronic assembly, including: a die including the IC structure of any of Examples 1-29; and a support electrically coupled to the die.

Example 31 includes the subject matter of Example 30, and further specifies that the support includes a package substrate.

Example 32 includes the subject matter of any of Examples 30-31, and further specifies that the support includes an interposer.

Example 33 includes the subject matter of any of Examples 30-31, and further specifies that the support includes a printed circuit board.

Example 34 includes the subject matter of any of Examples 30-33, and further includes: a housing around the die and the support.

Example 35 includes the subject matter of Example 34, and further specifies that the housing is a handheld computing device housing.

Example 36 includes the subject matter of Example 34, and further specifies that the housing is a server housing.

Example 37 includes the subject matter of any of Examples 34-36, and further includes: a display coupled to the housing.

Example 38 includes the subject matter of Example 37, and further specifies that the display is a touchscreen display.

The invention claimed is:

1. An integrated circuit (IC) structure, comprising:
a first source/drain (S/D) contact in contact with a first S/D region at a first S/D contact interface;
a second S/D contact in contact with a second S/D region at a second S/D contact interface;
a single dielectric spacer between the first S/D contact and an adjacent gate contact, the single dielectric spacer spacing the first S/D contact apart from the adjacent gate contact; and
at least two dielectric spacers between the second S/D contact and the adjacent gate contact, the at least two dielectric spacers spacing the second S/D contact apart from the adjacent gate contact;
wherein the first S/D region and the second S/D region have a same length, and the first S/D contact and the second S/D contact have different lengths along the first S/D contact interface and the second S/D contact interface, respectively.

2. The IC structure of claim 1, wherein the first S/D contact and the second S/D contact have a single gate contact between them.

3. The IC structure of claim 1, further comprising:
a third S/D contact in contact with a third S/D region at a third S/D contact interface;
wherein the second S/D contact is between the first S/D contact and the third S/D contact, and the third S/D contact has a same length along the third S/D contact interface as a length of the first S/D contact along the first S/D contact interface.

4. The IC structure of claim 3, wherein a length of the second S/D contact along the second S/D contact interface is less than the length of the first S/D contact along the second S/D contact interface and the third S/D contact along the third S/D contact interface.

5. The IC structure of claim 1, wherein a first dielectric layer is between the first S/D contact and the adjacent gate contact, the first dielectric layer is between the second S/D contact and a second gate contact adjacent to the second S/D contact, and a second dielectric layer is between the second S/D contact and the second gate contact.

6. The IC structure of claim 1, further comprising:
a channel region in contact with the first S/D region.

7. The IC structure of claim 6, wherein the channel region includes a semiconductor fin.

8. The IC structure of claim 6, wherein the channel region includes one or more semiconductor wires.

9. The IC structure of claim 1, further comprising a support structure, wherein the first S/D contact has a first length extending in a direction parallel to the support structure, the second S/D contact has a second length extending in a direction parallel to the support structure, the first length different from the second length.

10. The IC structure of claim 9, wherein the first S/D contact extends in a direction perpendicular to the support structure, and the second S/D contact extends in a direction perpendicular to the support structure.

11. The IC structure of claim 1, wherein the first S/D contact and the second S/D contact have different lengths along a longitudinal axis of a channel region.

12. An integrated circuit (IC) structure, comprising:
a first source/drain (S/D) contact;
a second S/D contact; and
a gate contact between the first S/D contact and the second S/D contact;
wherein the first S/D contact, second S/D contact, and gate contact are contacts to a single transistor; the first S/D contact is spaced apart from the gate contact by a first dielectric region having a first thickness, the first dielectric region comprising a single dielectric spacer, and the first dielectric region extending from a sidewall of the first S/D contact to a first sidewall of the gate contact; the second S/D contact is spaced apart from the gate contact by a second dielectric region having a second thickness, the second dielectric region comprising at least two dielectric spacers, and the second dielectric region extending from a sidewall of the second S/D contact to a second sidewall of the gate contact; and the second thickness is different from the first thickness.

13. The IC structure of claim 12, wherein the gate contact is a first gate contact, and the IC structure further includes:
a third S/D contact; and
a second gate contact between the second S/D contact and the third S/D contact;
wherein the third S/D contact is spaced apart from the second gate contact by a third dielectric region having a third thickness, the third dielectric region extending from a sidewall of the third S/D contact to a sidewall of the second gate contact; and the third thickness is different from the second thickness.

14. The IC structure of claim 13, wherein the third thickness is equal to the first thickness.

15. The IC structure of claim 13, wherein the second thickness is greater than the first thickness, and the second thickness is greater than the third thickness.

16. The IC structure of claim 12, wherein the first dielectric region includes a first dielectric layer between the first S/D contact and the gate contact, the second dielectric region includes the first dielectric layer between the second S/D contact and the gate contact, and the second dielectric region includes a second dielectric layer between the second S/D contact and the first dielectric layer.

17. The IC structure of claim 12, wherein the first dielectric region is in contact with the sidewall of the first S/D contact and the first sidewall of the gate contact, and the second dielectric region is in contact with the sidewall of the second S/D contact and the second sidewall of the gate contact.

18. The IC structure of claim 17, wherein the first S/D contact extends in a direction perpendicular to a support structure, and the second S/D contact extends in a direction perpendicular to the support structure.

\* \* \* \* \*